(12) United States Patent
Barron et al.

(10) Patent No.: US 8,913,686 B2
(45) Date of Patent: Dec. 16, 2014

(54) SPARSE SUPERPOSITION ENCODER AND DECODER FOR COMMUNICATIONS SYSTEM

(75) Inventors: Andrew R. Barron, North Haven, CT (US); Antony Joseph, Berkeley, CA (US)

(73) Assignee: Yale University, New Haven, CT (US)

( * ) Notice: Subject to any disclaimer, the term of this patent is extended or adjusted under 35 U.S.C. 154(b) by 149 days.

(21) Appl. No.: 13/696,745

(22) PCT Filed: May 9, 2011

(86) PCT No.: PCT/US2011/035762
§ 371 (c)(1),
(2), (4) Date: Jun. 14, 2013

(87) PCT Pub. No.: WO2011/140556
PCT Pub. Date: Nov. 10, 2011

(65) Prior Publication Data
US 2013/0272444 A1    Oct. 17, 2013

Related U.S. Application Data

(60) Provisional application No. 61/332,407, filed on May 7, 2010.

(51) Int. Cl.
| | |
|---|---|
| H04L 1/00 | (2006.01) |
| H03M 13/03 | (2006.01) |
| H03M 13/11 | (2006.01) |
| H03M 13/29 | (2006.01) |
| H03M 13/35 | (2006.01) |
| H03M 13/37 | (2006.01) |
| H03M 13/00 | (2006.01) |
| H03M 13/15 | (2006.01) |

(52) U.S. Cl.
CPC ............... *H04L 1/00* (2013.01); *H03M 13/036* (2013.01); *H03M 13/11* (2013.01); *H03M 13/1102* (2013.01); *H03M 13/2906* (2013.01); *H03M 13/353* (2013.01); *H03M 13/356* (2013.01); *H03M 13/3746* (2013.01); *H03M 13/611* (2013.01); *H03M 13/6561* (2013.01); *H04L 1/0043* (2013.01); *H04L 1/0052* (2013.01); *H03M 13/1515* (2013.01)
USPC .......... 375/295; 375/296; 375/141; 375/145; 375/146; 375/147

(58) Field of Classification Search
USPC .................. 375/295, 296, 141, 145, 146, 147
See application file for complete search history.

(56) References Cited

U.S. PATENT DOCUMENTS 8,553,595 B2 * 10/2013 Laroia et al. .................. 370/310
8,582,684 B2 * 11/2013 Niesen et al. ................. 375/295
(Continued)

OTHER PUBLICATIONS

U.S. Patent and Trademark Office, International Search Report and Written Opinion for PCT/US2011/035762 mailed Sep. 9, 2011.

*Primary Examiner* — Siu Lee
(74) *Attorney, Agent, or Firm* — Klintworth & Rozenblat IP LLC

(57) ABSTRACT

A computationally feasible encoding and decoding arrangement and method for transmission of data over an additive white Gaussian noise channel with average codeword power constraint employs sparse superposition codes. The code words are linear combinations of subsets of vectors from a given dictionary, with the possible messages indexed by the choice of subset. An adaptive successive decoder is shown to be reliable with error probability exponentially small for all rates below the Shannon capacity.

45 Claims, 9 Drawing Sheets

(56) References Cited

U.S. PATENT DOCUMENTS

| | | |
|---|---|---|
| 2004/0086027 A1 * | 5/2004 | Shattil .......................... 375/146 |
| 2007/0248164 A1 | 10/2007 | Zuo et al. |
| 2009/0110033 A1 | 4/2009 | Shattil |
| 2009/0245084 A1 | 10/2009 | Moffatt et al. |
| 2010/0296591 A1 * | 11/2010 | Xu et al. ....................... 375/259 |

* cited by examiner

SPARSE SUPERPOSITION ENCODER AND DECODER FOR COMMUNICATIONS SYSTEM

RELATIONSHIP TO OTHER APPLICATION

This application claims the benefit of the filing date of U.S. Provisional Patent Application Ser. No. 61/332,407 filed May 7, 2010, Conf. No. 1102 (Foreign Filing License Granted) in the names of the same inventors as herein. The disclosure in the identified United States Provisional Patent Application is incorporated herein by reference.

BACKGROUND OF THE INVENTION

1. Field of the Invention

This invention relates generally to data transmission systems, and more particularly, to a system of encoding, transmitting, and decoding data that is fast and reliable, and transmits data at rates near theoretical capacity along a noisy transmission medium.

2. Description of the Prior Art

Historically, in the analog communication era the FCC would allocate a predetermined bandwidth, i.e., frequency band, for transmission of information, illustratively music, over the air as the transmission medium. The signal typically took the form of a sinusoidal carrier wave that was modulated in response to the information. The modulation generally constituted analog modulation, where the amplitude of the carrier signal (AM) was varied in response to the information, or alternatively the frequency of the carrier signal was varied (FM) in response to the information desired to be transmitted. At the receiving end of the transmission, a receiver, typically a radio, consisting primarily of a demodulator, would produce a signal responsive to the amplitude or frequency of the modulated carrier, and eliminate the carrier itself. The received signal was intended to replicate the original information, yet was subjected to the noise of the transmission channel.

During the 1940s, a mathematical analysis was presented that shifted the thinking as to the manner by which information could reliably be transferred. Mathematician Claude Shannon introduced the communications model for coded information in which an encoder is introduced before any modulation and transmission and at the receiver a decoder is introduced after any demodulation. Shannon proved that rather than listening to noisy communication, the decoding end of the transmission could essentially recover the originally intended information, as if the noise were removed, even though the transmitted signal could not easily be distinguished in the presence of the noise. One example of this proof is in modern compact disc players where the music heard is essentially free of noise notwithstanding that the compact disc medium might have scratches or other defects.

In regard of the foregoing, Shannon identified two of the three significant elements associated with reliable communications. The first concerned the probability of error, whereby in an event of sufficient noise corruption, the information cannot be reproduced at the decoder. This established a need for a system wherein as code length increases, the probability of error decreases, preferably exponentially.

The second significant element of noise removal related to the rate of the communication, which is the ratio of the length of the original information to the length in its coded form. Shannon proved mathematically that there is a maximum rate of transmission for any given transmission medium, called the channel capacity C.

The standard model for noise is Gaussian. In the case of Gaussian noise, the maximum rate of the data channel between the encoder and the decoder as determined by Shannon corresponds to the relationship $C=(\frac{1}{2})\log_2(1+P/\sigma^2)$, where $P/\sigma^2$ corresponds to the signal-to-noise ratio (i.e., the ratio of the signal power to the noise power, where power is the average energy per transmitted symbol). Here the value P corresponds to a power constraint. More specifically, there is a constraint on the amount of energy that would be used during transmission of the information.

The third significant element associated with reliable communications is the code complexity, comprising encoder and decoder size (e.g., size of working memory and processors), the encoder and decoder computation time, and the time delay between sequences of source information and decoded information.

To date, no one other than the inventors herein has achieved a computationally feasible, mathematically proven scheme that achieves rates of transmission that are arbitrarily close to the Shannon capacity, while also achieving exponentially small error probability, for an additive noise channel.

Low density parity check (LDPC) codes and so called "turbo" codes were empirically demonstrated (in the 1990s) through simulations to achieve high rate and small error probability for a range of code sizes, that make these ubiquitous for current coded communications devices, but these codes lack demonstration of performance scalability for larger code sizes. It has not been proven mathematically that for rate near capacity, that these codes will achieve the low probabilities of error that will in the future be required of communications systems. An exception is the case of the comparatively simple erasure channel, which is not an additive noise channel.

Polarization codes, a more recent development of the last three years of a class of computationally feasible codes for channels with a finite input set, do achieve any rate below capacity, but the scaling of the error probability is not as effective.

There is therefore a need for a code system for communications that can be mathematically proven as well as empirically demonstrated to achieve the necessary low probabilities of error, high rate, and feasible complexity, for real-valued additive noise channels.

There is additionally a need for a code system that can mathematically be proven to be scalable wherein the probability of error decreases exponentially as the code word length is increased, with an acceptable scaling of complexity, and at rates of transmission that approach the Shannon capacity.

SUMMARY OF THE INVENTION

The foregoing and other deficiencies in the prior art are solved by this invention, which provides, in accordance with a first apparatus aspect thereof, sparse superposition encoder for a structured code for encoding digital information for transmission over a data channel. In accordance with the invention, there is provided a memory for storing a design matrix (also called the dictionary) formed of a plurality of column vectors $X_1, X_2, \ldots, X_N$, each such vector having n coordinates. An input is provided for entering a sequence of input bits $u_1, u_2, \ldots, u_K$ which determine a plurality of coefficients $\beta_1, \ldots, \beta_N$. Each of the coefficients is associated with a respective one of the vectors of the design matrix to form codeword vectors, with selectable real or complex-valued entries. The entries take the form of superpositions $\beta_1 X_1 + \beta_2 X_2 + \ldots + \beta_N X_N$. The sequence of bits $u_1, u_2, \ldots, u_K$ constitute in this embodiment of the invention at least a portion of the digital information.

In one embodiment, the plurality of the coefficients $\beta_j$ have selectably a determined non-zero value, or a zero value. In further embodiments, at least some of the plurality of the coefficients $\beta_j$ have a predetermined value multiplied selectably by +1, or the predetermined value multiplied by −1. In still further embodiments of the invention, at least some of the plurality of the coefficients $\beta_j$ have a zero value, the number non-zero being denoted L and the value B=N/L controlling the extent of sparsity, as will be further described in detail herein.

In a specific illustrative embodiment of the invention, the design matrix that is stored in the memory is partitioned into L sections, each such section having B columns, where L>1. In a further aspect of this embodiment, each of the L sections of size B has B memory positions, one for each column of the dictionary, where B has a value corresponding to a power of 2. The positions are addressed (i.e., selected) by binary strings of length $\log_2(B)$. The input bit string of length K=L $\log_2$ B is, in some embodiments, split into L substrings, wherein for each section the associated substring provides the memory address of which one column is flagged to have a non-zero coefficient. In an advantageous embodiment, only 1 out of the B coefficients in each section is non-zero.

In a further embodiment of the invention, the L sections each has allocated a respective power that determines the squared magnitudes of the non-zero coefficients, denoted $P_1$, $P_2, \ldots, P_L$, i.e., one from each section. In a further embodiment, the respectively allocated powers sum to a total P to achieve a predetermined transmission power. In still further embodiments, the allocated powers are determined in a set of variable power assignments that permit a code rate up to value $C_B$ where, with increasing sparsity B, this value approaches the capacity $C=\frac{1}{2} \log_2(1+P/\sigma^2)$ for the Gaussian noise channel of noise variance $\sigma^2$.

In one embodiment of the invention, the code rate is R=K/n, for an arbitrary R where R<C, for an additive channel of capacity C. In such a case, the partitioned superposition code rate is R=(L log B)/n.

In another embodiment of the invention, there is provided an adder that computes each entry of the codeword as the superposition of the corresponding dictionary elements for which the coefficients are non-zero.

In a still further embodiment of the invention, there are provided n adders for computing the codeword entries as the superposition of selected L columns of the dictionary in parallel. In an advantageous embodiment, before initiating communications, the specified magnitudes are pre-multiplied to the columns of each section of the design matrix X, so that only adders are subsequently required of the encoder processor to form the code-words. Further in accordance with the embodiment of the invention, R/log(B) is arranged to be bounded so that encoder computation time to form the superposition of L columns is not larger than order n, thereby yielding constant computation time per symbol sent.

In another embodiment of the invention, the encoder size complexity is not more than the nBL memory positions to hold the design matrix and the n adders. Moreover, in some embodiments, the value of B is chosen to be not more than a constant multiplied by n, whereupon also L is not more than n divided by a log. In this manner, the encoder size complexity nBL is not more than $n^3$. Also R/log(B) is, in some embodiments, chosen to be small.

In yet another embodiment of the invention, the input to the code arises as the output of a Reed-Solomon outer code of alphabet size B and length L. This serves to maintain an optimal separation, the distance being measured by the fraction of distinct selections of non-zero terms.

In accordance with an advantageous embodiment of the invention, the dictionary is generated by independent standard normal random variables. Preferably, the random variables are provided to a specified predetermined precision. In accordance with some aspects of this embodiment of the invention, the dictionary is generated by independent, equiprobable, +1 or −1, random variables.

In accordance with a second apparatus aspect of the invention, there is provided an adaptive successive decoder for a structured code whereby digital information that has been received over a transmission channel is decoded. There is provided in this embodiment of the invention a memory for storing a design matrix (dictionary) formed of a plurality of vectors $X_1, X_2, \ldots X_N$, each such vector having n coordinates. An input receives the digital information Y from the transmission channel, the digital information having been encoded as a plurality of coefficients $\beta_1 \ldots \beta_N$, each of the coefficients being associated with a respective one of the vectors of the design matrix to form codeword vectors in the form of superpositions $\beta_1 X_1 + \beta_2 X_2 + \ldots + \beta_N X_N$. The superpositions have been distorted during transmission to the form Y. In addition, there is provided a first inner product processor for computing inner products of Y with each of the plurality of vectors $X_1$, $X_2, \ldots X_N$, stored in the memory to determine which of the inner products has a value above a predetermined threshold value.

In one embodiment of this second apparatus aspect of the invention the first inner product processor performs a plurality of first inner products in parallel.

As a result of data transmission over a noisy channel, the resulting distortion of the superpositions is responsive to an additive noise vector $\xi$, having a distribution $N(0,\sigma^2 I)$.

In a further embodiment of the invention, there is additionally provided a processor of adders for superimposing the columns of the design matrix that have inner product values above the predetermined threshold value. The columns are flagged and the superposition of flagged columns are termed the "fit." In the practice of this second aspect of the invention, the fit is subtracted from Y leaving a residual vector r. A further inner product processor, in some embodiments, receives the residual vector r and computes selected inner products of the residual r with each of the plurality of vectors $X_1, X_2, \ldots X_N$, not previously flagged, for determining which of these columns to flag as having therein an inner product value above the predetermined threshold value.

In an advantageous embodiment of the invention, upon receipt of the residual vector r by the further inner product processor, a new Y vector is entered into the input so as to for achieve simultaneous pipelined inner product processing.

In a further embodiment of the invention, there are additionally provided k−2 further inner product processors arranged to operate sequentially with one another and with the first and further inner product processors. The additional k−2 inner product processors compute selected inner products of respectively associated ones of residuals with each of the plurality of vectors $X_1, X_2, \ldots X_N$, not previously flagged, to determine which of these columns to flag as having there an inner product value above the predetermined threshold value. In accordance with some embodiments, the k inner product processors are configured as a computational pipeline to perform simultaneously their respective inner products of residuals associated with a sequence of corresponding received Y vectors.

In a still further embodiment, in each of the inner product processors there are further provided N accumulators, each associated with a respective column of the design matrix memory to enable parallel processes. In another embodiment, each of the inner product processors is further provided with N multipliers, each of which is associated with a respective column of the design matrix, for effecting parallel processing.

In yet another embodiment, there are further provided a plurality of comparators for comparing respective ones of the inner products with a predetermined threshold value. The plurality of comparators, in some embodiments, store a flag responsive to the comparison of the inner products with the predetermined threshold value.

In accordance with a specific illustrative embodiment of the invention, there is provided a processor for computing superposition of fit components from the flagged columns of the design matrix. In a further embodiment, there are provided k−1 inner product processors, each of which computes, in succession, the inner product of each column that has not previously been flagged, with a linear combination of Y and of previous fit components.

In a still further embodiment of the invention, there is provided a processor by which the received Y and the fit components are successively orthogonalized.

The linear combination of Y and of previous fit components is, in one embodiment, formed with weights responsive to observed fractions of previously flagged terms. In a further embodiment, the linear combination of Y and of previous fit components is formed with weights responsive to expected fractions of previously flagged terms. In a highly advantageous embodiment of the invention, the expected fractions of flagged terms are determined by an update function processor.

The expected fractions of flagged terms are pre-computed, in some embodiments, before communication, and are stored in a memory of the decoder for its use.

The update function processor determines $g_L(x)$ which evaluates the conditional expected total fraction of flagged terms on a step if the fraction on the previous step is x. The fraction of flagged terms is, in some embodiments of the invention, weighted by the power allocation divided by the total power. In further embodiments of the invention, the update function processor determines $g_L(x)$ as a linear combination of probabilities of events of inner product above threshold.

In accordance with a further embodiment of the invention, the dictionary is partitioned whereby each column has a distinct memory position and the sequence of binary addresses of flagged memory positions forms the decoded bit string. In one embodiment, the occurrence of more than one flagged memory position in a section or no flagged memory positions in a section is denoted as an erasure, and one incorrect flagged position in a section is denoted as an error. In a still further embodiment, the output is provided to an outer Reed-Solomon code that completes the correction of any remaining small fraction of section mistakes.

In accordance with a third apparatus aspect of the invention, there is provided a performance-scalable structured code system for transferring data over a data channel having code rate capacity of C. The system is provided with an encoder for specified system parameters of input-length K and code-length n. The encoder is provided with a memory for storing a design matrix formed of a plurality of vectors $X_1, X_2, \ldots X_N$, each such vector having n coordinates. Additionally, the encoder has an input for entering a plurality of bits bits $u_1$, $u_2, \ldots, u_K$ that determine a plurality of coefficients $\beta_1, \ldots, \beta_N$. Each of the coefficients is associated with a respective one of the vectors of the design matrix to form codeword vectors in the form of superpositions $\beta_1 X_1 + \beta_2 X_2 + \ldots + \beta_N X_N$. There is additionally provided on the encoder an output for delivering the codeword vectors to the transmission channel. In addition to the foregoing, there is provided a decoder having an input for receiving the superpositions $\beta_1 X_1 + \beta_2 X_2 + \ldots + \beta_N X_N$, the superpositions having been distorted during transmission to the form Y. The decoder is further provided with a first inner product processor for computing inner products of Y with each of the plurality of vectors $X_1, X_2, \ldots, X_N$, stored in the memory to determine which of the inner products has a value above a predetermined threshold value.

In one embodiment of this third apparatus aspect of the invention, the encoder and decoder adapt a choice of system parameters to produce a smallest error probability for a specified code rate and an available code complexity.

In a further embodiment, in response to the code-length n, the choice of system parameters has exponentially small error probability and a code complexity scale not more than $n^3$ for any code rate R less than the capacity C for the Gaussian additive noise channel.

In an advantageous embodiment of the invention, there is provided a performance-scale processor for setting of systems parameters K and n. The performance-scale processor is responsive to specification of the power available to the encoder of the channel. In other embodiments, the performance-scale processor is responsive to specification of noise characteristics of the channel. In still further embodiments, the performance-scale processor is responsive to a target error probability. In yet other embodiments, the performance-scale processor is responsive to specification of a target decoder complexity. In still other embodiments, the performance-scale processor is responsive to specification of a rate R, being any specified value less than C.

In some embodiments of the invention the performance-scale processor sets values of L and B for partitioning of the design matrix. In respective other embodiments, the performance-scale processor:

sets values of power allocation to each non-zero coefficient;
sets values of threshold of inner product test statistics; and
sets a value of the maximum number of steps of the decoder.

In an advantageous embodiment, the decoder includes multiple inner product processors operating in succession to provide steps of selection of columns of the fit. The performance-scale processor performs successive evaluations of an update function $g_L(x)$ specifying an expected total fraction of correctly flagged terms on a step if the total fraction on the previous step were equal to the value x.

In further embodiments, the fraction of flagged terms is weighted by the power allocation divided by the total power. The update function processor in some embodiments, determines $g_L(x)$ as a linear combination of probabilities determined for events of an inner product above threshold. The system parameters are, in some embodiments, optimized by examination of a sequence of system parameters and performing successive evaluations of the update function for each.

In the practice of some embodiments of the invention, the encoder is a sparse superposition encoder. The decoder is in some embodiments an adaptive successive decoder. An outer Reed-Solomon encoder is, in some embodiments, matched to the inner sparse superposition encoder. In other embodiments, the outer Reed-Solomon decoder is matched to the adaptive successive decoder.

In a specific illustrative embodiment of the invention, the encoder is a sparse partitioned superposition encoder, and the decoder is an adaptive successive decoder, with parameter values set at those demonstrated to produce exponentially small probability of more than a small specified fraction of mistakes, with exponent responsive to $C_B$–R. The decoder has a hardware implemented size-complexity not more than a constant times $n^2$ B, a constant time-complexity rate, a delay not more than a constant times log(B), and a code rate R up to a value $C_B$ of quantified approach to the Channel Capacity C of the Gaussian noise channel as the values of n and B are scaled to account for increasing density and the extent of computer memory and processors.

Further in accordance with this embodiment, the inner-code sparse superposition encoder and decoder having the characteristics herein above set forth are matched to an outer Reed-Solomon encoder and decoder, respectively, whereby mistakes are corrected, except in an event of an exponentially small probability.

In accordance with a method aspect of the invention there is provided a method of decoding data, the method including the steps of:

computing an inner products of a received signal Y with each column of a X stored in a design matrix;

identifying ones of the inner products that exceed a predetermined threshold value;

forming an initial fit fit$_1$; and, then in succession for k>1, computing inner products of residuals Y–fit$_{k-1}$, with each column of X;

identifying columns for which the inner product exceeds a predetermined threshold value;

adding those columns for which the inner product exceeds the predetermined threshold value to the fit fit$_{k-1}$; and selectably terminating computing of inner products of residuals when k is a specific multiple of log B or when no inner products of residuals exceed a predetermined threshold value.

In one embodiment of this method aspect of the invention, there are provided the further steps of:

subtracting a sum of the identified products that exceed a predetermined threshold value from Y to form a residual r; and computing an inner products of the residual r with each column of a X stored in the design matrix.

In a further embodiment, there are further provided the steps of:

repeating the steps of subtracting a sum of the identified products that exceed a predetermined threshold value from Y to form a residual r and computing an inner products of the residual r with each column of a X stored in the design matrix; and selectably terminating computing of inner products of residuals when k is a specific multiple of log B or when no inner products of residuals exceed a predetermined threshold value.

BRIEF DESCRIPTION OF THE DRAWING

Comprehension of the invention is facilitated by reading the following detailed description, in conjunction with the annexed drawing, in which.

DETAILED DESCRIPTION

Glossary of Terms

Figure 1:
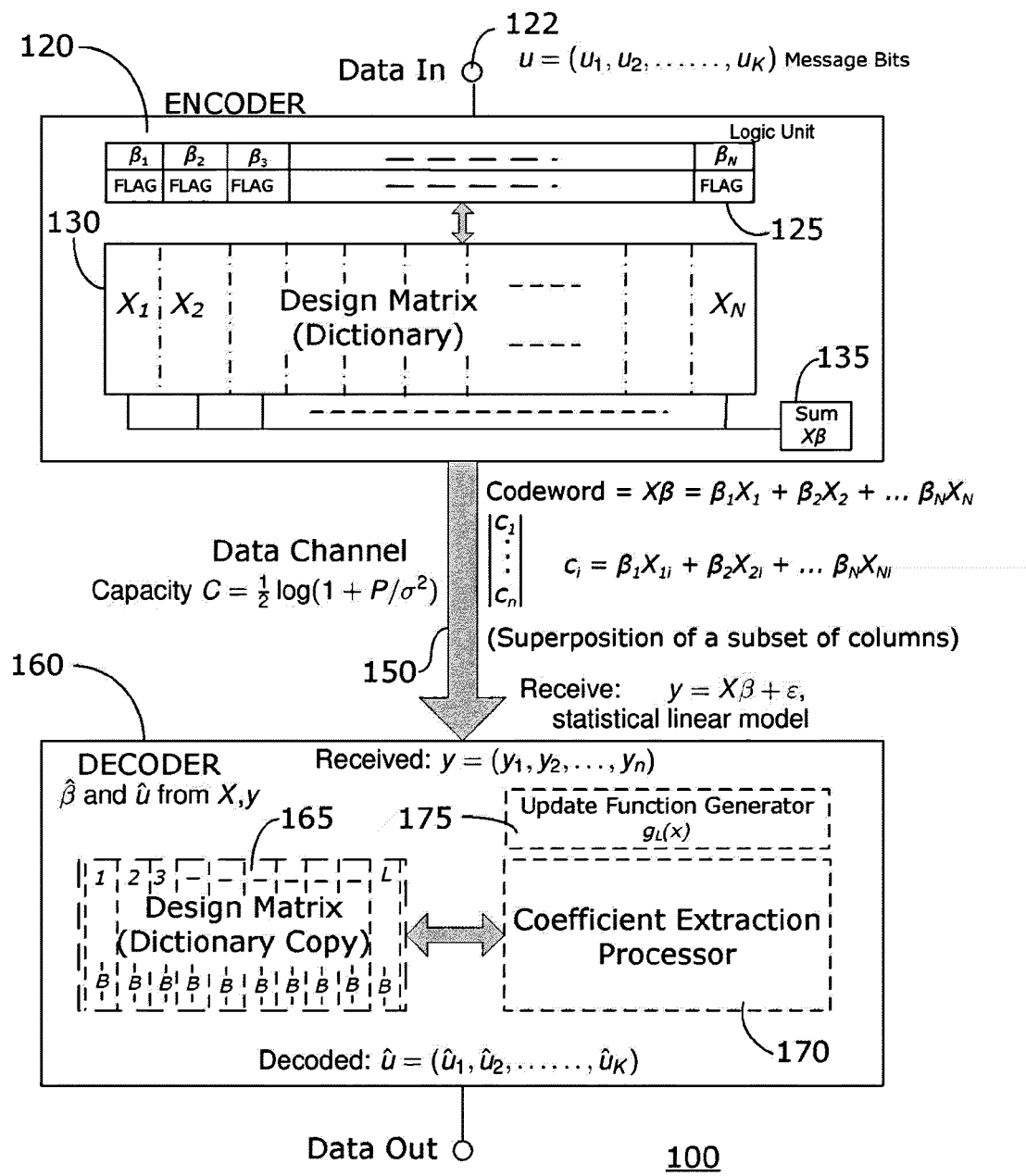
FIG. 1 is a simplified schematic representation of an encoder constructed in accordance with the principles of the invention arranged to deliver data encoded as coefficients multiplied by values stored in a design matrix to a data channel having a predetermined maximum transmission capacity, the encoded data being delivered to a decoder that contains a local copy of a design matrix and a coefficient extraction processor, the decoder being constructed in accordance with the principles of the invention.

Adaptive Successive Decoder: An iterative decoder for a partitioned superposition code with hardware design in which an overlapping sequence of sections is tested each step to see which have suitable test statistics above threshold, and flags these to correspond with decoded message segments. The invention here-in determines that an adaptive successive decoder is mistake rate scalable for all code rates $R<C_B$ for the Gaussian channel, with size complexity $n^2B$, delay snr log B, constant time complexity rate, and a specified sequence $C_B$ that approach the capacity C with increasing B. Thereby when composed with a suitable outer code it is performance scalable with exponentially small error probability and specified control of complexity. [See also: Partitioned Superposition Code, Fixed Successive Decoder, Code-Rate, Complexity, Mistake Rate Scalability, Performance Scalability.]

Additive Noise Channel: A channel specification of the form $Y=c+\xi$ where c is the codeword, $\xi$ is the noise vector, and Y is the vector of n received values. Such a discrete-time model arises from consideration of several steps of the communication system (modulator, transmitter, transmission channel, demodulator and filter) as one code channel for the purpose of focus on issues of coding. It is called a White Additive Noise Channel if the successive values of the resulting noise vector are uncorrelated (wherein the purpose of the filter, a so-called whitening filter, is to produce a successive removal of any such correlation in the original noise of the transmission channel). A channel in which the transmitted signal is attenuated (faded) by a determined amount is converted to an additive noise channel by a rescaling of the magnitude of the received sequence.

Block Error (also called "error"): The event that the decoded message of length K is not equal to the encoded message string. Associate with it is the block error probability.

Channel Capacity C (also called Shannon Capacity): For any channel it is the supremum (least upper bound) of code rates R at which the message is decoded, where for any positive error probability there is a sufficiently complex encoder/decoder pair that has code rate R and error probability as specified. By Shannon theory it is explicitly expressed via specification of signal power and channel characteristics. [See, also "Channel Code System," "Code Rate," and "Error Probability"]

Channel Code System: A distillation of the ingredients of the parts of a communication system that focus on the operation and performance of the pathway in succession starting with the message bit sequence, including the channel encoder, the channel mapping the sequence of values to be sent to the values received at each recipient, the channel decoder (one for each recipient), and the decoded message bit sequence (one at each recipient), the purpose of which is to avoid the mistakes that would result from transmission without coding, and the cost of which will be expressed in coding complexity and in limitations on code rate [See also: "Communication System"].

Channel Decoder (also called the "decoder"): A device for converting n received values (the received vector Y) into a string of K bits, the decoded message.

Channel Encoder (also called the "encoder"): A device for converting a K bit message into a string of n values (the codeword) to be sent across a channel, the values being of a form (binary or real or complex) as is suited to the use of the channel. The value n is called the code-length or block-length of the code.

Code Complexity (also called "computational complexity"): Encompasses size complexity, time complexity, and delay. Specific to a hardware instantiation, the size complexity is the sum of the number of fixed memory locations, the number of additional memory locations for workspace of the decoding algorithm, and the number of elementary processors (e.g. multiplier/accumulators, adders, comparators, memory address selectors) that may act in parallel in encoding and decoding operation. With reference to the decoder, the time complexity (or time complexity rate) is the number of elementary operations performed per pipelined received string Y divided by the length of the string n. Time complexity of the encoder is defined analogously. With reference to the decoder, the delay is defined as the count of the number of indices between the flow of received strings Y and the flow of decoded strings concurrently produced.

Code Rate: The ratio $R=K/n$ of the number of message bits to the number of values to be sent across a channel.

Communication System: A system for electronic transfer of source data (voice, music, data bases, financial data, images, movies, text, computer files for radio, telephone, television, internet) through a medium (wires, cables, or electromagnetic radiation) to a destination, consisting of the sequence of actions of the following devices: a source compression (source encoder) providing a binary sequence rendering of the source (called the message bit sequence); a channel encoder providing a sequence of values for transmission, a modulator, a transmitter, a transmission channel, and, for each recipient, a receiver, a filter, a demodulator, a channel decoder, and a source decoder, the outcome of which is a desirably precise rendering of the original source data by each recipient.

Computational Complexity: See, "Code Complexity."

Decoder: (See, "Channel Decoder")

Design Matrix (or "Dictionary"): An n by N matrix X of values known to the encoder and decoder. In the context of coding these matrices arise by strategies called superposition codes in which the codewords are linear combinations of the columns of X, in which case power requirements of the code are maintained by restrictions on the scale of the norms of these columns and their linear combinations.

Dictionary: See, "Design Matrix."

Encoder Term Specification: Each partitioned message segment of length log(B) gives the memory position at which it is flagged that a column is selected (equivalently it is a flagged entry indicating a non-zero coefficient).

(Fixed) Successive Decoder: An iterative decoder for a partitioned superposition code in which it is pre-specified what sequence of sections is to be decoded. Fixed successive decoders that have exponentially small error probability at rates up to capacity unfortunately have exponentially large complexity.

Fraction of Section Mistakes (also called "section error rate"): The proportion of the sections of a message string that are in error. For partitioned superposition codes with adaptive successive decoder, by the invention herein, the mistake rate is likely not more than a target mistake rate which is an expression inversely proportional to $s=\log_2(B)$.

Gaussian Channel: An additive noise channel in which the distribution of the noise is a mean zero normal (Gaussian) with the specified variance $\sigma^2$. Assumed to be whitened, it is an Additive White Gaussian Noise Channel (AWGN). The Shannon Capacity of this channel is $C=\frac{1}{2}\log_2(1+P/\sigma^2)$.

Iterative Decoder: In the context of superposition codes an iterative decoder is one in which there are multiple steps, where for each step there is a processor that takes the results of previous steps and updates the determination of terms of the linear combination that provided the codeword.

Message Sections: A partition of a length K message string into L sections of length s each of which conveys a choice of $B=2^s$, with which $K=Ls$. Typical values of are between about 8 and about 20, though no restriction is made. Also typical is for B and L to be comparable in value, and so to is the codelength n, via the rate relationship $nR=K=L \log_2(B)$. That is, the number L of sections matches the codelength n to within a logarithmic factor.

Message Strings: The result of breaking a potentially unending sequence of bits into successive blocks of length denoted as K bits, called the sequence of messages. Typical values of K range from several hundred to several tens of thousands, though no restriction is made.

Noise Variance $\sigma^2$: The expected squared magnitude of the components of the noise vector in an Additive White Noise Channel.

Outer Code for Inner Code Mistake Correction: A code system in which an outer code such as a Reed-Solomon code is concatenated (composed) with another code (which then becomes the inner code) for the purpose of correction of the small fraction of mistakes made by the inner code. Such a composition converts a code with specified mistake-rate scaling into a code with exponentially small error probability, with slight overall code rate reduction by an amount determined by the target mistake rate [See, also "Fraction of Section Mistakes," and "Scaling of Section Mistakes"].

Performance Scalable Codes: A performance scalable code system (as first achieved for additive noise channels by the invention here-in) is a structured code system in which for any code rate R less than channel capacity the codes have scalable error probability with an exponent E depending on C−R and scalable complexity with space complexity not more than a specific constant times $n^3$, delay not more than a constant times log n, and time complexity rate not more than a constant, where the constants depend only on the power requirement and the channel specification (e.g., through the signal to noise ratio snr=$P/\sigma^2$). [See, also "Structured Code System," "Scaling of Error Probability," and "Scaling of Code Complexity"]

Partitioned Superposition Code: A sparse superposition code in which the N columns of the matrix X are partitioned into L sections of size B, with at most one column selected in each section. It is a structured code system, because a size (n',L') code is nested in a larger size (n,L) code by restricting to the use of the first L'<L sections and the first n'<n sections in both encoding and decoding. [See, also "Sparse Superposition Code" and "Structured Code System"]

Scaling of Code Complexity: For a specified sequence of code systems with specific hardware instantiation, the scaling of complexity is the expression of the size complexity, time complexity, and delay as typically non-decreasing functions of the code-length n. In formal computer science, feasibility is associated with there being a finite power of n that bounds these expressions of complexity. For communication industry purposes, implementation has more exacting requirements. The space complexity may coincide with expressions bounded b $n^2$ or $n^3$ but certainly not $n^5$ or greater. Refined space complexity expressions arise with specific codes in which there can be dependence on products of other measures of size (e.g., n, L and B for dictionary based codes invented herein). The time complexity rate needs to be constant to prevent computation from interfering with communication rate in the setting of a continuing sequence of received Y vectors. It is not known what are the best possible expressions for delay, it may be necessary to permit it to grow slowly with n, e.g., logarithmically, as is the case for the designs herein. [See, also "Code Complexity"]

Scaling of Error Probability: For a sequence of code systems of code-length n, an exponential error probability (also called exponentially small error probability or geometrically small error probability) is a probability of error not more than value of the form $10^{-nE}$, with a positive exponent E that conveys the rate of change of log probability with increasing code-length n. Probabilities bounded by values of the form $n^w 10^{-nE}$ are also said to be exponentially small, where w and E depend on characteristics of the code and the channel. When a sequence of code systems has error probability governed by an expression of the form $10^{-LE}$ indexed by a related parameter (such as the number of message sections L), that agrees with n to within a log factor, we still say that the error probability is exponentially small (or more specifically it is exponentially small in L). By Shannon theory, the exponent E can be positive only for code rates R<C.

Scaling of Section Mistake Rates: A code system with message sections is said to be mistake rate scalable if there is a decreasing sequence of target mistake rates approaching 0, said target mistake rate depending on s=log(B), such that the probability with which the mistake rate is greater than the target is exponentially small in L/s with exponent positive for any code rates $R<C_B$ where $C_B$ approaches the capacity C.

Section Error (also called a "section mistake"): When the message string is partitioned into sections (sub-blocks), a section error is the event that the corresponding portion of the decoded message is not equal to that portion of the message.

Section Error Rate: See, "Fraction of Section Mistakes."

Section Mistake: See, "Section Error."

Shannon Capacity: See, "Channel Capacity."

Signal Power: A constraint on the transmission power of a communication system that translates to the average squared magnitude P of the sequence of n real or complex values to be sent.

Sparse Superposition Code: A code in which there is a design matrix for which codewords are linear combinations of not more than a specified number L of columns of X. The message is specified by the selection of columns (or equivalently by the selection of which coefficients of the linear combination are non-zero).

Structured Code System: A set of code systems, one for each block-length n, in which there is a nesting of ingredients of the encoder and decoder design of smaller block-lengths as specializations of the designs for larger block-lengths.

DESCRIPTION OF SPECIFIC ILLUSTRATIVE EMBODIMENTS OF THE INVENTION

FIG. 1 is a simplified schematic representation of a transmission system 100 having an encoder 120 constructed in accordance with the principles of the invention arranged to deliver data encoded as coefficients multiplied by values stored in a design matrix to a data channel 150 having a predetermined maximum transmission capacity, the encoded data being delivered to a decoder 160 that contains a local copy of the design matrix 165 and a coefficient extraction processor 170.

Encoder 120 contains in this specific illustrative embodiment of the invention a logic unit 125 that receives message bits $u=(u_1, u_2, \ldots u_K)$ and maps these into a sequence of flags (one for each column of the dictionary), wherein a flag=1 specifies that column is to be included in the linear combination (with non-zero coefficient) and flag=0 specifies that column is excluded (i.e., is assigned a zero coefficient value).

In the specific embodiment of partitioned superposition codes, in each section of the partition there is only one out of B column selected to have flag=1. In this embodiment, the action of logic unit 125 is to parse the message bit stream into segments each having $\log_2(B)$ bits, said bit stream segments specifying (selecting, flagging) the memory address of the one chosen column in the corresponding section of a design matrix 130, said selected column to be included in the superposition with a non-zero coefficient value, whereas all non-selected columns are not included in the superposition (i.e., have a zero coefficient value and a flag value set to 0).

It is a highly advantageous aspect of the present invention that those who would design a communications system in accordance with the principles of the present invention are able to use any size of design matrix. More specifically, as the size of the design matrix is increased, the size of the input stream K=L log(B) and the codelength n are increased (wherein the ratio is held fixed at code rate R=K/n), said increase in K and n resulting in an exponentially decreasing probability of decoding error, as will be described in detail in a later section of this disclosure. Such adaptability of the present communications system enables the system to be tailored to the quality of the receiving device or to the error requirements of the particular application.

Design matrix 130 is in the form of a memory that contains random values X (not shown). In this embodiment of the invention, a succession of flags of columns for linear combination, as noted above, are received by the design matrix from logic unit 125, wherein columns with flag=1 are included in the linear combination (with non-zero coefficient value) and columns with flag=0 are excluded from the linear combination (zero coefficient value). The information that is desired to be transmitted, i.e., the message, is thereby contained in the choice of the subset included with non-zero coefficients. Each coefficient is combined with a respectively associated one of the columns of X contained in design matrix 130, and said columns are superimposed thus forming a code word $X\beta=\beta_1 X_1+\beta_2 X_2+\ldots \beta_N X_N$. Thus, the data that is delivered to data channel 150 comprises a sequence of linear combinations of the selected columns of the design matrix X Data channel 150 is any channel that takes real or complex inputs and produces real or complex received values, subjected to noise, said data channel encompassing several parts of a standard communication system (e.g., the modulator, transmitter, transmission channel, receiver, filter, demodulator), said channel having a Shannon capacity, as herein above described. Moreover, it is an additive noise channel in which the noise may be characterized as having a Gaussian distribution. Thus, a code word $X\beta$ is issued by encoder 120, propagated along noisy data channel 150, and the resulting vector Y is received at decoder 160, where Y is the sum of the code word plus the noise, i.e., $Y=X\beta+\xi$, where $\xi$ is the noise vector.

Decoder 160, in this simplistic specific illustrative embodiment of the invention, receives Y and subjects it to a decoding process directed toward the identification and extraction of the coefficients $\beta_j$. More specifically, a coefficient extraction processor 170, which ideally would approximate the functionality of a theoretically optimal least squares decoder processor, would achieve the stochastically smallest distribution of mistakes. A comparison of the present practical decoder to the theoretically optimum least squares decoder of the sparse superposition codes is set forth in a subsequent section of this disclosure.

In addition to the foregoing, decoder 160 is, in an advantageous embodiment of the invention, provided with an update function generator 175 that is useful to determine an update function $g_L(x)$ that identifies the likely performance of iterative decoding steps. In accordance with this aspect of the invention, the update function $g_L(x)$ is responsive to signal power allocation. In a further embodiment of the invention, update function $g_L(x)$ is responsive to the size B and the number L of columns of the design matrix. In a still further embodiment, the update function is responsive to a rate characteristic R of data transmission and to a signal-to-noise ratio ("snr") characteristic of the data transmission. Specific characteristics of update function $g_L(x)$ are described in greater detail below in relation to FIGS. 4-6.

Figure 2:
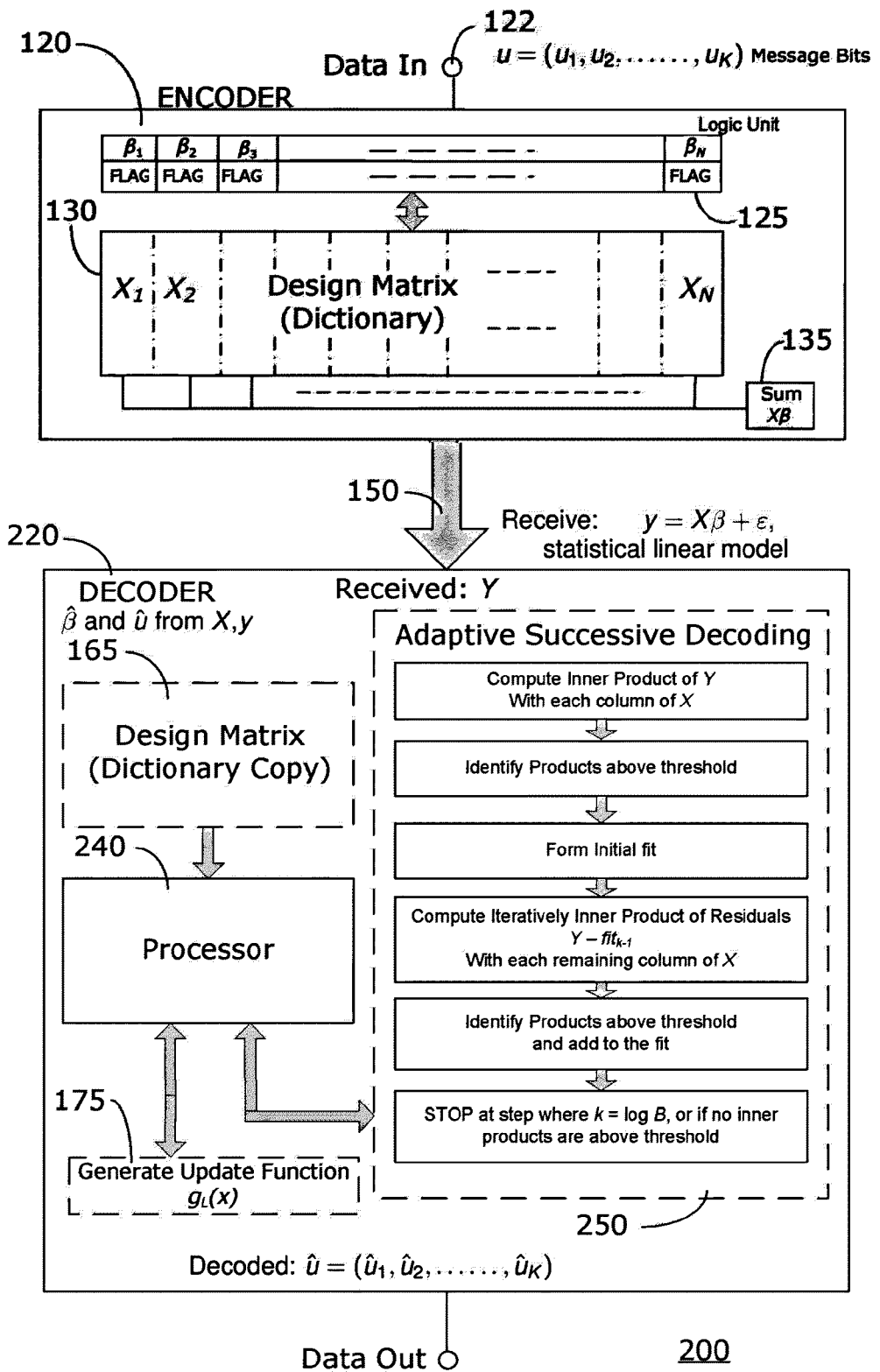
FIG. 2 is a simplified schematic representation of an encoder constructed in accordance with the principles of the invention arranged to deliver data encoded as coefficients multiplied by values stored in a design matrix to a data channel having a predetermined maximum transmission capacity, the encoded data being delivered to a decoder that contains a local copy of a design matrix and an adaptive successive decoding processor, the decoder being constructed in accordance with the principles of the invention.

FIG. 2 is a simplified schematic representation of a transmission system 200 constructed in accordance with the principles of the invention. Elements of structure or methodology that have previously been discussed are similarly designated. Transmission system 200 is provided with encoder 120 arranged to deliver data encoded as coefficients multiplied by values stored in a design matrix to a data channel 150 having a predetermined maximum transmission capacity, as described above.

The encoded data is delivered to a decoder 220 that contains a local copy of a design matrix 165 and a control processor 240 that functions in accordance with the steps set forth in function block 250, denominated "adaptive successive decoding." Local design matrix 165 is substantially identical to encoder design matrix 130. As shown in this figure, adaptive successive decoding at function block 250 includes the steps of:

Computing inner products of Y with respectively associated columns of X from local design matrix 230;

Identifying ones of the inner products that exceed a predetermined threshold value;

Forming an initial fit;

Computing iteratively inner products of residuals $Y-\text{fit}_{k-1}$ with each remaining column of X;

Identifying the columns for which the inner products exceed a predetermined threshold value and adding them to the fit; and Stopping the process at a step where k is a specific multiple of log B, or when no inner products exceed the threshold.

Figure 3:
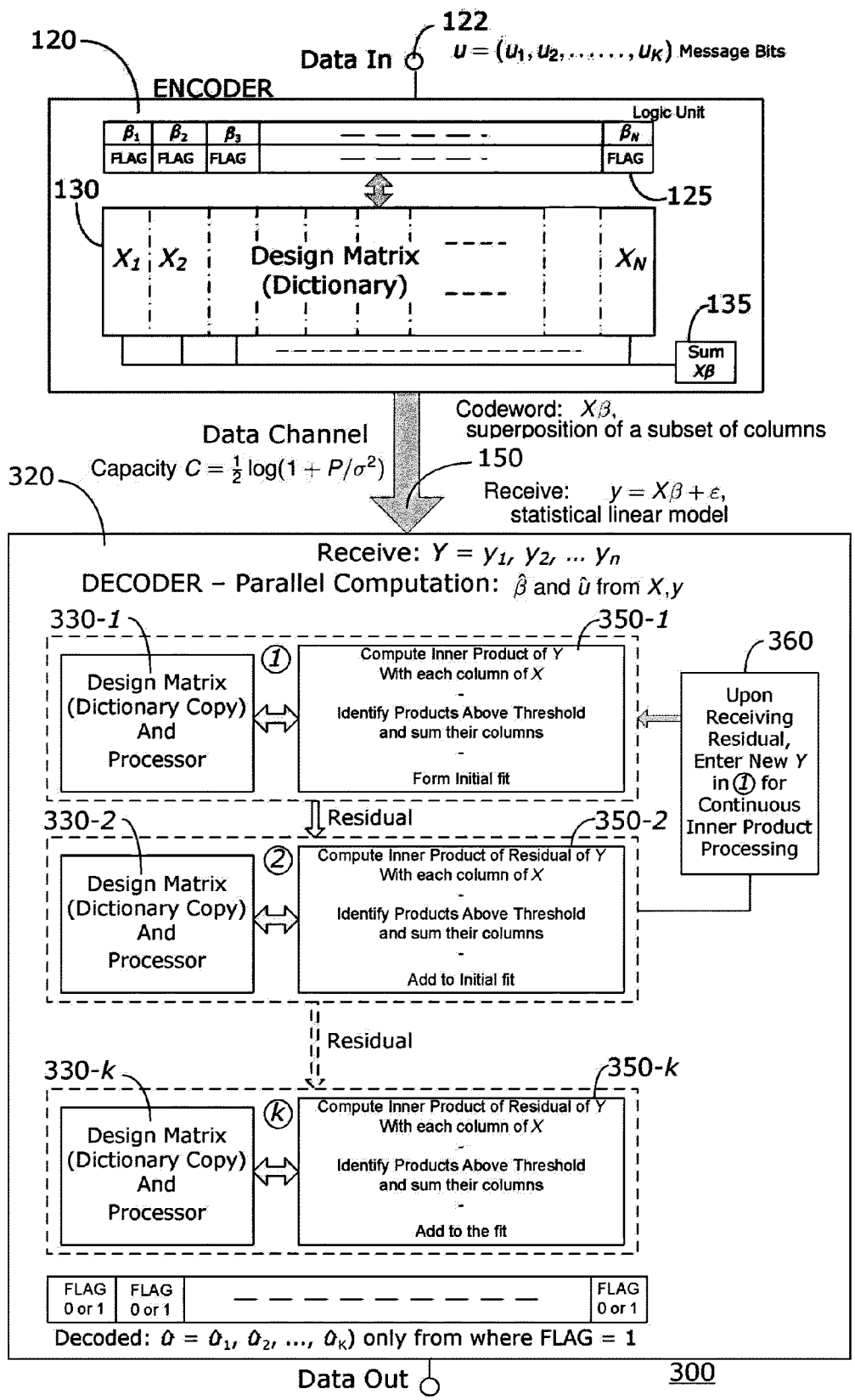
FIG. 3 is a simplified schematic representation of an encoder constructed in accordance with the principles of the invention arranged to deliver data encoded as coefficients multiplied by values stored in a design matrix to a data channel having a predetermined maximum transmission capacity, the encoded data being delivered to a decoder that contains a plurality of local copies of a design matrix, each associated with a sequential pipelined decoding processor constructed in accordance with the principles of the invention that achieves continuous data decoding.

FIG. 3 is a simplified schematic representation of a transmission system 300 constructed in accordance with the principles of the invention. Elements of structure that have previously been discussed are similarly designated. As previously noted, an encoder 120 delivers data encoded in the form of a string of flags specifying a selection of a set of non-zero coefficients, as hereinabove described, which linearly combine columns of X stored in a design matrix 125, to data channel 150 that, as noted, has a predetermined maximum capacity. The encoded data is delivered to a decoder system 320 that contains a plurality of local copies of a design matrix, each associated with a sequential decoding processor, the combination of local design matrix and processor being designated 330-1, 330-2, to 330-k. Decoder system 320 is constructed in accordance with the principles of the invention to achieve continuous data decoding.

In operation, a vector Y corresponding to a received signal is comprised of an original codeword $X\beta$ plus a noise vector $\xi$. Noise vector $\xi$ derives from data channel 150, and therefore $Y=X\beta+\xi$. Noise vector $\xi$ may have a Gaussian distribution. Vector Y is delivered to the processor in 350-1 where its inner product is computed with each column of X in associated local design matrix 330-1. As set forth in the steps in function block 350-1, each inner product then is compared to a predetermined threshold value, and if it exceeds the threshold, it is flagged and the associated column are superimposed in a fit. The fit is then subtracted from Y, leaving a residual that is delivered to processor 330-2.

Upon delivery of the residual to processor 330-2, a process step 360 causes a new value of Y to be delivered from data channel 150 to processor 330-1. Thus, the processors are continuously active computing residuals.

Processor 330-2 computes the inner product of the residual it received from processor 330-1, in accordance with the process of function block 350-2. This is effected by computing the inner product of the residual with not already flagged column of X in the local design matrix associated with processor 330-2. Each of these inner products then is compared to a predetermined threshold value, and if it exceeds the threshold, each such associated column is flagged and added to the fit. The fit is then subtracted from the residual, leaving a further residual that is delivered to the processor 330-3 (not shown). The process terminates when no columns of X have inner product with the residual exceeding the threshold value, or when processing has been completed by processor 330-$k$. At which point the sequence of addresses of the columns flagged as having inner product above threshold provide the decoded message.

1. Introduction

For the additive white Gaussian noise channel with average codeword power constraint, sparse superposition codes are developed, in which the encoding and decoding are computationally feasible, and the communication is reliable. The codewords are linear combinations of subsets of vectors from a given dictionary, with the possible messages indexed by the choice of subset. An adaptive successive decoder is developed, with which communication is demonstrated to be reliable with error probability exponentially small for all rates below the Shannon capacity.

The additive white Gaussian noise channel is basic to Shannon theory and underlies practical communication models. Sparse superposition codes for this channel are introduced and analyzed and fast encoders and decoders are here invented for which error probability is demonstrated to be exponentially small for any rate below the capacity. The strategy and its analysis merges modern perspectives on statistical regression, model selection and information theory.

The development here provides the first demonstration of practical encoders and decoders, indexed by the size n of the code, with which the communication is reliable for any rate below capacity, with error probability demonstrated to be exponentially small in n and the computational resources required, specified by the number of memory positions and the number of simple processors, is demonstrated to be a low order power of n, and the processor computation time is demonstrated to be a constant per received symbol.

Performance-scalability is used to refer succinctly to the indicated manner in which the error probability, the code rate, and the computational complexity together scale with the size n of the code.

Such a favorable scalability property is essential to know for a code system, such that if it is performing at given code size how the performance will thereafter scale (for instance in improved error probability for a given fraction of capacity if code size is doubled) to suitably take advantage of increased computational capability (increased computer memory and processors) sufficient to accommodate the increased code size.

A summary of this work appeared in (Barron and Joseph, 'Toward fast reliable communication at rates near capacity with Gaussian noise', *IEEE Intern. Symp. Inform. Theory*, June 2010), after the date of first discloser, and thereafter an extensive manuscript has been made publicly available (Barron and Joseph, 'Sparse Superposition Codes: Fast and Reliable at Rates Approaching Capacity with Gaussian Noise', www.stat.yale.edu/~arb4 publications), upon which the present patent manuscript is based. Companion work by the inventors (Barron and Joseph, 'Least squares superposition coding of moderate dictionary size, reliable at rates up to channel capacity' *IEEE Intern. Syrup. Inform. Theory*, June 2010) has theory for the optimal least squares decoder again with exponentially small error probability for any rate below capacity, though that companion work, like all previous theoretical capacity-achieving schemes is lacking in practical decodability. In both treatments (that given here for practical decoding and that given for impractical optimal least squares decoding) the exponent of the error is shown to depend on the difference between the capacity and the rate. Here for the practical decoder the size of the smallest gap from capacity is quantified in terms of design parameters of the code thereby allowing demonstration of rate approaching capacity as one adjusts these design parameters.

In the familiar communication set-up, an encoder is to map input bit strings $u=(u_1, u_2, \ldots, u_K)$ of length K into codewords which are length n strings of real numbers $c_1, c_2, \ldots, c_n$ of norm expressed via the power $(1/n)\Sigma_{i=1}^{n} c_i^2$. The average of the power across the $2^K$ codewords is to be not more than P. The channel adds independent $N(0, \sigma^2)$ noise to the codeword yielding a received length n string Y. A decoder is to map it into an estimate û desired to be a correct decoding of u. Block error is the event û≠u. When the input string is partitioned into sections, the section error rate is the fraction of sections not correctly decoded. The reliability requirement is that, with sufficiently large n, the section error rate is small with high probability or, more stringently, the block error probability is small, averaged over input strings a as well as the distribution of Y. The communication rate R=K/n is the ratio of the number of message bits to the number of uses of the channel required to communicate them.

The supremum of reliable rates of communication is the channel capacity given by $C=(½)\log_2(1+P/\sigma^2)$, by traditional Shannon information theory. For practical coding the challenge is to achieve arbitrary rates below the capacity, while guaranteeing reliable decoding in manageable computation time.

In a communication system operating at rate R, the input bit strings arise from input sequences $u_1, u_2, \ldots$ cut into successive K bit strings, each of which is encoded and sent, leading to a succession of received length n strings Y. The reliability aim that the block error probability be exponentially small is such that errors are unlikely over long time spans. The computational aim is that coding and decoding computations proceed on the fly, rapidly, with the decoder having not too many pipelined computational units, so that there is only moderate delay in the system.

The development here is specific to the discrete-time channel for which $Y_i = c_i + \epsilon_i$ for i=1, 2, . . . , n with real-valued inputs and outputs and with independent Gaussian noise. Standard communication models, even in continuous-time, have been reduced to this discrete-time white Gaussian noise setting, or to parallel uses of such, when there is a frequency band constraint for signal modulation and when there is a specified spectrum of noise over that frequency band. Solution to the coding problem, when married to appropriate modulation schemes, is regarded as relevant to myriad settings involving transmission over wires or cables for internet, television, or telephone communications or in wireless radio, TV, phone, satellite or other space communications.

Previous standard approaches, as discussed in Formey and Ungerboeck (*IEEE Trans. Inform. Theory* 1998), entail a decomposition into separate problems of modulation, of shaping of a multivariate signal constellation, and of coding. For coding purposes, the continuous-time modulation and demodulation may be regarded as given so that the channel reduces to the indicated discrete-time model. In the approach developed in the invention here-in the shaping of the signal is built directly into the code design and not handled separately.

As shall be reviewed in the section on past work below, there are practical schemes of specific size with empirically good performance.

However, all past works concerning sequences of practical schemes, with rates set arbitrarily below capacity, lack proof that the error probability will exponentially small in the size n of the code, wherein the exponent of the error probability will depend on the difference between the capacity and the rate. With the decoder invented herein, it amenable to the desired analysis, providing the first theory establishing that a practical scheme is reliable at rates approaching capacity for the Gaussian channel.

1.1 Sparse Superposition Codes:

The framework for superposition codes is the formation of specific forms of linear combinations of a given list of vectors. This list (or book) of vectors is denoted $X_1, X_2, \ldots, X_N$. Each vector has n real-valued (or complex-valued) coordinates, for which the codeword vectors take the form of superpositions $$\beta_1 X_1 + \beta_2 X_2 + \beta_N X_N.$$

The vectors $X_j$ provide the terms or components of the codewords with coefficients $\beta_j$. By design, each entry of these vectors $X_j$ is independent standard normal. The choice of codeword is conveyed through the coefficients, with sum of squares chosen to match the power requirement P. The received vector is in accordance with the statistical linear model $$Y = X\beta + \epsilon,$$

where X is the matrix whose columns are the vectors $X_1, X_2, \ldots, X_N$ and $\epsilon$ is the noise vector with distribution $N(0, \sigma^2 I)$. In some channel models it can be convenient to allow codeword vectors and received vectors to have complex-valued entries, though as there is no substantive difference in the analysis for that case, the focus in the description unfolding here is on the real-valued case. The book X is called the design matrix consisting of p=N variables, each with n observations, and this list of variables is also called the dictionary of candidate terms.

For general subset superposition coding the message bit string is arranged to be conveyed by mapping it into a choice of a subset of terms, called sent, with L coefficients non-zero, with specified positive values. Denote B=N/L to be the ratio of dictionary size to the number of terms sent. When B is large, it is a sparse superposition code. In this case the number of terms sent is a small fraction L/N of the dictionary size.

In subset coding, it is known in advance to the encoder and decoder what will be the coefficient magnitude $\sqrt{P_j}$ if a term is sent. Thus $\beta_j^2 = P_j 1_{j\,sent}$ is equal to $P_j$ if the term is sent and equal to 0 otherwise. In the simplest case, the values of the non-zero coefficients are the same, with $P_j = P/L$.

Optionally, the non-zero coefficient values may be +1 or −1 times specified magnitudes, in which case the superposition code is said to be signed. Then the message is conveyed by the sequence of signs as well as the choice of subset.

For subset coding, in general, the set of permitted coefficient vectors β is not an algebraic field, that is, it is not closed under linear operations. For instance, summing two coefficient vectors with distinct sets of L non-zero entries does not yield another such coefficient vector. Hence the linear statistical model here does not correspond to a linear code in the sense of traditional algebraic coding.

In this document particular focus is given to a specialization which the inventors herein call a partitioned superposition code. Here the book X is split into L sections of size B with one term selected from each, yielding L terms in each codeword. Likewise, the coefficient vector β is split into sections, with one coordinate non-zero in each section to indicate the selected term. Partitioning simplifies the organization of the encoder and the decoder.

Moreover, partitioning allows for either constant or variable power allocation, with $P_j$ equal to values $P_{(l)}$ for j in section l, where $\Sigma_l^L P_{(l)} = P$. This respects the requirement that $\Sigma_{j\,sent} P_j = P$, no matter which term is selected from each section. Set weights $\pi_j = P_j/P$. For any set of terms, its size induced by the weights is defined as the stun of the $\pi_j$ for j in that set. Two particular cases investigated include the case of constant power allocation and the case that the power is proportional to $e^{-2C l/L}$ for sections l=1, 2, ..., L. These variable power allocations are used in getting the rate up to capacity.

Most convenient with partitioned codes is the case that the section size B is a power of two. Then an input bit string a of length $K = L \log_2 B$ splits into L substrings of size $\log_2 B$ and the encoder becomes trivial. Each substring of u gives the index (or memory address) of the term to be sent from the corresponding section.

As said, the rate of the code is R=K/n input bits per channel uses, with arbitrary rate R less than $C$. For the partitioned superposition code this rate is $$R = \frac{L \log B}{n}.$$

For specified L, B and R, the codelength n is (L/R)log B. This the length n and the subset size L agree to within a log factor.

Control of the dictionary size is critical to computationally advantageous coding and decoding. Possible dictionary sizes are between the extremes K and $2^K$ dictated by the number and size of the sections, where K is the number of input bits. In one extreme, with 1 section of size $B=2^K$, the design X is the whole codebook with its columns as the codewords, but the exponential size makes its direct use impractical. At the other extreme there would be L=K sections, each with two candidate terms in subset coding or two signs of a single term in sign coding with B=1; in which case X is the generator matrix of a linear code.

Between these extremes, computationally feasible, reliable, high-rate codes are constructed with codewords corresponding to linear combinations of subsets of terms in moderate size dictionaries, with fast decoding algorithms. In particular, for the decoder developed here, at a specific sequence of rates approaching capacity, the error probability is shown to be exponentially small in $L/(\log B)^{3/2}$.

For high rate, near capacity, the analysis herein requires B to be large compared to $(1+snr)^2$ and for high reliability it also requires L to be large compared to $(1+snr)^2$, where $snr = P/\sigma^2$ is the signal to noise ratio.

Entries of X are drawn independently from a normal distribution with mean zero and a variance 1 so that the codewords Xβ have a Gaussian shape to their distribution and so that the codewords have average power near P. Other distributions for the entries of X may be considered, such as independent equiprobable ±1, with a near Gaussian shape for the codeword distribution obtained by the convolutions associated with sums of terms in subsets of size L.

There is some freedom in the choice of scale of the coefficients. Here the coordinates of the $X_j$ are arranged to have variance 1 and the coefficients of β are set to have sum of squares equal to P. Alternatively, one may simplify the coefficient representation by arranging the coordinates of $X_j$ to be normal with variance $P_j$ and setting the non-zero coefficients of β to have magnitude 1. Whichever of these scales is convenient to the argument at hand is permitted.

1.2 Summary of Findings:

A fast sparse superposition decoder is herein described and its properties analyzed. The inventor herein call it adaptive successive decoding.

For computation, it is shown that with a total number of simple parallel processors (multiplier-accumulators) of order n B, and total memory work space of size $n^2$ B, it runs in a constant time per received symbol of the string Y.

For the communication rate, there are two cases. First, when the power of the terms sent are the same at P L in each section, the decoder is shown to reliably achieves rates up to a rate $R_0=(\frac{1}{2})P/(P+\sigma^2)$ which is less than capacity. It is close to the capacity when the signal-to-noise ratio is low. It is a deficiency of constant power allocation with the scheme here that its rate will be substantially less than the capacity if the signal-to-noise is not low.

To bring the rate higher, up to capacity, a variable power allocation is used with power $P_{(l)}$ proportional to $e^{-2\mathcal{C}\,l/L}$, for sections l from 1 to L, with improvements from a slight modification of this power allocation for l/L near 1.

To summarize what is achieved concerning the rate, for each B≥2, there is a positive communication rate $\mathcal{H}_B$ that the decoder herein achieves with large L. This $\mathcal{H}_B$ depends on the section size B as well as the signal to noise ratio snr=$P/\sigma^2$. It approaches the Capacity $\mathcal{H}=(\frac{1}{2})\log(1+\text{snr})$ as B increases, albeit slowly. The relative drop from capacity $$\Delta_B = \frac{C - C_B}{C},$$

is accurately bounded, except for extremes of small and large snr, by an expression near $$\frac{(1.5 + 1/v)\log\log B}{\log B},$$

where $v$=snr/(1+snr), with other bounds given to encompass accurately also the small and large snr cases.

Concerning reliability, a positive error exponent function $\epsilon(\mathcal{H}_B-R)$ is provided for $R<\mathcal{H}_B$. It is of the order $(\mathcal{H}_B-R)^2 \sqrt{\log B}$ for rates R near $\mathcal{H}_B$. The sparse superposition code reliably makes not more than a small fraction of section mistakes. Combined with an outer Reed-Solomon code to correct that small fraction of section mistakes the result is a code with block error probability bounded by an expression exponentially small in $L\epsilon(\mathcal{H} C_B-R)$, which is exponentially small in $n\epsilon(\mathcal{H}_B-R)/\log B$. For a range of rates R not far from $\mathcal{H}_B$, the error exponent is shown to be within a $\sqrt{\log B}$ factor of the optimum reliability exponent.

1.3 Decoding Sparse Superposition Codes:

Optimal decoding for minimal average probability of error consists of finding the codeword Xβ with coefficient vector β of the assumed form that maximizes the posterior probability, conditioning on X and Y. This coincides, in the case of equal prior probabilities, with the maximum likelihood rule of seeking such a codeword to minimize the sum of squared errors in fit to Y. This is a least squares regression problem $\min_\beta \|Y-X\approx\|^2$, with codeword constraints on the coefficient vector. There is the concern that exact least squares decoding is computationally impractical. Performance bounds for the optimal decoder are developed in the previously cited companion work achieving rates up to capacity in the constant power allocation case. Instead, here a practical decoder is developed for which desired properties of reliability and rate approaching capacity are established in the variable power allocation case.

The basic step of the decoder is to compute for a given vector, initially the received string Y, its inner product with each of the terms in the dictionary, as test statistics, and see which of these inner products are above a threshold. Such a set of inner products for a step of the decoder is performed in parallel by a computational unit, e.g. a signal-processing chip with N=LB parallel accumulators, each of which has pipelined computation, so that the inner product is updated as the elements of the string arrive.

In this basic step, the terms that it decodes are among those for which the test statistic is above threshold. The step either selects all the terms with inner product above threshold, or a portion of these with specified total weight. Having inner product $X_j^T Y$ above a threshold $T=\|Y\|_\tau$ corresponds to having normalized inner product $X_j^T Y/\|Y\|$ above a threshold $\tau$ set to be of the form $$\tau=\sqrt{2\log B}+a,$$

where the logarithm is taken using base e. This threshold may also be expressed as $\sqrt{2\log B}(1+\delta_a)$ with $\delta_a=a/\sqrt{2\log B}$. The a is a positive value, free to be specified, that impacts the behavior of the algorithm by controlling the fraction of terms above threshold each step. An ideal value of a is moderately small, corresponding to $\delta_a$ near 0.75(log log B)/log B, plus log(1+snr)/log B when snr is not small. Having $2\delta_a$ near 1.5 log log B/log B plus $4\mathcal{C}/\log B$ constitutes a large part of the above mentioned rate drop $\Delta_B$.

Having the threshold larger than $\sqrt{2\log B}$ implies that the fraction of incorrect terms above threshold is negligible. Yet it also means that only a moderate fraction of correct terms are found to be above threshold each step.

A fit is formed at the end of each step by adding the terms that were selected. Additional steps are used to bring the total fraction decoded up near 1.

Each subsequent step of the decoder computes updated test statistics, taking inner products of the remaining terms with a vector determined using Y and the previous fit, and sees which are above threshold. For fastest operation these updates are performed on additional computational units so as to allow pipelined decoding of a succession of received strings. The test statistic can be the inner product of the terms $X_j$ with the vector of residuals equal to the difference of Y and the previous fit. As will be explained, a variant of this statistic is developed and found to be somewhat simpler to analyze.

A key feature is that the decoding algorithm does not pre-specify which sections of terms will be decoded on any one step. Rather it adapts the choice in accordance with which sections have a term with an inner product observed to be above threshold. Thus this class of procedures is called adaptive successive decoding.

Concerning the advantages of variable power in the partitioned code case, which allows the scheme herein to achieve rates near capacity, the idea is that the power allocations proportional to $e^{-2\mathcal{C}\,l/L}$ give some favoring to the decoding of the higher power sections among those that remain each step. This produces more statistical power for the test initially as well as retaining enough discrimination power for subsequent steps.

Such power allocation also would arise if one were attempting to successively decode one section at a time, with the signal contributions of as yet un-decoded sections treated as noise, in a way that splits the rate $\mathcal{C}$ into L pieces each of size $\mathcal{C}/L$; however, such pre-specification of one section to decode each step would require the section sizes to be exponentially large to achieve desired reliability. In contrast, in the adaptive scheme herein, many of the sections are considered each step. The power allocations do not change too much across many nearby sections, so that a sufficient distribution of decodings can occur each step.

For rate near capacity, it helpful to use a modified power allocation, with power proportional to $$\max\left\{e^{-2C\frac{\ell-1}{L}}, u_{cut}\right\},$$

where $u_{cut} = e^{-2C}(1+\delta_c)$ with a small non-negative value of $\delta_c$. Thus $u_{cut}$ can be slightly larger than $e^{-2C}$. This modification performs a slight leveling of the power allocation for $l/L$ near 1. It helps ensure that, even in the end game, there will be sections for which the true terms are expected to have inner product above threshold.

Analysis of empirical bounds on the proportions of correct detections involves events shown to be nearly independent across the L sections. The probability with which such proportions differ much from what is expected is exponentially small in the number of sections L. In the case of variable power allocation the inductive determination of distributional properties herein is seen to requires that one work with weighted proportions of events, which are sums across the terms of indicators of events multiplied by the weights provided by $\pi_j = P_j/P$. With bounded ratio of maximum to minimum power across the sections, such weighted proportions agree with un-weighted proportions to within constant factors. Moreover, for indicators of independent events, weighted proportions have similar exponential tail bounds, except that in the exponent, in place of L there is $L_\pi = 1/\max_j \pi_j$, which is approximately a constant multiple of L for the designs investigated here.

1.4 An Update Function:

A key ingredient of this work is the determination of a function $g_L:[0, 1] \to [0, 1]$, called the update function, which depends on the design parameters (the power allocation and the parameters L, B and R) as well as the snr. This function $g_L(x)$ determines the likely performance of successive steps of the algorithm. Also, for a variant of the residual-based test statistics, it is used to set weights of combination that determine the best updates of test statistics.

Let $\hat{q}_k^{tot}$ denote the weighted proportion correctly decoded after k steps. A sequence of deterministic values $q_{1,k}$ is exhibited such that $\hat{q}_k^{tot}$ is likely to exceed $q_{1,k}$ each step. The $q_{1,k}$ is near the value $g_L(q_{1,k-1})$ given by the update function, provided the false alarm rate is maintained small. Indeed, an adjusted value $q_{1,k}^{adj}$ is arranged to be not much less than $g_L(q_{1,k-1}^{adj})$ where the 'adj' in the superscript denotes an adjustment to $q_{1,k}$ to account for false alarms.

Determination of whether a particular choice of design parameters provides a total fraction of correct detections approaching 1 reduces to verification that this function $g_L(x)$ remains strictly above the line y=x for some interval of the form [0,x*] with x* near 1. The successive values of the $g_L(x_k) - x_k$ at $x_k = q_{1,k-1}^{adj}$ control the error exponents as well as the size of the improvement in the detection rate and the number of steps of the algorithm. The final weighted fraction of failed detections is controlled by $1 - g_L(x^*)$.

Figure 4:
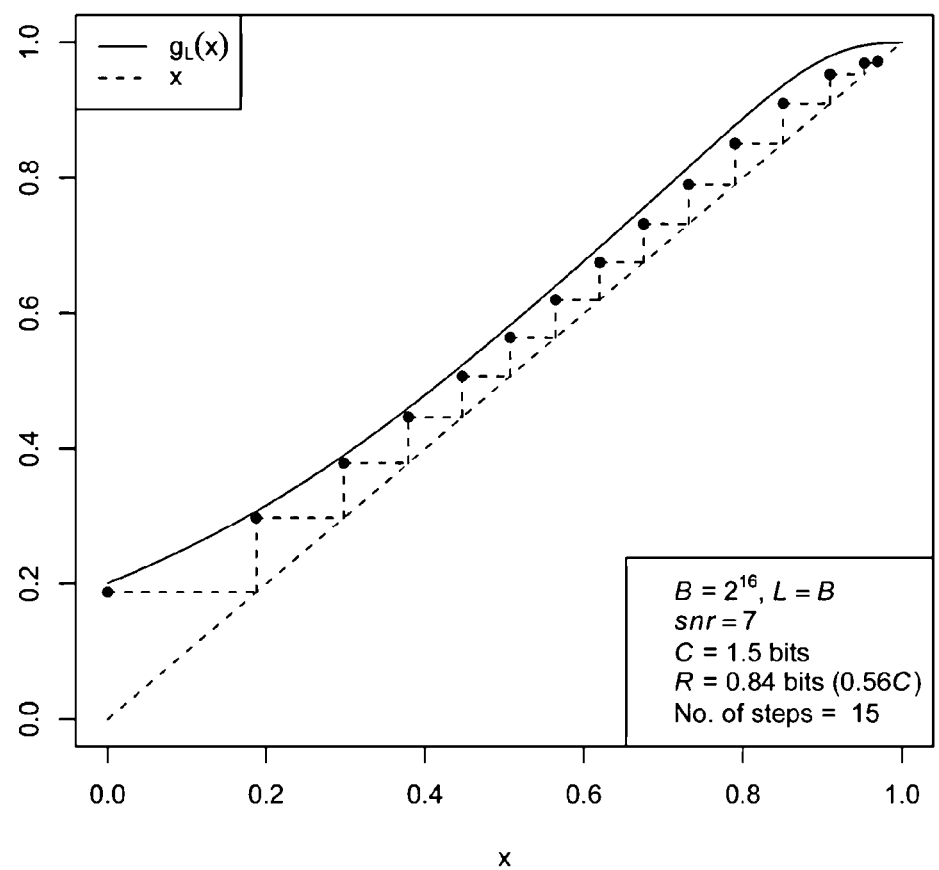
FIG. 4 is a graphical representation of a plot of the function $g_L(x)$, wherein the dots indicate the sequence $q_{1,k}^{adj}$ for the 16 steps. $B=2^{16}$, snr=7, R=0.74 and L is taken to be equal to B (Note: snr→"signal-to-noise ratio"). The height reached by the $g_L(x)$ curve at the final step corresponds to a weighted correct detection rate target of 0.993, un-weighted 0.986, for a failed detection rate target of 0.014. The accumulated false alarm rate bound is 0.008. The probability of mistake rates larger than these targets is bounded by $4.8 \times 10^{-4}$.

The role of $g_L$ is shown in FIG. 4. This figure provides a plot of the function $g_L(x)$ in a specific case. The dots indicate the sequence $q_{1,k}^{adj}$ for 16 steps. Here $B=2^{16}$, snr=7, R=0.74 and L taken to be equal to B. The height reached by the $g_L(x)$ curve at the final step corresponds to a weighted correct detection rate target of 0.993, un-weighted 0.986, for a failed detection rate target of 0.014. The accumulated false alarm rate bound is 0.008. The probability of mistake rates larger than these targets is bounded by $4.8 \times 10^{-4}$.

Provision of $g_L(x)$ and the computation of its iterates provides a computational devise by which a proposed scheme is checked for its capabilities.

An equally important use of $g_L(x)$ is analytical analysis of the extent of positivity of the gap $g_L(x) - x$ depending on the design parameters. For any power allocation there will be a largest rate R at which the gap remains positive over most of the interval [0, 1] for sufficient size L and B. Power allocations with $P_{(l)}$ proportional to $e^{-2C l/L}$, or slight modifications thereof, are shown to be the form required for the gap $g_L(x) - x$ to have such positivity for rates R near $C$.

Analytical examination of the update function shows for large L how the choice of the rate R controls the size of the shortfall $1-x^*$ as well as the minimum size of the gap $g_L(x)-x$ for $0 \le x \le x^*$, as functions of B and snr. Thereby bounds are obtained on the mistake rate, the error exponent, and the maximal rate for which the method produces high reliability.

To summarize, with the adaptive successive decoder and suitable power allocation, for rates approaching capacity, the update function stays sufficiently above x over most of [0, 1] and, consequently, the decoder has a high chance of not more than a small fraction of section mistakes.

1.5 Accounting of Section Mistakes:

Ideally, the decoder selects one term from each section, producing an output which is the index of the selected term. It is not in error when the term selected matches the one sent.

In a section a mistake occurs from an incorrect term above threshold (a false alarm) or from failure of the correct term to provide a statistic value above threshold after a suitable number of steps (a failed detection). Let $\hat{\delta}_{mis}$ refer to the failed detection rate plus the false alarm rate, that is, the sum of the fraction of section with failed detections and the fraction of sections with false alarms. This sum from the two sources of mistake is at least the fraction of section mistakes, recognizing that both types can occur. The technique here controls this $\hat{\delta}_{mis}$ by providing a small bound $\delta_{mis}$ that holds with high probability.

A section mistake is counted as an error if it arises from a single incorrectly selected term. It is an erasure if no term is selected or more than one term is selected. The distinction is that a section error is a mistake you don't know you made and a section erasure is one you known you made. Let $\hat{\delta}_{error}$ be the fraction of section errors and $\hat{\delta}_{erase}$ be the fraction of section erasures. In each section one sees that the associated indicators of events satisfy the property that $1_{erase} + 2 \cdot 1_{error}$ is not more than $1_{failed\ detection} + 1_{false\ alarm}$. This is because an error event requires both a failed detection and a false alarm. Accordingly $2\hat{\delta}_{error} + \hat{\delta}_{erase}$ is not more than $\hat{\delta}_{mis}$, the failed detection rate plus the false alarm rate.

1.6 An Outer Code:

An issue with this superposition scheme is that candidate subsets of terms sent could differ from each other in only a few sections. When that is so, the subsets could be difficult to distinguish, so that it would be natural to expect a few section mistakes.

An approach is discussed which completes the task of identifying the terms by arranging sufficient distance between the subsets, using composition with an outer Reed-Solomon (RS) code of rate near one. The alphabet of the Reed-Solomon code is chosen to be a set of size B, a power of 2. Indeed in this invention it is arranged the RS symbols correspond to the indices of the selected terms in each section.

Details are given in a later section. Suppose the likely event $\hat{\delta}_{mis} < \delta_{mis}$ holds from the output of the inner superposition code. Then the outer Reed-Solomon corrects the small fraction of remaining mistakes so that the composite decoder ends up not only with small section mistake rate but also with small block error probability. If $R_{outer}=1-\delta$ is the communication rate of an RS code, with $0<\delta<1$, then the section errors and erasures can be corrected, provided $\delta_{mis} \leq \delta$.

Furthermore, if $R_{inner}$ is the rate associated with the inner (superposition) code, then the total rate after correcting for the remaining mistakes is given by $R_{total}=R_{inner}R_{outer}$, using $\delta=\delta_{mis}$. Moreover, if $\Delta_{inner}$ is the relative rate drop from capacity of the inner code, then the relative rate drop of the composite code $\Delta_{total}$ is not more than $\delta_{mis}+\Delta_{inner}$.

The end result, using the theory developed herein for the distribution of the fraction of mistakes of the superposition code, is that for suitable rate up to a value near capacity the block error probability is exponentially small.

One may regard the composite code as a superposition code in which the subsets are forced to maintain at least a certain minimal separation, so that decoding to within a certain distance from the true subset implies exact decoding.

Performance of the sparse superposition code is measured by the three fundamentals of computation, rate, and reliability.

1.7 Computational Resource of Hardware Implementation:

The main computation required of each step of the decoder is the computation of the inner products of the residual vectors with each column of the dictionary. Or one has computation of related statistics which require the same order of resource. For simplicity in this subsection the case is described in which one works with the residuals and accepts each term above threshold. The inner products requires order nLB multiply-and-adds each step, yielding a total computation of order nLBm for m steps. The ideal number of steps m according to the bounds obtained herein is not more than 2+snr log B.

When there is a stream of strings Y arriving in succession at the decoder, it is natural to organize the computations in a parallel and pipelined fashion as follows. One allocates m signal processing chips, each configured nearly identically, to do the inner products. One such chip does the inner products with Y, a second chip does the inner products with the residuals from the preceding received string, and so on, up to chip m which is working on the final decoding step from the string received several steps before.

Each signal processing chip has in parallel a number of simple processors, each consisting of a multiplier and an accumulator, one for each stored column of the dictionary under consideration, with capability to provide pipelined accumulation of the required sum of products. This permits the collection of inner products to be computed online as the coordinates of the vectors are received. After an initial delay of m received strings, all m chips are working simultaneously.

Moreover, for each chip there is a collection of simple comparators, which compare the computed inner products to the threshold and store, for each column, a flag of whether it is to be part of the update. Sums of the associated columns are computed in updating the residuals (or related vectors) for the next step. The entries of that simple computation (sums of up to L values) are to be provided for the next chip before processing the entries of the next received vector. If need be, to keep the runtime at a constant per received symbol, one arranges 2m chips, alternating between inner product chips and subset sum chips, each working simultaneously, but on strings received up to 2m steps before. The runtime per received entry in the string Y is controlled by the time required to load such an entry (or counterpart residuals on the additional chips) at each processor on the chip and perform in parallel the multiplication by the associated dictionary entries with result accumulated for the formation of the inner products.

The terminology signal processing chip refers to computational units that run in parallel to perform the indicated tasks. Whether one or more of these computational units fit on the same physical computer chip depends on the size of the code dictionary and the current scale of circuit integration technology, which is an implementation matter not a concern at the present level of decoder description.

If each of the signal processing chips keeps a local copy of the dictionary X, alleviating the challenge of numerous simultaneous memory calls, the total computational space (memory positions) involved in the decoder is nLBm, along with space for LBm multiplier-accumulators, to achieve constant order computation time per received symbol. Naturally, there is the alternative of increased computation time with less space; indeed, decoding by serial computation would have runtime of order nLBm.

Substituting L=nR/log B and m of order log B the computational resource expression nLBm simplifies. One sees that the total computational resource required (either space or time) is of order $n^2B$ for this sparse superposition decoder. More precisely, to include the effect of the snr on the computational resource, using the number of steps m which arise in upcoming bounds, which is within 2 of snr log B, and using R upper bounded by capacity $\mathcal{C}$, the computational resource of nLBm memory positions is bounded by $\mathcal{C}$ snr $n^2$ B, and a number LBm of multiplier-adders bounded by $\mathcal{C}$ snr n B.

In concert with the action of this decoder, the additional computational resource of a Reed-Solomon decoder acts on the indices of which term is flagged from each section to provides correction of the few mistakes. The address of which term is flagged in a section provides the corresponding symbol for the RS decoder, with the understanding that if a section has no term flagged or more than one term flagged it is treated as an erasure. For this section, as the literature on RS code computation is plentiful, it is simply note that the computation resource required is also bounded as a low order polynomial in the size of the code.

1.8 Achieved Rate:

This subsection discusses the nature of the rates achieved with adaptive successive decoding. The invention herein achieves not only fixed rates $R<\mathcal{C}$ but also rates R up to $\mathcal{C}_B$, for which the gap from capacity is of the order near $1/\log B$.

Two approaches are provided for evaluation of how high a rate R is achieved. For any L, B, snr, any specified error probability and any small specified fraction of mistakes of the inner code, numerical computation of the progression of $g_L(x)$ permits a numerical evaluation of the largest R for which $g_L(x)$ remains above x sufficiently to achieve the specified objectives.

The second approach is to provide simplified bounds to prove analytically that the achieved rate is close to capacity, and exhibit the nature of the closeness to capacity as function of snr and B. This is captured by the rate envelope $C_B$ and bounds on its relative rate drop $\Delta_B$. Here contributions to $\Delta_B$ are summarized, in a way that provides a partial blueprint to later developments. Fuller explanation of the origins of these contributions arise in these developments in later sections.

The update function $g_L(x)$ is near a function g(x), with difference bounded by a multiple of 1/L. Properties of this function are used to produce a rate expression that ensures that g(x) remains above x, enabling the successive decoding to progress reliability. In the full rate expressions developed later, there are quantities η, h, and ρ that determine error exponents multiplied by L. So for large enough L, these exponents can be taken to be arbitrarily small. Setting those quantities to the values for which these exponents would become 0, and ignoring terms that are small in 1/L, provides simplification giving rise to what the inventors call the rate envelope, denoted $C_B$.

With this rate envelope, for $R<C_B$, these tools enable us to relate the exponent of reliability of the code to a positive function of $C_B-R$ times L, even for L finite.

There are two parts to the relative rate drop bound $\Delta_B$, which are written as $\Delta_{shape}$ plus $\Delta_{alarm}$, with details on these in later sections. Here these contributions are summarized to express the form of the bound on $\Delta_B$.

The second part denoted $\Delta_{alarm}$ is determined by optimizing a combination of rate drop contributions from $2\delta_a$, plus a term snr/(m−1) involving the number of steps m, plus terms involving the accumulated false alarm rate. Using the natural logarithm, this $\Delta_{alarm}$ is optimized at m equal to an integer part of 2+snr log B and an accumulated baseline false alarm rate of $1/[(3\mathcal{C}+½)\log B]$. At this optimized m and optimized false alarm rate, the value of the threshold parameter $\delta_a$ is $$\delta_a = \frac{\log[msnr(3+1/2C)\sqrt{\log B}/\sqrt{4\pi}]}{2\log B}$$

and $$\Delta_{alarm} = 2\delta_a + \frac{2}{\log B}.$$

At the optimized m, the $\delta_a$ is an increasing function of snr, with value approaching 0.25 log [(log B)/π]/log B for small snr and value near $$\frac{.75 \log\log B + 2C - 0.25 \log(4\pi/9)}{\log B}$$

for moderately large snr. The constant subtracted in the numerator 0.25 log(4π/9) is about 0.08. With $\delta_a$ thus set, it determines the value of the threshold $\tau=\sqrt{2\log B}(1+\delta_a)$.

To obtain a small $2\delta_a$, and hence small $\Delta_{alarm}$, this bound requires log B large compared to $4\mathcal{C}$, which implies that the section size B is large compared to $(1+snr)^2$.

The $\Delta_{shape}$ depends on the choice of the variable power allocation rule, via the function g and its shape. For a specified power allocation, it is determined by a minimal inner code rate drop contribution at which the function has a non-negative gap g(x)−x on [0, x*], plus the contribution to the outer code rate drop associated with the weighted proportion not detected $\delta^*=1-g(x^*)$. For determination of $\Delta_{shape}$, three cases for power allocation are examined, then, for each snr, pick the one with the best such tradeoff, which includes determination of the best x*. The result of this examination is a $\Delta_{shape}$ which is a decreasing function of snr.

The first case has no leveling ($\delta_c=0$). In this case the function g(x)−x is decreasing for suitable rates. Using an optimized x* it provides a candidate $\Delta_{shape}$ equal to $1/\tau^2$ plus $\xi_\mathcal{C}/(\tau\mathcal{C})$, where $\xi_\mathcal{C}$ is an explicitly given expression with value near $\sqrt{2\log(\mathcal{C}+1/2)}$ for large $\mathcal{C}$. If snr is not large, this case does not accomplish the aims because the term involving 1/τ, near $1/\sqrt{2\log B}$, is not nearly as small as will be demonstrated in the leveling case. Yet with snr such that $\mathcal{C}$ is large compared to τ, this $\Delta_{shape}$ is acceptable, providing a contribution to the rate drop near the value 1/(2 log B). Then the total rate drop is primarily determined by $\Delta_{alarm}$, yielding, for large snr, that $\Delta_B$ is near $$\frac{1.5 \log\log B + 4C + 2.34}{\log B}.$$

This case is useful for a range of snr, where $\mathcal{C}$ exceeds a multiple of $\sqrt{\log B}$ yet remains small compared to log B.

The second case has some leveling with $0<\delta_c<$snr. In this case the typical shape of the function g(x)−x, for x in [0, 1], is that it undergoes a single oscillation, first going down, then increasing, and then decreasing again, so there are two potential minima for x in [0, x*], one of which is at x*. In solving for the best rate drop bound, a role is demonstrated for the case that $\delta_c$ is such that an equal gap value is reached at these two minima. In this case, with optimized x*, a bound on $\Delta_{shape}$ is shown, for a range of intermediate size signal to noise ratios, to be given by the expression $$\frac{2}{\nu \log B}\left\{2+\log\left(\frac{1}{2}+\frac{\nu\mathcal{T}}{4C\sqrt{2\pi}}\right)\right\}+\frac{1}{2\log B},$$

where $\nu=$snr/(1+snr). When $2\mathcal{C}/\nu$ is small compared to $\tau/\sqrt{2\pi}$, this $\Delta_{shape}$ is near (1/$\nu$)(log log B)/(log B). When added to $\Delta_{alarm}$ it provides an expression for $\Delta_B$, as previously given, that is near (1.5+1/$\nu$)log log B/log B plus terms that are small in comparison.

The above expression provides the $\Delta_{shape}$ as long as snr is not too small and $2\nu/\mathcal{C}$ is less than $\tau/\sqrt{2\pi}$. For $2\mathcal{C}/\nu$ at least $\tau/=\sqrt{2\pi}$, the effect of the log log B is canceled, though there is then an additional small remainder term that is required to be added to the above as detailed later. The result is that $\Delta_{shape}$ is less than const/log B for $(2\mathcal{C}/\nu)\sqrt{2\pi}$ at least τ.

The third case uses constant power allocation (complete leveling with $\delta_c=$snr), when snr is small. The $\Delta_{shape}$ is less than a given bound near $\sqrt{2(\log\log B)/\log B}$ when the snr is less than twice that value. For such sufficiently small snr this $\Delta_{shape}$ with complete leveling becomes superior to the expression given above for partial leveling.

Accordingly, let $\Delta_{shape}$ be the best of these values from the three cases, producing a continuous decreasing function of snr, near $\sqrt{2(\log\log B)/\log B}$ for small snr, near (1+1/snr)log log B/(log B) for intermediate snr and near ½ log B for large snr. Likewise, the $\Delta_B$ bound is $\Delta_{shape}+\Delta_{alarm}$. In this way one has the dependence of the rate drop on snr and section size B.

Thus let $C_B$ be the rate of the composite sparse superposition inner code and Reed-Solomon outer code obtained from optimizing the total relative rate drop bound $\Delta_B$.

Included in $\Delta_{alarm}$ and $\Delta_{shape}$, which sum to $\Delta_B$, are baseline values of the false alarm rates and the failed detection rates, respectively, which add to provide a baseline value $\delta_{mis}^*$, and, accordingly, $\Delta_B$ splits as $\delta_{mis}^*$ plus $\Delta_{B,inner}$, using the relative rate drop of the inner code. As detailed later, this $\delta_{mis}^*$ is typically small compared to the rate drop sources from the inner code.

In putting the ingredients together, when R is less than $C_B$, part of the difference $C_B-R$ is used in providing slight increase past the baseline to determine a reliable $\delta_{mis}$, and the rest of the difference is used in setting the inner code rate to insure a sufficiently positive gap g(x)−x for reliability of the decoding progression. The relative choices are made to produce the best resulting error exponent $L\epsilon(C_B-R)$ for the given rate.

1.9 Comparison to Least Squares:

It is appropriate to compare the rate achieved here by the practical decoder herein with what is achieved with theoretically optimal, but possibly impractical, least squares decoding of these sparse superposition codes, subject to the constraint that there is one non-zero coefficients in each section. Such least squares decoding provides the stochastically smallest distribution of the number of mistakes, with a uniform distribution on the possible messages, but it has an unknown computation time.

In this direction, the results in the previously cited companion paper for least squares decoding of superposition codes, partially complement what is give herein for the adaptive successive decoder. For optimum least square decoding, favorable properties are demonstrated, in the case that the power assignments P/L are the same for each section. Interestingly, the analysis techniques there are different and do not reveal rate improvement from the use of variable instead of constant power with optimal least squares decoding. Another difference is that while here there are no restrictions on B, there it is required that $B \geq L^b$ for a specified section size rate b depending only on the signal-to-noise ratio, where conveniently b tends to 1 for large signal-to-noise, but unfortunately b gets large for small snr. For comparison with the scheme here, restrict attention to moderate and large signal-to-noise ratios, as for computational reasons, it is desirable that B be not more than a low order polynomial in L.

Let $\Delta = (\mathcal{C} - R)/\mathcal{C}$ be the rate drop from capacity, with R not more than $\mathcal{C}$. For least squares decoding there is a positive constant $c_1$ such that the probability of more than a fraction $\delta_{mis}$ of mistakes is less than $\exp\{-nc_1 \min\{\Delta^2, \delta_{mis}\}\}$, for any $\delta_{mis}$ in $[0,1]$, any positive rate drop $\Delta$ and any size n. This bound is better than obtained for the practical decoder herein in its freedom of any choice of mistake fraction and rate drop in obtaining this reliability. In particular, the result for least squares does not restrict $\Delta$ to be larger than $\Delta_B$ and does not restrict $\delta_{mis}$ to be larger than a baseline value of order $1/\log B$.

It shows that n only needs to be of size $[\log(1/\epsilon)]/[c_1 \min\{\Delta^2, \delta_{mis}\}]$ for least squares to achieve probability $\epsilon$ of at least a fraction $\delta_{mis}$ mistakes, at rate that is $\Delta$ close to capacity. With suitable target fractions of mistakes, the drop from capacity $\Delta$ is not more than $\sqrt{(1/c_1 n)\log 1/\epsilon}$. It is of order $1/\sqrt{n}$ if $\epsilon$ is fixed; whereas, for $\epsilon$ exponentially small in n, the associated drop from capacity $\Delta$ would need to be at least a constant amount.

An appropriate domain for comparison is in a regime between the extremes of fixed probability $\epsilon$ and a probability exponentially small in n. The probability of error is made nearly exponentially small if the rate is permitted to slowly approach capacity. In particular, suppose B is equal to n or a small order power of n. Pick $\Delta$ of order $1/\log B$ to within iterated log factors, arranged such that the rate drop $\Delta$ exceeds the envelope $\Delta_B$ by an amount of that order $1/\log B$. One can ask, for a rate drop of that moderately small size, how would the error probability of least squares and the practical method compare? At a suitable mistake rate, the exponent of the error probability of least squares would be quantified by $n/(\log B)^2$ of order $n/(\log n)^2$, neglecting log log factors. Whereas, for the practical decoder herein the exponent would be a constant times $L(\Delta - \Delta_B)^2(\log B)^{1/2}$, which is of order $L/(\log B)^{1.5}$, that is, $n/(\log n)^{2.5}$. This the exponent for the practical decoder is within a $(\log n)^{0.5}$ factor of what is obtained for optimal least squares decoding.

1.10 Comparison to the Optimal Form of Exponents:

It is natural to compare the rate, reliability, and code-size tradeoff that is achieved here, by a practical scheme, with what is known to be theoretically best possible. What is known concerning the optimal probability of error, established by Shannon and Gallager, as reviewed for instance in work of Polyanskiy, Poor and Verdú (*IEEE IT* 2010), is that the optimal probability of error is exponentially small in an expression $n\epsilon(R)$ which, for R near $\mathcal{C}$, matches $n\Delta^2$ to within a factor bounded by a constant, where $\Delta = (\mathcal{C} - R)/\mathcal{C}$. As recently refined in the work of Altug and Wagner (*IEEE ISIT* 2010), this behavior of the exponent remains valid for $\Delta$ down to the order remaining larger than $1/\sqrt{n}$. The reason for that restriction is that for $\Delta$ as small as order $1/\sqrt{n}$, the optimal probability of error does not go to zero with increasing block length (rather it is then governed by an analogous expression involving the tail probability of the Gaussian distribution). It is reiterated that these optimal exponents are associated with analyses which provided no practical scheme to achieve them in the literature.

The bounds for the practical decoder do not rely on asymptotics, but rather finite sample bounds available for all choices of L and B and inner code rates $R \leq \mathcal{C}_B$, with blocklength $n = (L \log B)/R$. As derived herein the overall error probability bound is exponentially small in an expression of the form $L \text{ mill } \{\Delta, \Delta^2\sqrt{\log B}\}$, provided R is enough less than $\mathcal{C}_B$ that the additional drop from $\mathcal{C}_B - R$ is of the same order as the total drop $\Delta$. Consequently, the error probability is exponentially small in $$n\min\left\{\frac{\Delta}{\log B}, \frac{\Delta^2}{\sqrt{\log B}}\right\}.$$

Focussing on the $\Delta$ for which the square term is the minimizer, it shows that the error probability is exponentially small in $n(\mathcal{C}-R)^2/\sqrt{\log B}$, within a $\sqrt{\log B}$ factor of optimal, for rates R for which $\mathcal{C}_B - R$ is of order between log log B/log B and $1/\sqrt{\log B}$.

An alternative perspective on the rate and reliability tradeoff as in Polyanskiy, Poor, and Verdú, is to set a small block error probability e and seek the largest possible communication rate $R_{opt}$ as a function of the codelength. They show for n of at least moderate size, this optimal rate is near $$R_{opt} = C - \frac{\sqrt{V}}{\sqrt{n}}\sqrt{2\log 1/\epsilon},$$

for a constant V they identify, where if $\epsilon$ is not small the $\sqrt{2\log 1/\epsilon}$ is to be replaced by the upper $\epsilon$ quantile of the standard normal. For small $\epsilon$ this expression agrees with the form of the relationship between error probability c and the exponent $n(\mathcal{C}-R_{opt})^2$ stated above. The rates and error probabilities achieve with the practical decoder herein have a similar form of relationship but differ in three respects. One is that here there is the somewhat smaller $n/\sqrt{\log B}$ in place of n, secondly the constant multipliers do not match the optimal V, and thirdly the result herein is only applicable for $\epsilon$ small enough that the rate drop is made to be at least $\Delta_B$.

From either of these perspectives, the results here show that to gain provable practicality a price is paid of needing blocklength larger by a factor of $\sqrt{\log B}$ to have the same performance as would be optimal without concern for practicality.

1.11 On the Signal Alphabet and Shaping:

From the cited review by Formey and Ungerboeck, as previously said, the problem of practical communication for additive Gaussian noise channels, has been decomposed into separate problems, which in addition to modulation, include the matters of choice of signal alphabet, of the shaping of a signal constellation, and of coding. The approach taken herein merges the signal alphabet and constellation into the coding. The values of codeword symbols that arise in herein are those that can be realized via sums of columns of the dictionary, one from each section in the partitioned case. Some background on signalling facilitates discussion of relationship to other work.

By choice of signal alphabet, codes for discrete channels have been adapted to use on Gaussian channels, with varying degrees of success. In the simplest case the code symbols take on only two possible values, leading to a binary input channel, by constraining the symbol alphabet to allow only the values $\pm\sqrt{P}$ and possibly using only the signs of the $Y_i$. With such binary signalling, the available capacity is not more than 1 and it is considerably less than $(\frac{1}{2})\log(1+\mathrm{snr})$, except in the case of low signal-to-noise ratio. When considering snr that is not small it is preferable to not restrict to binary signalling, to allow higher rates of communication. When using signals where each symbol has a number M of levels, the rate caps at log M, which is achieved in the high snr limit even without coding (simply infer for each symbol the level to which the received $Y_i$ is closest). As quantified in Formey and Ungerboeck, for moderate snr, treating the channel as a discrete M-ary channel of particular cross-over probabilities and considering associated error-correcting codes allows, in theory, for reasonable performance provided log M sufficiently exceeds log snr (and empirically good coding performance has been realized by LDPC and turbo codes). Nevertheless, as they discuss, the rate of such discrete channels with a fixed number of levels remains less than the capacity of the original Gaussian channel.

To bring the rate up to capacity, the codeword choices must be properly shaped, that is, the codeword vectors should approximate a good packing of points on the n-dimensional sphere of squared radius dictated by the power. An implication of which is that, marginally and jointly for any subset of codeword coordinates, the set of codewords should have empirical distribution not far from Gaussian. Such shaping is likewise a problem for which theory dictates what is possible in terms of rate and reliability, but theory has been lacking to demonstrate whether there is a moderate or low complexity of decoding that achieves such favorable rate and error probability.

The sparse superposition code automatically takes care of the required shaping of the multivariate signal constellation by using linear combinations of subsets a given set of real-valued Gaussian distributed vectors. For high snr; the role of log M being large compared to log snr is replaced herein by having L large and having log B large compared to $\mathcal{C}$. These sparse superposition codes are not exactly well-spaced on the surface of an n-sphere, as inputs that agree in most sections would have nearby codewords. Nevertheless, when coupled with the Reed-Solomon outer code, sufficient distance between codewords is achieved for quantifiably high reliability.

1.12 Relationships to Previous Work:

Several directions of past work are discussed that connect to what is developed here. There is some prior work concerning computational feasibility for reliable communications near capacity for certain channels. Building on Gallager's low density parity check codes (LDPC), iterative decoding algorithms based on statistical belief propagation in loopy networks have been empirically shown in various works to provide reliable and moderately fast decoding at rates near the capacity for various discrete channels, and mathematically proven to provide such properties only in the special case of the binary erasure channel in Luby, Mizemnacher, Shokrollahi, and Spielman (*IEEE IT* 2001). Belief networks are also used for certain empirically good schemes such as turbo codes that allow real-valued received symbols, with a discrete set of input levels. Though substantial steps have been made in the analysis of such belief networks, as summarized for instance in the book by Richardson and Urbanke (2008), there is not proof of the desired properties at rates near capacity for the Gaussian channel.

When both schemes are set up with rate near capacity, the critical distinction between empirically demonstrated code performance (as in the case of LDPC and turbo codes), and a quantified exponential scaling of error probability (as with sparse superposition code with adaptive successive decoder) is what is asserted herein by the exponential scaling of error probability. With such error rate scaling, as the size of the code doubles while maintaining the same communication rate R, then the error probability is squared. For instance an error probability of $10^{-4}$ then reduces to $10^{-8}$, likewise multiplying the code size by 4 would reduce the error probability to $10^{-16}$.

In the progression of available computational ability, such doubling of the size of memory allocatable to the same size chip, is a customary matter in computer chip technology that has occurred every couple of years. With the code invented herein one knows that the reliability will scale in such an attractive way as computational resources improve. With LDPC and turbo codes one might guess that the error probability will likewise improve, but with those technologies (and all other existing code technologies) it can not be definitively asserted. Empirical simulation can not come to the rescue when planning for several years ahead. Until there are the computational resources to implement such increased size devices one can not know whether the investment in existing code strategies (other than ours) will be rewarded when they are increased in size.

An approach to reliable and computationally-feasible decoding, with restriction to binary signaling, is in the work on channel polarization of Arikan (*IEEE IT* 2009) and Arikan and Telatar (*IEEE IT* 2010). Error probability is demonstrated there at a level exponentially small in $n^{1/2}$ for fixed rates less than the binary signaling capacity. In contrast for the scheme herein, the error probability is exponentially small in n to within a logarithmic factor and communication is permitted at higher rates than would be achieved with binary signalling, approaching capacity for the Gaussian noise channel. In recent work Emmanuel Abbe adapts channel polarization to achieve the sum rate capacity for m user binary input multiple-access channels, with specialization to single-user channels with $2^m$ inputs. Building on that work. Abbe and Barron (*IEEE ISIT* 2011) are investigating discrete near-Gaussian signalling to adapt channel polarization to the Gaussian noise channel. That provides an alternative interesting approach to achieving rates up to capacity for the Gaussian noise, but not with error exponents exponentially small in n.

The analysis of concatenated codes in the book of Formey (1966) is an important fore-runner to the development of code composition given herein. For the theory, he paired an outer Reed-Solomon code with concatenation of optimal inner codes of Shannon-Gallager type, while, for practice he focussed on binary input channels, he paired such an outer Reed-Solomon code with inner based on linear combinations of orthogonal terms (for target rates Kin less than 1 such a basis is available), in which all binary coefficient sequences are possible codewords.

A challenge concerning theoretically good inner codes is that the number of messages searched is exponentially large in the inner codelength. Formey made the inner codelength of logarithmic size compared to the outer codelength as a step toward practical solution. However, caution is required with these strategies. Suppose the rate of the inner code has a small relative drop from capacity, $\Delta=(\mathcal{C}-R)/\mathcal{C}$. For at least moderate reliability, the inner codelength would be of order at least $1/\Delta^2$. So with these the required outer codelength becomes exponential in $1/\Delta^2$.

To compare, for the Gaussian noise channel, the approach herein provides a practical decoding scheme for the inner code. Herein inner and outer codelengths are permitted that are comparable to each other. One can draw a parallel between the sections described here and the concatenations of Formey's inner codes. However, a key difference is use herein of superposition across the sections and the simultaneous decoding of these sections. Challenges remain in the restrictiveness of the relationship of the rate drop $\Delta$ to the section sizes. Nevertheless, particular rates are identified as practical and near optimal.

By having set up the channel coding via the linear model $Y=X\beta+\epsilon$ with a sparse coefficient vector $\beta$, it is appropriate to discuss the relationships of the iterative communication decoder here with other iterative algorithms for statistical signal recovery. Though some similarities are here-below described, an important distinction is that previously obtained constrained least squares coefficient estimators have not been developed for communication at rates near capacity for the Gaussian channel.

A class of algorithms for seeking fits of the form $X\beta$ to an observed response vector Y are those designed for the task of finding the least squares convex projection. This projection can either be to the convex hull of the columns of the dictionary X or, for the present problem, to the convex hull of the sums of columns, one from each section in the partitioned case. The relaxed greedy algorithm is an iterative procedure that solves such problems, applying previous theory by Lee Jones (1992), Barron (1993), Lee, Bartlett and Williamson (1996), or Barron, Cohen, et all (2007). Each pass of the relaxed greedy algorithm is analogous to the steps of decoding algorithm developed herein, though with an important distinction. This convex projection algorithm finds in each section the term of highest inner product with the residuals from the previous iteration and then uses it to update the convex combination. Accordingly, like the adaptive decoder here, this algorithm has computation resource requirements linear in the product of the size of the dictionary and the number iterations. The cited theory bounds the accuracy of the fit to the projection as a function of the number of iterations.

The distinction is that convex projection seeks convex combinations of vertices, whereas the decoding problem here can be regarded as seeking the best vertex (or a vertex that agrees with it in most sections). Both algorithms embody a type of relaxation. The Jones-style relaxation is via the convex combination down-weighting the previous fits. The adaptive successive decoder instead achieves relaxation by leaving sections un-decoded on a step if the inner product is not yet above threshold. At any given step the section fit is restricted to be a vertex or 0.

The inventors have conducted additional analysis of convex projection in the case of equal power allocation in each section. An approximation to the projection can be characterized which has largest weight in most sections at the term sent, when the rate R is less than $R_0$; whereas for larger rates the weights of the projection are too spread across the terms in the sections to identify what was sent. To get to the higher rates, up to capacity, one cannot use such convex projection alone. Variable section power may be necessary in the context of such algorithms. It advantageous to conduct a more structured iterative decoding, which is more explicitly targeted to finding vertices, as presented here.

The conclusions concerning communication rate may also be expressed in the language of sparse signal recovery and compressed sensing. A number of terms selected from a dictionary is linearly combined and subject to noise. Suppose a value B is specified for the ratio of the number of variables divided by the number of terms. For signals of the form $X\beta$ with $\beta$ satisfying the design stipulations used here. Recovery of these terms from the received noisy Y of length n is possible provided the number of terms L satisfies $L \geq Rn/\log B$. Equivalently the number of observations sufficient to determine L terms satisfies $n \leq (1/R)L \log B$. In this signal recovery story, the factor 1/R is not arising as reciprocal of rate, but rather as the constant multiplying $L \log N/L$ determining the sample size requirement.

Our results interpreted in this context show for practical recovery that there is the $R<R_0$ limitation in the equal power allocation case. For other power allocations designed here, recovery by other means is possible at higher R up to the capacity $\mathcal{C}$. Thus our practical solution to the communications capacity problem provides also practical solution to the analogous signal recovery problem as well as demonstration of the best constant for signal recovery for a certain behavior of the non-zero coefficients.

These conclusions complement work on sparse signal recovery by Wainwright (*IEEE IT* 2009a,b), Fletcher, Rangan, Goyal (*IEEE IT* 2009), Donoho, Elad, Temlyakov (*IEEE IT* 2006), Candes and Palm (*Ann. Statist.* 2009), Tropp (*IEEE IT* 2006), and Tong Zhang. In summary, their work shows that for reliable determination of L terms from noisy measurements, having the number of such measurements n be of order $L \log B$ is sufficient, and is achieved by various estimator (including convex optimization with an $l_1$ control on the coefficients as in Wainwright and a forward stepwise regression algorithm in Zhang analogous to the greedy algorithms discussed above). There results for signal recovery, when translated into the setting of communications, yield reliable communications with positive rate, by not allowance for rates up to capacity. Wainwright (*IEEE IT* 2009a,b) makes repeated use of information-theoretic techniques including the connection with channel coding, allowing use of Fano's inequality to give converse-like bounds on sparse signal recovery. His work shows, for the designs he permits, that $l_1$ constrained convex optimization does not perform as well as the information-theoretic limits. As said above, the work herein takes it further, identifying the rates achieved in the constant power allocation case, as well as identifying practical strategies that do achieve up to the information-theoretic capacity, for specify variable power allocations.

The ideas of superposition codes, rate splitting, and successive decoding for Gaussian noise channels began with Cover (*IEEE IT* 1972) in the context of multiple-user channels. In that setting what is sent is a sum of codewords, one for each message. Instead the inventors herein are putting that idea to use for the original Shannon single-user problem. The purpose here of computational feasibility is different from the original multi-user purpose which was characterization of the set of achievable rates. The ideas of rate splitting and successive decoding originating in Cover for Gaussian broadcast channels were later developed also for Gaussian multiple-access channels, where in the rate region characterizations of Rimoldi and Urbanke (*IEEE IT* 2001) and of Cao and Yeh (*IEEE IT* 2007) rate splitting is in some cases applied to individual users. For instance with equal size rate splits there are $2^{nR/L}$ choices of code pieces, corresponding to the sections of the dictionary as used here.

So the applicability of superposition of rate split codes for a single user channel has been noted, albeit the rate splitting in the traditional information theory designs have exponential size $2^{nR/L}$ to gain reliability. Feasibility for such channels has been lacking in the absence of demonstration of reliability at high rate with superpositions from polynomial size dictionaries. In contrast success herein is built on the use of sufficiently many pieces (sections) with L of order n to within log factors such the section sizes $B=2^{nR/L}$ become moderate (e.g. also of order n). Now with such moderate B one can not assure reliability of direct successive decoding. As said, to overcome that difficulty, adaptation rather than pre-specification of the set of sections decoded each step is key to the reliability and speed of the decoder invented here.

It is an attractive feature of the superposition based solution obtained herein for the single-user channel that it is amenable to extension to practical solution of the corresponding multi-user channels, namely, the Gaussian multiple access and Gaussian broadcast channel.

Accordingly, the invention is understood to include those aspects of practical solution of Gaussian noise broadcast channels and multiple-access channels that arise directly from combining the single-user style adaptive successive decoder analysis here with the traditional multi-user rate splitting steps.

Outline of Manuscript:

After some preliminaries, section 3 describes the decoder. In Section 4 the distributions of the various test statistics associated with the decoder are analyzed. In particular, the inner product test statistics are shown to decompose into normal random variables plus a nearly constant random shift for the terms sent. Section 5 demonstrates the increase for each step of the mean separation between the statistics for terms sent and terms not sent. Section 6 sets target detection and alarm rates. Reliability of the algorithm is established in section 7, with demonstration of exponentially small error probabilities. Computational illustration is provided in section 8. A requirement of the theory is that the decoder satisfies a property of accumulation of correct detections. Whether the decoder is accumulative depends on the rate and the power allocation scheme. Specialization of the theory to a particular variable power allocation scheme is presented in section 9. The closeness to capacity is evaluated in section 10. Lower bounds on the error exponent are in section 11. Refinements of closeness to capacity are in section 12. Section 13 discusses the use of an outer Reed-Solomon code to correct any mistakes from the inner decoder. The appendix collects some auxiliary matters.

2 Some Preliminaries

Notation:

For vectors a, b of length n, let $\|a\|^2$ be the sum_of squares of coordinates, let $|a|^2=(1/n)\Sigma_{i=1}^{n}a_i^2$ be the average square and let respectively $a^T b$ and $a \cdot b=(1/n)\Sigma_{i=1}^{n}a_i b_i$ be the associated inner products. It is more convenient to work with $|a|$ and $a \cdot b$.

Setting of Analysis:

The dictionary is randomly generated. For the purpose of analysis of average probability of error or average probability of at least certain fraction of mistakes, properties are investigated with respect to the joint distribution of the dictionary and the noise.

The noise $\epsilon$ and the $X_j$ in the dictionary are jointly independent normal random vectors, each of length n, with mean equal to the zero vector and covariance matrixes equal to $\sigma^2 I$ and I, respectively. These vectors have n coordinates indexed by i=1, 2, . . . , n which may be called the time index. Meanwhile J is the set of term indices j corresponding to the columns of the dictionary, which may be organized as a union of sections. The codeword sent is from a selection of L terms. The cardinality of J is N and the ratio B=N/L.

Corresponding to an input, let sent=$\{j_1, j_2, \ldots, j_L\}$ be the indices of the terms sent and let other=J−sent be the set of indices of all other terms in the dictionary. Component powers $P_j$ are specified, such that $\Sigma_{j\,sent}P_j=P$. The simplest setting is to arrange these component powers to be equal $P_j=P/L$. Though for best performance, there will be a role for component powers that are different in different portions of the dictionary. The coefficients for the codeword sent are $\beta_j = \sqrt{P_j} 1_{j\,sent}$. The received vector is $$Y = \sum_j \beta_j X_j + \varepsilon.$$

Accordingly, $X_j$ and Y are joint normal random vectors, with expected product between coordinates and hence expected inner product $\mathbb{E}[X_j \cdot Y]$ equal to $\beta_j$. This expected inner product has magnitude $\sqrt{P_j}$ for the terms sent and 0 for the terms not sent. So the statistics $X_j \cdot Y$ are a source of discrimination between the terms.

Note that each coordinate of Y has expected square $\sigma_Y^2=P+\sigma^2$ and hence $\mathbb{E}[|Y|^2]=P+\sigma^2$.

Exponential Bounds for Relative Frequencies:

In the distributional analysis repeated use is made of simple large deviations inequalities. In particular, if $\hat{q}$ is the relative frequency of occurrence of L independent events with success probability $q^*$, then for $q<q^*$ the probability of the event $\{\hat{q}<q\}$ is not more than the Sanov-Csiszàr bound $e^{-LD(q\|q^*)}$, where the exponent $D(q\|q^*)=D_{Ber}(q\|q^*)$ is the relative entropy between Bernoulli distributions. This information-theoretic bound subsumes the Hoeffding bound $e^{-2(q^*-q)^2 L}$ via the Csiszàr-Kullback inequality that D exceeds twice the square of total variation, which here is, $D \geq 2(q^*-q)^2$. An extension of the information-theoretic bound to cover weighted combinations of indicators of independent events is in Lemma 46 in the appendix and slight dependence among the events is addressed through bounds on the joint distribution. The role of $\hat{q}$ is played by weighted counts for j in sent of test statistics being above threshold.

In the same manner, one has that if $\hat{p}$ is the relative frequency of occurrence of independent events with success probability $p^*$, then for $p>p^*$ the probability of the event $\{\hat{p}>p\}$ has a large deviation bound with exponent $D_{Ber}(p\|p^*)$. In the use here of such bounds, the role of $\hat{p}$ is played by the relative frequency of false alarms, based on occurrences of j in other of test statistics being above threshold. Naturally, in this case, both p and $p^*$ are arranged to be small, with some control on the ratio between them. It is convenient to make use of lower bounds on $D_{Ber}(p\|p^*)$, as detailed in Lemma 47 in the appendix, which include what may be called the Poisson bound $p \log p/p^*+p^*-p$ and the Bellinger bound $2(\sqrt{p}-\sqrt{p^*})^2$, both of which exceed $(p-p^*)^2/(2p)$. All three of these lower bounds are superior to the variation bound $2(p-p^*)^2$ when p is small.

3 The Decoder

From the received Y and knowledge of the dictionary, decode which terms were sent by an iterative procedure now specified more fully.

The first step is as follows. For each term $X_j$ of the dictionary compute the inner product with the received string $X_j^T Y$ as a test statistic and see if it exceeds a threshold $T=\|Y\|\tau$. Denote the associated event $$\mathcal{H}_j=\{X_j^T Y \geq T\}.$$

In terms of a normalized test statistic this first step test is the same as comparing $\mathcal{Z}_{1,j}$ to a threshold $\tau$, where $$\mathcal{Z}_{1,j}=X_j^T Y/\|Y\|,$$

the distribution of which will be shown to be that of a standard normal plus a shift by a nearly constant amount, where the presence of the shift depends on whether $j$ is one of the terms sent. Thus $\mathcal{H}_j=\{\mathcal{Z}_{1,j} \geq \tau\}$. The threshold is chosen to be $$\tau=\sqrt{2\log B}+a.$$

The idea of the threshold on the first step is that very few of the terms not sent will be above threshold. Yet a positive fraction of the terms sent, determined by the size of the shift, will be above threshold and hence will be correctly decoded on this first step.

Let $\text{thresh}_1=\{j \in J: {}^1\mathcal{H}_j=1\}$ be the set of terms with the test statistic above threshold and let $\text{above}_1$ denote the fraction of such terms. In the variable power case it is a weighted fraction $\text{above}_1=\Sigma_{j \in \text{thresh}_1} P_j/P$, weighted by the power $P_j$. The strategy is to restrict decoding on the first step to terms in $\text{thresh}_1$ so as to avoid false alarms. The decoded set is either taken to be $\text{dec}_1=\text{thresh}_1$ or, more generally, a value $\text{pace}_1$ is specified and, considering the terms in $J$ in order of decreasing $\mathcal{Z}_{1,j}$, include in $\text{dec}_1$ as many as can be with $\Sigma_{j \in \text{dec}_1} \pi_j$ not more than $\min\{\text{pace}_1, \text{above}_1\}$. Let $DEC_1$ denote the cardinality of the set $\text{dec}_1$.

The output of the first step consists of the set of decoded terms $\text{dec}_1$ and the vector $F_1=\Sigma_{j \in \text{dec}_1}\sqrt{P_j}X_j$ which forms the first part of the fit. The set of terms investigated in step 1 is $J_1=J$, the set of all columns of the dictionary. Then the set $J_2=J_1-\text{dec}_1$ remains for second step consideration. In the extremely unlikely event that $DEC_1$ is already at least $L$ there will be no need for the second step.

A natural way to conduct subsequent steps would be as follows. For the second step compute the residual vector $$r_2=Y-F_1.$$

For each of the remaining terms, i.e. terms in $J_2$, compute the inner product with the vector of residuals, that is, $X_j^T r_2$ or its normalized form $\mathcal{Z}_j^r=X_j^T r_2/\|r_2\|$ which may be compared to the same threshold $\tau=\sqrt{2\log B}+a$, leading to a set $\text{dec}_2$ of decoded terms for the second step. Then compute $F_2=\Sigma_{j \in \text{dec}_2}\sqrt{P_j}X_j$, the fit vector for the second step.

The third and subsequent steps would proceed in the same manner as the second step. For any step $k$, one computes the residual vector $$r_k=Y-(F_1+\ldots+F_{k-1}).$$

For terms in $J_k=J_{k-1}-\text{dec}_{k-1}$, one gets $\text{thresh}_k$ as the set of terms for which $X_j^T r_k/\|r_k\|$ is above $\tau$. The set of decoded terms is either taken to be $\text{thresh}_k$ or a subset of it. The decoding stops when the size of the cardinality of the set of all decoded term becomes $L$ or there are no terms above threshold in a particular step.

3.1 Statistics from Adaptive Orthogonal Components:

A variant of the above algorithm from second step onwards is described, which is found here to be easier to analyze. The idea is that the ingredients $Y, F_1, \ldots, F_{k-1}$ previously used in forming the residuals may be decomposed into orthogonal components and test statistics formed that entail the best combinations of inner products with these components.

In particular, for the second step the vector $G_2$ is formed, which is the part of $F_1$ orthogonal to $G_1=Y$. For $j$ in $J_2$, the statistic $\mathcal{Z}_{2,j}=X_j^T G_2/\|G_2\|$ is computed as well as the combined statistic $\mathcal{Z}_{2,j}^{comb}=\sqrt{\lambda_1}\mathcal{Z}_{1,j}-\sqrt{\lambda_2}\mathcal{Z}_{2,j}$, where $\lambda_1=1-\lambda$ and $\lambda_2=\lambda$, with a value of $\lambda$ to be specified. What is different on the second step is that now the events $\mathcal{H}_{2,j}=\{\mathcal{Z}_{2,j}^{comb} \geq \tau\}$ are based on these $\mathcal{Z}_{2,j}^{comb}$, which are inner products of $X_j$ with the normalized vector $E_2=\sqrt{\lambda_1}Y/\|Y\|-\sqrt{\lambda_2}G_2/\|G_2\|$. To motivate these statistics note the residuals $r_2=Y-F_1$ may be written as $(1-\hat{b}_1)Y-G_2$ where $\hat{b}_1=F_1^T Y/\|Y\|^2$. The statistic used in this variant may be viewed as approximations to the corresponding statistics based on the normalized residuals $r_2/\|r_2\|$, except that the form of $\lambda$ and the analysis are simplified.

Again these test statistics $\mathcal{Z}_{2,j}^{comb}$ lead to the set $\text{thresh}_2=\{j \in J_2: {}^1\mathcal{H}_{2,j}=1\}$ of size $\text{above}_2=\Sigma_{j \in \text{thresh}_2}\pi_j$. Considering these statistics in order of decreasing value, it leads to the set $\text{dec}_2$ consisting of as many of these as can be while maintaining $\text{accept}_2 \leq \min\{\text{pace}_2, \text{above}_2\}$, where $\text{accept}_2=\Sigma_{j \in \text{dec}_2}\pi_j$. This provides an additional part of the fit $F_2=\Sigma_{j \in \text{dec}_2}\sqrt{P_j}X_j$.

Proceed in this manner, iteratively, to perform the following loop of calculations, for $k \geq 2$. From the output of step $k-1$, there is available the vector $F_{k-1}$, which is a part of the fit, and for $k'<k$ there are previously stored vectors $G_{k'}$ and statistics $\mathcal{Z}_{k',j}$. Plus there is a set $\text{dec}_{1,k-1}=\text{dec}_1 \cup \ldots \cup \text{dec}_{k-1}$ already decoded on some previous step and a set $J_k=J-\text{dec}_{1,k-1}$ of terms for is to test at step $k$. Consider, as discussed further below, the part $G_k$ of $F_{k-1}$ orthogonal to the previous $G_{k'}$ and for each $j$ not in $\text{dec}_{k-1}$ compute $$\mathcal{Z}_{k,j}=X_j^T G_k/\|G_k\|$$

and the combined statistic $$\mathcal{Z}_{k,j}^{comb}=\sqrt{\lambda_{1,k}}\mathcal{Z}_{1,j}-\sqrt{\lambda_{2,k}}\mathcal{Z}_{2,j}-\ldots-\sqrt{\lambda_{k,k}}\mathcal{Z}_{k,j},$$

where these $\lambda$ will be specified with $\Sigma_{k'=1}^{k}\lambda_{k',k}=1$. These positive weights will take the form $\lambda_{k',k}=w_{k'}/s_k$, with $w_1=1$, and $s_k=1+w_2+\ldots w_k$, with $w_k$ to be specified. Accordingly, the combined statistic may be computed by the update comb $$\mathcal{Z}_{k,j}^{comb}=\sqrt{1-\lambda_k}\mathcal{Z}_{k-1,j}^{comb}-\sqrt{\lambda_k}\mathcal{Z}_{k,j},$$

where $\lambda_k=w_k/s_k$. This statistic may be thought of as the inner product of $X_j$ with a vector updated as $E_k=\sqrt{1-\lambda_k}E_{k-1}-\sqrt{\lambda_k}G_k/\|G_k\|$, serving as a surrogate for $r_k/\|r_k\|$. For terms $j$ in $J_k$ these statistics $\mathcal{Z}_{k,j}^{comb}$ are compared to a threshold, leading to the events $$\mathcal{H}_{k,j}=\{\mathcal{Z}_{k,j}^{comb} \geq \tau\}.$$

The idea of these steps is that, as quantified by an analysis of the distribution of the statistics $\mathcal{Z}_{k,j}$, there is an increasing separation between the distribution for terms $j$ sent and the others.

Let $\text{thresh}_k=\{j \in J_k: \mathcal{Z}_{k,j}^{comb} \geq \tau_k\}$ and $\text{above}_k=\Sigma_{j \in \text{thresh}k}\pi_j$ and for a specified $\text{pace}_k$, considering these test statistics in order of decreasing value, include in $\text{dec}_k$ as many as can be with $\text{accept}_k \leq \min\{\text{pace}_k, \text{above}_k\}$, where $\text{accept}_k=\Sigma_{j \in \text{dec}_k}\pi_j$. The output of step $k$ is the vector $$F_k = \sum_{j \in \text{dec}_k} \sqrt{P_j}\, X_j.$$

Also the vector $G_k$ and the statistics $\mathcal{Z}_{k,j}$ are appended to what was previously stored, for all terms not in the decoded set. From this step update is provided to the set of decoded terms $\text{dec}_{1,k}=\text{dec}_{k-1} \cup \text{dec}_k$ and the set $J_{k+1}=J_k-\text{dec}_k$ of terms remaining for consideration.

This completes the actions of step k of the loop.

To complete the description of the decoder, the values of $w_k$ that determine the $\lambda_k$ will need to be specified and likewise $pace_k$ is to be specify. For these specifications there will be a role for measures of the accumulated size of the detection set $accept_k^{tot} = \Sigma_{k'=1}^{k} accept_{k'}$ as well a target lower bound $q_{1,k}$ on the total weighted fraction of correct detection (the definition of which arises in a later section), and an adjustment to it given by $q_{1,k}^{adj} = q_{1,k}/(1+f_{1,k}/q_{1,k})$ where $f_{1,k}$ is a target upper bound on the total weighted fraction of false alarms. The choices considered here take $w_k = s_k - s_{k-1}$ to be increments of the sequence $s_k = 1/(1 - x_{k-1}v)$ that arises in characterizing the above mentioned separation. In the definition of $w_k$ the $x_{k-1}$ is taken to be as either $accept_{k-1}^{tot}$ or $q_{1,k-1}^{adj}$, both of which arise as surrogates to a corresponding unobservable quantity which would require knowledge of the actual fraction of correct detection through step k−1.

There are two options for $pace_k$ that are described. First, one may arrange for $dec_k$ to be all of $thresh_k$ by setting $pace_k = 1$, large enough that it has essentially no role, and with this option the $w_k$ is set as above using $x_{k-1} = accept_{k-1}^{tot}$. This choice yields a successful growth of the total weighted fractions of correct detections, though to handle the empirical character of $w_k$ there is a slight cost to it in the reliability bound, not present with the second option.

For the second option, let $pace_k = q_{1,k}^{adj} - q_{1,k-1}^{adj}$ be the deterministic increments of the increasing sequence $q_{1,k}^{adj}$, with which it is shown that $above_k$ is likely to exceed $pace_k$, for each k. When it does then $accept_k$ equals the value $pace_k$, and cumulatively their sum $accept_k^{tot}$ matches the target $q_{1,k}^{adj}$. Likewise, for this option, $w_k$ is set using $x_{k-1} = q_{1,k-1}^{adj}$. It's deterministic trajectory facilitates the demonstration of reliability of the decoder.

On each step k the decoder uncovers a substantial part of what remains, because of growth of the mean separation between terms sent and the others, as shall be seen.

The algorithm stops under the following conditions. Natural practical conditions are that L terms have been decoded, or that the weighted total size of the decoded set $accept_k^{tot}$ has reached at least 1, or that no terms from $J_k$ are found to have statistic above threshold, so that $F_k$ is zero and the statistics would remain thereafter unchanged. An analytical condition is the lower bound that will be obtained on the likely mean separation stops growing (captured through $q_{1,k}^{adj}$ no longer increasing), so that no further improvement is theoretically demonstrable by such methodology. Subject to rate constraints near capacity, the best bounds obtained here occur with a total number of steps m equal to an integer part of 2+snr log B.

Up to step k, the total set of decoded terms is $dec_{1,k}$, and the corresponding fit $fit_k$ may be represented either as $\Sigma_{j \in dec_{1,k}} \sqrt{P_j} X_j$ or as the sum of the pieces from each step $$fit_k = F_1 + F_2 + \ldots + F_k.$$

As to the part $G_k$ of $F_{k-1}$ orthogonal to $G_{k'}$ for k'<k, take advantage of two ways to view it, one emphasizing computation and the other analysis.

For computation, work directly with parts of the fit. The $G_1$, $G_2$, ..., $G_{k-1}$ are orthogonal vectors, so the parts of $F_{k-1}$ in these directions are $\hat{b}_{k,k'} G_{k'}$ with coefficients $\hat{b}_{k,k'} = F_{k-1}^T G_{k'} / \|G_{k'}\|^2$ for k'=1, 2, ..., k−1, where if peculiarly $\|G_{k'}\| = 0$ use $\hat{b}_{k,k'} = 0$. Accordingly, the new $G_k$ may be computed from $F_{k-1}$ and the previous $G_{k'}$ with k'<k by $$G_k = F_{k-1} - \sum_{k'=1}^{k-1} \hat{b}_{k,k'} G_{k'}.$$

This computation entails the n-fold sums of products $F_k^T G_{k'}$ for determination of the $\hat{b}_{k,k'}$. Then from this computed $G_k$ obtain the inner products with the $X_j$ to yield $\mathcal{Z}_{k,j} = X_j^T G_k / \|G_k\|$ for j in $J_k$.

The algorithm is seen to perform an adaptive Gram-Schmidt orthogonalization, creating orthogonal vectors $G_k$ used in representation of the $X_j$ and linear combinations of them, in directions suitable for extracting statistics of appropriate discriminatory power, starting from the received Y. For the classical Gram-Schmidt process, one has a pre-specified set of vectors which are successively orthogonalized, at each step, by finding the part of the current vector that is orthogonal to the previous vectors. Here instead, for each step, the vector $F_{k-1}$, for which one finds the part $G_k$ orthogonal to the vectors $G_1, \ldots, G_{k-1}$, is not pre-specified. Rather, it arises from thresholding statistics extracted in creating these vectors.

For analysis, look at what happens to the representation of the individual terms. Each term $X_j$ for $j \in J_{k-1}$ has the decomposition $$X_j = \mathcal{Z}_{1,j} \frac{G_1}{\|G_1\|} + \mathcal{Z}_{2,j} \frac{G_2}{\|G_2\|} + \ldots + \mathcal{Z}_{k-1,j} \frac{G_{k-1}}{\|G_{k-1}\|} + V_{k,j},$$

where $V_{k,j}$ is the part of $X_j$ orthogonal to $G_1, G_2, \ldots, G_{k-1}$. Since $$F_{k-1} = \sum_{j \in dec_{k-1}} \sqrt{P_j} X_j$$

it follows that $G_k$ has the representation $$G_k = \sum_{j \in dec_{k-1}} \sqrt{P_j} V_{k,j},$$

from which $\mathcal{Z}_{k,j} = V_{k,j}^T G_k / \|G_k\|$, and one has the updated representation $$X_j = \mathcal{Z}_{1,j} \frac{G_1}{\|G_1\|} + \ldots + \mathcal{Z}_{k-1,j} \frac{G_{k-1}}{\|G_{k-1}\|} + \mathcal{Z}_{k,j} \frac{G_k}{\|G_k\|} + V_{k+1,j}.$$

With the initialization $V_{0,j} = X_j$, these $V_{k+1,j}$ may be thought of as iteratively obtained from the corresponding vectors at the previous step, that is, $$V_{k+1,j} = V_{k,j} - \mathcal{Z}_{k,j} G_k / \|G_k\|.$$

These V do not actually need to be computed, nor do its components detailed below, but this representation of the terms $X_j$ is used in obtaining distributional properties of the $\mathcal{Z}_{k,j}$.

3.2 The Weighted Fractions of Detections and Alarms:

The weights $\pi_j = P_j/P$ sum to 1 across in sent and they sum to B−1 across j in other. Define in general $$\hat{q}_k = \sum_{j \in sent \cap dec_k} \pi_j$$

for the step k correct detections and $$\hat{f}_k = \sum_{j \in other \cap dec_k} \pi_j$$

for the false alarms. In the case $P_j = P/L$ which assigns equal weight $\pi_j = 1/L$, then $\hat{q}_k L$ is the increment to the number of correct detections on step k, likewise $\hat{f}_k L$ is the increment to the number of false alarms. Their sum $accept_k = \hat{q}_k + \hat{f}_k$ matches $\sum_{j \in dec_k} \pi_j$.

The total weighted fraction of correct detections up to step k is $\hat{q}_k^{tot} = \sum_{j \in sent \cap dec_{1,k}} \pi_j$ which may be written as the sum $$\hat{q}_k^{tot} = \hat{q}_1 + \hat{q}_2 + \ldots + \hat{q}_k.$$

Assume for now that $dec_k = thresh_k$. Then these increments $\hat{q}_k$ equal $\sum_{j \in sent \cap J_k} \pi_j 1_{\mathcal{H}_{k,j}}$ The decoder only encounters these $\mathcal{H}_{k,j} = \{\mathcal{Z}_{k,j}^{comb} > \tau\}$ for j not decoded on previous steps, i.e., for j in $J_k = (dec_{1,k-1})^c$. For each step k, one may define the statistics arbitrarily for j in $dec_{1,k-1}$, so as to fill out definition of the events $\mathcal{H}_{k,j}$ for each j, in a manner convenient for analysis. By induction on k, on sees that $dec_{1,k}$ consists of the terms j for which the union event $\mathcal{H}_{1,j} \cup \ldots \cup \mathcal{H}_{k,j}$ occurs. Because if $dec_{1,k-1} = \{j: 1_{\mathcal{H}_{1,j} \cup \ldots \cup \mathcal{H}_{k-1,j}} = 1\}$ then the decoded set $dec_{1,k}$ consists of terms for which either $\mathcal{H}_{1,j} \cup \ldots \cup \mathcal{H}_{k-1,j}$ occurs (previously decoded) or $\mathcal{H}_{k,j} \cup [\mathcal{H}_{1,j} \cup \ldots \cup \mathcal{H}_{k-1,j}]^c$ occurs (newly decoded), and together these events constitute the union $\mathcal{H}_{1,j} \cup \ldots \cup \mathcal{H}_{k,j}$.

Accordingly, the total weighted fraction of correct detection $\hat{q}_k^{tot}$ may be regarded as the same as the $\pi$ weighted measure of the union $$\hat{q}_k^{tot} = \sum_{j\, sent} \pi_j 1_{\{\mathcal{H}_{1,j} \cup \ldots \cup \mathcal{H}_{k,j}\}}.$$

Indeed, to relate this expression to the preceding expression for the stun for $\hat{q}_k^{tot}$, the sum for k' from 1 to k corresponds to the representation of the union as the disjoint union of contributions from terms sent that are in $\mathcal{H}_{k',j}$ but not in earlier such events.

Likewise the weighted count of false alarms $\hat{f}_k^{tot} = \sum_{j \in other \cup dec_{1,k}} \pi_j$ may be written as $$\hat{f}_k^{tot} = \hat{f}_1 + \hat{f}_2 + \ldots + \hat{f}_k$$

which when $dec_k = thresh_k$ may be expressed as $$\hat{f}_k^{tot} = \sum_{j\, other} \pi_j 1_{\{\mathcal{H}_{1,j} \cup \ldots \cup \mathcal{H}_{k,j}\}}.$$

In the distributional analysis that follows the mean separation is shown to be given by an expression inversely related to $1 - \hat{q}_{k-1}^{tot} v$. The idea of the multi-step algorithm is to accumulate enough correct detections in $\hat{q}_k^{tot}$, with an attendant low number of false alarms, that the fraction that remains becomes small enough, and the mean separation hence pushed large enough, that most of what remains is reliably decoded on the last step.

The analysis will provide, for each section l, lower bounds on the probability that the correct term is above threshold by step k and upper-bounds on the accumulated false alarms. When the snr is low and a constant power allocation is used, these probabilities are the same across the sections, all of which remain active for consideration until completion of the steps.

For variable power allocation, with $P_{(l)}$ decreasing in l, then for each step k, the probability that the correct term is above threshold varies with l. Nevertheless, it can be a rather large number of sections for which this probability takes an intermediate value (neither small nor close to one), thereby necessitating the adaptive decoding. Most of the analysis here proceeds by allowing at each step for terms to be detected from any section l=1, 2, . . . , L.

3.3 An Optional Analysis Window:

For large C, the $P_{(l)}$ proportional to $e^{-2Cl/L}$ exhibits a strong decay with increasing l. Then it can be appropriate to take advantage of a deterministic decomposition into three sets of sections at any given number of steps. There is the set of sections with small l, which called polished, where the probability of the correct term above threshold before step k is already sufficiently close to one that it is known in advance that it will not be necessary to continue to check these (as the subsequent false alarm probability would be quantified as larger than the small remaining improvement to correct detection probability for that section). Let $polished_k$ (initially empty) be the set of terms in these sections. With the power decreasing, this coincides with a non-decreasing initial interval of sections.

Likewise there are the sections with large l where the probability of a correct detection on step k is less than the probability of false alarm, so it would be advantageous to still leave them untested. Let $untested_k$ (desirably eventually empty) be the set of terms from these sections, corresponding to a decreasing tail interval of sections up to the last section L.

The complement is a middle region of terms $$potential_k = J - polished_k - untested_k,$$

corresponding to a window of sections, $left_k \leq l \leq right_k$, worthy of attention in analyzing the performance at step k. For each term in this analysis window there is a reasonable chance (neither too high nor too low) of it being decoded by the completion of this step.

These middle regions overlap across k, so that for any term j has potential for being decoded in several steps.

In any particular realization of X, Y, some terms in this set $potential_k$ are already in $dec_{1,k-1}$. Accordingly, one has the option at step k to restrict the active set of the search to $J_k = potential_k \cup dec_{1,k-1}^c$ rather than searching all of the set $dec_{1,k-1}^c$ not previously decoded. In this case one modifies the definitions of $\hat{q}_k^{tot}$ and $\hat{f}_k^{tot}$, to be $$\hat{q}_k^{tot} = \sum_{j\, sent} \pi_j 1_{\left\{\bigcup_{k' \in K_{j,k}} \mathcal{H}_{k',j}\right\}}$$

and $$\hat{f}_k^{tot} = \sum_{j\, other} \pi_j 1_{\left\{\bigcup_{k' \in K_{j,k}} \mathcal{H}_{k',j}\right\}}$$

-continued where $K_{j,k} = \{k' \leq k: j \in \text{potential}_{k'}\}$.

This refinement allows for analysis to show reduction in the total false alarms and corresponding improvement to the rate drop from capacity, when C is large.

4 Distributional Analysis

In this section the distributional properties of the random variables $\mathcal{H}_k = (\mathcal{H}_{k,j}: j \in J_k)$ for each $k=1, 2, \ldots, n$ are described. In particular it is shown for each k that $\mathcal{H}_{k,j}$ are location shifted normal random variables with variance near one for $j \in \text{sent} \cup J_k$ and are independent standard normal random variables for $j \in \text{other} \cup J_k$.

In Lemma 1 below the distributional properties of $\mathcal{H}_1$ are derived. Lemma 2 characterizes the distribution of $\mathcal{H}_k$ for steps $k \geq 2$.

Before providing these lemmas a few quantities are defined which will be helpful in studying the location shifts of $\mathcal{Z}_{k,j}$ for $j \in \text{sent} \cup J_k$. In particular, define the quantity $C_{j,R} = \pi_j L v/(2R)$, where $\pi_j = P_j/P$ and $v = v_1 = P/(\sigma^2 + P)$. Likewise define $C_{j,R,B} = (C_{j,R}) 2 \log B$, which also has the representation $C_{j,R,B} = n\pi_j v$.

The role of this quantity as developed below is via the location shift $\sqrt{C_{j,R,B}}$ seen to be near $\sqrt{C_{j,R}} \tau$. One compares this value to $\tau$, that is, one compares $C_{j,R}$ to 1 to see when there is a reasonable probability of some correct detections starting at step 1, and one arranges $C_{j,R}$ to taper not too rapidly to allow decodings to accumulate on successive steps.

Recalling that $\pi_j = \pi_{(j)} = P_{(j)}/P$ for $j$ in section 1, also denote the quantities defined above as $C_{l,R} = \pi_{(l)} L v/(2R)$ and $c_{l,R,B} = C_{l,R}(2 \log B)$ which is $n\pi_{(l)} v$.

Here are two illustrative cases. For the constant power allocation case, $\pi_{(l)}$ equals $1/L$ and $C_{l,R}$ reduces to $C_{l,R} = R_0/R$, where $R_0 = (½)P/(\sigma^2 + P)$. This $C_{l,R}$ is at least 1 when the rate R is not more than $R_0$.

For the case of power $P_{(l)}$ proportional to $e^{-2C\ell/L}$, the value becomes $\pi_{(l)} = e^{-2C(\ell-1)/L}(1 - e^{-2C/L})/(1 - e^{-2C})$ for 1 from 1 to L. Define $\tilde{C} = (L/2)[1 - e^{-2C/L}]$, which is essentially identical to $C$, for L large compared to C. Then $\pi_{(l)} = (2 \tilde{C}/Lv) e^{-2C(\ell-1)/L}$ and $C_{l,R} = (\tilde{C}/R) e^{-2C(\ell-1)/L}$.

For rates R not more than $\mathcal{C}$, this $C_{l,R}$ is at least 1 in some sections, leading to likelihood of some initial successes, and it tapers at the fastest rate at which decoding successes can still accumulate.

4.1 Distributional Analysis of the First Step:

The lemma for the distribution of $\mathcal{Z}_1$ is now given. Recall that $J_1 = J$ is the set of all N indices.

Lemma 1.

For each $j \in J_1$, the statistic $\mathcal{Z}_{1,j}$ can be represented as $\sqrt{C_{j,R,B}} [\chi_n/\sqrt{n}] 1_{j \text{ sent}} + Z_{1,j}$, where $Z_1 = (Z_{1,j}: j \in J_1)$ is multivariate normal $N(0, \Sigma_1)$ and $\chi_n^2 = \|Y\|^2/\sigma_Y^2$ is a Chi-square (n) random variable that is independent of $Z_1$. Here recall that $\sigma_Y^2 = P + \sigma^2$ is the variance of each coordinate of Y.

The covariance matrix $\Sigma_1$ can be expressed as $\Sigma_1 = I - b_1 b_1^T$, where $b_1$ is the vector with entries $b_{1,j} = \beta_j/\sigma_Y$ for $j$ in J.

The subscript 1 on the matrix $\Sigma_1$ and the vector $b_1$ are to distinguish these first step quantities from those that arise on subsequent steps.

Demonstration of Lemma 1:

Recall that the $X_j$ for $j$ in J are independent $N(0, I)$ random vectors and that $Y = \Sigma_j \beta_j X_j + \epsilon$, where the sum of squares of the $\beta_j$ is equal to P.

Consider the decomposition of each random vector $X_j$ of the dictionary into a vector in the direction of the received Y and a vector $U_j$ uncorrelated with Y. That is, one considers the reverse regression $X_j = b_{1,j} Y/\sigma_Y + U_j$, where the coefficient is $b_{1,j} = \mathbb{E}[X_{i,j} Y_i]/\sigma_Y = \beta_j/\sigma_Y$, which indeed makes each coordinate of $U_j$ uncorrelated with each coordinate of Y. These coefficients collect into a vector $b_1 = \beta/\sigma_Y$ in $\mathbb{R}^N$.

These vectors $U_j = X_j - b_{1,j} Y/\sigma_Y$ along with Y are linear combinations of joint normal random variables and so are also joint normal, with zero correlation implying that Y is independent of the collection of $U_j$. The independence of Y and $U_j$ facilitates development of distributional properties of the $U_j^T Y$. For these purposes obtain the characteristics of the joint distribution of the $U_j$ across terms j (clearly there is independence for distinct time indices i).

The coordinates of $U_j$ and $U_{j'}$ have mean zero and expected product $1_{\{j=j'\}} - b_{1,j} b_{1,j'}$. These covariances ($\mathbb{E}[U_{i,j} U_{j,j'}]$: $j, j' \in J$) organize into a matrix $\Sigma_1 = \Sigma = I - \Delta = I - bb^T$.

For any constant vector $\alpha \neq 0$, consider $U_j^T \alpha/\|\alpha\|$. Its joint normal distribution across terms j is the same for any such $\alpha$. Specifically, it is a normal $N(0, \Sigma)$, with mean zero and the indicated covariances.

Likewise define the random variables $Z_j = U_j^T Y/\|Y\|$, also denoted $Z_{1,j}$ when making explicit that it is for the first step. Jointly across j, these $Z_j$ have the normal $N(0, \Sigma)$ distribution, independent of Y. Indeed, since the $U_j$ are independent of Y, when conditioned on $Y = \alpha$ one gets the same $N(0, \rho)$ distribution, and since this conditional distribution does not depend on Y, it is the unconditional distribution as well.

What this leads to is revealed via the representation of the inner product $N_j^T Y$ as $b_{1,j} \|Y\|^2/\sigma_Y + U_j^T Y$, which can be written as $$X_j^T Y = \beta_j \frac{\|Y\|^2}{\sigma_Y^2} + \|Y\| Z_j.$$

This identifies the distribution of the $X_j^T Y$ as that obtained as a mixture of the normal $Z_j$ with scale and location shifts determined by an independent random variable $\chi_n^2 = \|Y\|^2/\sigma_Y^2$, distributed as Chi-square with n degrees of freedom.

Divide through by $\|Y\|$ to normalize these inner products to a helpful scale and to simplify the distribution of the result to be only that of a location mixture of normals. The resulting random variables $\mathcal{Z}_{1,j}=X_j^T Y/\|Y\|$ take the form $$\mathcal{Z}_{1,j}=\sqrt{n}b_{1,j}|Y|/\sigma_Y+Z_j,$$

where $|Y|/\sigma_Y=\chi_n/\sqrt{n}$ is near 1. Note that $\sqrt{n}b_{1,j}=\sqrt{n}\beta_j/\sigma_Y$ which is $\sqrt{n\pi_j}v$ or $\sqrt{C_{j,R,B}}$. This completes the demonstration of Lemma 1.

The above proof used the population reverse regression of $X_j$ onto Y, in which the coefficient $b_{1,j}$ arises as a ratio of expected products. There is also a role for the empirical projection decomposition, the first step of which is $X_j=\mathcal{Z}_{1,j}Y/\|Y\|+V_{2,j}$, with $G_1=Y$. Its additional steps provide the basis for additional distributional analysis.

4.2 Distributional Analysis of Steps k≥2:

Let $V_{k,j}$ be the part of $X_j$ orthogonal to $G_1, G_2, \ldots, G_{k-1}$, from which $G_k$ is obtained as $\Sigma_{j\in dec_{k-1}}\sqrt{P_j}V_{k,j}$. It yields the representation of the statistic $\mathcal{Z}_{k,j}=X_j^T G_k/\|G_k\|$ as $V_{k,j}^T G_k/\|G_k\|$, as said. Amongst other matters, the proof of the following lemma determines, for $j\in J_k$, the ingredients of the regression $V_{k,j}=b_{k,j}G_k/\sigma_k+U_{k,j}$ in which $U_{k,j}$ is found to be a mean zero normal random vector independent of $G_k$, conditioning on certain statistics from previous steps. Taking the inner product with the unit vector $G_k/\|G_k\|$ yields a representation of $\mathcal{Z}_{k,j}$ as a mean zero normal random variable $Z_{k,j}$ plus a location shift that is a multiple of $\|G_k\|$ depending on whether j is in sent or not. The definition of $Z_{k,j}$ is $U_{k,j}^T G_k/\|G_k\|$.

Here the pattern used in Lemma 1 is maintained, using the calligraphic font $\mathcal{Z}_{k,j}$ to denote the test statistics that incorporate the shift for j in sent and using the standard font $Z_{k,j}$ to denote their counterpart mean zero normal random variables before the shift.

The lemma below characterizes the sequence of conditional distributions of the $Z_k=(Z_{k,j}: j\in J_k)$ and $\|G_k\|$, given $\mathcal{F}_{k-1}$, for $k=1, 2, \ldots n$, where $$\mathcal{F}_{k-1}=(\|G_{k'}\|, Z_{k'}: k'=1, \ldots, k-1).$$

This determines also the distribution of $\mathcal{Z}_k=(\mathcal{Z}_{k,j}: j\in J_k)$ conditional on $\mathcal{F}_{k-1}$. Initializing with the distribution of $\mathcal{Z}_1$ derived in Lemma 1, the conditional distributions for all 2≤k≤n, are provided. The algorithm will be arranged to stop long before n, so these properties are needed only up to some much smaller final k=m. Note that $J_k$ is never empty because at most L are decoded, so there must always be at least (B−1)L remaining. For an index set which may depend on the conditioning variables, let $N_{J_k}(0,\Sigma)$ denote a mean zero multivariate normal distribution with index set $J_k$ and the indicated covariance matrix.

Lemma 2.

For k≥2, given $\mathcal{F}_{k-1}$, the conditional distribution $\mathbb{P}_{Z_k|\mathcal{F}_{k-1}}$ of $Z_k=(Z_{k,j}: j\in J_k)$ is normal $N_{J_k}(0,\Sigma_k)$; the random variable $\chi_{d_k}^2\|G_k\|^2/\sigma_k^2$ is a Chi-square distributed, with $d_k=n-k+1$ degrees of freedom, conditionally independent of the $Z_k$, where $\sigma_k^2$ depends on $\mathcal{F}_{k-1}$ and is strictly positive provided there was at least one term above threshold on step k−1; and, moreover, $\mathcal{Z}_{k,j}$ has the representation $$-\sqrt{\hat{w}_k C_{j,R,B}}[\chi_{d_k}/\sqrt{n}]1_{j\,sent}+Z_{k,j}.$$

The shift factor $\hat{w}_k$ is the increment $\hat{w}_k=\hat{s}_k-\hat{s}_{k-1}$, of the series $\hat{s}_k$ with $$1+\hat{w}_2+\ldots+\hat{w}_k=\hat{s}_k=\frac{1}{1-(\hat{q}_1^{adj}+\ldots+\hat{q}_{k-1}^{adj})v}$$

where $\hat{q}_j^{adj}=\hat{q}_j/(1+\hat{f}_j/\hat{q}_j)$, determined from weighted fractions of correct detections and false alarms on previous steps. Here $\hat{s}_1=\hat{w}_1=1$. The $\hat{w}_k$ is strictly positive, that is, $\hat{s}_k$ is increasing, as long as $\hat{q}_{k-1}>0$, that is, as long as the preceding step had at least one correct term above threshold. The covariance $\Sigma_k$ has the representation $$93_k=I-\delta_k\delta_k^T=I-v_k\beta^{\sim T}/P$$

where $v_k=\hat{s}_k v$, $(\Sigma_k)_{j,j'}=1_{j=j'}-\delta_{k,j}\delta_{k,j'}$, for j, j', in $J_k$, where the vector $\delta_k$ is in the direction $\beta$, with $\delta_{k,j}=\sqrt{v_k P_j/P}1_{j\,sent}$ for j in $J_k$. Finally, $$\sigma_k^2=\frac{\hat{s}_{k-1}}{\hat{s}_k}\text{accept}_{k-1}P$$

where $\text{accept}_k=\Sigma_{j\in dec_k}\pi_j$ is the size of the decoded set on step k.

The demonstration of this lemma is found in the appendix section 14.1. It follows the same pattern as the demonstration of Lemma 1 with some additional ingredients.

4.3 The Nearby Distribution:

Two joint probability measures $\mathbb{Q}$ and $\mathbb{P}$ are now specified for all the $Z_{k,j}$, $j\in J$ and the $\|G_k\|$ for $k=1, \ldots m$. For $\mathbb{P}$, it is to have the conditionals $\mathbb{P}_{Z_{k,J_k}|\mathcal{F}_{k-1}}$ specified above.

The $\mathbb{Q}$ is the approximating distribution. Choose $\mathbb{Q}$ to make all the $Z_{k,j}$, for $j\in J$, for $k=1, 2, \ldots, m$, be independent standard normal, and like $\mathbb{P}$, choose $\mathbb{Q}$ to make the $\chi_{n-k+1}^2=\|G_k\|^2/\sigma_k^2$ be independent Chi-square(n−k+1) random variables.

Fill out of specification of the distribution assigned by $\mathbb{P}$, via a sequence of conditionals $\mathbb{P}_{Z_{k,J}|\mathcal{F}_{k-1}^{full}}$ for $Z_{k,J}=(Z_{k,j}: j\in J)$, which is for all j in J, not just for j in $J_k$. Here $\mathcal{F}_k^{full}=(\|G_k\|, Z_{k',J}: k'=1, 2, \ldots, k)$. For the variables $Z_{k,J_k}$ that actually used, the conditional distribution is that of $\mathbb{P}_{Z_{k,J_k}|\mathcal{F}_{k-1}}$ as specified in the above Lemma. Whereas for the $Z_{k,j}$ with j in the already decoded set $J-J_k=\text{dec}_{1,k-1}$, given $\mathcal{F}_{k-1}$, it is convenient to arrange them to have the same independent standard normal as is used by $\mathbb{Q}$. This completes the definition of the $Z_{k,j}$ for all j, and with it one likewise extends the definition of $\mathcal{Z}_{k,j}$ as a function of $Z_{k,j}$ and $\|G_k\|$ and completes the definition of the events $\mathcal{H}_{k,j}$ for all j, used in the analysis.

This choice of independent standard normal for the distribution of $Z_{k,j}$ given $\mathcal{F}_{k-1}$ for j in $\text{dec}_{1,k-1}$, is contrary to what would have arisen in the proof of 2 from the inner product of $U_{k,j}$ with $G_k/\|G_k\|$ if there one were to have looked there at such j with $1_{\mathcal{H}_{k',j}}=1$ for earlier k'<k. Nevertheless, as said, there is freedom of choice of the distribution of these variables not used by the decoder. The present choice is a simpler extension providing a conditional distribution of $(Z_{k,j}: j\in J)$ that shares the same marginalization to the true distribution of $(Z_{k,j}: j\in J_k)$ given $\mathcal{F}_{k-1}$.

An event A is said to be determined by $\mathcal{F}_k$ if its indicator is a function of $\mathcal{F}_k$. As $\mathcal{F}_k=(\chi_{n-k'+1}, Z_{k'+1}, Z_{k',J_{k'}}: k'\leq k)$, with a random index set $J_k$ given as a function of preceding $\mathcal{F}_{k-1}$, it might be regarded as a tricky matter. Alternatively a random variable may be said to be determined by $\mathcal{F}_k$ if it is measurable with respect to the collection of random variables ($\|G_{k'}\|$, $Z_{k',j}1_{\{j\in dec_{1,k'-1}^c\}}$, $j\in J$, $1\leq k'\leq k$). The multiplication by the indicator removes the effect on step k' of any $Z_{k',j}$ decoded on earlier steps, that is, any j outside $J_{k'}$. Operationally, no advanced measure-theoretic notions are required, as the sequences of conditional densities being worked have explicit Gaussian form.

In the following lemma appeal to a sense of closeness of the distribution $\mathbb{P}$ to $\mathbb{Q}$, such that events exponentially unlikely under $\mathbb{Q}$ remain exponentially unlikely under the governing measure $\mathbb{P}$.

Lemma 3.

For any event A determined by $\mathcal{F}_k$, $$\mathbb{P}[A] \leq \mathbb{Q}[A]e^{kc_0},$$

where $c_0=(\frac{1}{2})\log(1+P.\sigma^2)$. The analogous statement holds more generally for the expectation of any non-negative function of $\mathcal{F}_k$.

See the appendix, subsection 14.2, for the proof. The fact that $c_0$ matches the capacity $\mathcal{C}$ might be interesting, but it is not consequential to the argument. What matters for us is simply that if $\mathbb{Q}[A]$ is exponentially small in L or n, then so is $\mathbb{P}[A]$.

4.4 Logic in Bounding Detections and False Alarms:

Simple logic concerning unions plays an important simplifying role in the analysis here to lower bound detection rates and to upper bound false alarms. The idea is to avoid the distributional complication of stuns restricted to terms not previously above threshold.

Here assume that $dec_k=thresh_k$ each step. Section 7.2 discusses an alternative approach where $dec_k$ is taken to be a particular subset of $thresh_k$, to demonstrate slightly better reliability bounds for given rates below capacity.

Recall that with $\hat{q}_k = \sum_{j\,sent \cap J_k} \pi_j 1_{\mathcal{H}_{k,j}}$ as the increment of weighted fraction of correct detections, the total weighted fraction of correct detections $\hat{q}_k^{tot}=\hat{q}_1+\ldots+\hat{q}_k$ up to step k is the same as the weighted fraction of the union $\sum_{j\,sent}\pi_j 1_{\mathcal{H}_{1,j}\cup\ldots\cup\mathcal{H}_{k,j}}$ Accordingly, it has the lower bound $$\hat{q}_k^{tot} \geq \sum_{j\,sent} \pi_j 1_{\mathcal{H}_{k,j}}$$

based solely on the step k half-spaces, where the sum on the right is over all j in sent, not just those in sent$\cap J_k$. That this simpler form will be an effective lower bound on $\hat{q}_k^{tot}$ will arise from the fact that the statistic tested in $\mathcal{H}_{k,j}$ is approximately a normal with a larger mean at step k than at steps k'<k, producing for all j in sent greater likelihood of occurrence of $\mathcal{H}_{k,j}$ than earlier $\mathcal{H}_{k',j}$.

Concerning this lower bound $\sum_{j\,sent}\pi_j 1_{\mathcal{H}_{k,j}}$, in what follows it is convenient to set $\hat{q}_{1,k}$ to be the corresponding sum $\sum_{j\,sent}\pi_j 1_{H_{k,j}}$ using a simpler purified form $H_{k,j}$ in place of $\mathcal{H}_{k,j}$. Outside of an exception event studied herein, this $H_{k,j}$ is a smaller set that $\mathcal{H}_{k,j}$ and so then $\hat{q}_k^{tot}$ is at least $\hat{q}_{1,k}$.

Meanwhile, with $\hat{f}_k = \sum_{j\in other \cap J_k} \pi_j 1_{\mathcal{H}_{k,j}}$ as the increment of weighted count of false alarms, as seen, the total weighted count of false alarms cot $\hat{f}_k^{tot}=\hat{f}_1+\ldots+\hat{f}_k$ is the same as $\sum_{j\,other}\pi_j 1_{\mathcal{H}_{1,j}\cup\ldots\cup\mathcal{H}_{k,j}}$. It has the upper bound $$\hat{f}_k^{tot} \leq \sum_{j\,other}\pi_j 1_{\mathcal{H}_{1,j}} + \ldots + \sum_{j\,other}\pi_j 1_{\mathcal{H}_{k,j}}.$$

Denote the right side of this bound $\hat{f}_{1,k}$.

These simple inequalities permit establishment of likely levels of correct detections and false alarm bounds to be accomplished by analyzing the simpler forms $\sum_{j\,sent}\pi_j 1_{\mathcal{H}_{k,j}}$ and $\sum_{j\,other}\pi_j 1_{\mathcal{H}_{k,j}}$ without the restriction to the random set $J_k$, which would complicate the analysis.

Refinement Using Wedges:

Rather than using the last half-space $\mathcal{H}_{k,j}$ alone, one may obtain a lower bound on the indicator of the union $\mathcal{H}_{1,j}\cup\ldots\cup\mathcal{H}_{k,j}$ by noting that it contains $\mathcal{H}_{k-1,j}\cup H\mathcal{H}_{k,j}$ expressed as the disjoint union of the events $\mathcal{H}_{k,j}$ and $\mathcal{H}_{k-1,j}\cap\mathcal{H}_{k,j}$. The latter event may be interpreted as a wedge (an intersection of two half-spaces) in terms of the pair of random variables $\mathcal{Z}_{k-1,j}^{comb}$ and $\mathcal{Z}_{k,j}$. Accordingly, there is the refined lower bound on $\hat{q}_k^{tot} = \sum_{j\,sent}\pi_j 1_{\mathcal{H}_{1,j}\cup\ldots\cup\mathcal{H}_{k,j}}$, given by $$\hat{q}_k^{tot} \geq \sum_{j\,sent} \pi_j 1_{\mathcal{H}_{k,j}} + \sum_{j\,sent} \pi_j 1_{\mathcal{H}_{k-1,j}\cap\mathcal{H}_{k,j}^c}.$$

With this refinement a slightly improved bound on the likely fraction of correct detections can be computed from determination of lower bounds on the wedge probabilities. One could introduce additional terms from intersection of three or more half-spaces, but it is believed that these will have negligible effect.

Likewise, for the false alarms, the union $\mathcal{H}_{1,j}\cup\ldots\cup\mathcal{H}_{k,j}$ expressed as the disjoint union of $\mathcal{H}_{k,j}$, $\mathcal{H}_{k-1,j}\cap\mathcal{H}_{k,j}^c,\ldots,\mathcal{H}_{1,j}\cap\mathcal{H}_{2,j}^c\cap\ldots\cap\mathcal{H}_{k,j}^c$, has the improved upper-bound for its indicator given by the sum $$1_{\mathcal{H}_{k,j}} + 1_{\mathcal{H}_{k-1,j}\cap\mathcal{H}_{k,j}^c} + \ldots + 1_{\mathcal{H}_{1,j}\cap\mathcal{H}_{2,j}^c}$$

given by just one half-space indicator and k−1 wedge indicators. Accordingly, the weighted total fraction of false alarms $\hat{f}_k^{tot}$ is upper-bounded by the $\pi$ weighted sum of these indicators for j in other. This leads to improved bounds on the likely fraction of false alarms from determination of upper bounds on wedge probabilities.

Accounting with the Optional Analysis Window:

In the optional restriction to terms in the set $pot_k=potential_k$ for each step, the $\hat{q}_k$ take the same form but with $J_k=pot_k\cap dec_{1,k-1}^c$ in place of $J_k=J\cap dec_{1,k-1}^c$. Accordingly the total weighted count of correct detections $\hat{q}_k^{tot}=\hat{q}_1+\ldots+\hat{q}_k$ takes the form $$\hat{q}_k^{tot} \geq \sum_{j\,sent} \pi_j 1_{\{\cup_{k'}\mathcal{H}_{k',j}\}},$$

where the union for term j is taken for steps in the set $\{k'\leq k: j\in pot_{k'}\}$. These unions are non-empty for the terms j in $pot_{1,k}=pot_1\cup\ldots\cup pot_k$. For terms in sent it will be arranged that for each j there is, as k' increases, an increasing probability (of purified approximations) of the set $\mathcal{H}_{k',j}$. Accordingly, for a lower bound on the indicator of the union using a single set use $1_{\mathcal{H}_{max_{k,j},j}}$ where $max_{k,j}$ is the largest of $\{k'>k: j\in pot_{k'}\}$. Thus in place of $\sum_{j\,sent}\pi_j 1_{\mathcal{H}_{k,j}}$, for the lower bound on the total weighted fraction of correct detections this leads to $$\hat{q}_k^{tot} \geq \sum_{j\in sent \cap pot_{1,k}} \pi_j 1_{\mathcal{H}_{max_{k,j},j}}.$$

Likewise an upper bound on the total weighted fraction of false alarms is $$\hat{f}_k^{tot} \leq \sum_{j \in other \cap pot_1} \pi_j 1_{\mathcal{H}_{1,j}} + \ldots + \sum_{j \in other \cap pot_k} \pi_j 1_{\mathcal{H}_{k,j}}.$$

Again the idea is to have these simpler forms with single half-space events, but now with each sum taken over a more targeted deterministic set, permitting a smaller total false alarm bound.

This document does not quantify specifics of the benefits of the wedges and of the narrowed analysis window (or a combination of both). This is a matter of avoiding complication. But the matter can be revisited to produce improved quantification of mistake bounds.

4.5 Adjusted Sums Replace Sums of Adjustments:

The manner in which the quantities $\hat{q}_1, \ldots, \hat{q}_k$ and $\hat{f}_1, \ldots \hat{f}_k$ arise in the distributional analysis of Lemma 2 is through the sum $$\hat{q}_k^{adj,tot} = \hat{q}_1^{adj} + \ldots + \hat{q}_k^{adj}$$

of the adjusted values $\hat{q}_k^{adj} = \hat{q}_k/(1+\hat{f}_k/\hat{q}_k)$. Conveniently, by Lemma 4 below, $\hat{q}_k^{adj,tot} \geq \hat{q}_k^{tot,adj}$. That is, the total of adjusted increments is at least the adjusted total given by $$\hat{q}_k^{tot,adj} = \frac{\hat{q}_k^{tot}}{1 + \hat{f}_k^{tot}/\hat{q}_k^{tot}}$$

which may also be written $$\hat{q}_k^{tot} - \hat{f}_k^{tot} + \frac{(\hat{f}_k^{tot})^2}{\hat{q}_k^{tot} + \hat{f}_k^{tot}}.$$

In terms of the total weighted count of tests above threshold $accept_k^{tot} = \hat{q}_k^{tot} + \hat{f}_k^{tot}$ it is $$\hat{q}_k^{tot,adj} = accept_k^{tot} - 2\hat{f}_k^{tot} + \frac{(\hat{f}_k^{tot})^2}{accept_k^{tot}}.$$

Lemma 4.
Let $f_1, \ldots, f_k$ and $g_1, \ldots, g_k$ be non-negative numbers. Then $$\frac{g_1}{1+f_1/g_1} + \ldots + \frac{g_k}{1+f_k/g_k} \geq \frac{g_1 + \ldots + g_k}{1+(f_1+\ldots+f_k)/(g_1+\ldots+g_k)}.$$

Moreover, both of these quantities exceed $$(g_1 + \ldots + g_k) - (f_1 + \ldots + f_k).$$

Demonstration of Lemma 4:

Form $p_{k'} = f_{k'}/[f_1 + \ldots + f_k]$ and interpret as probabilities for a random variable K taking values k' from 1 to k. Consider the convex function defined by $\psi(x) = x/(1+1/x)$. After accounting for the normalization, the left side is $\mathbb{E}[\psi(g_K/f_K)]$ and the right side is $\psi[\mathbb{E}(g_K/f_K)]$. So the first claim holds by Jensen's inequality. The second claim is because $g/(1+f/g)$ equals $g-f/(1+f/g)$ or equivalently $g-f+f^2/(g+f)$, which is at least $g-f$. This completes the demonstration of Lemma 4.

This lemma is used to assert that $\hat{s}_k = 1/(1-\hat{q}_{k-1}^{adj,tot}v)$ is at least $1/(1-\hat{q}_{k-1}^{tot/adj}v)$. For suitable weights of combination this $\hat{s}_k$ corresponds to a total shift factor, as developed in the next section.

5 Separation Analysis

In this section the extent of separation is explored between the distributions of the test statistics $\mathcal{Z}_{k,j}^{comb}$ for j sent versus other j. In essence, for j sent, the distribution is a shifted normal. The assignment of the weights $\lambda$ used in the definition of $\mathcal{Z}_{k,j}^{comb}$ is arranged so as to approximately maximize this shift.

5.1 The Shift of the Combined Statistic:

Concerning the weights $\lambda_{1,k}, \lambda_{2,k}, \ldots, \lambda_{k,k}$, for notational simplicity hide the dependence on k and denote them simply by $\lambda_1, \ldots, \lambda_k$, as elements of a vector $\lambda$. This $\lambda$ is to be a member of the simplex $S_k = \{\lambda : \lambda_k \geq 0, \Sigma_{k'=1}^k \lambda_{k'} = 1\}$ in which the coordinates are non-negative and stun to 1.

With weight vector $\lambda$ the combined test statistic $\mathcal{Z}_{\lambda,k,j}^{comb}$ takes the form $$shift_{\lambda,k,j} 1_{\{j\ sent\}} + Z_{\lambda,k,j}^{comb}$$

where $$Z_{\lambda,k,j}^{comb} = \sqrt{\lambda_1} Z_{1,j} - \sqrt{\lambda_2} Z_{2,j} - \ldots - \sqrt{\lambda_k} Z_{k,j}.$$

For convenience of analysis, it is defined not just for $j \in J_k$, but indeed for all $j \in J$, using the normal distribution for the $Z_{k',j}$ discussed above. Here $$shift_{\lambda,k,j} = shift_{\lambda,k} \sqrt{C_{j,R,B}}$$

where $shift_{\lambda,k}$ is $$\sqrt{\lambda_1 \chi_n^2/n} + \sqrt{\lambda_k \hat{w}_2 \chi_{n-1}^2/n} + \ldots + \sqrt{\lambda_k \hat{w}_k \chi_{n-k+1}^2/n},$$

where $\chi_{n-k+1}^2 = \|G_k\|^2/\sigma_k^2$. This $shift_{\lambda,k}$ would be largest with $\lambda_{k'}$ proportional to $\hat{w}_k \chi_{n-k+1}^2$.

Outside of an exception set $A_h$ developed further below, these $\chi_{n-k'+1}^2/n$ are at least 1−h, with small positive h. Then $shift_{\lambda,k}$ is at least $\sqrt{1-h}$ times $$\sqrt{\lambda_1 \hat{w}_1} + \sqrt{\lambda_k \hat{w}_2} + \ldots + \sqrt{\lambda_k \hat{w}_k}.$$

The test statistic $\mathcal{Z}_{k,j}^{comb}$ along with its constituent Z.k, $j^{comb}$ arises by plugging in particular choices of $\hat{\lambda}$. Most choices of these weights that arise in our development will depend on the data and those exact normality of $Z_{k,j}^{comb}$ does not hold. This matter is addressed using tools of empirical processes, to show uniformity of closeness of relative frequencies based on $Z_{\lambda,k,j}^{comb}$ to the expectations based on the normal distribution. This uniformity can be exhibited over all $\lambda$ in the simplex $S_k$. For simplicity it is exhibited over a suitable subset of it.

5.2 Maximizing Separation:

Setting $\lambda_{k'}$ equal to $\hat{w}_{k'}/(1+\hat{w}_2+\ldots+\hat{w}_k)$ for $k' \leq k$ would be ideal, as it would maximize the resulting shift factor $\sqrt{\lambda_1} + \sqrt{\hat{w}_2} \sqrt{\lambda_2} + \ldots + \sqrt{\hat{w}_k} \sqrt{\lambda_k}$, for $\lambda \in S_k$, making it equal $\sqrt{1+\hat{w}_2+\ldots+\hat{w}_k} = \sqrt{\hat{s}_k}$, where $\hat{s}_k = 1/(1-q_k^{adj,tot}v)$ and $\hat{w}_{k'} = \hat{s}_{k'} - \hat{s}_{k'-1}$.

Setting $\lambda_{k'}$ proportional to $\hat{w}_{k'}$ may be ideal, but it suffers from the fact that without advance knowledge of sent and other, the decoder does not have access to the separate values of $\hat{q}_k = \Sigma_{j \in sent \cap J_k} \pi_j 1_{\mathcal{H}_{k,j}}$ and $\hat{f}_k = \Sigma_{j \in other \cap J_k} \pi_j 1_{\mathcal{H}_{k,j}}$ needed for precise evaluation of $\hat{w}_k$. A couple of means are devised to overcome this difficulty. The first is to take advantage of the fact that the decoder does have $accept_k = \hat{q}_l + \hat{f}_k = \Sigma_{j \in J_k} \pi_j 1_{\mathcal{H}_{k,j}}$, which is the weighted count of terms above threshold on step k. The second is to use computation of $\|G_k\|^2/n$ which is $\sigma_k^2 \chi_{n-k+1}^2/n$ as an estimate of $\sigma_k^2$ with which a reasonable estimate of $\hat{w}_k$ is obtained. A third method is to use residuals as discussed in the appendix, though its analysis is more involved.

5.3 Setting Weights $\hat{\lambda}$ Based on Accept$_k$:

The first method uses accept$_k$ in place of $\hat{q}_{k'}^{adj}$ where it arises in the definition of $\hat{w}_{k'}$ to produce a suitable choice of $\lambda_{k'}$. Abbreviate accept$_k$ as acc$_k$, when needed to allow certain expressions to be suitably displayed. This accept$_k$ upper-bounds $\hat{q}_k$ and is not much greater that $\hat{q}_k$ when suitable control of the false alarms is achieved.

Recall $\hat{w}_k = \hat{s}_k - \hat{s}_{k-1}$ for k>1 so finding the common denominator it takes the form $$\hat{w}_k = \frac{\hat{q}_{k-1}^{adj} v}{(1 - \hat{q}_{k-1}^{adj,tot} v)(1 - \hat{q}_{k-2}^{adj,tot} v)},$$

with the convention that $\hat{q}_0^{adj} = 0$. Let $\hat{w}_k^{acc}$ be obtained by replacing $\hat{q}_{k-1}^{adj}$ with its upper bound of acc$_{k-1}$ = accept$_{k-1}$ and likewise replacing $\hat{q}_{k-2}^{adj,tot}$ and $\hat{q}_{k-1}^{adj,tot}$ with their upper bounds acc$_{k-2}^{tot}$ and acc$_{k-1}^{tot}$, respectively, with acc$_0^{tot} = 0$. Thus as an upper bound on $\hat{w}_k$ set $$\hat{w}_k^{acc} = \frac{acc_{k-1} v}{(1 - acc_{k-2}^{tot} v)(1 - acc_{k-1}^{tot} v)},$$

where for k=1 set $\hat{w}_k^{acc} = \hat{w}_k = 1$. For k>1 this $\hat{w}_k^{acc}$ is also $$\frac{1}{1 - acc_{k-1}^{tot} v} - \frac{1}{1 - acc_{k-2}^{tot} v}.$$

Now each accept$_{k'}$ exceeds $\hat{q}_{k'}^{adj}$ and is less than $\hat{q}_{k'}^{adj} + 2\hat{f}_{k'}$.

Then set proportional to $\hat{\lambda}_{k'}$ proportional to $\hat{w}_k^{acc}$. Thus $$\hat{\lambda}_1 = \frac{1}{1 + \hat{w}_2^{acc} + \ldots + \hat{w}_k^{acc}}$$

and for k' from 2 to k one has $$\hat{\lambda}_{k'} = \frac{\hat{w}_{k'}^{acc}}{1 + \hat{w}_2^{acc} + \ldots + \hat{w}_k^{acc}}.$$

The shift factor $$\sqrt{\hat{\lambda}_1} + \sqrt{\hat{\lambda}_2 \hat{w}^2} + \ldots + \sqrt{\hat{\lambda}_k \hat{w}_k}$$

is then equal to the ratio $$\frac{1 + \sqrt{\hat{w}_2^{acc} \hat{w}_2} + \ldots + \sqrt{\hat{w}_k^{acc} \hat{w}_k}}{\sqrt{1 + \hat{w}_2^{acc} + \ldots + \hat{w}_k^{acc}}}.$$

From $\hat{w}_{k'}^{acc} \geq \hat{w}_{k'}$ the numerator is at least $1 + \hat{w}_2 + \ldots + \hat{w}_l = \hat{s}_k$, equaling $1/(1 - (\hat{q}_1^{adj} + \ldots + \hat{q}_{k-1}^{adj})v)$, which per Lemma 4 is at least $1/(1 - \hat{q}_{k-1}^{tot,adj} v)$. As for the sum in the denominator, it equals $1/(1 - acc_{k-1}^{tot} v)$. Consequently, the above shift factor using $\hat{\lambda}$ is at least $$\frac{\sqrt{1 - acc_{k-1}^{tot} v}}{1 - \hat{q}_{k-1}^{tot,adj} v}.$$

Recognizing that acc$_{k-1}^{tot}$ and $\hat{q}_{k-1}^{tot}$ are similar when the false alarm effects are small, it is desirable to express this shift factor in the form $$\sqrt{\frac{1 - \hat{h}_{f,k-1}}{1 - \hat{q}_{k-1}^{tot,adj} v}},$$

where $\hat{h}_{f,k}$ for each k is a small term depending on false alarms.

Some algebra confirms this is so with $$\hat{h}_{f,k} = \hat{f}_k^{tot} \frac{(2 - \hat{f}_k^{tot} / acc_k^{tot}) v}{1 - \hat{q}_k^{tot,adj} v}$$

which is less than the value $2\hat{f}_k^{tot} v/(1-v)$ equal to $2\hat{f}_k^{tot}$snr. Except in cases of large snr this approach is found to be quite suitable.

To facilitate a simple empirical process argument, replace each acc$_k$ by its value $\lceil acc_k \tilde{L} \rceil / \tilde{L}$ rounded up to a rational of denominator $\tilde{L}$ for some integer $\tilde{L}$ large compared to k. This restricts the acc$_k$ to a set of values of cardinality $\tilde{L}$ and correspondingly the set of values of acc$_1, \ldots,$ acc$_{k-1}$ determining $\hat{w}_2^{acc}, \ldots, \hat{w}_k^{acc}$ and hence $\hat{\lambda}_1, \ldots, \hat{\lambda}_k$ is restricted to a set of cardinality $(\tilde{L})^{k-1}$. The resulting acc$_k^{tot}$ is then increased by at most $k/\tilde{L}$ compared to the original value. With this rounding, one can deduce that $$\hat{h}_{f,k} \leq 2\hat{f}_k^{tot} snr + k/\tilde{L}.$$

Next proceed with defining natural exception sets outside of which $\hat{q}_{k'}^{tot}$ is at least a deterministic value $q_{1,k'}$ and $\hat{f}_k^{tot}$ is not more than a deterministic value $f_{1,k'}$ for each k' from 1 to k. This leads to $\hat{q}_k^{tot,adj}$ being at least $q_{1,k}^{adj}$, where $$q_{1,k}^{adj} = q_{1,k}/(1 + f_{1,k}/q_{1,k})$$

and $\hat{h}_{f,k}$ is at most $h_{f,k} = 2f_{1,k} snr$, and likewise for each k'≤k. This $q_{1,k}^{adj}$ is regarded as an adjustment to $q_{1,k}$ due to false alarms.

When rounding the acc$_k$ to be rational of denominator $\tilde{L}$, it is accounted for by setting $$h_{k,k} = 2f_{1,k} snr + k/\tilde{L}.$$

The result is that the shift factor given above is at least the deterministic value given by $\sqrt{1 - h_{f,k-1}}/\sqrt{1 - q_{1,k-1}^{adj} v}$ near $1/\sqrt{1 - q_{1,k-1}^{adj} v}$. Accordingly shift$_{\hat{\lambda},k,j}$ exceeds the purified value $$\sqrt{\frac{1 - h'}{1 - q_{1,k-1}^{adj} v}} \sqrt{C_{j,R,B}},$$

where $1 - h' = (1 - h_f)(1 - h)$, with $h' = h + h_f - h h_f$, where $h_f = h_{f,m-1}$ serves as an upper bound to the $h_{f,k-1}$ for all steps k≤m.

5.4 Setting Weights $\hat{\lambda}$ Based on Estimation of $\sigma_k^2$:

The second method entails estimation of $\hat{w}_k$ using an estimate of $\sigma_k^2$. For its development make use of the multiplicative relationship from Lemma 2, $$\hat{s}_k = \hat{s}_{k-1} \frac{ACC_{k-1}}{\sigma_k^2},$$

where $ACC_{k-1}=acc_{k-1}P=\Sigma_{j \in deck-1}P_j$ is the un-normalized weight of terms above threshold on step k−1. Accordingly, from $\hat{w}_k=\hat{s}_k-\hat{s}_{k+1}$ it follows that $$\hat{w}_k = \hat{s}_{k-1}\left(\frac{ACC_{k-1}}{\sigma_k^2} - 1\right),$$

where the positivity of $\hat{w}_k$ corresponds to $ACC_{k-1} \geq \sigma_k^2$. Also $$\hat{s}_k = \prod_{k'=1}^{k-1} \frac{ACC_{k'-1}}{\sigma_{k'}^2}.$$

Recognize that each $1/\sigma_{k'}^2 = \chi_{n-k'+1}^2/\|G_{k'}\|^2$. Again, outside an exception set, replace each $\chi_{n-k'+1}^2$ by its lower bound $n(1-h)$, obtaining the lower bounding estimates $$\hat{w}_k^{low} = \hat{s}_{k-1}^{low}\left(\frac{ACC_{k-1}}{\hat{\sigma}_k^2} - 1\right),$$

where $$\hat{s}_k^{low} = \prod_{k'=1}^{k-1} \frac{ACC_{k'-1}}{\hat{\sigma}_{k'}^2}$$

with $$\hat{\sigma}_k^2 = \max\left\{\frac{\|G_k\|^2}{n(1-h)}, ACC_{k-1}\right\}.$$

Initializing with $\hat{s}_1^{low}=\hat{w}_1^{low}=1$ again have $\hat{w}_k^{low}=\hat{s}_k^{low}-\hat{s}_{k-1}^{low}$ and hence $$\hat{s}_k^{low} = 1 + \hat{w}_2^{low} + \ldots + \hat{w}_k^{low}.$$

Set the weights of combination to be $\hat{\lambda}_{k'} = \hat{w}_{k'}^{low}/\hat{s}_{k'}^{low}$ with which the shift factor is $$\frac{1 + \sqrt{\hat{w}_2^{low}\hat{w}_2} + \ldots + \sqrt{\hat{w}_k^{low}\hat{w}_k}}{\sqrt{\hat{s}_k^{low}}}.$$

Using $\hat{w}_{k'} \geq \hat{w}_{k'}^{low}$ this is at least $$\frac{1 + \hat{w}_2^{low} + \ldots + \hat{w}_k^{low}}{\sqrt{\hat{s}_k^{low}}} = \sqrt{\hat{s}_k^{low}},$$

which is $\sqrt{\hat{s}_k}$ times the square root of $$\prod_{k'=1}^{k-1} \left(\frac{(1-h)n}{\chi_{n-k'+1}^2}\right).$$

When using this method of estimating $\hat{w}_k$ augment the exception set so that outside it one has $\chi_{n-k'+1}^2/n \leq (1+h)$. Then the above product is at least $[(1-h)/(1+h)]^{k-1}$ and the shift factor $\text{shift}_{\hat{\lambda},k}$ is at least $$\sqrt{\hat{s}_k(1-h')} \geq \sqrt{\frac{1-h'}{1-q_{1,k-1}^{adj}\nu}},$$

where now $1-h'=(1-h)/(1+h)^{k-1}$. Here the additional $(1-h)$ factor, as before, is to account in the definition of $\text{shift}_{\hat{\lambda},k}$ for lower bounding the $\chi_{n-k'+1}^2/n$ by $(1-h)$.

Whether now the $[(1-h)/(1-h)]^{k-1}$ is less of a drop than the $(1-h_f)=(1-2f_{k-1}\text{snr})$ from before depends on the choice of h, the bound on the false alarms, the number of steps k and the signal to noise ratio snr.

Additional motivation for this choice of $\hat{\lambda}_k$ comes from consideration of the tests statistics $Z_{k,j}^{res}=X_j^T res_k/\|res_k\|$ formed by taking the inner products of $X_j$ with the standardized residuals, where $res_k$ denotes the difference between Y and its projection onto the span of $F_1, F_2, \ldots, F_{k-1}$. It is shown in the appendix that these statistics have the same representation but with $\lambda_{k'}=w_{k'}/s_k$, for $k' \leq k$, where $s_k=\|Y\|^2/\|res_k\|^2$ and $w_k=s_k-s_{k-1}$, again initialized with $s_1=w_1=1$. In place of the iterative rule developed above $$\hat{s}_k = \hat{s}_{k-1}\frac{ACC_{k-1}}{\sigma_k^2} = \hat{s}_{k-1}\frac{ACC_{k-1}\chi_{n-k+1}^2}{\|G_k\|^2},$$

these residual-based $s_k$ are shown there to satisfy $$s_k = s_{k-1}\frac{\|\tilde{F}_{k-1}\|^2}{\|G_k\|^2}$$

where $\tilde{F}_{k-1}$ is the part of $F_{k-1}$ orthogonal to the previous $F_{k'}$ for $k'=1,\ldots,k-2$.

Intuitively, given that the coordinates of $X_j$ are i.i.d. with mean 0 and variance 1, this $\|\tilde{F}_{k-1}\|^2$ should not be too different from $\|F_{k-1}\|^2$ which should not be too different from n $AXX_{k-1}$. So these properties give additional motivation for this choice. It is also tempting to try to see whether this $\lambda$ based on the residuals could be amenable to the method of analysis, herein. It would seem that one would need additional properties of the design matrix X, such as uniform isometry properties of subsets of certain sizes. However, it is presently unclear whether such properties could be assured without harming the freedom to have rate up to capacity. For now stick to the simpler analysis based on the estimates here of the $\hat{w}_k$ that maximizes separation.

5.5 Exception Events and Purified Statistics:

Consider more explicitly the exception events $$A_q = \cup_{k'=1}^{k-1}\{\hat{q}_{k'}^{tot} < q_{1,k'}\}$$

and $$A_f = \cup_{k'=1}^{k-1}\{\hat{f}_{k'}^{tot} > f_{1,k'}\}.$$

As said, one may also work with the related events $\cup_{k'=1}^{k-1}\{\hat{q}_{1,k'} < q_{1,k'}\}$ and $\cup_{k'=1}^{k-1}\{\hat{f}_{1,k'} > f_{1,k'}\}$.

Define the Chi-square exception event $A_h$ to include $$\cup_{k'=1}^{k}\{\chi_{n-k'+1}^2/n \leq 1-h\}$$

or equivalently $\cup_{k'=1}^{k}\{\chi_{n-k'+1}^2/(n-k'+1) \leq (1-h_{k'})\}$ where $h_{k'}$ is related to h by the equation $(n-k'+1)(1-h_{k'})=n(1-h)$. For the second method it is augmented by including also $$\cup_{k'=1}^{k}\{\chi_{n-k'+1}^2/n \geq 1+h\}.$$

The overall exception event is $A=A_q \cup A_f \cup A_h$. When outside this exception set, the $\text{shift}_{\hat{\lambda},k,j}$ exceeds the purified value given by $$\text{shift}_{k,j} = \sqrt{\frac{1-h'}{1-q_{1,k-1}^{adj}\nu}} \sqrt{C_{j,R,B}}.$$

Recalling that $C_{j,R,B}=\pi_j \nu L(\log B)/R$ the factor $1-h'$ may be absorbed into the expression by letting $$C_{j,R,B,h}=C_{j,R,B}(1-h').$$

Or in terms of the section index l write $C_{l,R,B,h}=C_{l,R,B}(1-h')$. Then the above lower bound on the shift may be expressed as $$\sqrt{\frac{C_{j,R,B,h}}{1-x\nu}}$$

evaluated at $x=q_{1,k-1}^{adj}$, also denoted as $$\text{shift}_{\ell,x} = \sqrt{\frac{C_{\ell,R,B,h}}{1-x\nu}}$$

For $\lambda$ in $S_k$, set $H_{\lambda,k,j}$ to be the purified event that the approximate combined statistic $\text{shift}_{k,j}1_{j\text{ sent}}+Z_{\lambda,k,j}^{comb}$ is at least the threshold $\tau$. That is, $$H_{\lambda,k,j}=\{\text{shift}_{k,j}1_{j\text{ sent}}+Z_{\lambda,k,j}^{comb} \geq \tau\},$$

where in contrast to $\mathcal{H}_{k,j}=\{\mathcal{Z}k,j^{comb} \geq \tau\}$ a standard rather than a calligraphic font is used for this event $H_{\lambda,k,j}$ based on the normal $Z_{\lambda,k,j}^{comb}$ with the purified shift.

Recall that the coordinates of $\lambda$, denoted $\lambda_{k',k}$ for $k'=1, 2, \ldots k$, have dependence on k. For each k, the $\lambda_{k',k}$ can be determined from normalization of segments of the first k in sequences $w_1, w_2, \ldots, w_m$ of positive values. With an abuse of notation, also denote the sequence for $k=1,2,\ldots,m$ of such standardized combinations $Z_{\lambda,k,j}^{comb}$ as $$Z_{w,k,j}^{comb} = \frac{\sqrt{w_1}Z_{1,j} - \sqrt{w_2}Z_{2,j} - \ldots - \sqrt{w_k}Z_{k,j}}{\sqrt{w_1+w_2+\ldots+w_k}}.$$

In this case the corresponding event $H_{\lambda,k,j}$ is also denoted $H_{w,k,j}$.

Exept in $A_q \cup A_f \cup A_h$, the event $\mathcal{H}_{k,j}$ contains $H_{\hat{\lambda},k,j}$ also denote as $H_{\hat{w}^{acc},k,j}$ or $H_{\hat{w}^{low},k,j}$, respectively, for the two methods of estimating $\hat{w}$.

Also, as for the actual test statistics, the purified forms satisfy the updates $$Z_{\lambda,k,j}^{comb} = \sqrt{1-\lambda_k}Z_{\lambda,k-1}^{comb} - \sqrt{\lambda_k}Z_{k,j}$$

where $\lambda_k = \lambda_{k,k}$.

5.6 Definition of the Update Function:

Via $C_{j,R,B}$ the expression for the shift is decreasing in R. Smaller R produce a bigger shift and greater statistical distinguishability between the terms sent and those not sent. This is a property commensurate with the communication interest in the largest R for which after a suitable number of steps one can reliable distinguish most of the terms.

Take note for j sent that $\text{shift}_{k,j}$ is equal to $$\mu_j(x) = \sqrt{\frac{C_{j,R,B,h}}{1-x\nu}}$$

evaluated at $x=q_{l,k-1}^{adj}$. To bound the probability with which a term sent is successfully detected by step k, examine the behavior of $$\Phi(\mu_j(x)-\tau)$$

which, at that x, is the $\mathbb{Q}$ probability of the purified event $H_{\lambda,k,j}$ for in sent, based on the standard normal cumulative distribution of $Z_{\lambda,k,j}^{comb}$. This $\Phi(\mu_j(x)-\tau)$ is increasing in x.

For constant power allocation the contributions $\Phi(\mu_j(x)-\tau)$ are the same for all j in sent, whereas, for decreasing power assignments, one has a variable detection probability. Note that it is greater than ½ for those j for which $\mu_j(x)$ exceeds $\tau$. As x increases, there is a growing set of sections for which $\mu_j(x)$ sufficiently exceeds $\tau$, such that these sections have high $\mathbb{Q}$ probability of detection.

The update function $g_L(x)$ is defined as the $\pi$ weighted average of these $\Phi(\mu_j(x)-\tau)$ for j sent, namely, $$g_L(x) = \sum_{j\text{ sent}} \pi_j \Phi(\mu_j(x)-\tau)$$

or, equivalently, $$g_L(x) = \sum_{\ell=1}^{L} \pi_{(\ell)}\Phi(\text{shift}_{\ell,x}-\tau),$$

an L term sum. That is, $g_L(x)$ is the $\mathbb{Q}$ expectation of the sample weighted fraction $\Sigma_{j\text{ sent}}\pi_j 1_{H_{\lambda,k,j}}$ for any A in $S_k$. The idea is that for any given x this sample weighted fraction will be near $g_L(x)$, except in an event of exponentially small probability.

This update function $g_L$ on $g_L$ on [0,1] indeed depends on the power allocation $\pi$ as well as the design parameters L, B, R, and the value a determining $\tau=\sqrt{2\log B}+a$. Plus it depends on the signal to noise ratio via $\nu=\text{snr}/(1+\text{snr})$. The explicit use of the subscript L is to distinguish the stun $g_L(x)$ from an integral approximation to it denoted g that will arise later below.

6 Detection Build-up with False Alarm Control

In this section, target false alarm rates are set and a framework is provided for the demonstration of accumulation of correct detections in a moderate number of steps.

6.1 Target False Alarm Rates:

A target weighted false alarm rate for step k arises as a bound f* on the expected value of $\Sigma_{j\text{ other}}\pi_j 1_{H_{q,j,k}}$. This expected value is $(B-1)\overline{\Phi}(\tau)$, where $\overline{\Phi}(\tau)$ is the upper tail probability with which a standard normal exceeds the threshold $\tau=\sqrt{2\log B}+a$. A tight bound is $$\frac{1}{(\sqrt{2\log B} + a)\sqrt{2\pi}} \exp\{-a\sqrt{2\log B} - (1/2)a^2\}.$$

There is occasion to make use of the similar choice of f* equal to $$\frac{1}{(\sqrt{2\log B})\sqrt{2\pi}} \exp\{-a\sqrt{2\log B}\}.$$

The fact that these indeed upper bound $B\bar{\Phi}(\tau)$ follows from $\bar{\Phi}(x) \leq \phi(x)/x$ for positive x, with $\phi$ being the standard normal density. Likewise set f>f*. Express f=ρf* with ρ>1, w Across the steps k, the choice of constant $a_k$=a produces constant $f_k^*$=f* with stun $f_{1,k}^*$ equal to kf*. Furthermore, set $f_{1,k} > f_{1,k}$, which arises in upper bounding the total false alarm rate. In particular, it is arranged for the ratio $f_{1,k}/f_{1,k}^*$ to be at least as large as a fixed ρ>1.

At the final step m, let $$\bar{f}^* = f_{1,m}^* = mf^*$$

be the baseline total false alarm rate, and use $\bar{f}$=$f_{1,m}$, typically equal to $\rho\bar{f}^*$, to be a value which will be shown to likely upper bound $\Sigma_{j\ other}\pi_j 1_{\cup_{k=1}^m H_{a,j,k}}$.

As will be explored soon, it is needed for $f_{1,k}$ to stay less than a target increase in the correct detection rate each step. As this increase will be a constant times 1/log B, for certain rates close to capacity, this will then mean that $\bar{f}$ and hence $\bar{f}^*$ need to be bounded by a multiple of 1/log B. Moreover, the number of steps m will be of order log B. So with $\bar{f}^*$=mf* this means f* is to be of order 1/(log B)$^2$. From the above expression for f*, this will entail choosing a value of a near $$(3/2)(\log \log B)/\sqrt{2\log B}.$$

6.2 Target Total Detection Rate:

A target total detection rate $q_{1,k}^*$ and the associated values $q_{1,k}$ and $q_{1,k}^{adj}$ are recursively defined using the function $g_L(x)$.

In particular, per the preceding section, let $$q_{1,k}^* = \sum_{j\ sent} \pi_j \Phi(\text{shift}_{k,j} - \tau)$$

which is seen to be $$q_{1,k}^* = g_L(x)$$

evaluated at $x = q_{1,k-1}^{adj}$. The convention is adopted at k=1 that the previous $q_{k-1}$ and $x = q_{1,k-1}^{adj}$ are initialized at 0. To complete the specification, a sequences of small positive $\eta_k$ are chosen with which it is set that $$q_{1,k} = q_{1,k}^* - \eta_k.$$

For instance one may set $\eta_k = \eta$. The idea is that these $\eta_k$ will control the exponents of tail probabilities of the exception set outside of which $\hat{q}_k^{tot}$ exceeds $q_{1,k}$. With this choice of $q_{1,k}$ and $f_{1,k}$ one has also $$q_{1,k}^{adj} = q_{1,k}/(1 + f_{1,k}/q_{1,k}).$$

Positivity of the gap $g_L(x) - x$ provides that $q_{1,k}$ is larger than $q_{1,k-1}^{adj}$. As developed in the next subsection, the contributions from $\eta_k$ and $f_{1,k}$ are arranged to be sufficiently small that $q_{1,k}^{adj}$ and $q_{1,k}$ are increasing with each such step. In this way the analysis will quantify as x increases, the increasing proportion that are likely to be above threshold.

6.3 Building Up the Total Detection Rate:

Let's give the framework here for how the likely total correct detection rate $q_{1,k}$ builds up to a value near 1, followed by the corresponding conclusion of reliability of the adaptive successive decoder. Here the notion of correct detection being accumulative is defined. This notion holds for the power allocations studied herein.

Recall that with the function $g_L(x)$ defined above, for each step, one updates the new $q_{1,k}$ by choosing it to be slightly less than $q_{1,k}^* = g_L(q_{1,k-1}^{adj})$. The choice of $q_{1,k}$ is accomplished by setting a small positive $\eta_k$ for which $q_{1,k} = q_{1,k}^* - \eta_k$. These may be constant, that is $\eta_k = \eta$, across the steps k=1, 2, ..., m.

There are slightly better alternative choices for the $\eta_k$ motivated by the reliability bounds. One is to arrange for $D(q_{1,k} \| q_{1,k}^*)$ to be constant where D is the relative entropy between Bernoulli random variables of the indicated success probabilities. Another is to arrange $\eta_k$ such that $\eta_k/\sqrt{V_k}$ is constant, where $V_k = V(x)$ evaluated at $x = q_{1,k-1}^{adj}$, where $$V(x)/L = \sum_{j\ sent} \pi_j \Phi(\mu_j(x))\bar{\Phi}(\mu_j(x)).$$

This $V_k/L$ may be interpreted as a variance of $\hat{q}_{1,k}$ as developed below. The associated standard deviation factor $\sqrt{V(x)}$ is shown in the appendix to be proportional to $(1-xv)$.

With evaluation at $x = q_{1,k-1}^{adj}$, this gives rise to $\eta_k = \eta(x)$ equal to $(1-xv)$ times a small constant.

How large one can pick $\eta_k$ will be dictated by the size of the gap $g_L(x) - x$ at $x = q_{1,k-1}^{adj}$.

Let x* be any given value between 0 and 1, preferably not far from 1.

Definition:

A positive increasing function g(x) bounded by 1 is said to be accumulative for $0 \leq x \leq x^*$ if there is a function gap(x)>0, with $$g(x) - x \geq gap(x)$$

for all $0 \leq x \leq x^*$. An adaptive successive decoder with rate and power allocation chosen so that the update function $g_L(x)$ satisfies this property is likewise said to be accumulative. The shortfall is defined by $\delta^* = 1 - g_L(x^*)$.

If the update function is accumulative and has a small shortfall, then it is demonstrated, for a range of choices of $\eta_k > 0$ and $f_{1,k} > k_{1,k}^*$, that the target total detection rate $q_{1,k}$ increases to a value near 1 and that the weighted fraction mistakes is with high probability less than $\delta_k = (1 - q_{1,k}) + f_{1,k}$. This mistake rate $\delta_k$ is less than $1 - x^*$ after a number of steps, and then with one more step it is further reduced to a value not much more than $\delta^* = 1 - g_L(x^*)$, to take advantage of the amount by which $g_L(x^*)$ exceeds $x^*$.

The tactic in providing good probability exponents will be to demonstrate, for the sparse superposition code, that there is an appropriate size gap. It will be quantified via bounds on the minimum of the gap or the minimum of the ratio gap(x)/(1-xv) that arises in a standardization of the gap, where the minimum is taken for $0 \leq x \leq x^*$.

The following lemmas relate the sizes of $\eta$ and $\bar{f}$ and the number of steps m to the size of the gap.

Lemma 5.

Suppose the update function $g_L(x)$ is accumulative on $[0, xx^*]$ with $g_L(x) - x \geq$ gap for a positive constant gap>0. Arrange positive constants $\eta$ and $\bar{f}$ and $m^* \geq 2$, such that $$\eta + \bar{f} + 1/(m^* - 1) = \text{gap}.$$

Suppose $f_{1,k} \leq \bar{f}$ as arises from $f_{1,k} = \bar{f}$ or from $f_{1,k} = kf$ for each $k \leq m^*$ with $f = \bar{f}/m^*$. Set $q_{1,k} = q_{1,k}^* - \eta$. Then $q_{1,k}$ is increasing on each step for which $q_{1,k-1} - f_{1,k-1} \leq x^*$, and, for such k the increment $q_{1,k} - q_{1,k-1}$ is at least $1/(m^*-1)$. The number of steps $k = m-1$ required such that $q_{1,k} - f_{1,k}$ first exceeds $x^*$, is bounded by $m^*-1$. At the final step $m \leq m^*$, the weighted fraction of mistakes target $\delta_m = (1-q_{1,m}) + f_{1,m}$ satisfies $$\delta_m \leq \delta^* + \eta + \bar{f}.$$

The value $\delta_m = (1-q_{1,m}) + f_{1,m}$ is used in controlling the sum of weighted fractions of failed detections and of false alarms.

In the decomposition of the gap, think of $\eta$ and $\bar{f}$ as providing portions of the gap which contribute to the probability exponent and false alarm rate, respectively, whereas the remaining portion controls the number of steps.

The following is an analogous conclusion for the case of a variable size gap bound. It allows for somewhat greater freedom in the choices of the parameters, with $\eta_k$ and $f_{1,k}$ determined by functions $\eta(x)$ and $f(x)$, respectively, evaluated at $x = q_{1,k-1}^{adj}$.

Lemma 6.

Suppose the update function is accumulative on $[0,x^*]$. Choose positive functions $\eta(x)$ and $\bar{f}(x)$ on $[0,x^*]$ with gap $(x) - \eta(x) - \bar{f}(x)$ not less than a positive value denoted gap'. Suppose $q_{1,k} = q_{1,k}^* - \eta_k$ where $\eta_k \leq \eta(q_{1,k-1}^{adj})$ and $f_{1,k} \leq \bar{f}(q_{1,k-1}^{adj})$. Then $q_{1,k} - q_{1,k-1} > \text{gap}'$ on each step for which $q_{1,k-1}^{adj} \leq x^*$ and the number of steps k such that the $q_{1,k}^{adj}$ first exceeds $x^*$ is bounded by $1/\text{gap}'$. With a number of steps $m \leq 1 + 1/\text{gap}'$, the $\delta_m = (1-q_{1,m}) + f_{1,m}$ satisfies $$\delta_m \leq \delta^* + \eta_m + f_{1,m}.$$

The proofs for Lemmas 5 and 6 are given in Appendix 14.3. One has the choice whether to be bounding the number of steps such that $q_{1,k}^{adj}$ first exceeds $x^*$ or such that the slightly smaller value $q_{1,k} - f_{1,k}$ first exceeds $x^*$. The latter provides the slightly stronger conclusion that $\delta_k \leq 1 - x^*$. Either way, at the penultimate step $q_{1,k}^{adj}$ is at least $x^*$, which is sufficient for the next step $m = k+1$ to take us to a larger value of $q_{1,m}^*$ at least $g_L(x^*)$. So either formulation yields the stated conclusion.

Associated with the use of the factor $(1-xv)$ there is the following improved conclusion, noting that GAP is necessarily larger than the minimum of gap(x).

Lemma 7.

Suppose that $g_L(x) - x$ is at least $\text{gap}(x) = (1-xv)\text{GAP}$ for $0 \leq x \leq x^*$ with a positive GAP. Again there is convergence of $g_{1,k}$ to values at least $x^*$. Arrange positive $\eta_{std}$ and $m^*$ with $$\text{GAP} = \eta_{std} + \frac{\log 1/(1-x^*)}{m^*-1}.$$

Set $\eta(x) = (1-xv)\eta_{std}$ and $\bar{f} \leq (1-v)\text{GAP}'$ with $\text{GAP}' = [\log 1/(1-x^*)]/(m^*-1)$ and set $\eta_k = \eta(x)$ at $x = q_{1,k-1}^{adj}$ and $f_{1,k} \leq \bar{f}$. Then the number of steps $k = m-1$ until $zx_k$ first exceeds $x^*$ is not more than $m^*-1$. Again at step m the $\delta_m = (1-q_{1,m}) + f_{1,m}$ satisfies $\delta_m \leq \delta^* + \eta_m + \bar{f}$.

Demonstration of Lemma 7:

One has $$q_{1,k} = g_L(q_{1,k-1}^{adj}) - \eta(q_{1,k-1}^{adj})$$

at least $$q_{1,k-1}^{adj} + (1-q_{1,k-1}^{adj}v)(\text{GAP} - \eta_{std}).$$

Subtracting $\bar{f}$ as a bound on $f_{1,k}$, it yields $$q_{1,k}^{adj} \geq q_{1,k-1}^{adj} + (1-q_{1,k-1}^{adj})v\text{GAP}'.$$

This implies, with $x_k = g_{1,k}^{adj}$ and $\epsilon = v\text{GAP}'$, that $$x_k \geq (1-\epsilon)X_{k-1} + \epsilon$$

or equivalently, $$(1-x_k) \leq (1-\epsilon)(1-x_{k-1}),$$

as long as $X_{k-1} \leq x^*$. Accordingly for such k, there is the exponential bound $$(1-x_k) \leq (1-\epsilon)^k \leq e^{-\epsilon k} = e^{-v\text{GAP}'k}$$

and the number of steps $k = m-1$ until $x_k$ first exceeds $x^*$ satisfies $$m - 1 \leq \frac{\log 1/(1-x^*)}{\log 1/(1-\epsilon)} \leq \frac{\log 1/(1-x^*)}{v\text{GAP}'}.$$

This bound is $mA^*-1$. The final step takes $q_{1,m}^*$ to a value at least $g_L(x^*)$ so $\delta_m \leq \delta^* + \eta_m + f_{1,m}$. This completes the demonstration of Lemma 7.

The idea here is that by extracting the factor $(1-xv)$, which is small if x and v are near 1, it follows that a value GAP with larger constituents $\eta_{std}$ and GAP' can be extracted than the previous constant gap, though to do so one pays the price of the log $1/(1-x^*)$ factor.

Concerning the choice of $f_{1,k}$, consider setting $f_{1,k} = \bar{f}$ for all k from 1 to m. This constant $k_{1,k} = \bar{f}$ remains bigger than $f_{1,k}^* = kf^*$ with minimum ratio $\bar{f}/\bar{f}^*$ at least $\rho > 1$. To give a reason for choosing a constant false alarm bound, note that with $f_{1,k}$ equal to $f_{1,m} = \bar{f}$, it is greater than $f_{1,m}^* = \bar{f}^*$, which exceeds $f_{l,k}^*$ for $k < m$. Accordingly, the relative entropy exponent $(B-1)D(p_{1,k} \| p_{1,k}^*)$ that arises in the probability bound in the next section is smallest at $k = m$, where it is at least $\bar{f} \mathcal{D}(\rho)/\rho$, where $\mathcal{D}(\rho)$ is the positive value $\rho \log \rho - (\rho-1)$.

In contrast, one has the seemingly natural choice $f_{1,k} = kf$ of linear growth in the false alarm bound, with $f = f^*\rho$. It is also upper bounded by $\bar{f}$ for $k \leq m$ and has constant ratio $f_{1,k}/f_{1,k}^*$ equal to $\rho$. It yields a corresponding exponent of $kf\mathcal{D}(\rho)/\rho$ for $k = 1$ to m. However, this exponent has a value at $k = 1$ that can be seen to be smaller by a factor of order $1/m$. For the same final false alarm control, it is preferable to arrange the larger order exponent, by keeping $D(p_{1,k} \| p_{1,k}^*)$ at least its value at $k = m$.

7 Reliability of Adaptive Successive Decoding

Herein it is established, for any power allocation and rate for which the decoder is accumulative, the reliability with which the weighted fractions of mistakes are governed by the studied quantities $1 - q_{1,m}$ plus $f_{1,m}$. The bounds on the probabilities with which the fractions of mistakes are worse than such targets are exponentially small in L. The implication is that if the power assignment and the communication rate are such that the function $q_L$ is accumulative on $[0,x^*]$, then for a suitable number of steps, the tail probability for weighted fraction of mistakes more than $\delta^* = 1 - q_L(x^*)$ is exponentially small in L.

7.1 Reliability Using the Data-Driven Weights:

In this subsection reliability is demonstrated using the data-driven weights $\hat{\lambda}$ in forming the statistic $\mathcal{Z}_{k,j}^{comb}$. Subsection 7.2 discusses a slightly different approach which uses deterministic weights and provides slightly smaller error probability bounds.

Theorem 8.

Reliable communication by sparse superposition codes with adaptive successive decoding. With total false alarm rate targets $f_{1,k} > f_{1,k}^*$ and update function $g_L$, set recursively the detection rate targets $q_{1,k}=g_L(q_{1,k-1}^{adj})-\eta_k$, with $\eta_k=q_{1,k}^*-q_{1,k}>0$ set such that it yields an increasing sequence $q_{1,k}$ for steps $1 \le k \le m$. Consider $\hat{\delta}_m$, the weighted failed detection rate plus false alarm rate. Then the m step adaptive successive decoder incurs $\hat{\delta}_m$ less than $\delta_m=(1-q_{1,m})+f_{1,m}$, except in an event of probability with upper bound as follows:

$$\sum_{k=1}^{m}\left[e^{-L_\pi D(q_{1,k}\|q_{1,k}^*)+(k-1)\log \tilde{L})+c_0 k}\right]+ \qquad I)$$

$$\sum_{k=1}^{m}\left[e^{-L_\pi(B-1)D(p_{1,k}\|p_{1,k}^*)+(k-1)\log L}\right]+\sum_{k=1}^{m}e^{-(n-k+1)D_{h_k}},$$

where the terms correspond to tail probabilities concerning, respectively, the fractions of correct detections, the fractions of false alarms, and the tail probabilities for the events $\{\|G\|_k^2/\sigma_k^2 \le n(1-h)\}$, on steps 1 to m. Here $L_\pi=1/\max_j \pi_j$. The $p_{1,k},p_{1,k}^*$ equal the corresponding $f_{1,k}, f_{1,k}^*$ divided by $B-1$. Also $D_h=-\log(1-h)-h$ is at least, $h^2/2$. Here $h_k=(nh-k+1)/(m-k+1)$, so the exponent $(n-k+1)D_{h_k}$ is near $nD_h$, as long as $k/n$ is small compared to $h$.

II) A Refined Probability Bound Holds as in I Above but with Exponent $$L\frac{\eta_k^2}{V_k+(1/3)\eta_k(L/L_\pi)}$$

in place of $L_\pi D(q_{1,k}\|q_{1,k}^*)$ for each $k=1, 2, \ldots, m$.

Corollary 9.

Suppose the rate and power assignments of the adaptive successive code are such that $g_L$ is accumulative on $[0,x^*]$ with a positive constant gap and a small shortfall $\delta^*=1-g_L(x^*)$. Assign positive $\eta_k=\eta$ and $f_{1,k}=\tilde{f}$ and $m \ge 2$ with $1-q_{1,m} \le \delta^*+\eta$. Let $\mathcal{D}(\rho)=\rho \log \rho-(\rho-1)$. Then there is a simplified probability bound. With a number of steps in, the weighted failed detection rate plus false alarm rate is less than $\delta^*+\eta+\tilde{f}$, except in an event of probability not more than.

$$me^{-2L\eta^2+m[c_0+\log \tilde{L}]}+me^{-L\pi \bar{f}\mathcal{D}(\rho)/\rho+m\log L}+ me^{-(n-m+1)h_m^2/2}.$$

The bound in the corollary is exponentially small in $2L_\pi \eta^2$ if h is chosen such that $(n-m+1)h_m^2/2$ is at least $2L_\pi \eta^2$ and $\rho>1$ and $\bar{f}$ are chosen such that $\bar{f}[\log \rho-1+1/\rho]$ matches $2\eta^2$.

Improvement is possible using II, in which case it is found that $V_k$ is of order $1/\sqrt{\log B}$. This produces a probability bound exponentially small in $L\eta^2(\log B)^{1/2}$ for small $\eta$.

Demonstration of Theorem 8 and its Corollary:

False alarms occur on step k, when there are terms j in other $\cup J_k$ for which there is occurrence of the event $\mathcal{H}_{k,j}$, which is the same for such j in other as the event $H_{w,k,j}^{acc}$, as there is no shift of the statistics for j in other. The weighted fraction of false alarms up to step k is $\hat{f}_1+\ldots+\hat{f}_k$ with increments $\hat{f}_k=\Sigma_{j \in other \cup J_k}\pi_j 1_{\mathcal{H}_{k',j}}$. This increment excludes the terms in $dec_{1,k-1}$ which are previously decoded. Nevertheless, introducing associated random variables for these excluded events (with the distribution discussed in the proof of Lemmas 1 and 2), the sum may be regarded as the weighted fraction of the union $\Sigma_{j \in other}\pi_j 1_{\cup_{k'=1}^k \mathcal{H}_{k',j}}$.

Recall, as previously discussed, for all such j in other, the event $H_{w,k',j}$ is the event that $Z_{w,k',j}^{comb}$ exceeds $\tau$, where for each $w=(1, w_2, w_3, \ldots, w_k)$, the $Z_{w,k',j}^{comb}$ are standard normal random variables, independent across j in other. So the events $\cup_{k'=1}^k H_{w,k',j}$ are independent and equiprobable across such j. Let $p_{1,k}^*$ be their probability or an upper bound on it, and let $p_{1,k}>p_{1,k}^*$. Then $A_{f,k}=\{\hat{f}_k^{tot} \ge f_{1,k}\}$ is contained in the union over all possible w of the events $\{\hat{p}_{w,1,k} \ge p_{1,k}\}$ where $$\hat{p}_{w,1,k}=\frac{1}{B-1}\sum_{j \in other}\pi_j 1_{\cup_{k'=1}^k H_{w,k',j}}.$$

With the rounding of the $acc_k$ to rationals of denominator $\tilde{L}$, the cardinality of the set of possible w is at most $\tilde{L}^{k-1}$. Moreover, by Lemma 46 in the appendix, the probability of the events $\{\hat{p}_{w,1,k} \ge p_{1,k}\}$ is less than $e^{-L_\pi(B-1)D(p_{1,k}\|p_{1,k}^*)}$. So by the union bound the probability $\{\hat{f}_k^{tot} \ge f_{1,k}\}$ is less than $$(\tilde{L})^{k-1}e^{-L_\pi(B-1)D(p_{1,k}\|p_{1,k}^*)}.$$

Likewise, investigate the weighted proportion of correct decodings $\hat{q}_m^{tot}$ and the associated values $\hat{q}_{1,k}=\Sigma_{j\ sent}\pi_j 1_{\mathcal{H}_{\lambda,k,j}}$ which are compared to the target values $q_{1,k}$ at steps $k=1$ to $m$. The event $\{\hat{q}_{1,k}<q_{1,k}\}$ is contained in $\mathcal{F}_k$ so when bounding its $\mathbb{P}$ probability, incurring a cost of a factor of $e^{kc_0}$, one may switch to the simpler measure $\mathbb{Q}$.

Consider the event $A=\cup_{k=1}^m A_k$, where $A_k$ is the union of the events $\{\hat{q}_{1,k}\le q_{1,k}\}$, $\{\hat{f}_k^{tot} \ge f_{1,k}\}$ and $\{\chi_{n-k+1}^2/n<1-h\}$. This event A may be decomposed as the union for k from 1 to m of the disjoint events $A_k \cap_{k'=1}^{k-1} A_{k'}^c$. The Chi-square event may be expressed as $A_{h,k}=\{\chi_{n-k+1}^2/(n-k+1)<1-h_k\}$ which has the probability bound $$e^{-(n-k+1)D_{h_k}}.$$

So to bound the probability of A, it remains to bound for k from 1 to m, the probability of the event $$A_{q,k}=\{\hat{q}_{1,k}<q_{1,k}\}\cap A_{h,k}^c\Omega_{k'=1}^{k-1}A_{k'}^c.$$

In this event, with the intersection of $A_{k'}^c$ for all $k'<k$ and the intersection with the Chi-square event $A_{h,k}^c$, the statistic $\mathcal{Z}_{k,j}^{comb}$ exceeds the corresponding approximation $$\sqrt{s_k}\sqrt{C_{j,R,B,h}}1_{j\ sent}+Z_{\tilde{w},k,j}^{acc,comb},$$

where $s_k=1/[1-q_{1,k-1}^{adj}v]$. There is a finite set of possible $\hat{w}^{acc}$ associated with the grid of values of $acc_1, \ldots, acc_{k-1}$ rounded to rationals of denominator $\tilde{L}$. Now $A_{q,k}$ is contained in the union across possible w of the events $$\{\hat{q}_{w,1,k}<q_{1,k}\}$$

where $$\hat{q}_{w,1,k}=\sum_{j\ sent}\pi_j 1_{\{Z_{w,k,j}^{comb} \ge a_{k,j}\}}.$$

Here $a_{k,j}=\tau-\sqrt{s_k}\sqrt{C_{j,R,B,h}}$. With respect to $\mathbb{Q}$, these $z_{w,k,j}^{comb}$ are standard normal, independent across j, so the Bernoulli random variables $1_{\{Z_{w,k,j}^{comb}\ge a_{k,j}\}}$ have success probability $\bar{\Phi}(a_{k,j})$ and accordingly, with respect to $\mathbb{Q}$, the $\hat{q}_{w,1,k}$ has expectation $q_{1,k}^*=\Sigma_{j\ sent}\pi_j \bar{\Phi}(a_{k,j})$. Thus, again by Lemma 46 in the appendix the probability of $$\mathbb{Q}\{\hat{q}_{w,1,k}<q_{1,k}\}$$

is not more than $$e^{-L_\pi D(q_{1,k}\|q_{1,k}^*)}.$$

By the union bound multiply this by $(\tilde{L})^{k-1}$ to bound $\mathbb{Q}(A_{q,k})$. One may sum it across k to bound the probability of the union.

The Chi-square random variables and the normal statistics for j in other have the same distribution with respect to $\mathbb{P}$ and $\mathbb{Q}$ so there is no need to multiply by the $e^{c_0 k}$ factor for the $A_h$ and $A_f$ contributions.

The event of interest $$A_{q_m}^{tot} = \{\hat{q}_m^{tot} \leq q_{1,m}\}$$

is contained in the union of the event $A_{q_m}^{tot} \cap A_{q,m-1}^c \cap A_f^c \cap A_h^c$ with the events $A_{q,m-1}$, $A_h$ and $A_f$, where $A_h = \cup_{k=1}^m A_{h,k}$ and $A_f = \cup_{k=1}^m A_{f,k}$. The three events $A_{q,m-1}$, $A_h$ and $A_f$ are clearly part of the event A which has been shown to have the indicated exponential bound on its probability. This leaves us with the event $$A_{q_m}^{tot} \cap A_{q,m-1}^c \cap A_f^c \cap A_h^c$$

Now, as has been seen earlier herein, $\hat{q}_m^{tot}$ may be regarded as the weighted proportion of occurrence the union $\cup_{k=1}^m \mathcal{H}_{k,j}$, which is at least $\Sigma_{j\,sent} \pi_j 1_{\mathcal{H}_{m,j}}$. Outside the exception sets $A_h$, $A_f$ and $A_{q,m-1}$, it is at least $\hat{q}_{1,m} = \Sigma_{j\,sent} \pi_j 1_{H_{ij^{acc},m,j}}$. With the indicated intersections, the above event is contained in $A_{q,m} = \{\hat{q}_{1,m} \leq q_{1,m}\}$, which is also part of the event A. So by containment in a union of events for which we have the probability bounds, the indicated bound holds.

As a consequence of the above conclusion, outside the event A at step k=m, one has $\hat{q}_m^{tot} < q_{1,m}$. Thus outside A the weighted fraction of failed detections, which is not more than $1-\hat{q}_{1,m}$, is less than $1-q_{1,m}$. Also outside A, the weighted fraction of false alarms is less than $f_{1,m}$. So the total weighted fraction of mistakes $\delta_m$ is less than $\delta_m = (1-q_{1,m}) + f_{1,m}$.

In these probability bounds the role in the exponent of $D(q||q^*)$ for numbers $q$ and $q^*$ in [0, 1], is played the relative entropy between the Bernoulli(q) and the Bernoulli $q^*$ distributions, even though these q and $q^*$ arise as expectations of weighted sums of many independent Bernoulli random variables.

Concerning the simplified bounds in the corollary, by the Pinsker-Csiszar-Kulback-Kemperman inequality, specialized to Bernoulli distributions, the expressions of the form $D(q||q^*)$ in the above, exceed $2(q-q^*)^2$. This specialization gives rise to the $e^{-2L_\pi \eta^2}$ bound when the $q_{1,k}$ and $\tilde{q}_{1,k}$ differ from $q_{1,k}^*$ by the amount $\eta$.

The $e^{-2L_\pi \eta^2}$ bound arises alternatively by applying Hoeffding's inequality for sums of bounded independent random variables to the weighted combinations of Bernoulli random variables that arise with respect to the distribution $\mathbb{Q}$. As an aside, it is remarked that order $\eta^2$ is the proper characterization of $D(q||q^*)$ only for the middle region of steps when $q_{1,k}^*$ is neither near 0 nor near 1. There are larger exponents toward the ends of the interval (0, 1) because Bernoulli random variables have less variability there.

To handle the exponents $(B-1)D(p||p^*)$ at the small values $p = p_{1,k} = f_{1,k}/(B-1)$ and $p^* = p_{1,k}^* = f_{1,k}^*/(B-1)$, use the Poisson lower bound on the Bernoulli relative entropy, shown in the appendix. This produces the lower bound $(B-1)[p_{1,k} \log p_{1,k}/p_{1,k}^* + p_{1,k}^* - p_{1,k}]$ which is equal to $$f_{1,k} \log f_{1,k}/f_{1,k}^* + f_{1,k}^* - f_{1,k}$$

Write this value as $f_{1,k} \mathcal{D}(\rho_k)$ or equivalently $f_{1,k} \mathcal{D}(\rho_k)/\rho_k$ where the functions $\mathcal{D}(\rho)$ and $\mathcal{D}(\rho)/\rho = \log \rho + 1 - 1/\rho$ are increasing in $\rho \geq 1$.

If one used $f_{1,k} = kf$ and $f_{1,k}^* = kf^*$ in fixed ratio $\rho = f/f^*$, this lower bound on the exponent would be $kf \mathcal{D}(\rho)/\rho$ as small as $f \mathcal{D}(\rho)/\rho$. Instead, keeping $f_{1,k}$ locked at $\bar{f}$, which is at least $\bar{f}^* \rho$, and keeping $f_{1,k}^* = kf^*$ less than or equal to $mf^* = \bar{f}^*$, the ratio $\rho_k$ will be at least $\rho$ and the exponents will be at least as large as $\bar{f} \mathcal{D}(\rho)/\rho$.

Finally, there is the matter of the refined exponent in II. As above proof the heart of the matter is the consideration of the probability $\mathbb{Q}\{\hat{q}_{w,1,k} < q_{1,k}\}$. Fix a value of k between 1 and m. Recall that $\hat{q}_{w,1,k} = \Sigma_{j\,sent} \pi_j 1_{H_{w,kj}}$. Bound the probability of the event that the sum of the independent random variables $\xi_j = -\pi_j(1_{H_{w,kj}} - \bar{\Phi}_j)$ exceeds $\eta$, where $\bar{\Phi}_j = \Phi(\text{shift}_{k,j} - \tau) = \mathbb{Q}(H_{w,k,j})$ provides the centering so that the $\xi_j$ have mean 0. Recognize that $\bar{\Phi}_j$ is $\bar{\Phi}(\mu_j(x)) = 1 - \Phi(\mu_j(x))$, evaluated at $x = q_{1,k}^{adj}$, and it is the same as used in the evaluation of the $q_{1,k}^*$, the expected value of $\hat{q}_{w,1,k}$, which is $g_L(x)$. The random variables $\epsilon_j$ have magnitude bounded by $\max_j \pi_j = 1/L_\pi$ and variance $\upsilon_j = \pi_j^2 \bar{\Phi}_j (1-\bar{\Phi}_j)$. Thus bound $\mathbb{Q}\{\hat{q}_{w,1,k} < q_{1,k}\}$ by Bernstein's inequality, where the sums are understood to be for j in sent, $$\mathbb{Q}\left\{\sum_j \xi_j \geq \eta\right\} \leq \exp\left\{-\frac{\eta^2}{2[V/L + \eta/(3L_\pi)]}\right\},$$

where here $\eta = \eta_k$ is the difference between the mean $q_{1,k}^*$ and $q_{1,k}$ and $V/L = \Sigma_j \upsilon_j = \Sigma_j \pi_j^2 \bar{\Phi}_j(1-\bar{\Phi}_j)$ is the total variance. It is $V_k/L$ given by $$V(x)/L = \sum_j \pi_j^2 \Phi(\mu_j(x))(1-\Phi(\mu_j(x)))$$

evaluated at $g_{1,k-1}^{adj}$. This completes the demonstration of Theorem 8.

If one were to use the crude bound on the total variance of $(\max_j \pi_j) \Sigma_j \pi_j /4 = 1/(4L_\pi)$ the result in II would be no better than the $\exp\{-2L_\pi \eta^2\}$ bound that arises from the Hoeffding bound.

The variable power assignments to be studied arrange $\bar{\Phi}_j(1-\bar{\Phi}_j)$ to be small for most j in sent. Indeed, a comparison of the sum $V(x)/L$ to an integral, in a manner similar to the analysis of $g_L(x)$ in an upcoming section, shows that $V(x)$ is not more than a constant times $1/\tau$, which is of order $1/\sqrt{\log B}$, by the calculation in Appendix 14.7. This produces, with a positive constant const, a bound of the form $$\exp\{-\text{const}L \min\{\eta, \eta^2 \sqrt{\log B}\}\}.$$

Equivalently, in terms of $n = (L \log B)/R$ the exponent is at least a constant times $n \min\{\eta^2/\sqrt{\log B}, \eta/\log\}$. This exponential bound is an improvement on the other bounds in the Theorem 8, by a factor of $\sqrt{\log B}$ in the exponent for a range of values of $\eta$ up to $1/\sqrt{\log B}$, provided of course that $\eta <$ gap to permit the required increase in $q_{1,k}$. For the best rates obtained here, $\eta$ will need to be of order $1/\log B$, to within a log log factor, matching the order of $\mathcal{C}-R$. So this improvement brings the exponent to within a $\sqrt{\log B}$ factor of best possible.

Other bounds on the total variance are evident. For instance, from $\Sigma_j \pi_j \bar{\Phi}_j(1-\bar{\Phi}_j)$ less than both $\Sigma_j \pi_j \bar{\Phi}_j$ and $\Sigma_j \pi_j(1-\bar{\Phi}_j)\}$, it follows that $$V(x)/L \leq (1/L_\pi) \min\{g_L(x), 1-g_L(x)\}.$$

This reveals that there is considerable improvement in the exponents provided by the Bernstein bound for the early and later steps where $g_L(x)$ is near 0 or 1, even improving the order of the bounds there. This does not alter the fact that the decoder must experience the effect of the exponents for steps with x near the middle of the interval from 0 to 1, where the previously mentioned bound on $V(x)$ produces an exponent of order $L\eta^2 \sqrt{\log B}$.

For the above, data-driven weights λ are used, with which the error probability in a union bound had to be multiplied by a factor of $\tilde{L}^{k-1}$, for each step k, to account for the size of the set of possible weight vectors.

Below a slight modification to the above procedure is described using deterministic λ that does away with this factor, thus demonstrating increased reliability for given rates below capacity. The procedure involves choosing each $\text{dec}_k$ to be a subset of the terms above threshold, with the π weighted size of this set very near a pre-specified value $\text{pace}_k$.

7.2 An Alternative Approach:

As mentioned earlier, instead of making $\text{dec}_k$, the set of decoded terms for step k, to be equal to $\text{thresh}_k$, one may take $\text{dec}_k$ for each step to be a subset of $\text{thresh}_k$ so that its size $\text{accept}_k$ is near a deterministic quantity which called $\text{pace}_k$. This will yield a sum $\text{accept}_k^{tot}$ near $\Sigma_{k'=1}^k \text{pace}_{k'}$ which is arranged to match $q_{1,k}$. Again abbreviate $\text{accept}_k^{tot}$ as $\text{acc}_k^{tot}$ and $\text{accept}_k$ as $\text{acc}_k$.

In particular, setting $\text{pace}_k = q_{1,k}^{adj} - q_{1,k-1}^{adj}$, the set $\text{dec}_k$ is chosen by selecting terms in $J_k$ that are above threshold, in decreasing order of their $\mathcal{Z}_{k,j}^{comb}$ values, until for each k the accumulated amount nearly equals $q_{1,k}$. In particular given $\text{acc}_{k-1}^{tot}$, one continues to add terms to $\text{acc}_k$, if possible, until their sum satisfies the following requirement, $$q_{1,k}^{adj} - 1/L_\pi < \text{acc}_k^{tot} \leq q_{1,k}^{adj},$$

where recall that $1/L_\pi$ is the minimum weight among all j in J. It is a small term of order 1/L.

Of course the set of terms $\text{thresh}_k$ might not be large enough to arrange for $\text{accept}_k$ satisfying the above requirement. Nevertheless, it is satisfied, provided $$\text{acc}_{k-1}^{tot} + \sum_{j \in \text{thresh}_k} \pi_j \geq q_{1,k}^{adj}$$

or equivalently, $$\sum_{j \in \text{dec}_{1,k-1}} \pi_j + \sum_{j \in J - \text{dec}_{1,k-1}} \pi_j 1_{\mathcal{H}_{k,j}} \geq q_{1,k}^{adj}.$$

Here for convenience take $\text{dec}_0 = \text{dec}_{1,0}$ as the empty set.

To demonstrate satisfaction of this condition note that the left side is at least the value one has if the indicator $1_{\mathcal{H}_{k,j}}$ is imposed for each j and if the one restricts to j in sent, which is the value $\hat{q}_{1,k}^{above} = \Sigma_{j \in \text{sent}} 1_{\mathcal{H}_{k,j}}$. Analysis for this case demonstrates, for each k, that the inequality $$\hat{q}_{1,k}^{above} > q_{1,k}$$

holds with high probability, which in turn exceeds $q_{1,k}^{adj}$. So then the above requirement is satisfied for each step, with high probability, and thence $\text{acc}_k$ matches $\text{pacc}_k$ to within $1/L_\pi$.

This $\hat{q}_{1,k}^{above}$ corresponds to the quantity studied in the previous section, giving the weighted total of terms in sent for which the combined statistic is above threshold, and it remains likely that it exceeds the purified statistic $\hat{q}_{1,k}$. What is different is the control on the size of the previously decoded sets allows for constant weights of combination.

In the previous procedure random weights $\hat{w}_k^{acc}$ were employed in the assignment of the $\lambda_{1,k}, \lambda_{2,k}, \ldots, \lambda_{k,k}$ used in the definition of $\mathcal{Z}_{k,j}^{comb}$ and $Z_{k,j}^{comb}$, where recall that $\hat{w}_k^{acc} = 1/(1 - \text{acc}_{k-1}^{tot} v) - 1/(1 - \text{acc}_{k-2}^{tot} v)$. Here, since each $\text{acc}_j^{tot}$ is near a deterministic quantity, namely $q_{1,k}^{adj}$, replace $\hat{w}_k^{acc}$ by a deterministic quantity $w_k^*$ given by, $$w_k^* = \frac{1}{\left(1 - q_{1,k-1}^{adj} v\right)} - \frac{1}{\left(1 - q_{1,k-2}^{adj} v\right)},$$

and use the corresponding vector λ* with coordinates $\lambda_{k',k}^* = w_{k'}^* / [1 + w_2^* + \ldots + w_k^*]$ for k'=1 to k.

Earlier the inequality $\hat{w}_k \leq \hat{w}_k^{acc}$ was demonstrated, which allowed quantification of the shift factor in each step. Analogously, the following result is obtained for the current procedure using deterministic weights.

Lemma 10.

For k'<k, assume the decoding sets $\text{dec}_{1,k'}$ are arranged so that the corresponding $\text{acc}_{k'}^{tot}$ takes value in the interval $(q_{1,k'}^{adj} - 1/L_\pi, q_{1,k'}^{adj}]$. Then $$\hat{w}_k \leq w_k^* + \epsilon_1,$$

where $\epsilon_1 = v/(L_\pi(1-v)^2) = \text{snr}(1+\text{snr})/L_\pi$ is a small term of order 1/L. Likewise. $\hat{w}_k \leq w_k^* + \epsilon_2$ holds for k'<k as well.

Demonstration of Lemma 10:

The $\hat{q}_{k'}$ and $\hat{f}_{k'}$ are the weighted sizes of the sets of true terms and false alarms, respectively, retaining that which is actually decoded on step k', not merely above threshold. These have sum $\hat{\delta}_k + \hat{f}_k = \text{acc}_k$, nearly equal to $\text{pace}_k$, taken here to be $q_{1,k'}^{adj} - q_{1,k'-1}^{adj}$. Let's establish the inequalities $$\hat{q}_1^{adj} + \ldots + \hat{q}_{k-1}^{adj} \leq q_{1,k-1}^{adj}$$

and $$\hat{q}_{k-1}^{adj} \leq q_{1,k-1}^{adj} - q_{1,k-2}^{adj} + 1/L_\pi.$$

The first inequality uses that each $\hat{q}_{k'}^{adj}$ is not more than $\hat{q}_{k'}$, which is not more than $\hat{q}_{k'} + \hat{f}_{k'}$, equal to $\text{acc}_{k'}$ which sums to $\text{acc}^{k-1tot}$ not more than $q_{1,k-1}^{adj}$. The second inequality is a consequence of the fact that $\hat{q}_{k-1}^{adj} \leq \text{acc}_{k-1}^{tot} - \text{acc}_{k-2}^{tot}$. Using the bounds on $\text{acc}_{k-1}^{tot}$ and $\text{acc}_{k-2}^{tot}$ gives that claimed inequality.

These two inequalities yield $$\hat{w}_k \leq \frac{(q_{1,k-1}^{adj} - q_{1,k-2}^{adj} + 1/L_\pi)v}{\left(1 - q_{1,k-1}^{adj} v\right)\left(1 - q_{1,k-2}^{adj} v\right)}.$$

The right side can be written as, $$\frac{1}{1 - q_{1,k-1}^{adj} v} - \frac{1}{1 - q_{1,k-2}^{adj} v} + \frac{1/L_\pi v}{\left(1 - q_{1,k-1}^{adj} v\right)\left(1 - q_{1,k-2}^{adj} v\right)}.$$

Now bound the last term using $q_{1,k-1}^{adj}$ and $q_{1,k-2}^{adj}$ less than 1 to complete the demonstration of Lemma 10.

Define the exception set $A_{q,above} = \cup_{k'=1}^{k-1} \{\hat{q}_{1,k'}^{above} < q_{1,k'}\}$. In some expressions above is abbreviated as abv. Also recall the set $A_f = \cup k' = 1^{k-1} \{\hat{f}_{k'}^{tot} > f_{1,k'}\}$. For convenience suppress the dependence on k in these sets.

Outside of $A_{q,adv}$, the $\hat{q}_{1,k'}^{abv}$ at least $q_{1,k'}$ and hence at least $q_{1,k}^{adj}$ for each $1 \leq k' < k$, ensuring that for each such k' one can get decoding sets $\text{dec}_{k'}$ such that the corresponding $\text{acc}_{k'}^{tot}$ is at most $1/L_\pi$ below $q_{1,k'}^{adj}$. Thus the requirements of Lemma 10 are satisfied outside this set.

Now proceed to lower bound the shift factor for step k outside of $A_{q,abv} \cup A_f$.

For the above choice of $\lambda=\lambda^*$ the shift factor is equal to the ratio $$\frac{1+\sqrt{\hat{w}_2 w_2^*}+\ldots+\sqrt{\hat{w}_k w_k^*}}{\sqrt{1+w_2^*+\ldots+w_k^*}}.$$

Using the above lemma and the fact that $\sqrt{a-b} \geq \sqrt{a}-\sqrt{b}$, obtain that the above is greater than or equal to $$\frac{1+\hat{w}_2+\ldots+\hat{w}_k}{\sqrt{1+w_2^*+\ldots+w_k^*}}-\sqrt{\epsilon_1}\frac{\sqrt{\hat{w}_2}+\ldots+\sqrt{\hat{w}_k}}{\sqrt{1+w_2^*+\ldots+w_k^*}}.$$

Now use the fact that $$\sqrt{\hat{w}_2}+\ldots+\sqrt{\hat{w}_k} \leq \sqrt{k}\sqrt{\hat{w}_2+\ldots+\hat{w}_k}$$

to bound the second term by $\epsilon_2 = \sqrt{\epsilon_1}\sqrt{k}\sqrt{v/(1-v)}$ which is snr $\sqrt{(1-\text{snr})k/L_\pi}$, a term of order near $1/\sqrt{L}$. Hence the shift factor is at least, $$\frac{1+\hat{w}_2+\ldots+\hat{w}_k}{\sqrt{1+w_2+\ldots+w_k}}-\epsilon_2.$$

Consequently, it is at least $$\frac{\sqrt{1-q_{1,k-1}^{adj}v}}{1-\hat{q}_{k-1}^{tot,adj}v}-\epsilon_2.$$

where recall that $\hat{q}_{k-1}^{tot,adhj}=\hat{q}_{k-1}^{tot}/(1+\hat{f}_{k-1}^{tot}/\hat{q}_{k-1}^{tot})$. Here it is used that $1+\hat{w}_2+\ldots+\hat{w}_k$, which is $1/(1-\hat{q}_{k-1}^{adj,tot}v)$, can be bounded from below by $1/(1-\hat{q}_{k-1}^{tot,adj}v)$ using Lemma 4.

Similar to before, note that $q_{1,k-1}^{adj}$ and $q_{k-1}^{tot,adj}$ are close to each other when the false alarm effects are small. Hence write this shift factor in the form $$\sqrt{\frac{1-\hat{h}_{f,k-1}}{1-\hat{q}_{k-1}^{tot,adj}v}}$$

as before. Again find that $$\hat{h}_{f,k-1} \leq 2\hat{f}_{k-1}^{tot}\text{snr}+\epsilon_3$$

outside of the exception set $A_{q,abv}$. Here $$c_3 = \frac{\text{snr}}{L_\pi}+2c_2,$$

is a term of order $1/\sqrt{L}$.

To confirm the above use the inequality $\sqrt{1-a}-\sqrt{b} \geq \sqrt{1-c}$, where $c=a+2\sqrt{b}$. Here $a=(q_{1,k-1}-\hat{q}_{k-1}^{tot,adj})v/(1-\hat{q}_{k-1}^{tot,adj}v)$ and $b=\epsilon_2^2(1-q_{k-1}^{tot,adj}v)$. Noting that the numerator in a is at most $(1/L_\pi+2\hat{f}_{k-1}^{tot}-(\hat{f}_{k-1}^{tot})^2)v$ outside of $A_{q,abv}$ and that $0 \leq q_{k-1}^{tot,adj} \leq 1$, one obtains the bound for $\hat{h}_{f,k-1}$.

Next, recall outside of the exception set $A_j \cup A_{q,abv}$ that $\hat{q}_{k-1}^{tot} \geq q_{1,k-1}$ and $\hat{f}_{k-1}^{tot} \leq f_{1,k-1}$. This leads to the shift factor being at least $$\sqrt{\frac{1-h_{f,k-1}}{1-q_{1,k-1}^{adj}v}},$$

where $$h_{f,k} = 2f_{1,k}\text{snr}+\epsilon_3.$$

As before, assume a bound $f_{1,k} \leq \bar{f}$, so that $h_{f,k}$ is not more than $h_f = 2\bar{f}\text{snr}+\epsilon_3$, independent of k.

As done herein previously, create the combined statistics $\mathcal{Z}_{k,j}^{comb}$, now using the deterministic $\lambda^*$. For j in other this $\mathcal{Z}_{k,j}^{comb}$ equals $Z_{k,j}^{comb}$ and for j in sent, when outside the exception set $A_{abv}=A_{q,abv} \cup A_j \cup A_h$, this combination exceeds $$\sqrt{\frac{1-h'}{1-q_{1,k-1}^{adj}v}}\sqrt{C_{j,R,B}}1_{j\,sent}+Z_{k,j}^{comb},$$

where $(1-h')=(1-h)(1-j_f)$ as before, though with $h_f$ larger by the small amount $\epsilon_3$. Again obtain $\text{shift}_{k,j}=\sqrt{C_{j,R,B,h/(1-xv)}}$ evaluated at $x=q_{1,k-1}^{adj}$, with $C_{j,R,B,h}$ as before.

Analogous to Theorem 8, reliability after m steps of the decoder is demonstrated by bounding the probability of the exception set $A=\cup_{k=1}^m A_k$, where $A_k$ is the union of the events $\{\hat{q}_{1,k}^{abv} \leq q_{1,k}\}$, $\{\hat{k}_k^{tot} \geq f_{1,k}\}$ and $\{\chi_{n-k+1}^2/n<1-h\}$. Thus the proof of Theorem 8 carries over, only now it is not required to take the union over the grid of values of the weights. The analogous theorem with the resulting improved bounds is now stated.

Theorem 11.

Under the same assumptions as in Theorem 8, the m step adaptive successive decoder, using deterministic pacing with $\text{pace}_k=q_{1,k}-q_{1,k-1}$, incurs a weighted fraction of errors $\hat{\delta}_m$ less than $\delta_m=f_{1,m}+(1-q_{1,m})$, except in an event of probability not more than $$\sum_{k=1}^m\left[e^{-L_\pi D(q_{1,k}\|q_{1,k}^*)+c_0k}\right]+\sum_{k=1}^m\left[e^{-L_\pi(B-1)D(p_{1,k}\|p_{1,k}^*)}\right]+\sum_{k=1}^m e^{-(n-k+1)D_{h_k}},$$

where the bound also holds if the exponent $L_\pi D(q_{1,k}\|q_{1,k}^*)$ is replaced by $$L\frac{\eta_k^2}{V_k+(1/3)\eta_k(L/L_\pi)}.$$

In the constant gap bound case, with positive $\eta$ and $\bar{f}$ and $m \geq 2$, satisfying the same hypotheses as in the previous corollary, the probability of $\hat{\delta}_m$ greater than $\delta^*+\eta+\bar{f}$ is not more than $$me^{-2L\pi\eta^2+mc_0}+me^{-L_\pi\bar{f}D(\rho)/\rho}+me^{-(n-m+1)h_m^2/2}.$$

Furthermore, using the variance $V_k$ and allowing a variable gap bound $\text{gap}_k \leq g_L(x_k)-x_k$ and $0<f_{1,k}+\eta_k<\text{gap}_k$, with difference $\text{gap}'=\text{gap}_k-f_{1,k}+\eta_k$ and number of steps $m \leq 1+1/\text{gap}'$, and with $\rho_k = f_{1,k}/f_{1,k}^* < 1$, this probability bound also holds with the exponent $$L \min_k \eta_k^2 / [V_k + (1/3)\eta_k(L/L_\pi)]$$

in place of $2L_\pi \eta^2$ and with $\min_k f_{1,k} \mathcal{D}(\rho_k)/\rho_k$ in place of $\bar{f} \mathcal{D}(\rho)/\rho$, where the minima are taken over k from 1 to m.

The bounds are the same as in Theorem 9 and its corollary, except for improvement due to the absence of the factors $\tilde{L}^{k-1}$. In the same manner as discussed there, there are choices of $\bar{f}$, $\rho$ and h, such that the exponents for the false alarms and the chi-square contributions are at least as good as for the $q_{1,k}$, so that the bound becomes $$3me^{-2L_\pi \eta^2 + mc_0}.$$

It is remarked that for the particular variable power allocation rule studied in the upcoming sections, as said, the update function $g_L(x)$ will seen to be ultimately insensitive to L, with $g_L(x)-x$ rapidly approaching a function $g(x)-x$ at rate $1/L$ uniformly in x. Indeed, a gap bound for $g_L$ will be seen to take a form $gap_L = gap^* - \theta/L_\pi$ for some constant $\theta$, so that it approaches the value of the gap determined by g, denoted $gap^*$, where note that L and $L_\pi$ agree to within a constant factor. Accordingly, using $gap^* - \theta/L_\pi$ in apportioning the values of $\eta$, $\bar{f}$, and $1/(m-1)$, these values are likewise ultimately insensitive to L. Indeed, slight adjustment to the rate allows arrangement of a gap independent of L.

Nevertheless, to see if there be any effect on the exponent, suppose for a specified $\eta^*$ that $\eta = \eta^* - \theta/L_\pi$ represents a corresponding reduction in $\eta$ due to finite L. Consider the exponential bound $$e^{-2L_\pi \eta^2}.$$

Expanding the square it is seen that the exponent $L_\pi \eta^2$, which is $L_\pi(\eta^* - \theta/L_\pi)^2$, is at least $L_\pi(\eta^*)^2$ minus a term $2\theta \eta^*$ that is negligible in comparison. Thus the approach of $\eta$ to $\eta^*$ is sufficiently rapid that the probability bound remains close to what it would be, $$e^{-2L_\pi(f^*)^2},$$

if one were to ignore the effect of the $\theta/L_\pi$, where it is used that $L_\pi(\eta^*)^2$ is large, and that $\eta^*$ is small, e.g., of the order of $1/\log B$.

8 Computational Illustrations

An important part of the invention herein is a device for evaluating the performance of a decoder depending on the parameters of the design, including L, B, a snr, the choice of power allocations, and the amount that the rate is below capacity. The heart of this device is the successive evaluation of the update function $g_L(x)$. Accordingly, the performance of the decoder is illustrated. First, for fixed values of the design parameters and rates below capacity, evaluate the detection rate as well as the probability of the exception set $P_\epsilon$ using the theoretical bounds given in Theorem 11. Plots demonstrating the progression of the decoder are also shown in specific figures. These highlight the crucial role of the function $g_L$ in achieving performance objectives.

Figure 5:
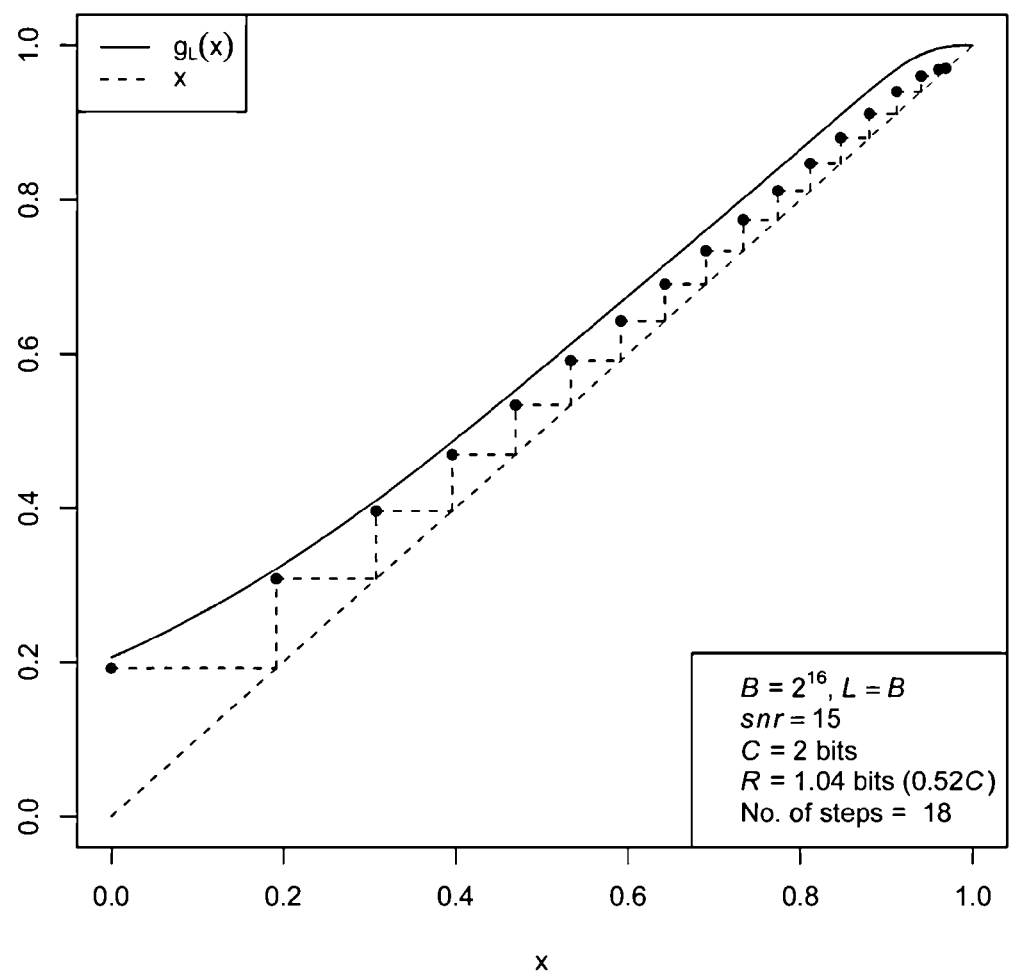
FIG. 5 is a graphical representation of a progression of a specific illustrative embodiment of the invention, wherein snr=15. The weighted (unweighted) detection rate is 0.995 (0.983) for a failed detection rate of 0.017 and the false alarm rate is 0.006. The probability of mistakes larger than these targets is bounded by $5.4 \times 10^{-4}$.
Figure 6:
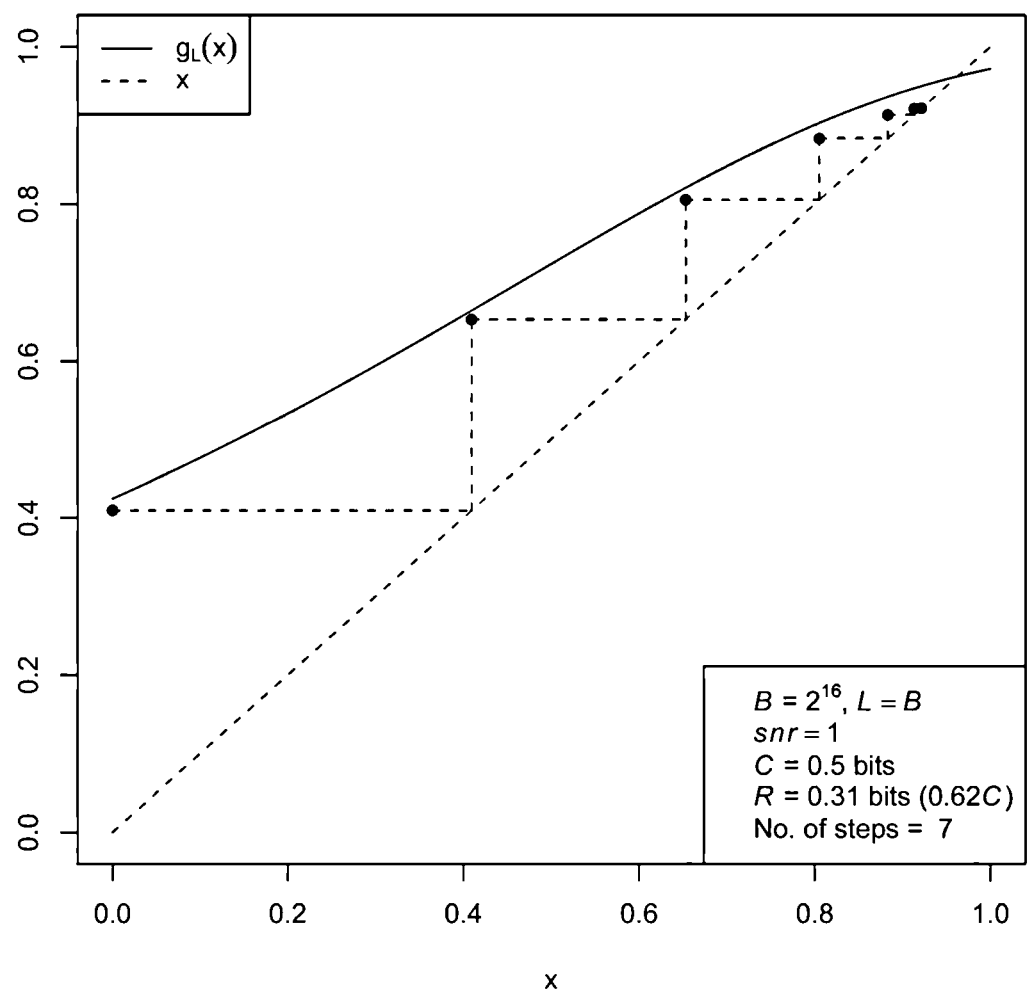
FIG. 6 is a graphical representation of a progression of a specific illustrative embodiment of the invention, wherein snr=1. The detection rate (both weighted and un-weighted) is 0.944 and the false alarm and failed detection rates are 0.016 and 0.056 respectively, with the corresponding error probability bounded by $2.1 \times 10^{-4}$.

FIGS. 4, 5, and 6 presents the results of computation using the reliability bounds of Theorem 11 for fixed L and B and various choices of snr and rates below capacity. The dots in these figures denotes $q_{1,k}^{adj}$ for each k and the step function joining these dots highlight how $q_{1,k}^{adj}$ is computed from $q_{1,k-1}^{adj}$. For large L these $q_{1,k}^{adj}$'s would be near $q_{1,k}$, the lower bound on the proportion of sections decoded after k passes. In this extreme case $q_{1,k}$ would match $g_L(q_{1,k-1})$, so that the dots would lie on the function.

For illustrative purposes take $B=2^{16}$, $L=B$ and snr values of 1, 7 and 15, in these three figures. For each snr value the maximum rate, over a grid of values, is determined, for which there is a particular control on the error probability. With snr=1 (FIG. 6), this rate R is 0.3 bits which is 593/4 of capacity. When snr is 7 and 15 (FIGS. 4 and 5), respectively, these rates correspond to 49.5% and 43.5% of their corresponding capacities.

Specifically, for FIG. 5, with snr=15, the variable power allocation was used with $P_{(l)}$ proportional to $e^{-2Cl/L}$ and a=1.3375. The weighted (unweighted) detection rate is 0.995 (0.983) for a failed detection rate of 0.017 and the false alarm rate is 0.006. The probability of mistakes larger than these targets is bounded by $5.4 \times 10^{-4}$.

For FIG. 6, with snr=1, constant power allocation was used for the sections with a=0.6625. The detection rate (both weighted and un-weighted) is 0.944 and the false alarm and failed detection rates are 0.016 and 0.056 respectively, with the corresponding error probability bounded by $2.1 \times 10^{-4}$.

Specifics for FIG. 4 with snr=7 were already discussed in the introduction.

The error probability in these calculations is controlled as follows. Arrange each of the 3m terms in the probability bound to take the same value, set in these examples to be $\epsilon = 10^{-5}$. In particular, compute in succession appropriate values of $q_{1,k}^*$ and $f_{1,k}^* = kf^*$, using an evaluation of the function $g_L(x)$, an L term sum, evaluated at a point determined from the previous step, and from these determine $q_{1,k}$ and $f_{1,k}$.

This means solving for $q_{1,k}$ less than $q_{1,k}^*$ such that $e^{-L_\pi D(q_{1,k}\|q_{1,k}^*) + c_0 k}$ equals $\epsilon$, and with $p_{1,k}^* = f_{1,k}^*/(B-1)$, solving for the $p_{1,k}$ greater than $p_{1,k}^*$ such that the corresponding term $e^{-L_\pi(B-1)D(p_{1,k}\|p_{1,k}^*)}$ also equals $\epsilon$. In this way, the largest $q_{1,k}$ less than $q_{1,k}^*$ is used, that is, the smallest $\eta_k$, and the smallest false alarm bound $f_{1,k}$, for which the respective contributions to the error probability bound is not worse then the prescribed value.

These are numerically simple to solve because $D(q\|q^*)$ is convex and monotone in $q<q^*$, and likewise for $D(p\|p^*)$ for $p>p^*$. Likewise arrange $h_k$ so that $e^{-(n-k+1)D_{h_k}}$ matches $\epsilon$.

Taking advantage of the Bernstein bound sometimes yields a smaller $\eta_k$ by solving for the choice satisfying the quadratic equation $L\eta_k^2/[V_k + (1/3)\eta_k L/L_\pi] = \log 1/\epsilon + c_0 k$, where $V_k$ is computed by an evaluation of $V(x)$, which like $q_L(x)$ is a L term sum, both of which are evaluated at $x = q_{1,k-1}^{adj}$.

These computation steps continue as long as $(1-q_{1,k}) + f_{1,k}$ decreases, thus yielding the choice of the number of steps m.

For these computations choose power allocations proportional to $$\max\{e^{-2\gamma(l-1)/L}, e^{-2\gamma}(1+\delta_c)\},$$

with $0 \leq \gamma \leq \mathcal{C}$. Here the choices of a, c and $\gamma$ are made, by computational search, to minimize the resulting sum of false alarms and failed detections, per the bounds. In the snr=1 case the optimum $\gamma$ is 0, so there is constant power allocation in this case. In the other two cases, there is variable power across most of the sections. The role of a positive c being to increase the relative power allocation for sections with low weights. Note, in the analytical results for maximum achievable rates as a function of B as given in the upcoming sections, $\gamma$ is constrained to be equal to $\mathcal{C}$, though the methodology does extend to the case of $\gamma < \mathcal{C}$.

Figure 7:
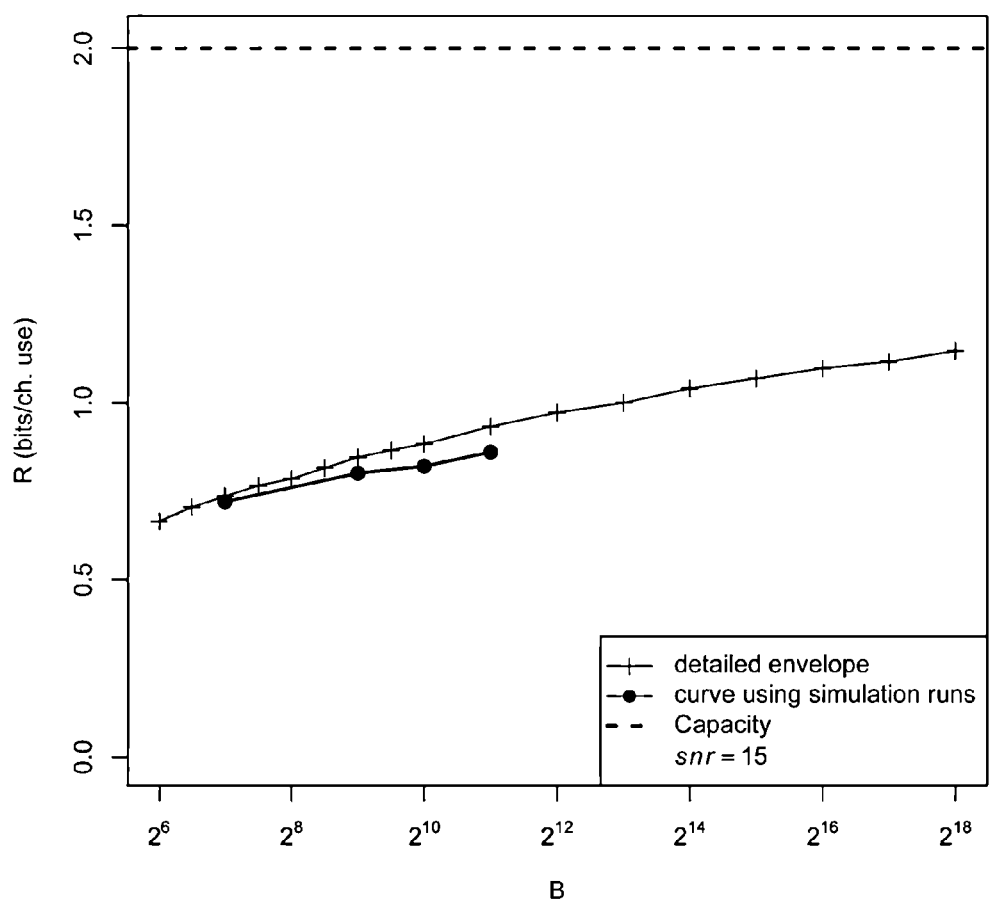
FIG. 7 is a graphical representation of a plot of an achievable rate as a function of B for snr=15. Section error rate is controlled to be between 9 and 10%. For the curve using simulation runs the rates are exhibited for which the empirical probability of making more than 10% section mistakes is near $10^{-3}$.
Figure 8:
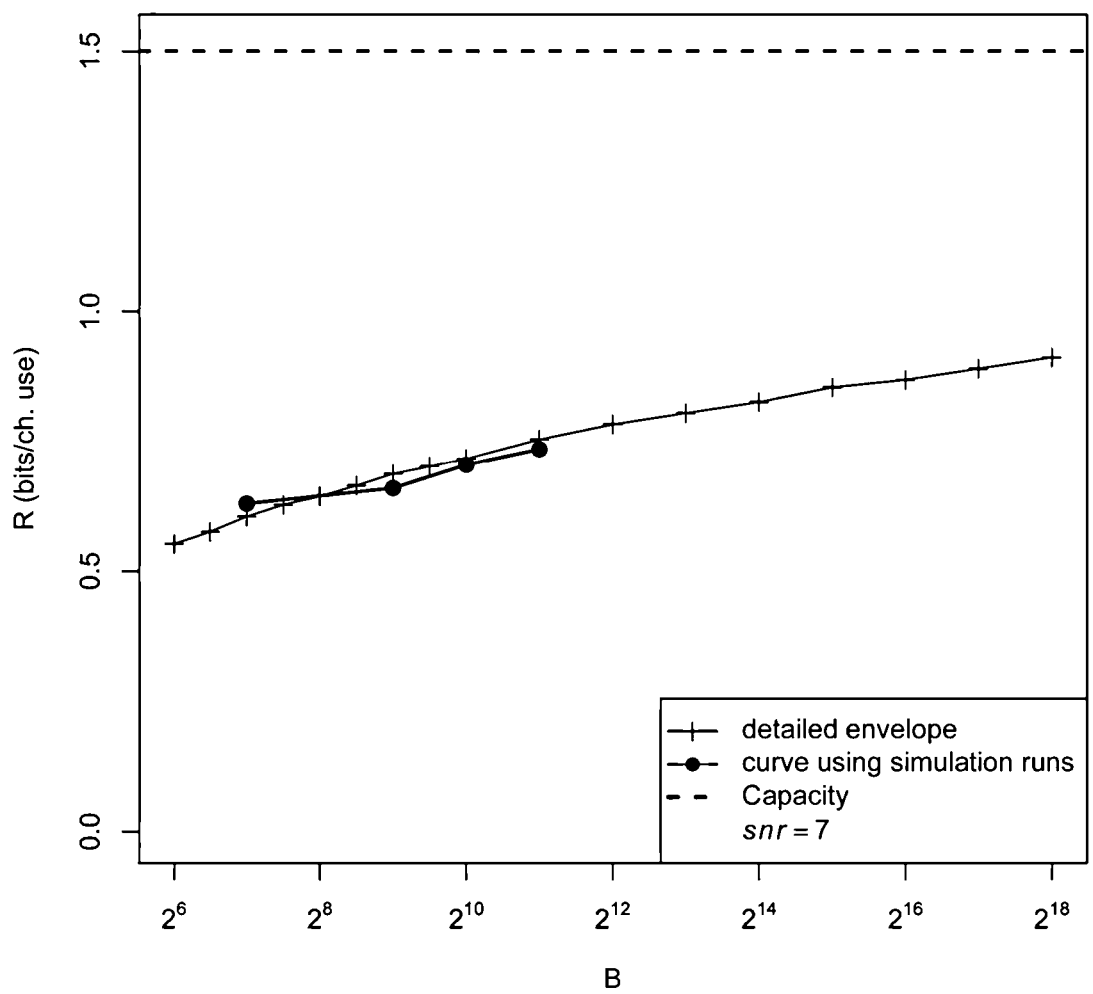
FIG. 8 is a graphical representation of a plot of an achievable rate as a function of B for snr=7. Section error rate is controlled to be between 9 and 10%. For the curve using simulation runs the rates are exhibited for which the empirical probability of making more than 10% section mistakes is near $10^{-3}$.
Figure 9:
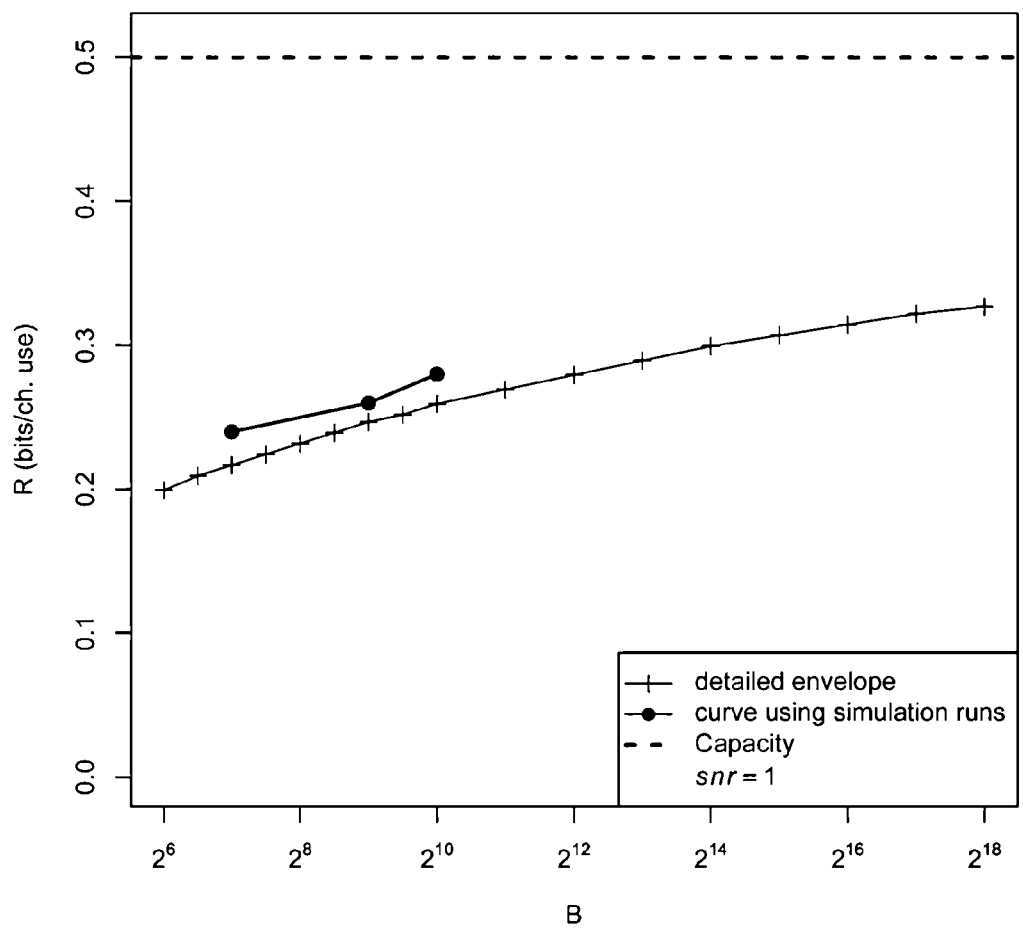
FIG. 9 is a graphical representation of a plot of an achievable rate as a function of B for snr=1. Section error rate is controlled to be between 9 and 10%. For the curve using simulation runs the rates are exhibited for which the empirical probability of making more than 10% section mistakes is near $10^{-3}$.

FIGS. 7, 8, 9 give plots of achievable rates as a function of B for snr values of 15, 7 and 1. The section error rate is controlled to be between 9 and 10%. For the curve using simulation runs the rates are exhibited for which the empirical probability of making more than 10% section mistakes is near $10^{-3}$.

For each B, the points on the detailed envelope correspond to the numerically evaluated maximum inner code rate for which the section mistake rate is between 9 and 10%. Here assume L to be large, so that the $q_{1,k}$'s and $f_k$'s are replaced by the expected values $q_{1,k}*$ and $f_k*$, respectively. Also take h=0. This gives an idea about the best possible rates for a given snr and section mistake rate.

For the simulation curve, L was fixed at 100 and for given snr. B and rate values, $10^4$ runs of our decoder were performed. The maximum rate over the grid of values satisfying section error rate of less than 10% except in 10 replicates, (corresponding to an estimated $P_e$ of $10^{-3}$) are shown in the plots. Interestingly, even for such small values of L the curve is quite close to the detailed envelope curve, showing that the theoretical bounds herein are quite conservative.

9 Accumulative g

This section complements the previous computational results and reliability results to analytically quantify, in the finite L and B case, conditions on the rate moderately close to capacity, such that the update function $g_L(x)$ is indeed accumulative for a suitable positive gap and an x* near 1.

In particular, normalized power allocation weights $\pi_{(l)}$ are developed in subsection 1, including slight modification to the exponential form. An integral approximation g(x) to the sum $g_L(x)$ is provided in subsection 2. Subsection 3 examines the behavior of $g_L(x)$ for x near 1, including introduction of x* via a parameter $r_1$ related to an amount of permitted rate drop and a parameter $\zeta$ related to the amount of shift at x*. For cases with monotone decreasing $g(x)-X_7$ as in the unmodified weight case, the behavior for x near 1 suffices to demonstrate that $g_L(x)$ is accumulative. Improved closeness of the rate to capacity is shown in the finite codelength case by allowance of the modifications to the weight via the parameter $\delta_c$. But with this modifications monotonicity is lost. In Subsection 4, a bound on the number of oscillations of g(x)−x is established in that is used in showing that $g_L(x)$ is accumulative. The location of x* and the value of $\delta_c$ both impact the mistake rate $\delta_{mis}$ and the amount of rate drop required for $g_L(x)$ to be accumulative, expressed through a quantity introduced there denoted $r_{crit}$. Subsection 5 provides optimization of $\delta_c$. Helpful inequalities in controlling the rate drop are in subsection 6. Subsection 7 provides optimization of the contribution to the total rate drop of the choice of location of x*, via optimization of $\zeta$.

Recall that $g_L(x)$ for $0 \leq x \leq 1$ is the function given by $$g_L(x) = \sum_{l=1}^{L} \pi_{(l)} \Phi(\mu_l(x) - \tau),$$

where here denote $\mu_l(x) = \text{shift}_{l,x} = \sqrt{C_{l,R,B,h}/(1-xv)}$. Recursively, $q_{1,k}$ is obtained from $q_{1,k}* = g_L(x)$ evaluated at $x = q_{1,k-1}^{adj}$, in succession for k from 1 to m.

The values of $\Phi(\mu_l(x) - \tau)$, as a function of l from 1 to L, provide what is interpreted as the probability with which the term sent from section l have approximate test statistic value that is above threshold, when the previous step successfully had an adjusted weighted fraction above threshold equal to x. The $\Phi(\mu_l(x) - \tau)$ is increasing in x regardless of the choice of $\pi_l$, though how high is reached depends on the choice of this power allocation.

9.1 Variable Power Allocations:

Consider two closely related schemes for allocating the power. First suppose $P_{(l)}$ is proportional to $e^{-2\mathcal{C}l/L}$ as motivated in the introduction. Then the weight for section l is $\pi_{(l)}$ given by $P_{(l)}/P$. In this case recall that $C_{l,R} = \pi_{(l)} Lv/(2R)$ simplifies to $u_l$ times the constant $\tilde{\mathcal{C}}/R$ where $$u_l = e^{-2\mathcal{C}(l-1)/L}.$$

for sections l from 1 to L. The presence of the factor $\tilde{\mathcal{C}}/R$ if at least 1, increases the value of $g_L(x)$ above what it would be if that factor were not there and helps in establishing that it is accumulative.

As l varies from 1 to L the ranges from 1 down to the value $e^{-2\mathcal{C}} = 1-v$.

To roughly explain the behavior, as shall be see, this choice of power allocation produces values of $\Phi(\mu_l(x) - \tau)$ that are near 1 for l with $u_l$ enough less than 1−xv and near 0 for values of $u_l$ enough greater than 1−xv, with a region of l in between, in which there will be a scatter of sections with statistics above threshold. Though it is roughly successful in reaching an x near 1, the fraction of detections is limited, if R is too close to $\tilde{\mathcal{C}}$, by the fact that $\mu_l(x)$ is not large for a portion of l near the right end, of the order $1/\sqrt{2\log B}$.

Therefore, the power allocation is modified, taking $\pi_{(l)}$ to be proportional to an expression that is equal $$u_l = \exp\left\{-2\mathcal{C}\frac{l-1}{L}\right\}$$

except for large l/L where it is leveled to be not less than a value $u_{cut} = e^{-2\mathcal{C}}(1+\delta_c)$ which exceeds $(1-v) = e^{-2\mathcal{C}} = 1/(1+$ snr$)$ using a small positive $\delta_c$. This $\delta_c$ is constrained to be between 0 and snr so that $u_{cut}$ is not more than 1. Thus let $\pi_{(l)}$ be proportional to $\tilde{u}_l$ given by $$\max\{u_l, u_{cut}\}.$$

The idea is that by leveling the height to a slightly larger value for l/L near 1, nearly all sections are arranged to have $\tilde{u}_l$ above (1−xv) when x is near 1. This will allow to reach the objective with an R closer to $\mathcal{C}$. The required normalization could adversely affect the rate, but it will be seen to be of a smaller order of 1/(2 log B).

To produce the normalized $\pi_{(l)=\max\{u_l, u_{cut}\}}$ (L SUM compute $$\text{sum} = \sum_{l=1}^{L} \max\{u_l, u_{cut}\}(1/L).$$

If c=0 this sum equals $v/(2\tilde{\mathcal{C}})$ as previously seen. If c>0 and $u_{cut} < 1$, it is the sum of two parts, depending on whether $e^{-2\mathcal{C}(l-1)/L}$ is greater than or not greater than $u_{cut}$. This sum can be computed exactly, but to produce a simplified expression let's note that replacing the sum by the corresponding integral $$\text{integ} = \int_0^1 \max\{e^{-2\mathcal{C}t}, u_{cut}\} dt$$

an error of at most 1/L is incurred. For each L there is a $\theta$ with $0 \leq \theta \leq 1$ such that $$\text{sum} = \text{integ} + \theta/L.$$

In the integral, $e^{-2\mathcal{C}t}$ to $u_{cut}$ corresponds to comparing corresponds to comparing t to $t_{cut}$ equal to $[1/(2\mathcal{C})] \log 1/u_{cut}$.

Splitting the integral accordingly, it is seen to equal $[1/(2\mathcal{C})](1-u_{cut})$ plus $u_{cut}(1-t_{cut})$, which may be expressed as $$integ = \frac{v}{2\mathcal{C}}[1 + D(\delta_c)/snr],$$

where $D(\delta)=(1+\delta)\log(1+\delta)-\delta$. For $\delta\geq 0$, the function $D(\delta)$ is not more than $\delta^2/2$, which is a tight bound for small $\delta$. This $[1+D(\delta_c)/snr]$ factor in the normalization, represents a cost to us of introduction of the otherwise helpful $\delta_c$. Nevertheless, this remainder $D(\delta_c)/snr$ is small compared to $\delta_c$, when $\delta_c$ is small compared to the snr. It might appear that $D(\delta_c)/snr$ could get large if snr were small, but, in fact, since $\delta_c\leq snr$ the $D(\delta_c)/snr$ remains less than $snr/2$.

Accordingly, from the above relationship to the integral, the sum may be expressed as $$sum = \frac{v}{2\mathcal{C}}[1 + \delta_{sum}^2],$$

where $\delta_{sum}^2$ is equal to $D(\delta_c)/snr+2\theta\mathcal{C}/(Lv)$, which is not more than $\delta_c^2/(2snr)+2\mathcal{C}/(Lv)$. Thus $$\pi_{(l)} = \frac{\max\{u_l, u_{cut}\}}{L\,sum} = \frac{2\mathcal{C}}{Lv}\frac{\max\{u_l, u_{cut}\}}{1+\delta_{sum}^2}.$$

In this case $C_{l,R,B,h}=(\pi_l Lv/(2R))(1-h')(2\log B)$ may be written $$C_{l,R,B,h} = \max\{u_l, u_{cut}\}\frac{\mathcal{C}(1-h')}{R(1+\delta_{sum}^2)}(2\log B),$$

or equivalently, using $\tau=\sqrt{2\log B}(1+\delta_a)$, this is $$\max\{u_l, u_{cut}\}(\mathcal{C}'/R)\tau^2,$$

where $$\mathcal{C}' = \frac{\mathcal{C}(1-h')}{(1+\delta_{sum}^2)(1+\delta_a)^2}.$$

For small $\delta_c$, $\delta_a$, and h' this is a value near the capacity $\mathcal{C}$. As seen later, the best choices of these parameters make $\mathcal{C}'$ less than capacity by an amount of order log log B/log B. When $\delta_c=0$ the $\mathcal{C}/(1+\delta_{sum}^2)$ is what is previously herein called $\bar{\mathcal{C}}$ and its closeness to capacity is controlled by $\delta_{sum}^2\leq 2\mathcal{C}/(vL)$.

In contrast, if $\delta_c$ were taken to be the maximum permitted, which is $\delta_c=snr$, then the power allocation would revert to the constant allocation rule, with an exact match of the integral and the sum, so that $1+\delta_{sum}^2=1+D(snr)/snr$ and the $\mathcal{C}/(1+\delta_{sum}^2)$ simplifies to $R_0=(\frac{1}{2})snr/(1+snr)$, which, as said herein, is a rate target substantially inferior to $\mathcal{C}$, unless the snr is small.

Now $\mu_l(x)-\tau$ which is $\sqrt{C_{l,R,B,h/(1-xv)}}-\tau$ may be written as the function $$\mu(x,u)=(\sqrt{u/(1-xv)}-1)\tau$$

evaluated at $u=\max\{u_l, u_{cut}\}(\mathcal{C}'/R)$. For later reference note that the $u_l(x)$ here and hence $g_L(x)$ both depend on x and the rate R only through the quantity $(1-xv)R/\mathcal{C}'$.

Note also that $\mu(x, u)$ is of order $\tau$ and whether it is positive or negative depends on whether or not u exceeds 1−xv in accordance with the discussion above.

9.2 Formulation and Evaluation of the Integral g (x):

The function that updates the target fraction of correct decodings is $$g_L(x) = \sum_{l=1}^{L} \pi_{(l)}\Phi(\mu_l(x) - \tau)$$

which, for the variable power allocation with allowance for leveling, takes the form $$\sum_{l=1}^{L} \pi_{(l)}\Phi(\mu(x, \max\{u_l, u_{cut}\}\mathcal{C}'/R)),$$

with $$u_l = e^{-2\mathcal{C}\frac{l-1}{L}}.$$

From the above expression for $\pi_{(l)}$, this $g_L(x)$ is equal to $$\frac{2\mathcal{C}}{vL}\sum_{l=1}^{L}\frac{\max\{u_l, u_{cut}\}}{1+\delta_{sum}^2}\Phi(\mu(x, \max\{u_l, u_{cut}\}\mathcal{C}'/R)).$$

Recognize that this sum corresponds closely to an integral. In each interval $$\frac{l-1}{L} \leq t < \frac{l}{L}$$

for l from 1 to L, one have $$e^{-2\mathcal{C}\frac{l-1}{L}}$$

at least $e^{-2\mathcal{C}t}$ Consequently, $g_L(x)$ is greater than $g_{num}(x)/(1+\delta_{sum}^2)$ where the numerator $g_{num}(x)$ is the integral $$\frac{2\mathcal{C}}{v}\int_0^1 \max\{e^{-2\mathcal{C}t}, u_{cut}\}\Phi(\mu(x, \max\{e^{-2\mathcal{C}t}, u_{cut}\}\mathcal{C}'/R))dt.$$

Accordingly, the quantity of interest $g_L(x)$ has value at least $(integ/sum)g(x)$ where $$g(x) = \frac{g_{num}(x)}{1+D(\delta_c)/snr}.$$

Using $$\frac{integ}{sum} = 1 - \frac{2\theta C}{L\eta} \frac{1}{1+\delta_{sum}^2}$$

and using that $g_L(x) \leq 1$ and hence $g_{num}(x)/(1+\delta_{sum}^2) \leq 1$ it follows that $$g_L(x) \geq g(x) - 2\mathcal{C}/(Lv).$$

The $g_L(x)$ and $g(x)$ are increasing functions of x on [0, 1].

Let's provide further characterization and evaluation of the integral $g_{num}(x)$ for the variable power allocation. Let $z_x^{low} = \mu(x, u_{cut} \mathcal{C}'/R)$ and $z_x^{max} = \mu(x, \mathcal{C}'/R)$. These have $z_x^{low} \leq z_x^{max}$, with equality only in the constant power case (where $u_{cut} = 1$). For emphasis, write out that $z_x = z_x^{low}$ takes the form $$z_x = \left[\frac{\sqrt{u_{cut} C'/R}}{\sqrt{1-xv}} - 1\right]\tau.$$

Set $u_x = 1-xv$.

Lemma 12.

Integral evaluation. The $g_{num}(x)$ for has a representation as the integral with respect to the standard normal density $\phi(z)$ of the function that takes the value $1+D(\delta_c)/snr$ for z less than $z_x^{low}$, takes the value $$x + \frac{u_x}{v}\left(1 - \frac{R}{C'}(1+z/\tau)^2\right)$$

for z between $z_x^{low}$ and $z_x^{max}$, and takes the value 0 for z greater than $z_x^{max}$. This yields $g_{num}(x)$ is equal to $$[1 + D(\delta_c)/snr]\Phi(z_x^{low}) + \left[x + \delta_R \frac{u_x}{v}\right][\Phi(z_x^{max}) - \Phi(z_x^{low})] +$$

$$\frac{2R}{C'}\frac{u_x}{v}\frac{[\phi(z_x^{max}) - \phi(z_x^{low})]}{\tau} + \frac{R}{C'}\frac{u_x}{v}\frac{[z_x^{max}\phi(z_x^{max}) - z_x^{low}\phi(z_x^{low})]}{\tau^2},$$

where $$\delta_R = 1 - \frac{R}{C'}[1 + 1/\tau^2].$$

This $\delta_R$ is non-negative if $R \leq \mathcal{C}'/(1+1/\tau^2)$.

In the constant power case, corresponding to $u_{cut} = 1$, the conclusion is consistent with the simpler $g(x) = \Phi(z_x)$.

The integrand above has value near $x+(1-R/\mathcal{C}')u_x/v$, if z is not too far from 0. The heart of the matter for analysis in this section is that this value is at least x for rates $R \leq \mathcal{C}'$.

Demonstration of Lemma 12:

By definition, the function $g_{num}(x)$ is $$\frac{2C}{v}\int_0^1 \max\{e^{-2Ct}, u_{cut}\}\Phi(\mu(x, \max\{e^{-2Ct}, u_{cut}\}C'/R))dt,$$

which is equal to the integral $$\frac{2C}{v}\int_0^{t_{cut}} e^{-2Ct}\Phi(\mu(x, e^{-2Ct}C'/R))dt$$

plus the expression $$\frac{2C}{v}(1 - t_{cut})u_{cut}\Phi(z_x^{low}),$$

which can also be written as $[\delta_c D(\delta_c)]\Phi(z_x^{low}))/snr$.

Change the variable of integration from t to $u = e^{-2Ct}$, to produce the simplified expression for the integral $$\frac{1}{v}\int_{u_{cut}}^1 \Phi(\mu(x, uC'/R))du.$$

Add and subtract the value $\Phi(z_x^{low})$ in the integral to write it as $[(1-u_{cut})/v]\Phi(z_x^{low})$, which is $[1-\delta_c/snr]\Phi(z_x^{low})$, plus the integral $$\frac{1}{v}\int_{u_{cut}}^1 [\Phi(\mu(x, uC'/R)) - \Phi(\mu(x, u_{cut}C'/R))]du.$$

Now since $$\Phi(b) - \Phi(a) = \int 1_{\{a < z < b\}}\phi(z)dz,$$

it follows that this integral equals)

$$\iint 1_{\{u_{cut} \leq u \leq 1\}} 1_{\{z_x^{low} \leq z \leq \mu(x, uC'/R)\}}\phi(z)dz du/v.$$

Switch the order of integration. In the integral, the inequality $z \leq \mu(x, u\mathcal{C}'/R)$ is the same as $$u \leq u_x R/\mathcal{C}'(1+z/\tau)^2,$$

which exceeds $u_{cut}$ for z greater than $z_x^{low}$. Here $u_x = 1-xv$. This determines an interval of values of u. For z between $z_x^{low}$ and $z_x^{max}$ the length of this interval of values of u is equal to $$1 - (R/\mathcal{C}')u_x(1+z/\tau)^2.$$

Using $u_x = 1-xv$ one sees that this interval length, when divided by v, may be written as $$x + \frac{u_x}{v}\left(1 - \frac{R}{C'}(1+z/\tau)^2\right),$$

a quadratic function of z.

Integrate with respect to $\phi(z)$. The resulting value of $g_{num}(x)$ may be expressed as $$[1 + D(\delta_c)/snr]\Phi(z_x^{low}) + \frac{1}{v}\int_{z_x^{low}}^{z_x^{max}} [1 - (R/C')u_x(1+z/\tau)^2]\phi(z)dz,$$

To evaluate, expand the square $(1+z/\tau)^2$ in the integrand as $1+2z/\tau+z^2/\tau^2$. Multiply by $\phi(z)$ and integrate. For the term linear in z, use $z\phi(z) = -\phi'(z)$ for which its integral is a difference in values of $\phi(z)$ at the two end points. Likewise, for the term involving $z^2 = 1+(z^2-1)$, use $(z^2-1) = -(z\phi(z))'$ which integrates to a difference in values of $z\phi(z)$. Of course the constant multiples of $\phi(z)$ integrate to a difference in values of $\Phi(z)$. The result for the integral matches what is stated in the Lemma. This completes the demonstration of Lemma 12.

One sees that the integral $g_{num}(x)$ may also be expressed as $$\frac{1}{snr}[\delta_c + D(\delta_c)]\Phi(z_x) + \frac{1}{v}\int \left[1 - \max\left\{u_x \frac{R}{C'}(1+z/\tau)_+^2, u_{cut}\right\}\right]_+ \phi(z)dz.$$

To reconcile this form with the integral given in the Lemma one notes that the integrand here for z below $z_x$ takes the form of a particular constant value times $\phi(z)$ which, when integrated, provides a contribution that adds to the term involving $\phi(z_x)$.

Corollary 13.

Derivative evaluation. The derivative $g'_{num}(x)$ is equal to $$\frac{\tau}{2}\left(1 + \frac{z_x}{\tau}\right)^3 \phi(z_x)\frac{R}{C'}\log(1+\delta_c) + \int_{z_x}^{z_x^{max}} \frac{R}{C'}(1+z/\tau)^2 \phi(z)dz.$$

In particular if $\delta_c = 0$ the derivative $g'(x)$ is $$\frac{R}{C'}\int_{z_x^{low}}^{z_x^{max}} (1+z/\tau)^2 \phi(z)dz,$$

and then, if also $R = C'/(1+r/\tau^2)$ with $r \geq 1$, that is, if $R \leq C'/(1+1/\tau^2)$, the difference $g(x)-x$ is a decreasing function of x.

Demonstration:

Consider the last expression given for $g_{num}(x)$. The part $[(\delta_c + D(\delta_c))]\Phi(z_x)/snr$ has derivative $$z_x'[\delta_c + D(\delta_c)]\phi(z_x)/snr.$$

Use $(1+z_x/\tau) = \sqrt{u_{cut}(C'/R)/(1-xv)}$ to evaluate $z_x'$ as $$z_x' = \frac{v}{2}\frac{1}{(1-xv)^{3/2}}\sqrt{u_{cut}C'/R}\,\tau$$

and obtain that it is $(v/2)(1+z_x/\tau)^3\tau/(u_{cut}C'/R)$. So using $u_{cut} = (1-v)(1-\delta_c)$ the $z_x'$ is equal to $$\frac{snr}{2}(1+z_x/\tau)^3 \frac{\tau}{(1+\delta_c)}\frac{R}{C'}.$$

This using the form of $D(\delta_c)$ and simplifying, the derivative of this part of $g_{num}$ is the first part of the expression stated in the Lemma.

As for the integral in the expression for $g_{num}$, its integrand is continuous and piecewise differentiable in x, and the integral of its derivative is the second part of the expression in the Lemma. Direct evaluation confirms that it is the derivative of the integral.

In the $\delta_c = 0$ case, this derivative specializes to the indicated expression which is less than $$\frac{R}{C'}\int_{-\infty}^{\infty}(1+z/\tau)^2\phi(z)dz = \frac{R}{C'}[1+1/\tau^2],$$

which by the choice of R is less than 1. Then $g(x)-x$ is decreasing as it has a negative derivative. This completes the demonstration of Corollary 13.

Corollary 14.

A lower bound. The $g_{num}(x)$ is at least $g_{low}(x)$ given by $$[1 + D(\delta_c)/snr]\Phi(z_x) + \frac{1}{v}\int_{z_x^{low}}^{\infty}[1 - (R/C')u_x(1+z/\tau)^2]\phi(z)dz.$$

It has the analogous integral characterization as given immediately preceding Corollary 13, but with removal of the miter positive part restriction. Moreover, the function $g_{low}(x)-x$ may be expressed as $$g_{low}(x) - x = (1-xv)\frac{R}{vC'}\frac{A(z_x)}{\tau^2}$$

where $$\frac{A(z)}{\tau^2} = \frac{C'}{R} - (1+1/\tau^2) - \frac{2\tau\phi(z)+z\phi(z)}{\tau^2} + [1+1/\tau^2 - (1-\Delta_c)(1+z/\tau)^2]\Phi(z).$$

with $\Delta_c = \log(1+\delta_c)$.

Optionally, the expression for $g_{low}(x)-x$ may be written entirely in terms of $z = z_x$ by noting that $$(1-xv)\frac{R}{vC'} = \frac{(1+\delta_c)}{snr(1+z/\tau)^2}.$$

Demonstration: The integral expressions for $g_{low}(x)$ are the same as for $g_{num}(x)$ except that the upper end point of the integration extends beyond $z_x^{max}$, where the integrand is negative, i.e., the outer restriction to the positive part is removed. The lower bound conclusion follows from this negativity of the integrand above $z_x^{max}$. Evaluate $g_{low}(x)$ as in the proof of Lemma 12, using for the upper end that $\Phi(z)$ tends to 1, while $\phi(z)$ and $z\phi(z)$ tend to 0 as $z \to \infty$, to obtain that $g_{low}(x)$ is equal to $$[1+D(\delta_c)/snr]\Phi(z_x) + \left[x + \delta_R \frac{u_x}{v}\right][1-\Phi(z_x)] - 2\frac{R}{C'}\frac{u_x}{v}\frac{\phi(z_x)}{\tau} - \frac{R}{C'}\frac{u_x}{v}\frac{z_x\phi(z_x)}{\tau^2}.$$

Replace the $x+\delta_R u_x/v$ with the equivalent expression $(1/v)[1-u_x(R/C')(1+1/\tau^2)]$. Group together the terms that are multiplied by $u_x(R/C')/v$ to be part of $A/\tau^2$. Among what is left is $1/v$. Adding and subtracting x, this $1/v$ is $x+u_x/v$ which is $x+[(u_x/v)R/C'][C'/R]$. This provides the x term and contributes the $C'/R$ term to $A/\tau^2$.

It then remains to handle $[1+D(\delta_c)/snr]\Phi(z_x) - (1/v)\Phi(z_x)$ which is $-(1/snr)[1-D(\delta_c)]\Phi(z_x)$. Multiplying and dividing it by $$\frac{vC'}{u_xR} = \frac{snr(1+z/\tau)^2}{1+\delta_c}$$

and then noting that $(1-D(\delta_c))/(1+\delta_c)$ equals $1-\Delta_c$, it provides the associated term of $A/\tau^2$. This completes the demonstration of Corollary 14.

What is gained with this lower bound is simplification because the result depends only on $z_x = z_x^{low}$ and not also on $z_x^{max}$.

9.3 Values of g(x) Near 1:

From the expression for x in terms of z, when R is near $\mathcal{C}'$, the point z=0 corresponds to a value of x near $1-\delta_c/snr$. This relationship is used to establish reference values of x* and z* and to bound how close g(x*) is to 1.

A convenient choice of x* satisfies $(1-x^*v)R=(1-v)\mathcal{C}'$. More flexible is to allow other values of x* by choosing it along with a value $r_1$ to satisfy the condition $$(1-x^*v)R=(1-v)\mathcal{C}'/(1+r_1/\tau^2).$$

Also call the solution $x=x_{up}$. When $r_1$ is positive the x* is increased. Negative $r_1$ is allowed as long as $r_1 > -\tau^2$, but keep $r_1$ small compared to $\tau$ so that x* remains near 1.

With the rate R taken to be not more than $\mathcal{C}'$, write it as $$R = \frac{\mathcal{C}'}{(1+r/\tau^2)}.$$

Lemma 15.

A value of x* near 1. Let $R'=\mathcal{C}'/(1+r_1/\tau^2)$. For any rate R between R'/(1+snr) and R', the x* as defined above is between 0 and 1 and satisfies $$1-x^* = \frac{R'-R}{Rsnr} = \frac{r-r_1}{snr(\tau^2+r_1)} = (1-x^*v)\frac{r-r_1}{v(\tau^2+r)}.$$

It is near 1 it R is near R'. The value of $z_x$ at x*, denoted $z^*=\zeta$ satisfies $$(1+\zeta/\tau)^2=(1+\delta_c)(1+r_1/\tau^2).$$

This relationship has $\delta_c$ near $2\zeta/\tau$, when and $\zeta$ and $r_1$ are small in comparison to $\tau$. The $\delta_c\tau$ and $r_1$ are arranged, usually both positive, and of the order Of a power of a logarithm of $\tau$, just large enough that $\bar{\Phi}(\zeta)=1-\Phi(\zeta)$ contributes to a small shortfall, yet not so large that it overly impacts the rate.

Demonstration of Lemma 15:

The expression 1-xv may also be written $(1-v)+(1-x)v$. So the above condition may be written $1+(1-x^*)snr-R'/R$ which yields the first two equalities. It also may be written $(1-x^*v)=(1-v)(1+r/\tau^2)/(1+r_1/\tau^2)$ which yields the third equality in that same line.

Next recall that $z_x=\mu(x,u_{cut}\mathcal{C}'/R)$ which is $$\left(\sqrt{u_{cut}\mathcal{C}'/(R(1-xv))} - 1\right)\tau.$$

Recalling that $u_{cut}=(1-v)(1+\delta_c)$, at x* it is $z^*=\zeta$ given by $$\zeta = (\sqrt{(1+\delta_c)(1+r_1/\tau^2)}-1)\tau,$$

or, rearranging, express $\delta_c$ in terms of $z^*=\zeta$ and $r_1$ via $$1+\delta_c=(1+\zeta/\tau)^2/(1+r_1/\tau^2),$$

which is the last claim. This completes the demonstration of Lemma 15.

Because of this relationship one may just as well arrange $u_{cut}$ in the first place via $\zeta$ as $$u_{cut}=(1-v)(1+\zeta/\tau)^2/(1-r_1/\tau^2)$$

where suitable choices for $\zeta$ and $r_1$ will be found in an upcoming section. Also keep the $\delta_c$ formulation as it is handy in expressing the affect on normalization via $D(\delta_c)$.

Come now to the evaluation of $g_L(x^*)$ and its lower bound via $g_{low}(x^*)$. Since $g_L(x)$ depends on x and R only via the expression $(1-xv)R/\mathcal{C}'$, the choice of x* such that this expression is fixed at $(1-v)$ implies that the value $g_L(x^*)$ is invariant to R, depending only on the remaining parameters snr, $\delta_c$, $r_1$, $\tau$ and L. Naturally then, the same is true of the lower bound via $g_{low}(x^*)$ which depends only on snr, $\delta_c$, $r_1$ and $\tau$.

Lemma 16.

The value $g(x^*)$ is near 1. For the variable power case with $0 \leq \delta_c < snr$, the shortfall expressed by $1-g(x^*)$ is less than $$\delta^* = \frac{2\tau\phi(\zeta)+\zeta\phi(\zeta)+rem}{snr(\tau^2+r_1)[1+D(\delta_c)/snr]},$$

independent of the rate $R \leq R'$, where the remainder is given by $$rem=[(\tau^2+r_1)D(\delta_c)-(r_1-1)]\bar{\Phi}(\zeta).$$

Moreover, $g_L(x^*)$ has shortfall $\delta_L^*=1-g_L(x^*)$ not more than $\delta^*+2\mathcal{C}/(Lv)$. In the constant power case, corresponding to $\delta_c=snr$, the shortfall is $$\delta^*=1-\Phi(\zeta)=\bar{\Phi}(\zeta).$$

Setting $$\zeta = \sqrt{2\log\frac{\tau}{d\sqrt{2\pi}}}$$

with a constant d and $\tau > d\sqrt{2\pi}$, with $\delta_c$ small, this $\delta^*$ is near $2d/(snr\,\tau^2)$, whereas, with $\delta_c=snr$, using $\bar{\Phi}(\zeta) \leq \phi(\zeta)/\zeta$, it is not more than $d/(\zeta\tau)$.

Demonstration of Lemma 16

Using the lower bound on g(x*), the shortfall has the lower bound $$\delta^* = 1 - \frac{g_{low}(x^*)}{1+D(\delta_c)/snr}$$

which equals $$\frac{1-g_{low}(x^*)+D(\delta_c)/snr}{1+D(\delta_c)/snr}.$$

Use the formula for $g_{low}(x^*)$ in the proof of Lemma 14. For this evaluation note that at x=x* the expression $a\,u_x R/(v\mathcal{C}')$ simplifies to $1/[snr(1+r_1/\tau^2)]$ and the expression $x+\delta_R u_x/v$ becomes $$1 + \frac{r_1-1}{snr(\tau^2+r_1)}.$$

Consequently, $g_{low}(x^*)$ equals $$1 + \frac{D(\delta_c)}{snr}\Phi(\zeta) - \frac{2\tau\phi(\zeta)+\zeta\phi(\zeta)-(r_1-1)\bar{\Phi}(\zeta)}{snr(\tau^2+r_1)}.$$

This yields an expression for $1-g_{low}(x^*)+D(\delta_c)/snr$ equal to $$-\frac{D(\delta_c)}{snr}\bar{\Phi}(\zeta) + \frac{(2\tau+\zeta)\phi(\zeta)-(r_1-1)\bar{\Phi}(\zeta)}{snr(\tau^2+r_1)}.$$

Group the terms involving $\overline{\Phi}(\zeta)$ to recognize this equals $[(2\tau+\zeta)\phi(\zeta)+\text{rem}]/[\text{snr}(\tau^2+r_1)]$. Then dividing by the expression $1+D(\delta_c)/\text{snr}$ produces the claimed bound.

As for evaluation at the choice $\zeta=\sqrt{2\log\tau/d\sqrt{2\pi}}$, this is the positive value for which $\phi(\zeta)=d/\tau$, when $\tau\geq d\sqrt{2\pi}$. It provides the main contribution with $2\tau\phi(\zeta)=2d$. The $\zeta\phi(\zeta)$ is then $\zeta d/\tau$ which is of order $\sqrt{\log\tau}/\tau$, small compared to the main contribution $2d$.

For the remainder rein, using $\overline{\Phi}(\zeta)\leq\phi(\zeta)/\zeta$ and $D(\delta_c)\leq(\delta_c)^2/2$ near $2\zeta^2/\tau^2$, the $\tau^2 D(\delta_c)\overline{\Phi}(\zeta)$ (is near $2\zeta\phi(\zeta)=2\zeta b_0/\tau$, again of order $\sqrt{\log\tau}/\tau$.

For $\delta_L^*=1-g_L(x^*)$, using $g_L(x)\geq g(x)+2\mathcal{C}/(L\nu)$ yields $\delta_L^*\leq\delta^*+2\mathcal{C}/(L\nu)$.

For the constant power case use $g_L(x^*)=g(x^*)=\Phi(\zeta)$ directly, rather than $g_{low}(x^*)$. It has $\delta^*=\overline{\Phi}(\zeta)$, which is not more than $\phi(\zeta)/\zeta$. This completes the demonstration of Lemma 16.

Corollary 17.

Mistake bound. The likely bound on the weighted fraction of failed detections and false alarms $\delta_L^*+\eta+\bar{f}$, corresponds to an unweighted fraction of not more than $$\delta_{mis}=fac(\delta_L^*+\eta+\bar{f})$$

where the factor $$fac=\text{snr}(1+\delta_{sum}^2)/[2\mathcal{C}(1+\delta_c)].$$

In the variable power case the contribution $\delta_{mis,L}^*=fac\delta_L^*$ is not more than $\delta_{mis}^*+(1/L)(1+\text{snr})/(1+\delta_c)$ with $$\delta_{mis}^* = \frac{(2\tau+\zeta)\phi(\zeta)+rem}{2C(\tau+\zeta)^2},$$

while, in the constant power case $\delta_c=\text{snr}$, the $fac=1$ and $\delta_{mis,L}^*$ equals $$\delta_{mis}^*=\overline{\Phi}(\zeta)$$

Closely related to $\delta_{mis}^*$ in the variable power case is the simplified form $$\delta_{mis,simp}^*=[(2\tau+\zeta)\phi(\zeta)+rem]/2\mathcal{C}\tau^2,$$

for which $\delta_{mis}^*=\delta_{mis,simp}^*/(1+\zeta/\tau)^2$.

Demonstration of Corollary 17:

Multiplying the weighted fraction by the factor $1/[L\min_l \pi_{(l)}]$, which equals the given fac, provides the upper bound on the (unweighted) fraction of mistakes $\delta_{mis}=fac(\delta_L^*+\eta+\bar{f})$. Now $\delta_L^*=1-g_L(x)$ has the upper bound $$\frac{1-g_{low}(x^*)+\delta_{sum}^2}{1+\delta_{sum}^2}.$$

Multiplying by fac yields $\delta_{mis,L}^*=fac\delta_L^*$ not more than $$\frac{1-g_{low}(x^*)+\delta_{sum}^2}{(2C/snr)(1+\delta_c)}.$$

Recall that $\delta_{sum}^2$ exceeds $D(\delta_c)/\text{snr}$ by not more than $2\mathcal{C}/(L\nu)$ and that $1-g_{low}(x^*)+D(\delta_c)/\text{snr}$ is less than $[(2\tau+\zeta)\phi(\zeta)+\text{rem}]/[\text{snr}(\tau^2+r_1)]$. So this yields the $\delta_{mis,L}^*$ bound $$\frac{(2\tau+\zeta)\phi(\zeta)+rem}{2C(\tau^2+r_1)(1+\delta_c)} + \frac{(1+snr)}{(1+\delta_c)}\frac{1}{L}.$$

Recognizing that the denominator product $(\tau^2+r_1)(1+\delta_c)$ simplifies to $(\tau+\zeta)^2$ establishes the claimed form of $\delta_{mis}^*$.

For the constant power case note that $fac=1$ so that $\delta_{mis,L}^*=\delta_{mis}^*$ is then unchanged from $\delta^*=\overline{\Phi}(\zeta)$. This completes the demonstration of Corollary 17.

9.4 Showing $g(x)$ is Greater than x:

This section shows that $g_L(x)$ is accumulative, that is, it is at least x for the interval from 0 to $x^*$, under certain conditions on r.

Start by noting the size of the gap at $x=x^*$.

Lemma 18.

The gap at $x^*$. With rate $R=\mathcal{C}'/(1+r/\tau^2)$, the difference $g(x^*)-x^*$ is at least $$\frac{r-r_{up}}{snr(\tau^2+r_1)} = (1-x^*\nu)\frac{r-r_{up}}{\nu(\tau^2+r)}.$$

Here, $0\leq\delta_c<\text{snr}$, with rem as given in Lemma 16.

$$r_{up} = r_1 + \frac{(2\tau+\zeta)\phi(\zeta)+rem}{1+D(\delta_c)/snr}$$

while, for $\delta_c=\text{snr}$, $$r_{up}=r_1+snr(\tau^2+r_1)\overline{\Phi}(\zeta),$$

which satisfies $$\frac{r_{up}}{\tau^2} = \frac{(1+snr\overline{\Phi}(\zeta))(1+\zeta/\tau)^2}{1+snr} - 1.$$

Keep in mind that the rate target $\mathcal{C}'$ depends on $\delta_c$. For small $\delta_c$ is near the capacity $\mathcal{C}$, whereas for $\delta_c=\text{snr}$ it is near $R_0>0$.

If the upcoming gap properties permit, it is desirable to set r near $r_{up}$. Then the factor in the denominator of the rate becomes near $1+r_{up}/\tau^2$. In some cases $r_{up}$ is negative, permitting $1+r/\tau^2$ not more than 1.

It is reminded that $r_1$, $\zeta$, and $\delta_c$ are related by $$1+r_1/\tau^2 = \frac{(1+\zeta/\tau)^2}{1+\delta_c}.$$

Demonstration of Lemma 18:

The gap at $x^*$ equals $g(x^*)-x^*$. This value is the difference of $1-x^*$ and $\delta^*=1-g(x^*)$, for which the bounds of the previous two lemmas hold. Recalling that $1-x^*$ equals $(r-r_1)/[\text{snr}(\tau^2+r_1)]$, adjust the subtraction of $r_1$ to include in $r_{up}$ what is needed to account for $\delta^*$ to obtain the indicated expressions for $g(x^*)-x^*$ and $r_{up}$. Alternative expressions arise by using the relationship that $r_1$ has to the other parameters. This complete the demonstration of Lemma 18.

Positivity of this gap at $x^*$ entails $r>r_{up}$, and positivity of $x^*$ requires $\text{snr}(\tau^2+r_1)+r_1\geq r$. There is an interval of such r provided $\text{snr}(\tau^2-r_1)>r_{up}-r_1$.

For this next two corollaries, take the case that either $\delta_c$=snr or $\delta_c$=0, that is, either the power allocation is constant (completely level), or the power $P_{(\ell)}$ is proportional to $$u_\ell = \exp\left\{-2C\frac{\ell-1}{L}\right\},$$

unmodified (no leveling). The idea in both cases is to look for whether the minimum of the gap occurs at x* under stated conditions.

Corollary 19.

Positivity of g(x)–x with constant power. Suppose R= $\mathcal{C}'/(1+r/\tau^2)$ where, with constant power, the $\mathcal{C}'$ equals $R_0(1-h')/(1+\delta_a)^2$, and suppose $v\tau \geq 2(1+r/\tau^2)\sqrt{2\pi}$. Suppose $r-r_{up}$ is positive with $r_{up}$ as given in Lemma 18, specific to this $\delta_c$=snr case. If r≥0 and if $r-r_{up}$ is less than $v(\tau+\zeta)^2/2$, then, for 0≤x≤x*, the difference g(x)–x is at least $$\text{gap} = \frac{r-r_{up}}{snr(\tau^2+r_1)} = \frac{r-r_{up}}{v(\tau+\zeta)^2},$$

Whereas if $r_{up} < r \leq 0$ and if also $$r/\tau \geq -\sqrt{2\log\left(v\tau(1+r/\tau^2)/2\sqrt{2\pi}\right)},$$

then the gap g(x)–x on [0, x*] is at least $$\min\left\{1/2 + r/(\tau\sqrt{2\pi}), \frac{r-r_{up}}{v(\tau+\zeta)^2}\right\}.$$

In the latter case the minimum occurs at the second expression when $$r < r_{up} + v(\tau+\zeta)^2[\frac{1}{2} + r/\tau\sqrt{2\pi}].$$

This corollary is proven in the appendix, where, under the stated conditions, it is shown that g(x)–x is unimodal for x≥0, so the value is smallest at x=0 or x=x*.

From the formula for $r_{up}$ in this constant power case, it is negative, near $-v\tau^2$, when $snr\overline{\Phi}(\zeta)$ and $\zeta/\tau$ are small. It is tempting to try to set r close to $r_{up}$, similarly negative. As discussed in the appendix, the conditions prevent pushing r too negative and compromise choices are available. With $v\tau$ at least a little more than the constant $2\sqrt{2\pi}e^{\pi/4}$, allow r with which the $1+r/\tau^2$ factor becomes at best near $1-\sqrt{2\pi}/2\tau$, indeed nice that it is not more than 1, though not as ambitious as the unobtainable $1+r_{up}/\tau^2$ near 1–v.

Corollary 20.

Positivity of g(x)–x with no leveling. Suppose R=$\mathcal{C}'/(1-r/\tau^2)$], where, with $\delta_c$=0, the $\mathcal{C}'$ equals $\mathcal{C}(1h')/(1+2\mathcal{C}/vL)(1+\delta_a)^2$ near capacity. Set $r_1$=0 and $\zeta$=0 for which $1-x^*=r/(snr\tau^2)$ and $r_{up}=2\tau/\sqrt{2\pi}+\frac{1}{2}$ and suppose in this case that $r > r_{up}$. Then, for 0≤x≤x* the difference g(x)–x is greater than or equal to $$\text{gap} = \frac{r-r_{up}}{snr(\tau^2+r_1)}.$$

Moreover, g(x)–x is at least (1–xv)GAP where $$\text{GAP} = \frac{r-r_{up}}{v(\tau^2+r)}.$$

Demonstration of Corollary 20:

With $\delta_c$=0 the choice $\zeta$=0 corresponds to $r_1$=0. At this $\zeta$, the main part of $r_{up}$ equals $2\tau/\sqrt{2\pi}$ since $\phi(0)=1/\sqrt{2\pi}$ and the remainder rem equals ½ since $\Phi(0)$=½. This produces the indicated value of $r_{up}$. The monotonicity of g(x)–x in the $\delta_c$=0 case yields, for x≤x*, a value at least as large as at x* where it is bounded by Lemma 18. This yields the first claim.

Next use the representation of g(x)–x as $(1-xv)A(z_x)/[v(\tau^2+r)]$, where with $\delta_c$=0 the A(z) is $$A(z) = r - 1 - 2\tau\phi(z) - z\phi(z) + [\tau^2 + 1 - (\tau+z)^2]\Phi(z).$$

It has derivative which simplifies to $$A'(z) = -2(\tau+z)\Phi(z),$$

which is negative for $z > -\tau$ which includes the interval $[z_0, z_1]$. Accordingly $A(z_x)$ is decreasing and its minimum for x in [0, x*] occurs at x*. Appealing to Lemma 18 completes the demonstration of Lemma 20.

An alert to the reader: The above result together with the reliability bounds provides a demonstration that $g_L(x)$ is such that a rate $\mathcal{C}'/(1-r/\tau^2)$ is achieved with a moderately small fraction of mistakes, with high reliability. Here $r/\tau^2$ at least $r_{up}/\tau^2$ is nearly equal to a constant times $1/\tau$, which is near $1/\sqrt{\pi\log B}$. This is what can be achieved in the comparatively straightforward fashion of the first half of the manuscript.

Nevertheless, it would be better to have a bound with $r_{up}$ of smaller order so that for large B the rate is closer to capacity. For that reason, next take advantage of the modification to the power allocation in which it is slightly leveled using a small positive $\delta_c$. When $\mathcal{C}$ is not large, these modifications make an improved rate target $\mathcal{C}_B$ which is below capacity by an expression of order 1/log B and likewise the fraction of mistakes target (corrected by the outer code) is improved to be an expressions of order 1/log B. This is certainly an improvement over $1/\sqrt{\log B}$, and as already said herein, the reliability and rate tradeoff is not far from optimal in this regime. That is, if one wants rate substantially closer to capacity it would necessitate worse reliability. Moreover, for any fixed R<$\mathcal{C}$ it is certainly the case that with sufficient size B the rate R is less than $\mathcal{C}_B$, so that the existing results take effect.

Nevertheless, both of the $1/\sqrt{\log B}$ and 1/log B expressions are not impressively small.

This has compelled the authors to push in what follows in the rest of this manuscript to squeeze out as much as one can concerning the constant factor or other lower order factors. Even factors of 2 or 4 very much matter when one only has a log B. There are myriad aspects of the problem (via freedoms of the specified design) in which efforts are made push down the constants, and it persists as an active effort of the authors. Accordingly, it is anticipated that the inventors herein will provide further refinements of the material herein in the months to come.

Nevertheless, the comparatively simple results in the $\delta_c$=0 case above and the bounds from $\delta_c > 0$ in what follows both constitute first proofs of performance achievement by practical schemes, that scale suitably in rate, reliability and complexity.

It is anticipated that some refinements will derive from the tools provided here by making slightly different specializations of the design parameters already introduced, to which the invention has associated rights to determine the implications of these specializations.

It is the presence of a practical high-performance encoder and decoder as well as the general tools of performance evaluation and of rate characterizations, e.g. via the update function $g_L(x)$, that are the featured aspects of the invention to this point in the manuscript, and not the current value of the moderate constants that are develop in the pages to come.

The specific tools for refinement become detailed mathematical efforts that go beyond what most readers would want to digest. Nevertheless, proceed forward with inclusion of these since it does lead to specific instantiations of code parameter settings for which the drop from capacity is improved in its characteristics to be a specific multiple of 1/log B.

Monotonicity or unimodality of $g(x)-x$ or of $g_{low}(x)-x$ is used in the above gap characterizations for the $\delta_c=0$ and $\delta_c$=snr cases. It what follows, analogous shape properties are presented that include the intermediate case.

9.5 Showing g (x)>x in the Case of Some Leveling:

Now allow small leveling of the power allocation, via choice of a small $\delta_c>0$ and explore determination of lower bounds on the gap.

Use the inequality $g(x) \geq g_{low}(x)/(1+D(\delta_c)/snr)$ so that $$g(x) - x \geq \frac{g_{low}(x) - x - xD(\delta_c)/snr}{1 + D(\delta_c)/snr}.$$

This gap lower bound is expressible in terms of $z=z_x$ using the results of Lemma 14 and the expression for x given immediately thereafter. Indeed, $$g_{low}(x) - x = \frac{u_x R}{v C'} \frac{A(z_x)}{\tau^2}$$

where for $R=C'/(1+r/\tau^2)$ the function A(z) simplifies to $$r-1-2\tau\phi(z)-z\phi(z)+[\tau^2+1-(1-\Delta_c)(\tau+z)^2]\Phi(z),$$

where $\Delta_c=\log(1+\delta_c)$. The multiplier $u_x R/(v C')$ is also $(1+\delta_c)/(snr(1+z/\tau)^2)$. From the expression for x in terms of z write $$x = 1 - \frac{\delta_c}{snr} + \frac{(1+\delta_c)}{snr(1+z/\tau)^2}((1+z/\tau)^2 - 1 - r/\tau^2).$$

Accordingly, $$g_{low}(x)-x-xD(\delta_c)/snr=G(z_x)$$

where G(z) is the function $$G(z) = \frac{1+\delta_c}{(\tau+z)^2} \frac{\tilde{A}(z)}{snr} - \frac{D(\delta_c)}{snr}(1-\delta_c/snr)$$

with $$\tilde{A}(z) = A(z) + \frac{\tau^2 D(\delta_c)}{snr}(1-(1+z/\tau)^2 + r/\tau^2).$$

In this way the gap lower bound is expressed through the function G(z) evaluated at $z=z_x$. Regions for x in [0,1] where $g_{low}(x)-x-xD(\delta_c)/snr$ is decreasing or increasing, have corresponding regions of decrease or increase of G(z) in $[z_0, z_1]$. The following lemma characterizes the shape of the lower bound on the gap.

Definition:

A continuous function G(z) is said to be unimodal in an interval if there is a value $z_{max}$ such that G(z) is increasing for any values to the left of $z_{max}$ and decreasing for any values to the right of $z_{max}$. This includes the case of decreasing or increasing functions with $z_{max}$ at the left or right end point of the interval, respectively.

Likewise, with domain starting at $z_0$, a continuous function G(z) is said to have at most one oscillation if there is a value $z_G \geq z_0$ such that G(z) is decreasing for any values of z between $z_0$ and $z_G$, and unimodal to the right of $z_G$. Call the point $z_G$ the critical value of G.

Functions with at most one oscillation in an interval $[z_0, z^*]$ have the useful conclusion that the minimum over the interval is determined by the minimum of the values at $z_G$ and $z^*$.

Lemma 21.

Shape properties of the gap. Suppose the rate satisfies $$R \leq C(1+D(\delta_c)/snr)/(1+1/\tau^2).$$

The function $g_{low}(x)-x-xD(\delta_c)/snr$ has at most one oscillation in [0, 1]. Likewise, the functions A(z) and G(z) have at most one oscillation for $z \geq -\tau$ and their critical values are denoted $z_A$ and $z_G$. For all $\Delta_c \geq 0$, these satisfy $z_A \leq z_G$ and $z_A \leq -\tau/2+1$, which is less than or equal to 0 if $\tau \geq 2$.

Moreover, if either $\Delta_c \leq 2/3$ or $\Delta_c \geq 2\sqrt{2\pi}$half/$\tau$, then $z_G$ is also less than or equal to 0. Here half is an expression not much more than ½ as given in the proof.

The proof of Lemma 21 is in the appendix.

Note that $\tau \geq 3\sqrt{2\pi}$ half is sufficient to ensure that one or the other of the two conditions on A must hold. That would entail a value of B more than $e^{2.25\pi}>1174$. Such size of B is reasonable, though not essential as one may choose directly to have a small value of $\Delta_c$ not more than 2/3.

One can pin down the location of $z_c$; further, under additional conditions on $\Delta_c$. However, precise knowledge of the value of $z_G$ is not essential because the shape properties allow us to take advantage of tight lower bounds on A(z) for negative z as discussed in the next lemma.

It holds that $z_A \leq \tau/2+1$ and under conditions on $\Delta_c$ that $z_A \leq -\tau/2$. For $-\tau/2+1$ to be negative, it is assumed that $\tau \geq 2$, as is the case when $B \geq e^2$. Preferably B is much larger.

Lemma 22

Lower bounding A(z) for negative z: In an initial interval $[-\tau, t]$ with $t=-\tau/2$ or $-\tau/2+1$, the function A(z) is lower bounded by $$A(z) \geq r-1-\epsilon,$$

where $\epsilon$ is $(2\tau+t)/t^2)\phi(t)$. In particular for $t=-\tau/2$ it is $(6/\tau)\phi(\tau/2)$, not more than $(3/\sqrt{\pi \log B})(1/B)^{0.5}$, polynomially small in 1/B. Likewise, if $t=-\tau/2+1$, the $\epsilon$ remains polynomially If $\Delta_c \geq 4/\sqrt{2\pi}-1/\tau$, then the above inequality holds for all negative z.

$$\min_{-\tau \leq z \leq 0} A(z) \geq r - 1 - \epsilon$$

with $$\epsilon = (6/\tau)\phi(\tau/2).$$

Finally if also $\Delta_c \geq 8/\tau^2$ then for z between $-\tau/2$ and 0, the $$A(z) > r-1$$

which is strictly greater than r−1 with no need for $\epsilon$.

Demonstration of Lemma 22:

First, examine $A(z)$ for $z$ in an initial interval of the form $[-\tau, t]$. For such negative $z$ one has that $A(z)$ is at least $r-1-2\tau\phi(z)$ which is at least $r-1-2\tau\phi(t)$. This is seen by observing that in the expression for $A(z)$, the $-z\phi(z)$ term and the term involving $\Phi(z)$ are positive for $z \leq 0$. So for $\epsilon$ one can use $2\tau\phi(t)$.

Further analysis of $A(z)$ permits the improved value of $e$ as stated in the lemma. Indeed, $A(z)$ may be expressed as $$A_0(z) = r - 1 - (2\tau+z)\phi(z) - (2\tau+z)z\Phi(z) + \Phi(z)$$

plus an additional amount $[\Delta_c(\tau+z)^2]\Phi(z)$ which is positive. It's derivative simplifies as in the analysis in the previous lemma and it is less than or equal to 0 for $-\tau \leq z \leq 0$, so $A_0(z)$ is a decreasing function of $z$, so its minimum in $[-\tau, t]$ occurs at $z=t$.

Recall that along with the upper bound $|z|\Phi(z) \leq \phi(z)$, there is the lower bound of Feller, $|z|\Phi(z) > [1 - 1/z^2]\phi(z)$, or the improvement in the appendix which yields $|z|\Phi(z) \geq [1 - 1/(z^2+1)]\phi(z)$, which is $\Phi(z) \geq (|z|/(z^2+1))\phi(z)$, for negative $z$. Accordingly obtain $$A_0(z) \geq r - 1 - [(2\tau+z)/(z^2+1)]\phi(z).$$

At $z=t=-\tau/2$ the amount by which it is less than $r-1$ is $[(3/2)\tau/(\tau^2/4+1)]\phi(\tau/2)$ not more than $(6/\tau)\phi(\tau/2)$, which is not more than $(6/\sqrt{2\pi 2\log B})(1/B)^{1/2}$. An analogous bound holds at $t=-\tau/2+1$.

Next consider the value of $A(z)$ at $z=0$. Recall that $A(z)$ equals $$r - 1 - (2\tau+z)\phi(z) + [\tau^2 + 1 - (1-\Delta_c)(\tau+z)^2]\Phi(z).$$

At $z=0$ it is $$r - 1 - 2\tau/\sqrt{2\pi} + [1+\Delta_c\tau^2]/2$$

which is at least $r-1$ if $\Delta_c\tau^2 \geq 4\tau/\sqrt{2\pi}-1$, that is, if $\Delta_c \geq 4/(\tau\sqrt{2\pi}) - 1/\tau^2$. This is seen to be greater than $\Delta_c^{**} = 2/(\tau^2/4+2)$, having assumed that $\tau$ at least 2. So by the previous lemma $A(z)$ is unimodal to the right of $t=\tau/2$, and it follows that the bound $r-1-\epsilon$ holds for all $z$ in $[-\tau, 0]$.

Finally, for $A(z)$ in the form $$r - 1 - (2\tau+z)\phi(z) - (2\tau+z)z\Phi(z) + [1+\Delta_c(\tau+z)^2]\Phi(z),$$

replace $-z\Phi(z)$, which is $|z|\Phi(z)$ with its lower bound $\phi(z) - (1/|z|)\Phi(z)$ for negative $z$ from the same inequality in the appendix. Then the terms involving $\phi(z)$ cancel and the lower bound on $A(z)$ becomes $$r - 1 + [1 + \Delta_c(\tau+z)^2 - (2\tau+z)/|z|]\Phi(z)$$

which is $$r - 1 + [\Delta_c(\tau+z)^2 + 2(\tau+z)/z]\Phi(z).$$

In particular at $z=-\tau/2$ it is $r - 1 + [\Delta_c\tau^2/4 - 2]\Phi(-\tau/2)$ which exceeds $r-1$ by a positive amount due to die stated conditions on $\Delta_c$. To determine die region in which the expression in brackets is positive more precisely, proceed as follows. Factoring out $\tau+z$ the expression remaining in the brackets is $$\Delta_c(\tau+z) + 2/z.$$

It starts out negative just to the right of $-\tau$ and it hits 0 for $z$ solving the quadratic $\Delta_c(\tau+z)z + 2 = 0$, for which the left and right roots are $z = [-\tau \pm \sqrt{\tau^2 - 8/\Delta_c}]/2$, again centered at $-\tau/2$. The left root is near $-\tau[1 - 2/(\Delta_c\tau)]$. So at least between these roots, and in particular between the left root and the point $-\tau/2$, the $A(z) \geq r-1$. The existence of these roots is implied by $\Delta_c > 8/\tau^2$ which in turn is greater than $\Delta_c^{**} = 8/(\tau^2+8)$. So by the analysis of the previous Lemma, $A'(z)$ is positive at $-\tau/2$ and $A(z)$ is unimodal to the right of $-\tau/2$. Consequently $A(z)$ remains at least $r-1$ for all $z$ between the left root and 0. This completes the demonstration of Lemma 22.

Exact evaluation of $G(z_{crit})$ is problematic, so instead take advantage for negative $z$ of the tight lower bounds on $G(z)$ that follow immediately from the above lower bounds on $A(z)$. With no conditions on $\Delta_c$, use $A(z) \geq r - 1 - \epsilon$ for $z \leq -\tau/2+1$ and unimodality of $A(z)$ to the right of there, to allow us to combine this with the bounds at $z^*$. This use of unimodality of $A(z)$ has the slight disadvantage of needing to replace $u_x = 1 - xv$ with the lower bound $1 - x^*v$, and needing to replace $-xD(\delta_c)/snr$ with $-x^*D(\delta_c)/snr$, to obtain the combined lower bound on $G(z)$ via $A(z)$. In contrast, with conditions on $\Delta_c$, use directly that the minimum of $G(z)$ occurs at the minimum of the values at a negative $z_G$ and at $z^*$, allowing slight improvement on the gap.

Lemma 23.

Lower bounding $G(z)$ for negative $z$: If $\Delta_c\tau \geq 4/\sqrt{2\pi} - 1/2\tau$, then for $-\tau < z \leq 0$, setting $z' = z(1+z/2\tau)$, the function $G(z)$ is at least $$(1+\delta_c)\frac{r - 1 - \epsilon - (2z'\tau - r)D(\delta_c)/snr}{(\tau+z)^2 snr} - \frac{D(\delta_c)}{snr}\left(1 - \frac{\delta_c}{snr}\right),$$

which foe $r \geq (1+\epsilon)/(1+D(\delta_c)/snr)$, yields $G(z)$ at least $$\frac{r - 1 - \epsilon + rD(\delta_c)snr}{\tau^2 snr} - \frac{D(\delta_c)}{snr}\left(1 - \frac{\delta_c}{snr}\right).$$

Consequently, the gap $g(x) - x$ for $z_x \leq 0$ is at least $$\frac{r - r_{down}}{snr\tau^2/(1+\delta_c)}$$

with $$r_{down} = \frac{1 + \epsilon + \tau^2 D(\delta_c)(1 - \delta_c/snr)/(1+\delta_c)}{1 + D(\delta_c)/snr},$$

less than $1 + \epsilon + \tau^2 D(\delta_c)$. If also $\Delta_c \geq 8/\tau^2$, then the above inequalities hold for $-\tau/2 \leq z \leq 0$ without the $\epsilon$.

Demonstration of Lemma 23

Using the relationship between $G(z)$ and $A(z)$ given prior to Lemma 21, these conclusions follow immediately from plugging in the bounds on $A(z)$ from Lemma 22.

Next combine the gap bounds for negative $z$ with the gap bound for $z^*$. This allows to show that $g(x) - x$ has a positive gap as long as the rate drop from capacity is such that $r > \tau_{crit}$ for a value of $r_{crit}$ as identified. This holds for a range of choices of $r_1$ including 0.

Lemma 24.

The minimum value of the gap. For $0 \leq x \leq x^*$, of $r > r_{crit}$, then the $g(x) - x$ is at least $$\frac{r - r_{crit}}{snr(\tau^2 + r_1)}.$$

This holds for an $r_{crit}$ not more than $r_{crit}^*$ given by $$\max\{(\tau^2+r_1)D(\delta_c) + 1 + \epsilon, r_1 + (2\tau+\zeta)\phi(\zeta) + rem\},$$

where, as before, $rem = [(\tau^2+r_1)D(\delta_c) + 1 - r_1]\Phi(\zeta)$ and $\epsilon$ is as given in Lemma 22 with $t = -\tau/2+1$. Then $g_L(x) - x$ on $[0, x^*]$ has gap at least $$\text{gap} = \frac{r - r_{crit}}{snr(\tau^2 + r_1)} - \frac{2C}{vL}.$$

Consequently, any specified positive value of gap is achieved by setting $$r = r_{crit} + snr(\tau^2 + r_1)[\text{gap} + 2\,\mathcal{C}/(Lv)].$$

The contribution to the denominator of the rate expression $(1+D(\delta_c)/snr)(1+r_{crit}/\tau^2)$ at $r_{crit}$ has the representation in terms of $r_{crit}^*$ as $$1 + (1 + r_1/\tau^2) D(\delta_c)/snr + r_{crit}^*/\tau^2.$$

If $\Delta_c \geq 4/(\tau\sqrt{2\pi}) - 1/\tau^2$ and either $\Delta_c \leq 2/3$ or $\Delta_c \geq \sqrt{2\pi}\text{half}/\tau$, then in the above characterization of $r_{crit}^*$ the $D(\delta_c)$ in the first expression of the max may be reduced to $D(\delta_c)(1-\delta_c/snr)$.

Moreover, there is the refinement that $g(x)-x$ is at least $$\frac{1}{snr}\min\left\{\frac{r - r_{down}}{\tau^2/(1+\delta_c)}, \frac{r - r_{up}}{\tau^2 + r_1}\right\},$$

where $r_{down}$ and $r_{up}$ are as given in Lemmas 23 and 18, respectively. If also $\delta_x$ is such that the $z_G$ of order $-\sqrt{2\log(\tau/\delta_c)}$ is between $-\tau/2$ and $0$, then the $\epsilon$ above may be omitted.

For given $\zeta > 0$, adjust $r_1$ to optimize the value of $r_{crit}^*$ in the next subsection.

The proof of the lemma will improve on the statement of the lemma by exhibiting an improved value of $r_{crit}$ that makes use of $r_{crit}^*$.

Demonstration of Lemma 24:

Replacing $g(x)$ by its lower bound $g_{low}(x)/[1+D(\delta_c)/snr]$ the $g(x)-x$ is at least $$\text{gap}_{low}(x) = \frac{g_{low}(x) - x[1 + D(\delta_c)/snr]}{1 + D(\delta_c)/snr}$$

which is $$\frac{(u_x/v)(R/C')A(z_x)/\tau^2 - xD(\delta_c)/snr}{1 + D(\delta_c)/snr}.$$

For $0 \leq x \leq x^*$ the $u_x R/(v\,\mathcal{C}')$ is at least its value at $x^*$ which is $1/[snr(1+r_1/\tau^2)]$, so $\text{gap}_{low}(x)$ is at least $$\frac{A(z_x)/[snr(\tau^2 + r_1)] - x^* D(\delta_c)/snr}{1 + D(\delta_c)/snr},$$

which may also be written $$\frac{A(z_x) - (\tau^2 + r_1)x^* D(\delta_c)}{snr(\tau^2 + r_1)[1 + D(\delta_c)/snr]},$$

which by Lemma 18 coincides with $(r - r_{up})/[snr(\tau^2 + r_1)]$ at $x = x^*$.

Now recall from Lemma 21 that $A(z)$ is unimodal for $z \geq t$, where $t$ is $-\tau/2$ or $-\tau/2 + 1$, depending on the value of $\Delta_c$. As seen, when $\Delta_c$ is small, the $A(z)$ is in fact decreasing and so one may use $r_{crit} = r_{up}$ from the gap at $x^*$. For other $\Delta_c$, the unimodality of $A(z)$ for $z \geq t$ implies that the minimum of $A(z)$ over $[-\tau, z^*]$ is equal to that of over $[-\tau, t] \cup \{z^*\}$. As seen in Lemma 22, the minimum of $A(z)$ in $[-\tau, t]$ is given by $A_{low} = r - 1 - \epsilon$. Consequently, the $g(x) - x$ on $0 \leq x \leq x^*$ is at least $$\min\left\{\frac{r - 1 - \epsilon - (\tau^2 + r_1)x^* D(\delta_c)}{snr(\tau^2 + r_1)(1 + D(\delta_c)/snr)}, \frac{r - r_{up}}{snr(\tau^2 + r_1)}\right\}.$$

Now $x^* = 1 - (r - r_1)/[snr(\tau^2 + r_1)]$. So $(\tau^2 + r_1)x^*$ is equal to $(\tau^2 + r_1) - (r - r_1)/snr$. Then, gathering the terms involving $r$, note that a factor of $1 + D(\delta_c)/snr$ arises that cancels the corresponding factor from the denominator for the part involving T. Extract the value $r$ shared by the two terms in the minimum to obtain that the above expression is at least $$\frac{r - r_{crit}}{snr(\tau^2 + r_1)}$$

where here $r_{crit}$ is given by $$\max\left\{\frac{(\tau^2 + r_1)D(\delta_c) + 1 + \epsilon + r_1 D(\delta_c)/snr}{1 + D(\delta_c)/snr}, r_{up}\right\}.$$

Arrange $1 + D(\delta_c)/snr$ as a common denominator. From the definition of $r_{up}$ its numerator becomes $r_1[1 + D(\delta_c)/snr](2\tau + \zeta)\phi(z) + \text{rem}$. It follows that in the numerator the two expressions in the max share the term $r_1 D(\delta_c)/snr$. Accordingly, with $\alpha = [D(\delta_c)/snr]/[1 + D(\delta_c)/snr]$ and $1 - \alpha = 1/[1 + D(\delta_c)/snr]$, it holds that $$r_{crit} = \alpha r_1 + (1 - \alpha)r_{crit}^*,$$

with $r_{crit}^*$ given by $$\max\{(\tau^2 + r_1)D(\delta_c) + 1 + \epsilon, r_1 + (2\tau + \zeta)\phi(\zeta) + \text{rem}\}.$$

This $r_{crit}^*$ exceeds $r_1$, because the amount added to $r_1$ in the second expression in the max is the same as the numerator of the shortfall $\delta^*$ which is positive. Hence $\alpha r_1 + (1 - \alpha)r_{crit}^*$ is less than $r_{crit}^*$. So the $r_{crit}$ here improves somewhat on the choice in the statement of the Lemma.

Moreover, from $$r_{crit} = \frac{r_{crit}^* + r_1 D(\delta_c)/snr}{1 + D(\delta_c)/snr}$$

it follows that $(1 + D(\delta_c)/snr)(1 + r_{crit}/\tau^2)$ is equal to $$1 + \frac{(1 + r_1/\tau^2)D(\delta_c)}{snr} + \frac{r_{crit}^*}{\tau^2},$$

as claimed.

Finally, for the last conclusion of the Lemma, it follows from the fact that $$\min_{-\tau \leq z \leq z^*} G(z) = \min\{G(z_G), G(z^*)\},$$

invoking $z_G \leq 0$ and combining the bounds form Lemmas 23 and 18. This completes the demonstration of Lemma 24.

Note from the form of rem and using $1-\Phi(\zeta)=\overline{\Phi}(\zeta)$ that $r_{crit}^*$ may be written $$\max\{(\tau^2+r_1)D(\delta_x)+\epsilon, (r_1-1)\Phi(\zeta)+(2\tau+\zeta)\phi(z)+(\tau 2r_1)D(\delta_c)\overline{\Phi}(\zeta)\}.$$

Thus $[(\tau^2+r_1)D(\delta_c)+1]$ appears both in the first expression and as a multiplier of $\overline{\Phi}(\zeta)$ in the remainder of the second expression in the max.

To clean the upcoming expressions, note that upon replacing the second expression in this max with the bound in which the polynomially small e is added to it, then $r_{crit}^*-1-\epsilon$ becomes independent of $\epsilon$. Accordingly, henceforth herein make that redefinition of $r_{crit}^*$. Denoting $\tilde{r}_{crit}^*=r_{crit}^*-1-\epsilon$ it becomes $$\max\{(\tau^2-r_1)D(\delta_c), (r_1-1)\Phi(\zeta)+(2\tau+\zeta)\phi(z)+(\tau^2+r_1)D(\delta_c)\overline{\Phi}(\zeta)\}.$$

Evaluation of the best $r_{crit}^*$ arises in the next subsection from determination of the $r_1$ that minimizes it.

9.6 Determination of $\delta_c$:

Here suitable choices of the leveling parameter $\delta_c$ are determined. Recall, $\delta_c=0$ corresponds to no-leveling and $\delta_c=\text{snr}$ corresponds to the constant power allocation, and both will have their role for very large and very small snr, respectively. Values in between are helpful in conjunction with controlling the rate drop parameter $r_{crit}$.

Recall the relationship $1+\delta_c=(1+\zeta/\tau)^2/(1+r_1/\tau^2)$, used in analysis of the gap based on $g_{low}(x)$, where $\zeta$ is the value of $z_x$ at the upper end point $x^*$ of the interval in which the gap property is invoked. In this subsection, hold $\zeta$ fixed and ask for the determination of a suitable choice of $\delta_c$.

In view of the indicated relationship this is equivalent to the determination a choice of $r_1$. There are choices that arise in obtaining manageable bounds on the rate drop. One is to set $r_1=0$ at which $\delta_c$ is near $2\zeta/\tau$, proceeding with a case analysis depending on which of the two terms of $r_{crit}^*$ is largest. In the end this choice permits roughly the right form of bounds, but noticeable improvements in the constants arise with suitable non-zero $r_1$ in certain regimes.

Secondly, as determined in this section, one can find the $r_1$ or equivalently $\delta_c=\delta_{match}$ at which the two expressions in the definition of $r_{crit}^*$ match. In some cases this provides the minimum value of $r_{crit}^*$.

Thirdly, keep in mind that a small mistake rate $\delta_{mis}^*$ is desired as well as a small drop from capacity of the inner code. The use of the overall rate of the composite code provides means to express a combination of $\delta_{mis}^*$, $r_{crit}^*$ and $D(\delta_c)/\text{snr}$ to optimize.

In this subsection the optimization of $\delta_c$ for each $\zeta$ is addressed, and then in the next subsection the choice of nearly best values of $\zeta$. In particular, this analysis provides means to determine regimes for which it is best overall to use $\delta_{match}$ or for which it is best to use instead $\delta_c=0$ or $\delta_c=\text{snr}$.

For $\zeta>-\tau$, define $\zeta'$ by $$\zeta'=\zeta(1+\zeta/2\tau)$$

for which $(1+\zeta/\tau)^2=1+2\zeta'/\tau$ and define $\psi=\psi(\zeta)$ by $$\psi=(2\tau+\zeta)\phi(\zeta)/\Phi(\zeta)$$

and $\gamma=\gamma(\zeta)$ by the small value $$\gamma=2\zeta'/\tau+(\psi-1)/\tau^2.$$

Lemma 25.

Match making. Given $\zeta$, the choice of $\delta_c=\delta_{match}$ that makes the two expressions in the definition of $r_{crit}^*$ be equal is given by $$1+\delta_c=e^{\gamma/(1+\zeta/\tau)^2}.$$

at which $$1+r_1/\tau^2=(1+\zeta/\tau)^2 e^{-\gamma/(1+\zeta/\tau)^2}.$$

This $\delta_c$ is non-negative for $\zeta$ such that $\gamma \geq 0$. At this $\delta_c=\delta_{match}$ the value of $\tilde{r}^{crit*}=r_{crit}^*-1-\epsilon$ is equal to $$\tau^2)(1+r_1/\tau^2)D=(\delta_c)=r_1+\psi-1,$$

which yields $\tilde{r}_{crit}/\tau^2$ equal to $$(1+\zeta/\tau)^2[e^{-\gamma/(1+\zeta/\tau)^2}-1]+\gamma,$$

which is less than $\gamma^2/[2(1+\zeta/\tau)^2]$ for $\gamma>0$. Moreover, the contribution $\delta_{mis}^*$ to the mistake rate as in Lemma 17, at this choice of $\delta_c$ and corresponding $r_1$, is equal to $$\delta_{mis}^* = \frac{\psi}{2(\tau+\zeta)^2 C}.$$

Remark:

Note from the definition of $\psi$ and $\zeta'$ that $$\gamma = \frac{(2+\zeta/\tau)(\zeta+\phi(\zeta)/\Phi(\zeta))-1/\tau}{\tau}.$$

Thus $\gamma$ is near $2(\zeta+\phi(\zeta)/\Phi(\zeta))/\tau$.

Using the tail properties of the normal given in the appendix, the expression $\zeta+\phi(\zeta)/\Phi(\zeta)$ is seen to be non-negative and increasing in $\zeta$ for all $\zeta$ on the line, near to $1/|\zeta|$ for sufficiently negative $\zeta$, and at least $\zeta$ for all positive $\zeta$, In particular, $\gamma$ is found to be non-negative for $\zeta$ at least slightly to the right of $-\tau$.

Meanwhile, by such tail properties, $\phi(\zeta)/\Phi(\zeta)$ is near $|\zeta|$ for sufficiently negative $\zeta$, so to keep $\delta_{mis}^*$ small it is desired to avoid such $\zeta$ unless the capacity $\mathcal{C}$ is very large. At $\zeta=0$ the $\psi$ equals $4\pi/\sqrt{2\pi}$ so the $\delta_{mis}^*$ there is of order $1/\tau$. When $\mathcal{C}$ is not large, a somewhat positive $\zeta$ is preferred to produce a small $\delta_{mis}^*$ in balance with the rate drop contribution $r_{crit}^*/\tau^2$.

The $\zeta=0$ case is illustrative for the behavior of $\gamma$ and related quantities. There $\gamma$ is $(\psi-1)/\tau^2$ equal to $4/\tau\sqrt{2\pi}-1/\tau^2$, with which $\delta_c=e^\gamma-1$. Also $r_1/\tau^2=e^\gamma-1$. The $\tilde{r}_{crit}^*/\tau^2=r_1/\tau^2+(\psi-1)/\tau^2$ is then equal $e^{-\gamma}-1+\gamma$ near to and upper bounded by $\gamma^2/2=(1/2)(\omega-1)^2/\tau^4$ less than $4/\tau^2\pi$. In this $\zeta=0$ case, the slightly positive $\delta_c$, with associated negative $r_1$, is sufficient to cancel the $(\psi-1)/\tau^2$ part of $\tilde{r}_{crit}^*/\tau^2$, leaving just the small amount bounded by $(1/2)(\psi-1)^2/\tau^4$. With $(\psi-1)/\tau^2$ less than 2, that is a strictly superior value for $\tilde{r}_{crit}^*/\tau^2$ than obtained with $\delta_c=0$ and $\zeta=0$ for which $\tilde{r}_{crit}^*/\tau^2$ is $(\psi-1)/\tau^2$.

Demonstration of Lemma 25:

The $r_{crit}^*-\epsilon$ is the maximum of the two expressions $$(\tau^2+r_1)D(\delta_c)+1$$

and $$r_1\Phi(\zeta)+(2\tau+\zeta)\phi(z)+[(\tau^2+r_1)D(\delta_c)+1]\overline{\Phi}(\zeta).$$

Equating these, grouping like terms together using $1-\Phi(\zeta)=\overline{\Phi}(\zeta)$ and then dividing through by $\Phi(\zeta)$ yields $$(\tau^2+r_1)D(\delta_c)-r_1=\psi-1.$$

Using $\tau^2+r_1$ equal to $(\tau+\zeta)^2/(1+\delta_c)$ and $[D(\delta_c)-1]/(1+\delta_c)$ equal to $\log(1+\delta_c)-1$ the above equation may be written $$(\tau+\zeta)^2[\log(1+\delta_c)-1]+\tau^2=\psi-1.$$

Rearranging, it is $$\log(1+\delta_c) = 1 + \frac{\tau^2 + (\psi - 1)}{(\tau + \zeta)^2},$$

where the right side may also be written $\gamma/(1+\zeta/\tau)^2$. Exponentiating establishes the solution for $1+\delta_c$, with corresponding $r_1$ as indicated. Let's call the value that produces this equality $\delta_c = \delta_{match}$. At this solution the value of $\tilde{r}_{crit}^* = r_{crit}^* - 1 - \epsilon$ satisfies $$(\tau^2 + r_1)D(\epsilon_c) = r_1 + \psi - 1.$$

Likewise, from the identity $(\tau^2+r_1)D(\delta_c)-(r_1-1)=\psi$, multiplying by $\overline{\Phi}(\zeta)$ this establishes that the remainder used in Lemma 16 is in the present case equal to rem$=\psi\overline{\Phi}(\zeta)$, while the main part $(2\tau+\zeta)\phi(\zeta)$ is equal to $\psi\Phi(\zeta)$. Adding them using $\Phi(\zeta)+\overline{\Phi}(\zeta)=1$ shows that $(2\tau+\zeta)\phi(\zeta)+$rem is equal $\psi$. This is the numerator in the mistake rate expression $\delta_{mis}^*$.

Using the form of $r_1$ the above expression for $\tilde{r}_{crit}^*/\tau^2$ may also be written $$(1+\zeta/\tau)^2[e^{-\gamma/(1+\zeta/\tau)^2}-1]+\gamma.$$

With $y=\gamma/(1+\zeta/\tau)^2$ positive, the expression in the brackets is $e^{-y}-1$ which is less than $y+y^2/2$. Plugging that in, the part linear in y cancels, leaving the claimed bound $\gamma^2/[2/(1+\zeta/\tau)^2]$. This completes the demonstration of Lemma 25.

Lemma 26.

The optimum $\delta_c$ quartet. For each $\zeta$, consider the following minimizations. First, consider the minimization of $r_{crit}^*$ for $\delta_c$ in the interval [0, snr]. Its minimum occurs at the positive $\delta_c$ which is the minimum of the three values $\delta_{thresh_0}$, $\delta_{match}$, and snr, where $\delta_{thresh_0} = \Phi(\zeta)/\overline{\Phi}(\zeta)$.

Second, consider the minimization of $$(1+D(\delta_c)/snr)(1+r_{crit}/\tau^2)$$

as arises in the denominator of the detailed rate expression. Its minimum for $\delta_c$ in [0, snr] occurs at the positive $\delta_c$ which is the minimum of the two values $\delta_{thresh_1}$ and $\delta_{match}$, where $\delta_{thresh_1}$ is $\Phi(\zeta)/[\overline{\Phi}(\zeta)+1/snr]$.

Third, consider the minimization of the following combination of contributions to the inner code rate drop and the simplified mistake rate, $$\delta_{mis,simp}^* + (1+D(\delta_c)/snr)(1+r_{crit}/\tau^2)-1,$$

for $\delta_c$ in [0, snr]. For $\Phi(\zeta) \leq 1/(1+2\mathcal{C})$ its minimum occurs at $\delta_c = 0$, otherwise it occurs at the positive $\delta_c$ which is the minimum of the two values $\delta_{thresh}$ and $\delta_{match}$ where $$\delta_{thresh} = \frac{\Phi(\zeta) - \overline{\Phi}(\zeta)/2C}{1/snr + \overline{\Phi}(\zeta)(1 + 1/2C)}.$$

The same conclusion holds icing $\delta_{mis}^* = \delta_{mis,simp}^*/(1+\zeta/\tau)^2$, replacing the occurrences of $2\mathcal{C}$ in the previous sentence with $2\mathcal{C}(1+\zeta/\tau)^2$. Finally, set $$\Delta_{\zeta,\delta_c} = \delta_{mis}^* + (1+D(\delta_c)/snr)(1+r_{crit}/\tau^2)-1$$

and extend the minimization to [0, snr] using the previously given specialized values in the $\delta_c$=snr case. Then for each $\zeta$ the minimum $\Delta_{\zeta,\delta_c}$ for $\delta_c$ in [0, snr] is equal to the minimum over the four values 0, $\delta_{thresh}$, $\delta_{match}$ and snr.

Remark:

The $\Delta_{\zeta,\delta_c}$, when optimized also over $\zeta$, will provide the $\Delta_{shape}$ summarized in the introduction. As shown in the next section, motivation for it arises from the total drop rate from capacity of the composition of the sparse superposition code with the outer Reed-Solomon code. For now just think of it as desirable to choose parameters that achieve a good combination of low rate drop and low fraction of section mistakes. As the proof here shows, the proposed combination is convenient for the calculus of this optimization.

Recall for $0 \leq \delta_c < snr$ that $(1+D(\delta_c)/snr)(1+r_{crit}/\tau^2)$ equals $(1+r_1/\tau^2)D(\delta_c)/snr+1+r_{crit}^*/\tau^2$. In contrast, for $\delta_c$=snr, set $\delta_{mis}^* = \overline{\Phi}(\zeta)$ and $r_{crit} = \max\{r_{up}, 0\}$, using the form of $r_{up}$ previously given for this case. These different forms arise because the $g_{low}(x)$ bounds are used for $0 \leq \delta_c < snr$, whereas g(x) is used directly for $\delta_c$=snr.

Demonstration of Lemma 26:

To determine the $\delta_c$ minimizing $r_{crit}^*$, in the definition of $r_{crit}^* - 1 - \epsilon$ write the first expression $(\tau^2+r_1)D(\delta_c)$ in terms of $\delta_c$ as $$(\tau+\zeta)^2 \frac{D(\delta_c)}{(1+\delta_c)}.$$

Take its derivative with respect to $\delta_c$. The ratio $D(\delta_c)/(1+\delta_c)$ has derivative that is equal to $[D'(\delta_c)(1+\delta_c)-D(\delta_c)]$ divided by $(1+\delta_c)^2$. Now from the form of $D(\delta_c)$, its derivative $D'(\delta_c)$ is $\log(1+\delta_c)$, so the expression in brackets simplifies to $\delta_c$, which is nou-negative, and multiplying by the positive factor $(\tau+\zeta)^2/(1+\delta_c)^2$ provides the desired derivative. Thus this first expression is increasing in $\delta_c$, strictly so for $\delta_c > 0$. As for the second expression in the maximum, it is equal to the first expression times $\overline{\Phi}(\zeta)$ plus $r_1+\psi-1$ times $\Phi(\zeta)$. So from the relationship of $r_1$ and $\delta_c$, its derivative is equal to $[\delta_c \overline{\Phi}(\zeta)-\Phi(\zeta)]$ times the same $(\tau+\zeta)^2/(1+\delta_c)^2$. So the value of the derivative of the first expression is larger than that of the second expression, and accordingly the maximum of the two expressions equals the first expression for $\delta_c \geq \delta_{match}$ and equals the second expression for $\delta_c < \delta_{match}$. The derivative of the second expression, being the multiple of $[\delta_c \overline{\Phi}(\zeta)-\Phi(\zeta)]$ is initially negative so that the expression is initialing decreasing, up to the point $\delta_{thresh_0} = \Phi(\zeta)/\overline{\Phi}(\zeta)$ at which the derivative of this second expression is 0, so the optimizer of $r_{crit}^*$ occurs at the smallest of the three values $\delta_{match}$, $\delta_{thresh}$, and the right end point snr of the interval of consideration.

To minimize $(1+D(\delta_c)/snr)(1+r_{crit}/\tau^2)-1$, multiplying through by $\tau^2$ recall that it equals $(\tau^2+r_1)D(\delta_c)/snr+r_{crit}^*$ for $0 \leq \delta_c < snr$. Add to the previous derivative values the amount $\delta_c/snr$, which is again multiplied by the same factor $(\tau+\zeta)^2/(1+\delta_c)_2$. The first expression is still increasing. The second expression, after accounting for that factor, has derivative $$\delta_c/snr + \delta_c \overline{\Phi}(\zeta) - \Phi(\zeta).$$

It is still initially negative and hits 0 at $\delta_{thresh_1} = \Phi(\zeta)/[\overline{\Phi}(\zeta)+1/snr]$, which is again the minimizer if it occurs before $\delta_{match}$. Otherwise, if $\delta_{match}$ is smaller than $\delta_{thresh}$, then, since to the right of $\delta_{match}$ the maximum equals the increasing first expression, it follows that $\delta_{match}$ is the minimizer.

Next determine the minimizer of the criterion that combines the rate drop contribution with the simplified section mistake contribution $\delta_{mis,simp}^*$. Multiplying through by $\tau^2$, added the quantity $(\tau^2+r_1)D(\delta_c)-r_1+1$ times $\overline{\Phi}(\zeta)/2\mathcal{C}$ plus the amount $(2\tau+\zeta)\phi(\zeta)/2\mathcal{C}$ not depending on $\delta_c$. So its derivative adds the expression $(\delta_c+1)\overline{\Phi}(\zeta)/2\mathcal{C}$ times the same the factor $(\tau+\zeta)^2/(1+\delta_c)^2$. Thus, when the first part of the max is active, the derivative, after accounting for that factor, is $$\delta_c + \delta_c/snr + (1+\delta_c)\overline{\Phi}(\zeta)/2\,\mathcal{C},$$

whereas, when the second part of the max is active it is $$\delta_c \overline{\Phi}(\zeta) - \Phi(\zeta) + \delta_c snr + (1+\delta_c)\overline{\Phi}(\zeta)/2\mathcal{C}$$

Again the first of these is positive and greater than the second. Where the value $\delta_c$ is relative to $\delta_{match}$ determines which part of the max is active. For $\delta_c < \delta_{match}$ it is the second. Initially, at $\delta_c = 0$, it is $$-\Phi(\zeta) + \overline{\Phi}(\zeta)/2\mathcal{C},$$

which is $(1/2\mathcal{C})[1 - \Phi(\zeta)(1 + 2\mathcal{C})]$. If $\zeta$ is small enough that $\Phi(\zeta) \leq 1/(1+2\mathcal{C})$, this is at least 0. Then the criterion is increasing to the right of $\delta_c = 0$, whence $\delta_c = 0$ is the minimizer. Else if $\Phi(\xi) < 1/(1+2\mathcal{C})$ then initially, the derivative is negative and the criterion is initially decreasing. Then as before the minimum value is either at $\delta_{thresh}$ or at $\delta_{match}$ whichever is smallest. Here $\delta_{thresh}$ is the point where the function based on the second expression in the maximum has 0 derivative. The same conclusions hold with $\delta_{mis}^* = \delta_{mis,simp}^*/(1+\zeta/\tau^2)$ in place of $\delta_{mis,simp}$ except that the denominator $2\mathcal{C}$ is replaced with $2\mathcal{C}(1+\zeta/\tau^2)$. Examining $\delta_{thresh_1}$ and $\delta_{thresh}$, it is seen that these are less than snr. Nevertheless, when minimizing over [0, snr], the minimum can arise at snr because of the different form assigned to the expressions in that case. Accordingly the minimum of $\Delta_{\zeta,\delta_c}$ for $\delta_c$ [0, snr] is equal to the minimum over the four values 0, $\delta_{thresh}$, $\delta_{match}$ and snr, referred to as the optimum $\delta_c$ quartet. This completes the demonstration of Lemma 26.

Remark:

To be explicit as to the form of $\Delta_{\zeta,\delta_c}$ with $\delta_c = $ snr, recall that in this case $1 + r_{up}/\tau^2$ is $$(1 - snr\overline{\Phi}(\zeta))(1+\zeta/\tau)^2/(1+snr).$$

Consequently $\Delta_{\zeta,\delta_c} = \delta_{mis}^* + (1 + D(\delta_c)/snr)(1 + r_{crit}/\tau^2) - 1$, in this $\delta_c = $ snr case, becomes $$\Phi(\zeta) + \frac{(1 + D(snr)/snr)}{(1+snr)}(1 + snr\overline{\Phi}(\zeta))(1+\zeta/\tau)^2 - 1,$$

when $r_{up} \geq 0$. For $r_{up} < 0$ as is true for sufficiently small contributions from $snr\overline{\Phi}(\zeta)$ and $\zeta/\tau$, simply set $r_{crit} = 0$ to avoid complications from the conditions of Corollary 19. Then $\Delta_{\zeta,\xi_c}$ becomes $$\overline{\Phi}(\zeta) + D(snr)/snr.$$

9.7 Inequalities for $\psi$, $\gamma$, and $\tilde{r}_{crit}$:

At $\delta_c = \delta_{match}$, the $r_{crit}^*$ is examined further. Previously, in Lemma 25 the expression $\tilde{r}_{crit}^*/\tau^2$ is shown to be less than $\gamma^2/[2(1+\zeta/\tau)^2]$. Now this bound is refined in the cases of negative and positive $\zeta$. For negative $\zeta$ it is shown that $\gamma \leq 2/\tau|\zeta|$ and for positive $|\zeta|$ it is shown that $\tilde{r}_{crit}^*$ is not more than $\max\{2(\zeta')^2, \psi - 1\}$. For sufficiently positive $\zeta$ it is not more than $2\zeta^2$.

Recall that $\gamma$ is less than $$\frac{(2 + \zeta/\tau)(\zeta + \phi(\zeta)/\Phi(\zeta))}{\tau}$$

and that $\psi = (2\tau + \zeta)\phi(\zeta)/\Phi(\zeta)$.

Lemma 27.

Inequalities for negative $\zeta$. For $-\tau < \zeta \leq 0$, the $\gamma$ is an increasing function less than $\min\{2/|\zeta|, 4/\sqrt{2\pi}\}/\tau$. Likewise the function $\psi$ is less than $2(|\zeta| + 1/|\zeta|)\tau$.

Demonstration of Lemma 27:

For $\zeta \leq 0$, the increasing factor $2\zeta/\tau$ is less than 2 and the factor $\zeta + \phi(\zeta)/\Phi(\zeta)$ is non-negative, increasing, and less than $1/|\zeta|$ by the normal tail inequalities in the appendix. At $\zeta = 0$ this factor is $2/\sqrt{2\pi}$. As for $\psi$ the factor $\phi(\zeta)/\Phi(\zeta)$ is at least $|\zeta|$ and not more than $|\zeta| + 1/|\zeta|$ for negative $\zeta$ again by the normal tail inequalities in the appendix (where improvements are given, especially for $0 \leq |\zeta| \leq 1$). This completes the demonstration of Lemma 27.

Now turn attention to non-negative $\zeta$. Three bounds on $\tilde{r}_{crit}^*$ are given. The first based on $\gamma^2/2$ and the other two more exacting to determine the relative effects of $2(\zeta')^2$ and $\psi - 1$.

Corollary 28.

For $\zeta \geq 0$ it holds that $\tilde{r}_{crit}^*/\tau^2 \leq \gamma^2/2$ and $$\tilde{r}_{crit}^* \leq 2(\zeta + \phi(\zeta)/\Phi(\zeta))^2.$$

Demonstration of Corollary 28:

By Lemma 25, the $\tilde{r}_{crit}^*/\tau^2$ is not more than $\gamma^2/[2(1+\zeta/\tau)^2]$. Now $\gamma$ is not more than $$\frac{2(1 + \zeta/2\tau)(\zeta + \phi(\zeta)/\Phi(\zeta))}{\tau}$$

Consequently, $\tilde{r}_{crit}^*$ is not more than $$\frac{2(1 + \zeta/2\tau)^2(\zeta + \phi(\zeta)/\Phi(\zeta))^2}{(1+\zeta/\tau)^2}.$$

Using $1 + \zeta/2\tau$ not more than $1 + \zeta/\tau$, completes the demonstration of Lemma 28.

Lemma 29.

Direct $r_{crit}^*$ bounds. Let $\tilde{r}_{crit}^* = r_{crit}^* - 1 - \epsilon$ evaluated at $\delta_{match}$. Bounds are provided depending on whether $D(2\zeta'/\tau)$ or $(\psi - 1)/\tau^2$ is larger. In the case $D(2\zeta'/\tau) \geq (\psi - 1)/\theta^2$ the $\tilde{r}_{crit}^*$ satisfies $$\tilde{r}_{crit}^*/\tau^2 \leq D(2\zeta'/\tau).$$

In any case, the value of $\tilde{r}_{crit}^*/\tau^2$ may be represented as an average of $D(2\zeta'/\tau)$ and $(\psi - 1)/\tau^2$ plus small excess, where the weight assigned to $(\psi - 1)/\tau^2$ is proportional to the small $2\zeta'/\tau$. Indeed $\tilde{r}_{crit}^*/\tau^2$ equals $$\frac{D(2\zeta'/\tau) + \frac{(\psi - 1)}{\tau^2} 2\zeta'/\tau}{1 + 2\zeta'/\tau} + \text{excess}$$

where excess is $e^{-\upsilon} - (1-\upsilon)$ evaluated at $$\upsilon = \frac{\frac{\psi - 1}{\tau^2} - D(2\zeta'/\tau)}{1 + 2\zeta'/\tau}.$$

In the case $(\psi - 1)/\tau^2 > D(2\zeta'/\tau)$ it satisfies $$\text{excess} \leq \frac{\left[\frac{\psi - 1}{\tau^2} - D(2\zeta'/\tau)\right]^2}{2(1 + \zeta/\tau)^4}.$$

Demonstration of Lemma 29

With the relationship between $\tau_1$ and $\delta_c$, recall $(\tau^2 + r_1)D(\delta_c)$ is increasing in $\delta_c$ and hence decreasing in $r_1$. The $r_1$ that provides the match makes $(\tau^2 + r_1)D(\delta_c)$ equal $r_1 + \psi - 1$. At $r_1 = 0$, the first is $\tau^2 D(2\zeta'/\tau)$, so if that be larger than $\psi - 1$ then a positive $r_1$ is needed to bring it down to the matching value. Then $\tilde{r}_{crit}^*$ is less than $\tau^2 D(2\zeta'/\tau)$. Whereas if $\tau^2 D(2(\zeta'/\tau))$ is less than $\psi-1$ then $r_{crit}^*$ is greater than $D(2\zeta/\tau)$, but not by much as shall be seen. In any case, write $\tilde{r}_{crit}^*/\tau^2$ as $$\frac{r_1}{\tau^2} + \frac{\psi-1}{\tau^2}$$

which by Lemma 25 is $$\frac{\psi-1}{\tau^2} + (1+\zeta/\tau)^2 e^{-\gamma/(1+\zeta/\tau)^2} - 1.$$

Use $\gamma=2\zeta'/\tau(\psi-1)/\tau^2$ and for this proof abbreviate $a=(\psi-1)/\tau^2$ and $b=2\zeta'/\tau$. The exponent $\gamma/(1+\zeta/\tau)^2$ is then $(a+b)/(1+b)$ and the expression for $r_{crit}^*/\tau^2$ becomes $$a+(1+b)e^{-(a+b)/(1+b)}-1.$$

Add and subtract $D(b)$ in the numerator to write $(a+b)/(1+b)$ as $(a-D(b))/(1+b)$ plus $(b+D(b))(1+b)$, where by the definition of $D(b)$ the latter term is simply $\log(1+b)$ which leads to a cancellation of the $1+b$ outside the exponent. So the above expression becomes $$a+e^{(a-D(b))/(1+b)}-1,$$

which is $a+e^{-\upsilon}-1=a-\upsilon+\text{excess}$, where $\text{excess}=e^{-\upsilon}-(1-\upsilon)$ and $\upsilon=(a-D(b))/(1+b)$. For $a \geq D(b)$, that is, $\upsilon \geq 0$, the excess is less than $\upsilon^2/2$, by the second order expansion of $e^{-\upsilon}$, since the second derivative is bounded by 1, which provides the claimed control of the remainder. The $a-\upsilon$ may be written as $[D(b)+ba]/(1+b)$ the average of $D(b)$ and $a$ with weights $1/(1+b)$ and $b/(1+b)$, or equivalently as $D(b)+b(a-D(b))/(1+b)$. Plugging in the choices of $a$ and $b$ completes the demonstration of Lemma 29.

An implication when $\zeta$ and $\psi-1$ are positive, is that $r_{crit}^*/\tau^2$ is not more than $$D(2\zeta'/\tau) + \frac{2\zeta'(\psi-1)}{\tau^3} + \frac{(\psi-1)^2}{\tau^4}.$$

This bound, and its sharper form in the above lemma, shows that $\tilde{r}_{crit}^*/\tau^2$ is not much more than $D(2\zeta'/\tau)$, which in turn is less than $2(\zeta')^2/\tau^2$, near $2\zeta^2/\tau^2$.

Also take note of the following monotonicity property of the function $\psi(\zeta)$ for $\zeta \geq 0$. It uses the fact that $\tau \geq 1$. Indeed, $\tau \geq \sqrt{2\log B}$ is at least $\sqrt{2\log 2}=1.18$.

Lemma 30.

Monotonicity of $\psi$: With $\tau \geq 1.0$, the positive function $\psi(z)=(2\tau+z)\phi(z)/\Phi(z)$ is strictly decreasing for $z \geq 0$. Its maximum value is $\psi(0)=4\tau/\sqrt{2\pi} \leq 1.6\tau$. Moreover $\gamma=2\zeta'/\tau+(\psi-1)/\tau^2$ is positive.

Demonstration of Lemma 30

The function $\psi(z)$ is clearly strictly positive for $z \geq 0$. Its derivative is seen to be $$\psi'(z)=-[\psi(z)+z(2\tau-z)-1]\phi(z)/\Phi(z).$$

Note that the function $\tau^2 \gamma(z)$ matches the expression in brackets, this derivative equals $$-\tau^2 \gamma(z)\phi(z)/\Phi(z).$$

The $\tau^2 \gamma(z)$ is at least $\psi(z)+2\tau z-1$, and it remains to show that it is positive for all $z \geq 0$. It is clearly positive for $z \geq 1/2\tau$. For $0 \leq z \leq 1/2\tau$, lower bound it by lower bounding $\psi(z)-1$ by $2\tau\phi(1/2\tau)/\Phi(1/2\tau)-1$, which is positive provided $1/2\tau$ is less than the unique point $z=z_{root}>0$ where $\phi(z)=z\Phi(z)$. Direct evaluation shows that this $z$ is between 0.5 and 0.6. So $\tau \geq 1.0$ suffices for the positivity of $\gamma(z)$ and equivalently the negativity of $\psi'(z)$ for all $z \geq 0$. This completes the demonstration of Lemma 30.

The monotonicity of $\psi(\zeta)$ is associated with decreasing shortfall $\delta^*$, as $\zeta$ is increased, though with the cost of increasing $r_{crit}^*$. Evaluating $r_{crit}^*$ as a function of $\zeta$ enables control of the tradeoff.

Remark: The rate $R=\mathcal{C}'/(1-r/\tau^2)$ has been parameterized by $r$. As stated in Lemma 24, the relationship between the gap and $r$, expressed as $\text{gap}=(r-r_{crit})/[\text{snr}(\tau^2+r_1)]$, may also be written $r=r_{crit}+\text{snr}(\tau^2+r_1)\text{gap}$. Recall also that one may set $\text{gap}=\eta+\tilde{f}+1/(m-1)$, with $\tilde{f}=mf^*\rho$. In this way, the rate parameter $r$ is determined from the choices of $\zeta$ that appear in $r_{crit}$ as well as from the parameters $m$, $\tilde{f}$ and $\eta$ that control, respectively, the number of steps, the fractions of false alarms, and the exponent of the error probability.

The importance of $\zeta$ in this section is that provides for the evaluation of $r_{crit}$ and through $r_1$ it controls the location of the upper end of the region in which $g(x)-x$ is shown to exceed a target gap. For any $\zeta$, the above remark conveys the smallest size rate drop parameter $r$ for which that gap is shown to be achieved.

In the rate representation R, draw attention to the product of two of the denominator factors $(1+D(\delta_c)/\text{snr})(1+r/\tau^2)$. Here below these factors are represented in a way that exhibits the dependence on $r_{crit}^*$ and the gap.

Using $r$ equal to $r_{crit}+\text{snr gap } \tau^2(1-r_1/\tau^2)$ write the factor $1+r/\tau^2$ as the product $(1+r_{crit}/\tau^2)(1+\xi \text{snr gap})$ where $\xi$ is the ratio $(1+r_1/\tau^2)/(1+r_{crit}/\tau^2)$, a value between 0 and 1, typically near 1. Thus the product $(1+D(\delta_c)/\text{snr})(1-r/\tau^2)$ takes the form $$(1+D(\delta_c)/\text{snr})(1+r_{crit}/\tau^2)+(1+\xi \text{snr gap}).$$

Recall that $(1+D(\delta_c)/\text{snr})(1+r_{crit}/\tau^2)$ is equal to $$1 + \frac{(1+r_1/\tau^2)D(\delta_c)}{\text{snr}} + \frac{r_{crit}^*}{\tau^2}$$

which, at $r_1=r_{1,match}$, is equal to $$1 + \frac{\tilde{r}_{crit}^*}{\text{snr}\tau^2} + \frac{\tilde{r}_{crit}^* + 1 + \epsilon}{\tau^2}.$$

So in this way these denominator factors are expressed in terms of the gap and $\tilde{r}_{crit}^*$, where $\tilde{r}_{crit}^*$ is near $2\zeta^2$ by the previous corollary.

Complete this subsection by inquiring whether $r_{crit}$ is positive for relevant $\zeta$. By the definition of $r_{crit}$, its positivity is equivalent to the positivity of $r_{crit}^*+r_1 D(\delta_c)/\text{snr}$ which is not less than $1+\epsilon+(\tau^2+r_1)D(\delta_c)+r_1 D(\delta_c)/\text{snr}$. The multiplier of $D(\delta_c)$ is $(\tau^2+r_1)(1+1/\text{snr})$ which is positive for $r_1 \geq -\tau^2 \text{snr}/(1+\text{snr})$. So it is asked whether that be a suitable lower bound on $r_1$. Recall the relationship between $x^*$ and $r_1$, $$1-x^* = \frac{r-r_1}{\text{snr}(\tau^2+r_1)} = \text{gap} + \frac{r_{crit}-r_1}{\text{snr}(\tau^2+r_1)}.$$

Recognizing that $r_{crit}-r_1$ equals $r_{crit}^*-r_1$ divided by $1+D(\delta_c)/\text{snr}$, expressing $D(\delta_c)$ in terms of $r_{crit}^*$ and $r_1$ as above, one can rearrange this relationship to reveal the value of $r_1$ as a function of $x^*+\text{gap}$ and $r_{crit}^*$. Using $r_{crit}^*>0$ one finds that the minimal $r_1$ to achieve positive $x^*+\text{gap}$ is indeed greater than $-\tau^2 \text{snr}/(1+\text{snr})$.

9.8 Determination of $\zeta$:

In this subsection solve, where possible, for the optimal choice of $\zeta$ in the expression $\Delta_{\zeta,\delta_c}$ which balances contributions to the rate drop with the quantity $\delta_{mis}^*$ related to the mistake rate. As above it is $$\Delta_{\zeta,\delta_x} = \delta_{mis}^* + (1+D(\delta_c)/snr)(1+r_{crit}/\tau^2) - 1.$$

Also work with the simplified form $\Delta_{\zeta,\delta_c,simp}$ in which $\delta_{mis,simp}^*$ is used in place of $\delta_{mis}^*$. For $0 \le \delta_c < snr$, this $\Delta_{\zeta,\delta_c}$ coincides, as seen herein above, with $$\frac{(2\tau+\zeta)\phi(\zeta)+rem}{2C\tau^2(1+\zeta/\tau)^2} + \frac{(1+r_1/\tau^2)D(\delta_c)}{snr} + \frac{r_{crit}^*}{\tau^2},$$

where $rem = [(\tau^2 + r_1)D(\delta_c)(r_1-1)]\bar{\Phi}(\zeta)$. Define $\Delta_{\zeta,\delta_c,simp}$ to be the same but without the $(1+\zeta/\tau)^2$ in the denominator of the first part.

Seek to optimize $\Delta_{\zeta,\delta_c}$ or $\Delta_{\zeta,\delta_c,simp}$ over choices of $\zeta$ for each of the quartet of choices of $\delta_c$ given by 0, $\delta_{thresh}$, $\delta_{match}$ and snr. The minimum of $\Delta_{\zeta,\delta_c}$ provides what is denoted as $\Delta_{shape}$ as summarized in the introduction.

Optimum or near optimum choices for $\zeta$ are provided for the cases of $\delta_c$ equal to 0, $\delta_{match}$, and snr, respectively. These provide distinct ranges of the signal to noise ratio for which these cases provide the smallest $\Delta_{\zeta,\delta_c}$. At present, the inventors herein have not been able to determine whether the minimum $\Delta_{\zeta,\delta_{thresh}}$ has a range of signal to noise ratios at which its minimum is superior to what is obtained with the best of the other cases. What the inventors can confirm regarding $\delta_{thresh}$ is that for small snr the $\min_\zeta \Delta_{\zeta,\delta_{thresh}}$ requires $\delta_{thresh}$ near snr, and that for snr above a particular constant, the minimum $\Delta_{\zeta,\delta thresh}$ matches $\min_\zeta \Delta_{\zeta,0}$ with $\delta_{thresh}=0$ at the minimizing $\zeta$.

Optimal choices for $\zeta$ for the cases of $\delta_c$ equal to 0, $\delta_{match}$, and snr, respectively, provide three disjoint intervals $R_1$, $R_2$, $R_3$ of signal to noise ratio. The case of $\delta_c=0$ provides the optimum for the high end of snr in $R_3$; the case of $\delta_c=\delta_{match}$ provides the best bounds for the intermediate range $R_2$; and the case of $\delta_c=snr$ provides the optimum for the low snr range $R_1$.

The tactic is to consider these choices of $\delta_c$ separately, either optimizing over $\zeta$ to the extent possible or providing reasonably tight upper bounds on $\min_\zeta \Delta_{\zeta,\delta_c}$, and then inspect the results to see the ranges of snr for which each is best.

Note directly that $\Delta_{\zeta,\delta_c}$ is a decreasing function of snr for the $\delta_c=0$ and $\delta_c=\delta_{match}$ cases, so $\min_\zeta \Delta_{\zeta,\delta_c}$ also be decreasing in snr. Likewise for $\Delta_{\zeta,\delta_c,simp}$.

Remember that log base e is used, so the capacity is measured in mats.

Lemma 31.

Optimization of $\Delta_{\zeta,\delta_c,simp}$ with $\delta_c=0$. At $\delta_c=0$, the $\Delta_{\zeta,0,simp}$ is optimized at the $1/(2\mathcal{C}+1)$ quantile of the standard normal distribution $$\zeta = \zeta_C = \Phi^{-1}(1/(2\mathcal{C}+1)).$$

If $\mathcal{C} > 1/2$ this $\zeta_C$ is less than or equal to 0 and $\min_\zeta \Delta_{\zeta,0,simp}$ is not more than $$\frac{(2C+1)\phi(\zeta c)}{C\tau} + \frac{1}{\tau^2}.$$

Dividing the first term by $(1+\zeta_C/\tau)^2$ gives an upper bound on $\min_\zeta \Delta_{\zeta,0}$ valid for $\zeta_C > -\tau$. The bound is decreasing in $\mathcal{C}$ when $\zeta_C > -\tau + 1$. Let $\mathcal{C}$, exponentially large in $\tau^2/2$, be such that $\zeta_{C_{large}} = -\tau + 1$. For $\mathcal{C} > \mathcal{C}_{large}$, use $\zeta = -\tau + 1$ in place of $\zeta_C$, then the first term of this bound is exponentially small in $\tau^2/2$ and hence polynomially small in $1/B$.

This the $\zeta = \zeta_C^*$ advocated for $\delta_c = 0$ is $$\zeta_C^* = \max\{\zeta_C, -\tau + 1\}.$$

Examination of the bound shows an implication of this Lemma. When $\mathcal{C}/\sqrt{\log \mathcal{C}}$ is large compared to $\tau$ the $\Delta_{shape}$ is near $1/\tau^2$. This is clarified in the following corollary which provides slightly more explicit bounds.

Corollary 32.

Bounding $\min \Delta_{\zeta,0}$ with $\delta_c=0$. To upper bound $\min_\zeta \Delta_{\zeta,0,simp}$, the choice $\zeta=0$ provides $$\frac{(2C+1)}{C}\left(\frac{1}{\tau\sqrt{2\pi}} + \frac{1}{4\tau^2}\right),$$

which also bounds $\min_\zeta \Delta_{\zeta,0}$. Moreover, when $\mathcal{C} \ge 1/2$, the optimum $\zeta_C$ satisfies $|\zeta_C| \le \sqrt{2\log(\mathcal{C}+1/2)}$ and provides the following bound, which improves on the $\zeta=0$ choice when $\mathcal{C} \ge 2.2$, $$\frac{\xi(|\zeta c|)}{C\tau} + \frac{1}{\tau^2},$$

not more than $$\frac{\xi(\sqrt{2\log(C+1/2)})}{C\tau} + \frac{1}{\tau^2},$$

where $\xi(z)$ equals $z+1/z$ for $z \ge 1$ and equals 2 for $0 < \zeta < 1$. Dividing the first term by $(1+\zeta_X/\tau)^2$ gives an upper bound on $\min_\zeta \Delta_{\zeta,0}$ of $$\frac{\xi(|\zeta c|)}{C\tau(1+\zeta c/\tau)^2} + \frac{1}{\tau^2}.$$

When $B > 1+snr$, this bound on $\min_\zeta \Delta_{\zeta,0}$ improves on the bound with $\zeta=0$, for $\mathcal{C} \ge 5.5$. As before, when $\mathcal{C} \ge \mathcal{C}_{large}$ for which $\zeta_{C_{large}} = -\tau + 1$, use the bound with $\mathcal{C}_{large}$ in place of $\mathcal{C}$.

The $\min_\zeta \Delta_{\zeta,0,simp}$ bound above is smaller than given below for $\min_{\zeta,\delta_{match},simp}$, when the snr is large enough that an expression of order $\mathcal{C}/(\log \mathcal{C})^{3/2}$ exceeds $\tau$.

The quantity $d=d_{snr}=2\mathcal{C}/v=(1+1/snr)\log(1+snr)$ has a role in what follows. It is an increasing function of snr, with value always at least 1.

For $2\mathcal{C}/v \ge \tau/\sqrt{2\pi}$ use non-positive $\zeta$, whereas for $2\mathcal{C}/v < \tau/\sqrt{2\pi}$ use positive $\zeta$. Thus the discriminant of whether to use positive $\zeta$ is the ratio $\psi=d/\tau$ and whether it is smaller than $1/\sqrt{2\pi}$. This ratio $\omega$ is $$\omega = \frac{d}{\tau} = \frac{2C}{v\tau}.$$

In the next two lemma use $\delta_c=\delta_{match}$. Using the results of Lemma 25 and $1+1/snr=1/v$, the form of $\Delta_{\zeta,\delta_{match}}$ simplifies to $$\frac{\psi}{2C\tau^2(1+\zeta/\tau)^2} + \frac{1}{\nu}\frac{\tilde{r}_{crit}^*}{\tau^2} + \frac{1+\epsilon}{\tau^2}.$$

Recall for negative $\zeta$ that $\psi$ is near $2\tau|\zeta|$ and $\tilde{r}_{crit}^*$ through $\gamma^2/2$ is near $2/|\zeta|^2$, with associated bounds given in Lemma 27. So it is natural to set a negative $\zeta$ that minimizes $-\tau\zeta/\mathcal{C}+2/(\nu\zeta^2\tau^2)$ for which the solution is $$\zeta = -(4\,\mathcal{C}/\nu\tau)^{1/3} = -(2\omega)^{1/3},$$

which is here denoted as $\zeta_{1/3}$.

Lemma 33.

Optimization of $\Delta_{\zeta,\delta_c}$ at $\delta_c = \delta_{match}$: Bounds from non-positive $\zeta$. The choice of $\zeta=0$ yields the upper bound on $\min_\zeta \Delta_{\zeta,\delta_{match}}$ of $$\frac{2}{C\tau\sqrt{2\pi}} + \frac{4}{\nu\tau^2\pi} + \frac{1+\epsilon}{\tau^2}.$$

As for negative $\zeta$, the choice $\zeta = \zeta_{1/3} = -(4\,\mathcal{C}/\nu\tau)^{1/3}$ yields the upper bound on $\min_\zeta \Delta_{\zeta,\delta_{match}}$ of $$\frac{1}{(1+\zeta_{1/3}/\tau)^2}\left(\frac{2.4}{\nu^{1/3}C^{2/3}\tau^{4/3}} + \frac{2}{|\zeta_{1/3}|C\tau}\right) + \frac{1+\epsilon}{\tau^2}.$$

Amongst the bounds so far with $\zeta \le 0$, the first term controlling $\delta_{mis}^*$ is smallest at $\zeta = 0$ where it is $2/[\mathcal{C}\tau\sqrt{2\pi}]$. The advantage of going negative is that then the $4/[\nu\tau^2\pi]$ term is replaced by terms that are smaller for large $\mathcal{C}$.

Comparison:
The two bounds in Lemma 33 may be written as $$\frac{4}{\nu\tau^2}\left[\frac{1}{\sqrt{2\pi}\,\omega} + \frac{1}{\pi}\right] + \frac{1+\epsilon}{\tau^2}$$

and $$\frac{4}{\nu\tau^2}\left[\frac{1.5}{(2\omega)^{2/3}} + \frac{2}{(2\omega)^{4/3}}\right] + \frac{1+\epsilon}{\tau^2},$$

respectively, neglecting the $(1+\zeta_{1/3}/\tau)$ factor. Numerical comparison of the expressions in the brackets reveals that the former, from $\zeta=0$, is better for $\omega<5.37$, while the later from $\zeta=\zeta_{1/3}$ is better for $\omega\ge 5.37$, which is for $|\zeta_{1/3}|\ge 2.2$.

Next compare the leading term of the bound $\zeta_{1/3}$ and $\delta_c = \delta_{match}$ to the corresponding part of the bound using $\zeta_c$ and $\delta_c = 0$. These are, respectively, $$\frac{2.4}{\nu^{1/3}C^{2/3}\tau^{4/3}}$$

and $$\frac{\xi(|\zeta c|)}{C\tau}.$$

From this comparison the $\delta_c = 0$ solution is seen to be better when $$\frac{4.5C}{\nu(\xi(|\zeta c|))^3} > \tau.$$

Modified to take into account the factors $1+\partial_{1/3}/\tau$ and $1+\zeta_c^*/\tau$, this condition defines the region $R_3$ of very large snr for which $\delta_c = 0$ is best. To summarize it corresponds to snr large enough that an expression near $4.5\,\mathcal{C}/(\log \mathcal{C})^{3/2}$ exceeds $\tau$, or, equivalently, that $\mathcal{C}$ is at least a value of order $\tau(\log\tau)^{3/2}$, near to $(\tau/4.5)(\log(\tau/4.5))^{1/5}$, for sufficient size $\tau$.

Next consider the case of $\omega = d/\tau$ less than $1/\sqrt{2\pi}$ for which positive $\zeta$ is used. The function $\phi(\zeta)/\Phi(\zeta)$ is strictly decreasing. From its inverse, let $\zeta_\omega$ be the unique value at which $\phi(\zeta)/\Phi(\zeta) = 2\omega$. It is used to provide a tight bound on the optimal $\Delta_{\zeta,\delta_{match}}$.

Lemma 34.

Optimization of $\Delta_{\zeta,\delta_c}$ at $\delta_c = \delta_{match}$: Bounds from positive $\zeta$. Consider the case that $\tau/\sqrt{2\pi} \ge 2\,\mathcal{C}/\nu$. Let $\omega = 2\,\mathcal{C}/\nu\tau$. The choice of $\zeta = \zeta_\omega$ yields $\Delta_{\zeta,\delta_{match}}$ not more than $$\frac{2}{\nu\tau^2}[2+(\zeta_\omega+2\omega)^2] + \frac{1+\epsilon}{\tau^2}.$$

This $\zeta_\omega$ is not more than $$\zeta_\omega^* = \sqrt{2\log(1/2 + 1/2\omega\sqrt{2\pi})}$$

which is $$\sqrt{2\log\left(\frac{1}{2} + \frac{\tau\nu}{4C\sqrt{2\pi}}\right)},$$

at which $\Delta_{\zeta,\delta_{match}}$ is not more than $$\frac{2}{\nu\tau^2}\left[2+\left(\sqrt{2\log\left(\frac{1}{2}+\frac{\tau\nu}{4C\sqrt{2\pi}}\right)} + \frac{4C}{\tau\nu}\right)^2\right] + \frac{1+\epsilon}{\tau^2}.$$

For small $d/\tau$ the $2\omega = 4\,\mathcal{C}/\nu\tau = 2d/\tau$ term inside the square is negligible compared to the log term. Then the bound is near $$\frac{4}{\nu\tau^2}\left[1+\log\left(\frac{1}{2}+\frac{\tau}{2d\sqrt{2\pi}}\right)\right] + \frac{1}{\tau^2}.$$

In particular if snr is small the $d = 2\,\mathcal{C}/\nu$ is near 1 and the bound is near $$\frac{4}{\nu\tau^2}\left[1+\log\left(\frac{1}{2}+\frac{\tau}{2\sqrt{2\pi}}\right)\right] + \frac{1}{\tau^2}.$$

Finally, consider the case $\delta_c = \text{snr}$. The following lemma uses the form of $\Delta_{\zeta,snr}$ given in the remark following Lemma 26.

Lemma 35.

Optimization of $\Delta_{\zeta,\delta_c}$ at $\delta_c = \text{snr}$. The $\Delta_{\zeta,snr}$ is the maximum of the expressions $$\Phi(\varsigma) + \frac{(1+D(snr)/snr)}{(1+snr)}(1+snr\bar{\Phi}(\varsigma))(1+\varsigma/\tau)^2 - 1$$

-continued and $$\bar{\Phi}(\varsigma) + D(snr)/snr.$$

The first expression in this max is approximately of the form $b\bar{\Phi}(\zeta)+2\zeta/\tau+c$, optimized at $$\varsigma = \sqrt{2\log(\tau(1+2C)/2\sqrt{2\pi})},$$

where $b=1+2\mathcal{C}$ and c is equal to the negative value $(1/snr)\log(1+snr)-1$, at which $\bar{\Phi}(\zeta)\leq\phi(\zeta)=2/(\tau b)$. This yields a bound for that expression near $$\frac{2}{\tau} + \frac{2\sqrt{2\log(\tau(1+2C)/2\sqrt{2\pi})}}{\tau} + c,$$

with which one takes the maximum of it and $$\frac{2}{\tau(1+2C)} + \frac{D(snr)}{snr}.$$

Recall that $D(snr)/snr \leq snr/2$. Because of the $D(srr)/snr$ term the $\Delta_{\zeta,snr}$ is small only when snr is small. In particular $\Delta_{\zeta,snr}$ is less than a constant time $\sqrt{\log\tau}/\tau$ when snr is less than such.

In view of the $\nu = snr/(1+snr)$ factor in the denominator of $\Delta_{\zeta,\delta_{match}}$, one sees that $\min_\zeta \Delta_{\zeta,snr}$ provides a better bound than $\Delta_{\zeta,\delta_{match}}$ for snr less than a constant times $\sqrt{\log\tau}/\tau$.

Demonstration of Lemma 31 and its Corollary:

This Lemma concerns the optimization of $\zeta$ in the case $\delta_c = 0$. In this case $1+r_1/\tau^2 = (1+\zeta/\tau)^2$, the role of $r_{crit}^*$ is played by $r_{up}$ and the value of $\Delta_{\zeta,0,simp}$ is $$\frac{1}{2C}\frac{(2\tau+\varsigma)\phi(\varsigma)+\text{rem}}{\tau^2} + \frac{r_1+(2\tau+\varsigma)\phi(\varsigma)+\text{rem}}{\tau^2}.$$

Here $\text{rem}=-(r_1-1)\bar{\Phi}(\zeta)$, with $r_1=2\zeta\tau+\zeta^2$. Direct evaluation at $\zeta=0$ gives a bound, at which $r_1=0$ and $\text{rem}=1/2$.

Let's optimize $\Delta_{\zeta,0,simp}$ for the choice of $\zeta$. The derivative of $(2\tau+\zeta)\phi(\zeta)+\text{rem}$ with respect to $\zeta$ is seen to simplify to $-2(\tau+\zeta)\bar{\Phi}(\zeta)$. Accordingly, $\Delta_{\zeta,0,simp}$ has derivative $$2(\tau+\varsigma)\left(1-\left(\frac{1}{2C}+1\right)\Phi(\varsigma)\right),$$

which is 0 at $\zeta$ solving $\bar{\Phi}(\zeta)=2\mathcal{C}/(2\mathcal{C}+1)$, equivalently, $\Phi(\zeta=1/(2\mathcal{C}+1)$. At this $\zeta$, the quantities multiplying $r_1$ including the parts from the two occurrences of the remainder remainder are seen to cancel, such that the resulting value of $\Delta_{\zeta,0,simp}$ is $$\frac{(1+1/2C)(2\tau+\varsigma c)\phi(\varsigma c)+1}{\tau^2}.$$

With $2\mathcal{C}>1$, this $\zeta=\zeta_C$ is negative, so $\Delta_{\zeta,0,simp}$ is not more than $$\frac{(2C+1)\phi(\varsigma c)}{C\tau} + \frac{1}{\tau^2}.$$

Per the inequality in the appendix for negative $\zeta$, the $\phi(\zeta_C)$ is not more than the value) $\xi(|\zeta_C|)\Phi(\zeta)=\xi(|\zeta_C|)/(2\mathcal{C}+1)$, with $\xi(|\zeta|)$ the nondecreasing function equal to 2 for $|\zeta|\leq 1$ and equal to $|\zeta|+1/|\zeta|$ for $|\zeta|$ greater than 1. So at $\zeta=\zeta_C$, the $\Delta_{\zeta,0,simp}$ is not more than $$\frac{\xi(|\varsigma c|)}{C\tau} + \frac{1}{\tau^2},$$

where from $1/(2\mathcal{C}+1)=\Phi(\zeta_C)\leq(\frac{1}{2})e^{-\zeta_C^2/2}$ it follows that $|\zeta_C|\leq \sqrt{2\log(2\mathcal{C}+1)/2)}$.

The coefficient $\xi\sqrt{2\log(2\mathcal{C}-1)/2)}$ improves on the $(2\mathcal{C}+1)/\sqrt{2\pi}$ from the $\zeta=0$ case when $(2\mathcal{C}+1)/2$ is less than the value $\upsilon al$ for which $\xi(\sqrt{2\log\upsilon al})=(2/\sqrt{2\pi})\upsilon al$. Evaluations show $\upsilon al$ to be between 2.64 and 2.65. So it is an improvement when $2\mathcal{C}\geq 2\upsilon al-1=4.3$, and $\mathcal{C}\geq 2.2$ suffices. The improvement is substantial for large $\mathcal{C}$.

Dividing the first term by $(1+\zeta_C/\tau)^2$ produces an upper bound on $\Delta_{\zeta,0}$ when $\zeta_C>-\tau$. Exact minimization of $\Delta_{\zeta,0}$ is possible, though it does not provide an explicit solution. Accordingly, instead use the $\zeta_C$ that optimizes the simpler form and explore the implications of the division by $(1+\zeta_C/\tau)^2$.

Consider determination of conditions on the size $\mathcal{C}$ such that the bound on $\min_\zeta \Delta_{\zeta,0}$ is an improvement over the $\zeta=0$ choice. One can arrange the $|\zeta_C|/\tau$ to be small enough that the factor $(1+\zeta_C/\tau)^2$ in the denominator remains sufficiently positive. At $\zeta=\zeta_C$, the bound on $\zeta_C|$ of $\sqrt{2\log(2\mathcal{C}-1)/2)}$ is kept less than $\tau=\sqrt{2\log B}(1+\delta_a)$ when B is greater than $\mathcal{C}$, and $|\zeta_C|/\tau$ is kept small if B is sufficiently large compared to $\mathcal{C}$.

In particular, suppose $B\geq 1+snr$, then $\tau^2/4$ is at least $\mathcal{C}=(1/2)\log(1+snr)$, that is, $\tau \geq \sqrt{IC}$, and $(1+\zeta/\tau)$ is greater than $1-\sqrt{(1/2\mathcal{C})\log(2\mathcal{C}+1)/2)}$, which is positive for all $\mathcal{C}\geq 1/2$. Then for the non-zero $\zeta_C$ bound on $\Delta_{\zeta,0}$ to provide improvement over the $\zeta=0$ bound it is sufficient that $\mathcal{C}$ be at least the value $\mathcal{C}_0$ at which $(2\mathcal{C}+1)/\sqrt{2\pi}$ equals $\xi(\sqrt{2\log(2\mathcal{C}+1)/2})$ divided by $[1-2\mathcal{C}]^2$. Numerical evaluation reveals that $\mathcal{C}_0$ is between 5.4 and 5.45.

Next, consider what to do for very large $\sqrt{(1/2\mathcal{C})\log((2\mathcal{C}-1)/2)]}$ for which $\tau+\zeta_C$ is either negative or not sufficiently positive to give an effective bound. This could occur if snr is large compared to B. To overcome this problem, let $\mathcal{C}_{large}$ be the value with $\zeta_{Capacity_{large}}=\tau+1$. For $\mathcal{C}\geq \mathcal{C}_{large}$, use this $\zeta=\zeta_{C_{large}}$ in place of $\zeta_C$ so that $\tau+\zeta=1$ stays away from 0. Then upper bound $\Delta_{\zeta,0}$ by replacing the appearance of $\mathcal{C}$ with $\mathcal{C}_{large}$. This $\mathcal{C}_{large}$ has $\sqrt{2\log((2\mathcal{C}_{large}-1)/2)}\geq |\zeta|=\tau-1$ so that $$2\mathcal{C}_{large}+1\geq 2e^{(\tau-1)^2/2}.$$

More stringently, $$\frac{1}{2C_{large}+1} = \Phi(\varsigma) = \Phi(\tau-1) \leq \frac{1}{\tau-1}\phi(\tau-1),$$

from which $2\mathcal{C}_{large}+1$ is at least $(\tau-1)\sqrt{2\pi}e^{(\tau-)^2/2}$. Then for $\mathcal{C} \geq \mathcal{C}_{large}$, at $\zeta=\zeta_{\mathcal{C}_{large}}$ the term $$\frac{\tau\xi(|\zeta|)}{\mathcal{C}(\tau+\zeta)^2}$$

is less than $$\frac{2\tau^2}{(\tau-1)\sqrt{2\pi}\,e^{(\tau-1)^2/2}-1}$$

which is exponentially small in $\tau^2/2$ and hence of order $1/B$ to within a log factor. Consequently, for such very large $\mathcal{C}$, this term is negligible compared to the $1/\tau^2$.

Finally, consider the matter of the range of $\mathcal{C}$ for which the expression in the first term $(2\mathcal{C}+1)\phi(\zeta_C)/[\mathcal{C}\tau(1+\zeta_C/\tau)^2]$ is decreasing in $\mathcal{C}$ even with the presence of the division by $(1+\zeta_C/\tau)^2$. Taking the derivative of this expression with respect to $\mathcal{C}$, one finds that there is a $\mathcal{C}_{crit}$, with value of $\zeta_{\mathcal{C}_{crit}}$ not much greater than $-\tau$, such that the expression is decreasing for $\mathcal{C}$ up to $\mathcal{C}_{crit}$, after which, for larger $\mathcal{C}$, it becomes preferable to use $\zeta=\zeta_{\mathcal{C}_{crit}}$ in place of $\zeta_C$, though the determination of $\mathcal{C}_{crit}$ is not explicit. Nevertheless, one finds that at $\mathcal{C}=\mathcal{C}_{large}$ where $\zeta_C=-\tau+1$, the derivative of the indicated expression is still negative and hence $\mathcal{C}_{large} \leq \mathcal{C}_{crit}$. Thus the obtained bound is monotonically decreasing for $\mathcal{C}$ up to $\mathcal{C}_{large}$, and thereafter the bound for the first term is negligible. This completes the demonstration of Lemma 31 and its corollary.

Demonstration of Lemma 33:

Recall for negative $\zeta$ that $\psi$ is bounded by $2\tau[|\zeta|+1/|\zeta|]$. Likewise $\tilde{r}_{crit}^*/\tau^2$ is bounded by $\gamma^2/[2(1+\zeta/\tau)^2]$. Using $\gamma \leq 2/|\zeta|\tau$ this yields $\tilde{r}_{crit}^*/\tau^2$ less than $2/[\zeta^2(\tau+\zeta)^2]$. Plugging in the chosen $\zeta=\zeta_{1/3}$ produces the claimed bound for that case. Likewise directly plugging in $\zeta=0$ into the terms of $\Delta_{\zeta,\delta_{match}}$ provides a bound for that case. This completes the demonstration of Lemma 33.

Demonstration of Lemma 34:

As previously developed, at $\delta_c=\delta_{match}$, the form of $\Delta_{\zeta,\delta_{match}}$ simplifies to $$\frac{\psi}{2\mathcal{C}\tau^2(1+\zeta/\tau)^2} + \frac{1}{\nu}\frac{\tilde{r}_{crit}^*}{\tau^2} + \frac{1+\epsilon}{\tau^2}.$$

Now by Corollary 28, with $\zeta>0$, $\tilde{r}_{crit}^* \leq 2(\zeta+\phi(\zeta)/\Phi(\zeta))^2.$ Also $\psi(\zeta)=2\tau(1+\zeta/2\tau)\phi(\zeta)/\Phi(\zeta)$ and the $(1+\zeta/2\tau)$ factor is canceled by the larger $(1+\zeta/\tau)^2$ in the denominator. Accordingly, $\Delta_{\zeta,\delta_{match}}$ has the upper bound $$\frac{\phi(\zeta)}{\mathcal{C}\tau\Phi(\zeta)} + \frac{2}{\nu\tau^2}\left(\zeta+\frac{\phi(\zeta)}{\Phi(\zeta)}\right)^2 + \frac{1+\epsilon}{\tau^2}.$$

Plugging in $\zeta=\zeta_\omega$ for which $\phi(\zeta)\Phi(\zeta)=2\omega$ produces the claimed bound.

$$\frac{2\omega}{\mathcal{C}\tau} + \frac{2}{\nu\tau^2}(\zeta_\omega+2\omega)^2 + \frac{1+\epsilon}{\tau^2}.$$

To produce an explicit upper bound on $\Delta_{\zeta,\delta_{match}}$ replace the $\Phi(\zeta)$ in the denominator with its lower bound $1-\sqrt{2\pi}\phi(\zeta)/2$, for $\zeta \geq 0$. This lower bound agrees with $\Phi(\zeta)$ at $\zeta=0$ and in the limit of large $\zeta$. The resulting upper bound on $\Delta_{\zeta,\delta_{match}}$ is $$\frac{\phi\zeta}{\mathcal{C}\tau(1-\sqrt{2\pi}\,\phi(\zeta)/2)} + \frac{2}{\nu\tau^2}\left(\zeta+\frac{\phi(\zeta)}{(1-\sqrt{2\pi}\,\phi(\zeta)/2)}\right)^2$$

plus $(1+\epsilon)/\tau^2$.

The bound on $\phi(\zeta)/\Phi(\zeta)$ of $\phi(\zeta)/(1-\sqrt{2\pi}\phi(\zeta)/2)$ is found to equal $2\omega$ when $\sqrt{2\pi}\phi(\zeta)$ equals $2/[1+1/\omega\sqrt{2\pi}]$, at which $\zeta=\zeta^*$ is $$\zeta^* = \sqrt{2\log\left(\frac{1}{2}+\frac{1}{2\omega\sqrt{2\pi}}\right)}.$$

Accordingly, this $\zeta^*$ upper bounds $\zeta_\omega$ and the resulting bound on $\Delta_{\zeta^*,\delta_{match}}$ is $$\frac{2\omega}{\mathcal{C}\tau} + \frac{2}{\nu\tau^2}(\zeta^*+2\omega)^2 + \frac{1+\epsilon}{\tau^2}.$$

Using $2\omega=4\mathcal{C}/\nu\tau$ it is $$\frac{2}{\nu\tau^2}[2+(\zeta+2\omega)^2]+\frac{1+\epsilon}{\tau^2}.$$

This completes the demonstration of Lemma 34.

To provide further motivation for the choice $\zeta_\psi$, the derivative with respect to $\zeta$ of the above expression bounding $\Delta_{\zeta,\delta_{match}}$ for $\zeta \geq 0$ is seen, after factoring out $(4/\nu)(\zeta+\phi/\Phi)$, to equal $$1-\frac{1}{2\omega}\frac{\phi}{\Phi}-\left(\zeta+\frac{\phi}{\Phi}\right)\frac{\phi}{\Phi},$$

where the last term is negligible if $\zeta$ is not small. The first two yield 0 at $\zeta=\zeta_\psi$. Some improvement arises by exact minimization. Set the derivative to 0 including the last term, noting that it takes the form of a quadratic in $\phi/\Phi$. Then at the minimizer, $\phi/\Phi$ equals $[\sqrt{(\zeta+1/2\omega)^2+4}-(\zeta+1/2\omega)]/2$ which is less than $1/(\zeta+1/2\omega) \leq 2\omega$.

For further understanding of the choice of $\zeta$, note that for $\zeta$ not small, $\Phi(\zeta)$ is near 1 and the expression to bound is near $\phi(\zeta)/(\mathcal{C}\tau)+2\zeta^2/\nu\tau^2$, which by analysis of its derivative is seen to be minimized at the positive $\zeta$ for which $\phi(\zeta)$ equals 4 $\mathcal{C}/\nu\tau=2\omega$. It is $\zeta_1=$ $$\zeta_1 = \sqrt{2\log 1/(2\omega\sqrt{2\pi})}.$$

One sees that $\zeta^*$ is similar to $\zeta_1$, but has the addition of ½ inside the logarithm, which is advantageous in allowing $\omega$ up to $1/\sqrt{2\pi}$. The difference between the use of $\zeta^*$ and $\zeta_1$ is negligible when they are large (i.e. when $\omega$ is small), nevertheless, numerical evaluation of the resulting bound shows $\zeta^*$ to be superior to $\zeta_1$ for all $\omega \leq 1/\sqrt{2\pi}$.

In the next section the rate expression is used to solve for the optimal choices of the remaining parameters.

10 Optimizing Parameters for Rate and Exponent

In this section the parameters are determined that maximize the communication rate for a given error exponent. Moreover, in the small exponent (large L) case, the rate and its closeness to capacity are determined as a function of the section size B and the signal to noise ratio snr.

Recall that the rate of the sparse superposition inner code is $$R = \frac{(1-h')\mathcal{C}}{(1+\delta_a)^2(1+\delta_{sum}^2)(1+r/\tau^2)},$$

with $(1-h')=(1-h)(1-h_f)$. The inner code makes a weighted fraction of section mistakes bounded by $\delta_m = \delta^* + \eta + \bar{f}$ with high probability, as shown previously herein. If one multiply the weighted fraction by the factor $1/[L\min_i\pi_{(i)}]$ which equals fac=snr$(1+\delta_{sum}^2)/[2\mathcal{C}(1+\delta_c)]$, then it provides an upper bound on the (unweighted) fraction of mistakes $\delta_{mis}$=fac$\delta_m$ equal to $\delta_{mis}$=fac$(\delta^*+\eta+\bar{f})$.

So with the Reed-Solomon outer code of rate $1-\delta_{mis}$, which corrects the remaining fraction of mistakes, the total rate of the code is $$R_{tot} = \frac{(1-\delta_{mis})(1-h')\mathcal{C}}{(1+\delta_{sum}^2)(1+\delta_a)^2(1+r/\tau^2)}.$$

This multiplicative representation is appropriate considering the manner in which the contributions arise. Nevertheless, in choosing the parameters in combination, it is helpful to consider convenient and tight lower bounds on this rate, via an additive expression of rate drop from capacity.

Lemma 36.

Additive representation of rate drop: With a non-negative value for r, represented as in Remark 3 above, the rate $R_{tot}$ is at least $(1-\Delta)\mathcal{C}$ with $\Delta$ given by $$\Delta = \frac{snr\delta^*}{(1+\delta_c)2\mathcal{C}} + \frac{r^*_{crit}}{\tau^2} + \frac{(1+r_1/\tau^2)D(\delta_c)}{snr} +$$
$$\frac{snr}{2\mathcal{C}}(\eta+\bar{f}) + snr\text{ gap} + h_f + h + 2\delta_a + \frac{2\mathcal{C}}{Lv}.$$

These are called, respectively, the first and second lines of the expression for $\Delta$. The first line of $\Delta$ is what is also denoted in the introduction as $\Delta_{shape}$ or in the previous section as $\Delta_\zeta$ to emphasize its dependence on $\zeta$ which determines the values of $r_1$, $\delta_c$, and $\delta^*$. In contrast the second line of $\Delta$, which is denote $\Delta_{second}$, depends on $\eta$, $\bar{f}$, and a. It has the ingredients of $\Delta_{alarm}$ and the quantities which determine the error exponent.

Demonstration of Lemma 36:

Consider first the ratio $$\frac{1-\delta_{mis}}{(1+\delta_{sum}^2)(1+r/\tau^2)}.$$

Splitting according to the two terms of the numerator and using the non-negativity of r it is at least $$\frac{1}{(1+\delta_{sum}^2)(1+r/\tau^2)} - \frac{\delta_{mis}}{1+\delta_{sum}^2}.$$

From the form of fac, the ratio $\delta_{mis}/(1+\delta_{sum}^2)$ subtracted here is equal to $$\frac{snr}{2\mathcal{C}}\frac{(\delta^*+\eta+\bar{f})}{(1+\delta_c)},$$

where in bounding it further drop the $(1+\delta_c)$ from the terms involving $\eta+\bar{f}$, but find it useful to retain the term involving $\delta^*$.

Concerning the factors of the first part of the above difference, use $\delta_{sum}^2 \leq D(\delta_c)/snr + 2\mathcal{C}/Lv$ to bound the factor $(1+\delta_{sum}^2)$ by $(1+D(\delta_c)/snr)(1+2\mathcal{C}/Lv)$.

and use the representation of $(1+D(\delta_c)/snr)(1+r/\tau^2)$ developed at the end of the previous section, $$\left(1 + \frac{(1+r_1/\tau^2)D(\delta_c)}{snr} + \frac{r^*_{crit}}{\tau^2}\right)(1+\xi snr\text{ gap})$$

to obtain that the first part of the above difference is at least $$1 - \left[\frac{r^*_{crit}}{\tau^2} + \frac{(1+r_1/\tau^2)D(\delta_c)}{snr} + snr\text{ gap} + \frac{2\mathcal{C}}{Lv}\right].$$

Proceed in this way, including also the factors $(1-h')$ and $1/(1+\delta_a)$ to produce the indicated bound on the rate drop from capacity. This bound is tight when the individual terms are small, because then the products are negligible in comparison. Here it is used that $1/(1+\delta_i) \geq 1-\delta_i$ and $(1-\delta_1)(1-\delta_2)$ exceeds $1-\delta_1-\delta_2$, for non-negative reals $\delta_i$, where the amount by which it exceeds is the product $\delta_1\delta_2$. Likewise inductively products $\pi_i(1-\delta_i)$ exceed $1-\Sigma_i\delta_i$. This completes the demonstration of Lemma 36.

This additive form of $\Delta$ provides some separation of effects that facilitates joint optimization of the parameters as in the next Lemma. Nevertheless, once the parameters are chosen, it is preferable to reexpress the rate in the original product form because of the slightly larger value it provides.

Let's recall parameters that arise in this rate and how they are interrelated. For the incremental false alarm target use $$f^* = \frac{1}{\sqrt{2\pi}\sqrt{2\log B}} e^{-a\sqrt{2\log B}},$$

such that $$\delta_a = \frac{\log 1/[f^*\sqrt{2\pi}\sqrt{2\log B}]}{2\log B}.$$

With a number of steps m at least 2 and with ρ at least 1, the total false alarms are controlled by $\bar{f}=mf^*\rho$ and the exponent associated with failed detections is determined by a positive η. Set $h_f$ equal to 2snr$\bar{f}$ plus the negligible $\epsilon_3$=2sgr $\sqrt{(1+snr)k/L_\pi}$+snr/$L_\pi$, arising in the determination of the weights of combination of the test statistic. To control the growth of correct detections set $$gap=\eta+\bar{f}+1/(m-1).$$

The $r_1$, $r_{crit}^*$, $\delta^*$ and $\delta_c$ are determined as in the preceding section as functions of the positive parameter ζ.

The exponent of the error probability $e^{-L_n\epsilon}$ is $\epsilon=\epsilon_\eta$ either given by $$\epsilon_\eta=2\eta^2$$

or, if the Bernstein bound is used, by $$\frac{1}{2}\frac{L}{L_\pi}\frac{\eta^2}{V+(1/3)\eta L/L_\pi}$$

where V is the minimum value of the variance function discussed previously. For the chosen power allocation the $L_\pi$=1/$\max_j \pi_{(j)}$ has $L/L_\pi$ equal to $(2C/v)(1+\delta_{sum}^2)$, which may be replaced by its lower bound $(2C/v)$ yielding $$\varepsilon_\eta = \frac{\eta^2}{Vv/C+(2/3)\eta}.$$

In both cases the relationship between ε and η is strictly increasing on η>0 and invertible, such that for each ε≥0 there is a unique corresponding η(ε)≥0.

Set the Chi-square concentration parameter h so that the exponent $(n-m+1)/h_m^2/2$ matches $L_\pi \epsilon_\eta$, where $h_m$ equals $(nh-m+1)(n-m+1)$. Thus $h_m=\sqrt{2\epsilon_\eta L_\pi/(n-m+1)}$ which means $$h=(m-1)/n+\sqrt{2\epsilon_\eta L_\pi(n-m+1)}/n.$$

With $L_\pi \leq (v/2C)L$ not more than (v/2)n/log B, it yields h not more than (m-1/n+h* where $$h^*=\sqrt{v\epsilon_\eta/\log B}.$$

The part (m-1)/n which is (m-1)$C$/L log B is lumped with the above-mentioned remainders 2$C$/Lv and $\epsilon_3$, as negligible for large L.

Finally, ρ>1 is chosen such that the false alarm exponent $\bar{f}$ $\mathcal{D}(\rho)/\rho$ matches $\epsilon_\eta$. The function $\mathcal{D}(\rho)/\rho=\log \rho-1+1/\rho$ is 0 at ρ=1 and is an increasing function of ρ≥1 with unbounded positive range, so it has an inverse function ρ(ε) at which set ρ=ρ($\epsilon_\eta/\bar{f}$).

Herein the inventors pin down as many of these values as one can by exploring the best relationship between rate and error probability achieved by the analysis of the invented decoder.

Take advantage of the decomposition of Lemma 36.

Lemma 37.

Optimization of the second line of Δ. For any given positive η providing the exponent $\epsilon_\eta$ of the error probability, the values of the parameters m, $\bar{f}$, and ρ, are specified to optimize their effect on the communication rate. The second line $\Delta_{second}$ of the total rate drop $(C-R)/C$ bound Δ is the sum of three terms $$\Delta_m+\Delta_{\bar{f}}+\Delta_\eta,$$

plus the negligible $\Delta_L=2C/(Lv)+(m-1)C/(L\log B)+\epsilon_3$. Here $$\Delta_m = \frac{snr}{m-1} + \frac{\log m}{\log B}$$

is optimized at a number of steps m equal to an integer part of 2+snr log B at which $\Delta_m$ is not more than $$\frac{1}{\log B} + \frac{\log(2+snr\log B)}{\log B}.$$

Likewise $\Delta_{\bar{f}}$ is given by $$snr(3+1/2C)\bar{f} - \frac{\log(\bar{f}\sqrt{2\pi}\sqrt{2\log B})}{\log B},$$

optimized at the false alarm level $\bar{f}$=1/[snr(3+1/2$C$)log B] at which $$\Delta_{\bar{f}} = \frac{1}{\log B} + \frac{\log(snr(3+1/2C)\sqrt{\log B}/\sqrt{4\pi})}{\log B}.$$

The $\Delta_\eta$ is given by $$\Delta_\eta = \eta snr(1+1/2C) + \frac{\log \rho}{\log B} + h^*$$

evaluated at the optimal ρ=ρ($\epsilon_\eta/\bar{f}$). It yields $\Delta_\eta$ not more than
$\eta snr(1+1/2C)+\epsilon_\eta snr(3+1/2C)+1/\log B+h^*$.

Together the optimized $\Delta_m+\Delta_{\bar{f}}$ form what is called $\Delta_{alarm}$ in the introduction. In the next lemma use the $\Delta_\eta$ expression, or its inverse, to relate the error exponent to the rate drop.

Demonstration of Lemma 42:

Recall that $$2\delta_a = \frac{\log[\rho m/(\bar{f}\sqrt{2\pi}\sqrt{2\log B})]}{\log B}.$$

The log of the product is the sum of the logs. Associate the term log m/log B with $\Delta_m$ and the term log ρ/log B with $\Delta_\eta$ and leave the rest of $2\delta_a$ as part of $\Delta_{\bar{f}}$. The rest of the terms of Δ associate in the obvious way. Decomposed in this way, the stated optimizations of $\Delta_m$ and $\Delta_{\bar{f}}$ are straightforward.

For $\Delta_m$=snr/(m-1)+(log m)/(log B) consider it first as a function of real values m≥2. Its derivative is $-snr(m-1)^2+$ 1/(m log B), which is negative at $m_1=1+\text{snr} \log B$, positive at $m_2=2+\text{snr} \log B$, and equal to 0 at a point $m_2^*=[m_2+\sqrt{m_2^2-4}]/2$ in between $m_1$ and $m_2$. Moreover, the value of $\Delta_{m_2}$ is seen to be smaller than the value of $m_1$. Accordingly, for m in the interval $m_1 < m \leq m_2$, which includes an integer value, the $\Delta_m$ remains below what is attained for $m \leq m_1$. Therefore, the minimum among integers occurs at either at the floor $\lfloor 2+\text{snr} \log B \rfloor$ or at the ceiling $\lceil 2+\text{snr} \log B \rceil$ of $m_2$, whichever produces the smaller $\Delta_m$. [Numerical evaluation confirms that the optimizer tends to coincide with the rounding of $m_2^*$ to the nearest integer, coinciding with a near quadratic shape of $\Delta_m$ around $m_2^*$, by Taylor expansion for m not far from $m_2^*$.]

When the optimal integer in is less than or equal to $m_2=2+\text{snr} \log B$, use that it exceeds $M_1$ to conclude that $\Delta_m \leq 1/\log B + (\log m_2)/(\log B)$. When the optimal m is a rounding up of $m_2$, use $\text{snr}/(m-1) \leq \text{snr}/(1+\text{snr} \log B)$. Also log m exceeds log $m_2$ by the amount $\log(m/m_2) \leq \log(1+1/m_2)$ less than $1/(1+\text{snr} \log B)$, to obtain that at the optimal integer, $\Delta_m$ remains less than $$\frac{1}{\log B} + \frac{\log m_2}{\log B}.$$

For $\Delta_{\tilde{f}}$ and $\Delta_\eta$ there are two ways to proceed. One is to use the above expression for $\delta_a$, and set $\Delta_{\tilde{f}}$ as indicated, which is easily optimized by setting $\tilde{f}$ at the value specified.

For $\Delta_\eta$ note that the log $\rho$/log B has numerator log $\rho$ equal to $1-1/\rho+\epsilon_\eta/\tilde{f}$ at the optimized $\rho$, and accordingly get the claimed upper bound by dropping the subtraction of $1/\rho$. This completes the demonstration of Lemma 42.

It is noted that in accordance with the inverse function $\rho(\epsilon_\eta/\tilde{f})$ there is an indirect dependence of the rate drop on $\tilde{f}$ when $\epsilon_\eta > 0$. One can jointly optimize $\Delta_{\tilde{f}} + \Delta_\eta$ for $\tilde{f}$ for given $\eta$, though there is not explicit formula for that solution. The optimization claimed is for $\Delta_{\tilde{f}}$ which produces a clean expression suitable for use with small positive $\eta$.

A closely related presentation is to write $$2\delta_a = \frac{\log[m/(\bar{f}^*\sqrt{2\pi}\sqrt{2\log B})]}{\log B}$$

and in other terms involving $\tilde{f}$, write it as $\rho \tilde{f}^*$. Optimization of $$\text{snr}(3+1/2C)\rho \bar{f}^* - \frac{\log(\bar{f}^*\sqrt{2\pi}\sqrt{2\log B})}{\log B},$$

occurs at a baseline false alarm level $\tilde{f}^*$ that is equal to $1/[\rho \text{snr}(3+1/2\mathcal{C})\log B]$. These approaches have the baseline level of false alarms (as well as the final value of $\delta_a$) depending on the subsequent choice of $\rho$.

One has a somewhat cleaner separation in the story, as in the introduction, if $\tilde{f}^*$ is set independent of $\rho$. This is accomplished by a different way of spitting the terms of $\Delta_{second}$. One writes $\tilde{f}=\rho \tilde{f}^*$ as $\tilde{f}^*+(\rho-1)\tilde{f}^*$, the baseline value plus the additional amount required for reliability. Then set $\Delta_{\tilde{f}^*}$ to equal $$\text{snr}(3+1/2C)\bar{f}^* - \frac{\log(\bar{f}^*\sqrt{2\pi}\sqrt{2\log B})}{\log B},$$

optimized at $\tilde{f}^*=1/[\text{snr}(3+1/2\mathcal{C})\log B]$, which determines a value of $\delta_a$ for the rate drop envelope independent of $\eta$. In that approach one replaces $\Delta_\eta$ with $$\eta \text{snr}(1+1/2\mathcal{C})+(\rho-1)\text{snr}(3+1/2\mathcal{C})+h^*,$$

with $\rho$ defined to solve $\tilde{f}^* \mathcal{D}(\rho)=\epsilon_\eta$. There is not an explicit solution to the inverse of $\mathcal{D}(\rho)$ at $\epsilon_\eta/\tilde{f}^*$. Nevertheless, a satisfactory bound for small $\eta$ is obtained by replacing $\mathcal{D}(\rho)$ by its lower bound $2(\sqrt{\rho}-1)^2$, which can be explicitly inverted. Perhaps a downside is that from the form of the $\tilde{f}^*$ which minimizes $\Delta_{\tilde{f}}$ one ends up, multiplying by $\rho$, with a final $\tilde{f}$ larger than before.

With $2(\sqrt{\rho}-1)^2$ replacing $\mathcal{D}(\rho)$, it is matched to $2\eta^2/\tilde{f}^*$ by setting $\sqrt{\rho}-1=\eta/\sqrt{\tilde{f}^*}$ and solving for $\rho$ by adding 1 and squaring. The resulting expression used in place of $\Delta_\eta$ is then a quadratic equation in $\eta$, for which its root provides means by which to express the relationship between rate drop and error exponent. Then $\rho \tilde{f}^*$ is $(\sqrt{\tilde{f}^*}+\eta)^2$.

A twist here, is that in solving for the best $\tilde{f}^*$, rather than starting from $\eta=0$, one may incorporate positive $\eta$ in the optimization of $$\text{snr}(3+1/2C)\left(\sqrt{\bar{f}^*}+\eta\right)^2 - \frac{\log(\bar{f}^*\sqrt{2\pi}\sqrt{2\log B})}{\log B},$$

for which, taking the derivative with respect to $\sqrt{\tilde{f}^*}$ and setting it to 0, a solution for this optimization is obtained as the root of a quadratic equation in $\sqrt{\tilde{f}^*}$. Upon adding to that the other relevant terms of $\Delta_{second}$, namely $\eta \text{snr}(1+1/2\mathcal{C})+h^*$ one would have an explicit, albeit complicated, expression remaining in $\eta$.

Set $\Delta_B=\Delta(\text{snr}, B)$ equal to $\Delta_{shape}+\Delta_m+\Delta_{\tilde{f}}$ at the above values of $\zeta$, m, $\tilde{f}$. This $\Delta_B$ provides the rate drop envelope as a function only of snr and B. It corresponding to the large L regime in which one may take $\eta$ to be small. Accordingly, $\Delta_B$ provides the boundary of the behavior by evaluating $\Delta$ with $\eta=0$.

The given values of m and $\tilde{f}$ optimize $\Delta_B$, and the given $\zeta$ provides a tight bound, approximately optimizing the rate drop envelope $\Delta_B$. The associated total rate $R_{tot}$ evaluated at these choices of parameters with $\eta=0$, denoted $\mathcal{C}_m$ is at least $\mathcal{C}(1-\Delta_B)$. The associated bound on the fraction of mistakes of the inner code is $\delta_{mis}^*=(\text{snr}/2\mathcal{C})(\delta^*-\tilde{f})$.

Express the $\Delta_\eta$ bound as a strictly increasing function of the error exponent $\epsilon$ $$\eta(\varepsilon)\text{snr}(1+1/2C)+\varepsilon(3+1/2C)+\frac{1-1/\rho(\varepsilon/\bar{f})}{\log B}+\sqrt{v\varepsilon/\log B}$$

and let $\epsilon(\Delta)$ denote its inverse for $\Delta \geq 0$, [recognizing also per the statement of the Lemma above the cleaner upper bound dropping the $1/\rho(\epsilon/\tilde{f})/\log B$ term]. The part $\eta(\epsilon)\text{snr}/2\mathcal{C}$ within the first term is from the contribution to $2\delta_{mis}$ in the outer code rate. From the rate drop of the superposition inner code, the rest of $\Delta_\eta$ written as a function of $\epsilon$ is denoted $\Delta_{\eta,super}$ and let $\epsilon_{super}(\Delta)$ denote its inverse function.

For a given total rate $R_{tot} < \mathcal{C}_B$, an associated error exponent $\epsilon$ is $$\epsilon((\mathcal{C}_B-R_{tot})/\mathcal{C}),$$

which is the evaluation of that inverse at $(\mathcal{C}_B-R_{tot})/\mathcal{C}$. Alternatively, in place of $\mathcal{C}_B$ its lower bound $\mathcal{C}(1-\Delta_B)$ may be used and so take the error exponent to be $\epsilon(1-R_{tot}/\mathcal{C}-\Delta_B)$. Either choice provides an error exponent of a code of that specified total rate.

To arrange the constituents of this code, use the inner code mistake rate bound $\delta_{mis}=\text{fac}(\delta^*+\bar{f}+\eta(\epsilon))$, and set the inner code rate target $R=R_{tot}/(1-\delta_{mis})$. Accordingly, for any number of sections L, set the codelength n, to be L log B/R rounded to an integer, so that the inner code rate L log B/n agrees with the target rate to within a factor of $1\pm 1/n$, and the total code rate $(1-\delta_{mis})R$ agrees with $R_{tot}$ to within the same precision.

Theorem 38.

Rate and Reliability of the composite code: As a function of the section size B, let $\mathcal{C}_B$ and its lower bound $\mathcal{C}(1-\Delta_B)$ be the rate envelopes given above, both near the capacity $\mathcal{C}$ for B large. Let a positive $R_{tot}<\mathcal{C}_B$ be given. If $R_{tot}\leq\mathcal{C}(1-\Delta_B)$, set the error exponent $\epsilon$ by $$\epsilon(1-\Delta_B-R_{tot}/\mathcal{C}).$$

Alternatively, to arrange the somewhat larger exponent, with $\eta$ such that $\Delta_\eta=(\mathcal{C}_B-R_{tot})/\mathcal{C}$, suppose that $\Delta_\eta\geq\delta_{mis}$; then set $\epsilon=\epsilon_\eta$, that is, $\epsilon=\epsilon((\mathcal{C}_B-R_{tot})/\mathcal{C})$. To allow any $R_{tot}<\mathcal{C}_B$ without further condition, there is a unique $\eta>0$ such that $\Delta_{\eta,super}\mathcal{C}=\mathcal{C}_B/(1-\delta_{mis}^*)-R_{tot}/(1-\delta_{mis})$, at which set $\epsilon=\epsilon_\eta$. In any of these three cases, for any number of sections L, the code consisting of a sparse superposition code and an outer Reed-Solomon code, having composite rate equal to $R_{tot}$, to within the indicated precision, has probability of error not more than $$\kappa e^{-L\pi\epsilon},$$

which is exponentially small in $L_\pi$, near $L\nu/(2\mathcal{C})$, where $\kappa=m(1+\text{snr})^{1/2}B^c+2m$ is a polynomial in B with $c=\text{snr}\mathcal{C}$, with number of steps m equal to the integer part of $1+\text{snr}$ log B.

Demonstration of Theorem 38 for Rate Assumption $R_{tot}<\mathcal{C}(1-\Delta_B)$:

Set $\eta>0$ such that $\Delta_\eta=1-\Delta_B-R_{tot}/\mathcal{C}$. Then the rate $R_{tot}$ is expressed in the form $\mathcal{C}(1-\Delta_B-\Delta_\eta)$. In view of Lemma ?? and the development preceding it, this rate $\mathcal{C}(1-\Delta)=\mathcal{C}(1-\Delta_B-\Delta_\eta)$ is a lower bound on a rate of the established form $(1-\delta_{mis})\mathcal{C}'/(1-r/\tau^2)$, with parameter values that permit the decoder to be accumulative up to a point x* with shortfall $\delta^*$, providing a fraction of section mistakes not more than $\delta_{mis}=\text{fac}(\delta^*+\eta+\bar{f})$, except in an event of the indicated probability with exponent $\epsilon_h=\epsilon(\Delta_\eta)$. This fraction of mistakes is corrected by the outer code. The probability of error bound from the earlier theorem herein is $$m\,e^{-L_\pi\mathcal{E}+m\mathcal{C}}+2me^{-L\eta\epsilon}.$$

With $m\leq 1+\text{snr}$ log B it is not more than the given $\kappa e^{-L\eta\epsilon}$. The other part of the Theorem asserts a similar conclusion but with an improved exponent associated with arranging $\Delta_\eta=(\mathcal{C}_B-R_{tot})/\mathcal{C}$, that is, $R_{tot}=\mathcal{C}_B(1-\Delta_\eta)$. The inventors return to demonstrate that conclusion as a corollary of the next result.

One has the option to state the performance scaling results in terms of properties of the inner code. At any section size B, recognize that $\Delta_B$ above, at the $\eta=0$ limit, splits into a contribution from $\delta_{mis}^*=(\text{snr}/2\mathcal{C})(\bar{f}+\delta^*/(1+\delta_c))$ and the rest which is a bound on the rate drop of the inner superposition code, which is denoted $\Delta_{super}^*$, in this small $\eta$ limit. The rate envelope for such superposition codes is $$C_{super}^*=\frac{(1-2\text{snr}\bar{f})C}{(1+D(\delta_c)/\text{snr})[(1+\delta_a)^2+r/(2\log B)]},$$

evaluated at $\bar{f}$, $\delta_a$, $\delta_c$, r and $\zeta$ as specified above, with $\eta=0$, $h=0$ and $\rho=1$, again with a number of steps m equal to the integer part of $1+\text{snr}$ log B. It has $$\mathcal{C}_{super}^*\geq\mathcal{C}(1-\Delta_{super}^*).$$

Likewise recall that $\Delta_\eta$ splits into the part $\eta(\epsilon)\text{snr}/2\mathcal{C}$ associated with $\delta_{mis}$ and the rest $\Delta_{\eta,super}$ expressed as a function of $\epsilon$, for which $\epsilon_{super}(\Delta)$ is its inverse.

Theorem 39.

Rate and Reliability of the Sparse Superposition Code: For any rate $R<\mathcal{C}_{super}^*$, let $\epsilon$ equal $$\epsilon_{super}(\mathcal{C}_{super}^*-R)/\mathcal{C}).$$

Then for any number of sections L, the rate R sparse superposition code with adaptive successive decoder, makes a fraction of section mistakes less than $\delta_{mis}^*+\eta(\epsilon)\text{snr}/2\mathcal{C}$ except in an event of probability less than $\kappa e^{-L_\pi\epsilon}$.

This conclusion about the sparse superposition code would also hold for values of the parameters other than those specified above, producing related tradeoffs between rate and the reliable fraction of section mistakes. The particular choices of these parameters made above is specific to the tradeoff that produces the best total rate of the composite code.

Demonstration of Theorem 39.

In view of the preceding analysis, what remains to establish is that the rate $$\mathcal{C}_{super}^*(1-\Delta_{\eta,super})$$

is not more than the rate expression $$\frac{C(1-h_f)(1-h^*)}{(1+D(\delta_c)/\text{snr})(1+\delta_{a,\rho})^2(1+r_\eta/\tau^2)}$$

where $\Delta_{\eta,super}$ which is $$\eta\text{snr}(1+r_1/2\log B)+\epsilon_\eta(3+1/C)(1+1/\log B)+\sqrt{\nu\epsilon/\log B}$$

is at least $$\eta\text{snr}(1+r_1/\tau^2)+(\log\rho)/\log B+h^*.$$

with $\rho$ and $h^*$ satisfying the conditions of the Lemma, so that (once one accounts for the negligible remainder in 1/L), the indicated reliability holds with this rate. Here it is denoted that $\delta_{a,\rho}=\delta_a+(\log\rho)/2\log B$ to distinguish the value that occurs with $\rho>1$ with the value at $\rho=0$ used in the definition of $\mathcal{C}_{super}^*$. Likewise $r_\eta/\tau^2$ is written for the expression $r/\tau^2+\eta\text{snr}(1+r_1/\tau^2)$ to distinguish the value that occurs with $\eta>0$ with the value of $r/\tau^2$ at $\eta=0$ used in the definition of $\mathcal{C}_{super}^*$. Factoring out terms in common, what is to be verified is that $$\frac{1-\Delta_{\eta,super}}{(1+\delta_a)^2(1+r/\tau^2)}$$

is not more than $$\frac{(1-h^*)}{(1+\delta_{a,\rho})^2(1+r_\eta/\tau^2)}.$$

This is seen to be true by cross multiplying, rearranging, expanding the square in $(1+\delta_a+\log\rho/2\log B)^2$, using the lower bound on $\Delta_{\eta,super}$, and comparing term by term for the parts involving $h^* \log \rho$ and $\eta$. This completes the demonstration of Theorem 39.

Next the rest of Theorem 38 is demonstrated, in view of what has been established. For the general rate condition $R_{tot} < C_B$, for $\eta \geq 0$ the expression $$\Delta_{\eta,super} C + \frac{R_{tot}}{1 - \delta^*_{mis} - snr\eta/2C}$$

is a strictly increasing function of $\eta$ in the interval $[0, (2C/snr)(1-\delta_{mis}^*))$ where the second term in this expression may be interpreted as the rate R of an inner code, with total rate $R_{tot}$. This function starts at $\eta=0$ at the value $R_{tot}/(1-\delta_{mis}^*)$ which is less than $C_B/(1-\delta_{mis}^*)$ which is $C_{super}^*$. So there is an $\eta$ in this interval at which this function hits $C_{super}$. That is $\Delta_{\eta,super} C + R = C_{super}$, or equivalently, $\Delta_{\eta,super} = (C_{super}^* - R)/C$. So Theorem 39 applies with exponent $\epsilon_{super}((C_{super}^* - R)/C))$.

Finally, to obtain the exponent $\epsilon((C_B - R_{tot})/C))$, let $\Delta_\eta = C_B - R_{tot}/C$. Examine the rate $$C_B(1 - \Delta_\eta)$$

which is $$(1 - \delta_{mis}^*) C_{super}^* (1 - \Delta_{\eta,super} - \eta snr/2 C)$$

and determine whether it is not more than the following composite rate (obtained using the established inner code rate), $$(1 - \delta_{mis}^* - \eta snr/2 C) C_{super}^* (1 - \Delta_{\eta,super}).$$

These match to first order. Factoring out $C_{super}^*$ and canceling terms shared in common, the question reduces to whether $-(1-\delta_{mis}^*)$ is not more than $-(1-\Delta_{\eta,super})$, that is, whether $\delta_{mis}^*$ is not more than $\Delta_{\eta,super}$, or equivalently, whether $\delta_{mis}$ is not more than $\Delta_\eta$, which is the condition assumed in the Theorem for this case. This completes the demonstration of Theorem 38.

11 Lower Bounds on Error Exponent:

The second line of the rate drop can be decomposed as $$\Delta_m + \Delta_{\bar{f}^*} + \Delta_{\eta,\rho},$$

where $$\Delta_m = \frac{snr}{m-1} + \frac{\log m}{\log B}$$

optimized at a number of steps 117, equal to an integer part of $2+snr \log B$. Further, $$\Delta_{\bar{f}^*} = \vartheta \bar{f}^* - \frac{\log(\bar{f}^* \sqrt{2\pi} \sqrt{2\log B})}{\log B}$$

where $\theta = snr(3+1/2C)$. The optimum value of $\bar{f}^*$ equal to $1/[\theta \log B]$ and $$\Delta_{\eta,\rho} = \eta \theta_1 + (\rho - 1)/\log B \, h.$$

Here $\theta_1 = snr(1+1/2C)$.

The $\Delta_{\eta,\rho}$ is a strictly increasing function of the error exponent $\epsilon$, where $$\Delta_{\eta,\rho} = \theta_1 \eta(\epsilon) + (\rho - 1)/\log B + h.$$

Let $R_{tot} \leq C_B$ be given. The objective is to find the error exponent $\epsilon^* = \epsilon((C_B - R_{tot})/C)$, where $\epsilon$ solves the above equation with $\Delta_{\eta,\rho} = (C_B - R_{tot})/C$. That is, $$\Delta_{\eta,\rho} = \theta_1 \eta(\epsilon) + (\rho - 1)/\log B + h,$$

where $\rho = \rho(\epsilon/\bar{T}^*)$.

Now $\rho - 1 = (\sqrt{\rho} - 1)(\sqrt{\rho} + 1)$, which is $(\sqrt{\rho} - 1)^2 + 2(\sqrt{\rho} - 1)$. Correspondingly, using $\epsilon \geq 2\bar{T}^*(\sqrt{\rho} - 1)^2$, it follows that $\epsilon/2\bar{T}^* + \sqrt{2\epsilon/\bar{T}^*} \geq \rho - 1$. Further, using $\eta(\epsilon) = \sqrt{\epsilon/2}$ and $h^* = \sqrt{v\epsilon/\log B}$, one gets that $$\Delta_{\eta,\rho} \leq c_1 \varepsilon + c_2 \sqrt{\varepsilon},$$

where $$c_1 = \vartheta/2$$

and $$c_2 = \left[ \frac{\vartheta_1}{\sqrt{2}} + \sqrt{2\vartheta/\log B} + \sqrt{\frac{v}{\log B}} \right].$$

Solving the above quadratic in $\sqrt{\epsilon}$ given above, one gets that $$\varepsilon \geq \varepsilon_{sol} = \left[ \frac{-c_2 + \sqrt{c_2^2 + 4\Delta_{\eta,\rho} c_1}}{2c_1} \right]^2.$$

It is sought what $\epsilon_{sol}$ looks like for $\Delta_{\eta,\rho}$ near 0. Noticing that $\epsilon_{sol}$ has the shape $\Delta_{\eta,\rho}^2$ for $\Delta_{\eta,\rho}$ near 0, it is desired to find the limit of $\epsilon_{sol}/\Delta_{\eta,\rho}^2$ as $\Delta_{\eta,\rho}$ goes to zero. Using L' Hospital's rule one get that this limiting value is $1/c_2^2$. Correspondingly, using $L_\pi$ is near $Lv/2C$, one gets that the error exponent is near $$\exp\{-L\Delta_{\eta,\rho}^2/\epsilon_0\},$$

for $\Delta_{\eta,\rho}$ near 0, where $\xi_0 = (2C/v)c_2^2$. This quantity behaves like $snr^2 C$ for large snr and has the limiting value of $(1+4/\sqrt{\log B})^2/2$ for snr tending to 0.

A simplified expression for $\epsilon_{sol}$ is now given. To simplify this, lower bound the function $-a+\sqrt{a^2+x}$, with $x \geq 0$ with a function of the form $\min\{\alpha\sqrt{x}, \beta x\}$. It is seen that $$-a + \sqrt{a^2 + x} \geq \alpha\sqrt{x} \text{ for } x \geq \frac{4\alpha^2 a^2}{(1-\alpha^2)^2}$$

and $$-a + \sqrt{a^2 + x} \geq \beta x \text{ for } x \leq \frac{1 - 2\beta a}{\beta^2}.$$

Clearly, for the above to have any meaning one requires $0 < \alpha < 1$ and $0 < \beta < 1/2a$. Further, it is seen that $$\min\{\alpha\sqrt{x}, \beta x\} = \alpha\sqrt{x} \text{ for } x \geq (\alpha/\beta)^2$$

$$= \beta x \text{ for } x \leq (\alpha/\beta)^2.$$

Correspondingly, equating $(\alpha/\beta)^2$ with $4\alpha^2 a^2/(1-\alpha^2)^2$, or equivalently equating $(\alpha/\beta)^2$ with $(1-2\beta a)/\beta^2$, one gets that $1-\alpha^2 = 2a\beta$.

Now return to the problem of lower bounding $\epsilon_{sol}$. Set $a=c_2$ and $x=4\Delta_{\eta,\rho}c_1$. Also particular choices of $\beta$ and $\alpha$ are set to simplify the analysis. Take $\beta=1/4a$, for which $\alpha=1/\sqrt{2}$. Then the above gives that $$\epsilon_{sol} \geq \frac{(\min\{\alpha\sqrt{4\Delta_{\eta,\rho}c_1}, \beta 4\Delta_{\eta,\rho}c_1\})^2}{4c_1^2}$$

which simplifies to $$\epsilon_{sol} = \min\{\Delta_{\eta,\rho}/2c_1, \Delta_{\eta,\rho}^2/4c_2^2\}.$$

From Theorem 38, one get that the error probability is bounded by $$\kappa e^{-L\eta\epsilon_{sol}},$$

which from the above, can also be bounded by the more simplified expression $$\kappa \exp\{-L_\eta \min\{\Delta_{\eta,\rho}/2c_1, \Delta_{\eta,\rho}^2/4c_2^2\}\}.$$

It is desired to express this bound in the form, $$\kappa \exp\{-L \min\{\Delta_{\eta,\rho}/\xi_1 \Delta_{\eta,\rho}^2)\xi_{2a}\}\}$$

for some $\xi_1, \xi_2$. Using the fact that $L_\pi$ is near $L\nu/2\mathcal{C}$, one gets that $\xi_1$ is $(2\mathcal{C}/\nu)(2c_1)$, which gives $$\xi_1 = (1+snr)(6\mathcal{C}+1).$$

One sees that $\xi_1$ goes to 1 as snr tends to zero. Further $\xi_2 = (2\mathcal{C}/\nu)4c_2^2$, which behaves like $4C\, snr^2$ for large snr. It has the limiting value of $2(1+4/\sqrt{\log B})^2$ as snr tends to zero.

Improvement for Rates Near Capacity Using Bernstein Bounds:

The improved error bound associated with correct detection is given by $$\exp\left\{-\frac{\eta^2}{2(V_{tot} + \eta/(3L_\pi))}\right\},$$

where $V_{tot}=V/L$, with $V \leq \tilde{c}_\upsilon$, where $\tilde{c}_\upsilon = (4\mathcal{C}/\nu^2)(a_1+a_2/\tau^2)/\tau$. For small $\eta$, that is for rates near the rate envelope, the bound behaves like, $$\exp\left\{-L\frac{\eta^2}{2V}\right\}.$$

Consequently, for such $\eta$ the exponent is, $$\epsilon = \frac{1}{d_1} \frac{\eta^2}{2\tilde{c}_\upsilon}.$$

Here $d_1=L_\pi/L$. This corresponds to $\eta=\sqrt{d_2}\sqrt{\epsilon}$, where $d_2=2d_1\tilde{c}_\upsilon$. Here $\tilde{c}_\upsilon=(4\mathcal{C}/\nu^2)(a_1/\tau)$ and that $d_1=\nu/2\mathcal{C}$ and $\tau \geq \sqrt{2\log B}$, one gets that $d_2 \leq 1.62/\nu\sqrt{\log B}$. Substituting this upper bound for $\eta$ in the expression for $\Delta_{\eta,\rho}$, it follows that $$\Delta_{\eta,\rho} \leq \tilde{c}_1 \epsilon + \tilde{c}_2 \sqrt{\epsilon},$$

with $\tilde{c}_1 = \frac{\vartheta}{2}$ and $$\tilde{c}_2 = \left[\sqrt{d_2}\,\vartheta_1 + \sqrt{2\vartheta/\log B} + \sqrt{\frac{\nu}{\log B}}\,\right].$$

Consequently using the same reasoning as above one gets that using the Bernstein bound, for rates close to capacity, the error exponent is like $$\exp\{-L\Delta_{72,\rho}^2/\tilde{\epsilon}_0\},$$

for $\Delta_{\eta,\rho}$ near 0, where $\tilde{\epsilon}_0 = (2\mathcal{C}/\nu)\tilde{c}_2^2$. This quantity behaves like $2d_2 snr^2\,\mathcal{C}$ for large snr. Further, $2d_2$ is near $3.24/\sqrt{\log B}$ for such snr. Notice now the error exponent is proportional to $L\sqrt{\log B}\Delta_{\eta,\rho}^2$, instead of the $L\Delta_{\eta,\rho}^2$ as before. We see that for $B>36300$, the quantity $3.24/\sqrt{\log B}$ is less than one producing a better exponent that before for rates near capacity and for larger snr than before.

12 Optimizing Parameters for Rate and Exponent for No Leveling Using the 1−xv Factor From Corollary 20 one gets that $$GAP = \frac{r - r_{up}}{\nu(\tau^2 + r)}.$$

Simplifying one gets $$1 + r/\tau^2 = (1 + r_{up}/\tau^2)/(1 - \nu GAP).$$

Recall that the rate assigned in the analysis herein of sparse superposition inner code is $$R = \frac{(1 - h')C}{(1 + \delta_a)^2(1 + \delta_{sum}^2)(1 + r/\tau^2)}.$$

Here the terms involved in the leveling case are also included, even though it is the no leveling case being considering. This will be useful later on when generalizing to the case with the leveling. Further, with the Reed-Solomon outer code of rate $1-\delta_{mis}$, which corrects the remaining fraction of mistakes, the total rate of the code is $$R_{tot} = \frac{(1 - \delta_{mis})(1 - h')C}{(1 + \delta_{sum}^2)(1 + \delta_a)^2(1 + r/\tau^2)}.$$

which using the above is equal to $$R_{tot} = \frac{(1 - \delta_{mis})(1 - h')(1 - \nu GAP)C}{(1 + \delta_{sum}^2)(1 + \delta_a)^2(1 + r_{up}/\tau^2)}.$$

Lemma 40.

Additive representation of rate drop: With a non-negative value for GAP less than $1/\nu$ the rate $R_{tot}$ is at least $(1-\Delta)\mathcal{C}$ with $\Delta$ given by $$\Delta = \frac{snr\delta^*}{(1+\delta_c)2C} + \frac{r_{up}}{\tau^2} + \frac{D(\delta_c)}{snr} + \frac{snr}{2C}(\eta + \bar{f}) + \nu GAP + h' + 2\delta_a + \frac{2C}{L\nu}.$$

Demonstration of Lemma 40:
Notice that $$\frac{(1-\delta_{mis})(1-h')(1-v\text{GAP})}{(1+\delta_{sum}^2)(1+\delta_a)^2(1+r_{up}/\tau^2)}$$

is at least $$\frac{(1-h')(1-v\text{GAP})}{(1+\delta_{sum}^2)(1+\delta_a)^2(1+r_{up}/\tau^2)}$$

minus $\delta_{mis}/(1+\delta_{sum}^2)$. As before, the ratio $\delta_{mis}/(1+\delta_{sum}^2)$ subtracted here is equal to $$\frac{snr}{2\mathcal{C}} \frac{(\delta^* + \eta + \bar{f})}{(1-\delta_c)}.$$

Further the first part of the difference is at least $$1-h'-v\text{GAP}-\delta_{sum}^2-2\delta_a-r_{up}/\tau^2.$$

Further using $\delta_{sum}^2 \leq D(\delta_c)/snr+2\mathcal{C}/Lv$ one gets the result. This completes the demonstration of Lemma 40.

The second line of the rate drop is given by, $$\frac{snr}{2\mathcal{C}}(\eta(x^*) + \bar{f}) + v\text{GAP} + h' + 2\delta_a + \frac{2\mathcal{C}}{Lv},$$

where $$\eta(x^*) = (1-x^*v)\eta^{std}$$

and $$\text{GAP} = \eta^{std} + \log 1/(1-x^*)/(m-1).$$

Thus vGAP is equal to $$v\eta^{std} + vc(x^*)/(m-1),$$

where $$c(x^*) = \log[1/(1-x^*)].$$

Case 1:

$h'=h+h_f$: Now optimize the second line of the rate drop when $h'=h+h_f$. This leads to the following lemma.

Lemma 41.

Optimization of the second line of $\Delta$. For any given positive $\eta$ providing the exponent $\epsilon_\eta$ of the error probability, the values of the parameters 111, $\bar{f}^*$ are specified to optimize their effect on the communication rate. The second line $\Delta_{second}$ of the total rate drop $(\mathcal{C}-R)/\mathcal{C}$ bound $\Delta$ is the sum of three terms $$\Delta_m + \Delta_{\bar{f}^*} + \Delta_{\eta(x^*)},$$

plus the negligible $\Delta_L = 2\mathcal{C}/(Lv) + (m-1)\mathcal{C}/(L\log B) + \epsilon_3$. Here $$\Delta_m = v\frac{c(x^*)}{m-1} + \frac{\log m}{\log B}$$

is optimized at a number of steps m equal to an integer part of $2+vc(x^*)\log B$ at which $\Delta_m$ is not more than $$\frac{1}{\log B} + \frac{\log(2+vc(x^*)\log B)}{\log B}$$

Likewise $\Delta_{\bar{f}^*}$ is given by $$\partial \bar{f}^* - \frac{\log(\bar{f}^*\sqrt{2\pi}\sqrt{2\log B})}{\log B},$$

where $\theta = snr(2+1/2\mathcal{C})$. The above is optimized at the false alarm level $\bar{f}^*=1/[\theta \log B]$ at which $$\Delta_{\bar{f}^*} = \frac{1}{\log B} + \frac{\log(\partial\sqrt{\log B}/\sqrt{4\pi})}{\log B}.$$

The $\Delta\eta(x^*)$ is given by $$\Delta_{\eta(x^*)} = \eta^{std}[v+(1-x^*v)snr/2\mathcal{C}]+(\rho-1)/\log B + h$$

which is bounded by.

$$\eta^{std}\theta_1 + (\rho-1)/\log B + h$$

where $\theta_1 = v + snr/2\mathcal{C}$.

Remark:

Since $1-x^* = r/(snr\tau^2)$ and that $r > r_{up}$, one has that $1-x^* \geq r_{up}/snr\tau^2$. Correspondingly, $c(x^*)$ is at most $\log(snr)\log(\tau^2/r_{up})$. The optimum number of steps can be bounded accordingly.

Demonstration:

Club all terms involving the number of steps m to get the expression for $\Delta_m$. It is then seen that optimization of $\Delta_m$ give the expression as in the proof statement.

Next, write $$2\delta_a = \frac{\log[m/(\bar{f}^*\sqrt{2\pi}\sqrt{2\log B})]}{\log B}.$$

Further write $\bar{f}$ as $(\rho-1)\bar{f}^* + \bar{f}^*$ in terms involving $\bar{f}$. For example $h_f = 2snr\bar{f}$ is written as the sum of $2snr(\rho-1)\bar{f}^*$ plus $2snr\bar{f}^*$. Now club all terms involving only $\bar{f}^*$ (that is not $(\rho-1)\bar{f}^*$) into $\Delta_{\bar{f}^*}$. The result is $\Delta_{\bar{f}^*}$ to equal $$\partial \bar{f}^* - \frac{\log(\bar{f}^*\sqrt{2\pi}\sqrt{2\log B})}{\log B},$$

optimized at $\bar{f}^*=1/[\theta \log B]$, which determines a value of $\delta_a$ for the rate drop envelope independent of $\eta$.

The remaining terms are absorbed to give the expression for $\Delta_\eta$. Thus get that $\Delta_\eta$ is equal to $$\eta^{std}[v+(1-x^*v)/2\mathcal{C}]+(\rho-1)/\log B + h^*.$$

The bound on $\Delta_{\eta(x^*)}$ follows from using $1-x^*v \leq 1$.

Error Exponent:

Here it is preferred to use Bernstein bounds for the error bounds associated with correct detection. Recall that that for rates near the rate envelope, that for $\eta(x^*)$ close to 0, the exponent is near $$\varepsilon = \frac{1}{d_1} \frac{(\eta^{std})^2}{2\tilde{c}_v}.$$

As before, this corresponds to $\eta^{std}=\sqrt{d_2}\sqrt{\varepsilon}$, where $d_2=2d_1\tilde{c}_v$. Substituting this upper bound for $\eta^{std}$ in the expression for $\Delta_{\eta(x^*)}$, one gets that $$\Delta_{\eta,\rho} \leq \tilde{c}_1\varepsilon + \tilde{c}_2\sqrt{\varepsilon},$$

with $\tilde{c}_1 = \vartheta/2$ and $$\tilde{c}_2 = \left[\sqrt{d_2}\,\vartheta_1 + \sqrt{2\vartheta/\log B} + \sqrt{\frac{v}{\log B}}\right].$$

Consequently using the same reasoning as above one gets that using the Bernstein bound, for rates close to capacity, the error exponent is like $$\exp\{-L\Delta_{\eta,\rho}^2/\tilde{\xi}_0\},$$

for $\Delta_{\eta,\rho}$ near 0, where $\tilde{\xi}_0=(2\mathcal{C}/v)\tilde{c}_2^2$. For small snr, this quantity is near $(\sqrt{d_2}+\sqrt{2/\log B})^2$. This quantity behaves like $d_2\text{snr}^2/2\mathcal{C}$ for large snr. For large snr this is the same as what is obtained in the previous section.

Case 2:

$1-h'=(1-h)^{m-1}/(1+h)^{m-1}$. It is easy to that this implies that $h' \leq 2mh$. The corresponding Lemma for optimization of rate drop for such h' is presented.

Lemma 42.

Optimization of the second line of $\Delta$. For any given positive $\eta$ providing the exponent $\epsilon_\eta$ of the error probability, the values of the parameters m. $\tilde{f}^*$ are specified to optimize their effect on the communication rate. The second line $\Delta_{second}$ of the total rate drop $(\mathcal{C}-R)/\mathcal{C}$ bound $\Delta$ is the sum of three terms $$\Delta_m + \Delta_{\tilde{f}^*} + \Delta_{\eta(x^*)},$$

plus the negligible $\Delta_L = 2\mathcal{C}/(Lv) + (m-1)\mathcal{C}/(L\log B) + \epsilon_3$. Here $$\Delta_m = v\frac{c(x^*)}{m-1} + \frac{\log m}{\log B}$$

is optimized at a number of steps m* equal to an integer part of $2+vc(x^*)\log B$ at which $\Delta_m$ is not more than $$\frac{1}{\log B} + \frac{\log(2+vc(x^*)\log B)}{\log B}$$

Likewise $\Delta_{\tilde{f}^*}$ is given by $$\vartheta \tilde{f}^* - \frac{\log(\tilde{f}^*\sqrt{2\pi}\sqrt{2\log B})}{\log B},$$

where $\theta=\text{snr}/2\mathcal{C}$. The above is optimized at the false alarm level $\tilde{f}^*=1/[\theta\log B]$ at which $$\Delta_{\tilde{f}^*} = \frac{1}{\log B} + \frac{\log(\vartheta\sqrt{\log B}/\sqrt{4\pi})}{\log B}.$$

The $\Delta_{\eta(x^*)}$ is given by $$\Delta_{\eta(x^*)} = \eta^{std}[v+(1-x^*v)\text{snr}/2\mathcal{C}] + (\rho-1)/\log B + 2m^*h$$

which is bounded by, $$\eta^{std}\theta_1 + (\rho-1)/\log B + 2m^*h$$

where $\theta_1 = v + \text{snr}/2\mathcal{C}$.

Error Exponent:

Exactly similar to before, use Bernstein bounds for the correct detection error probabilities to get that, $$\Delta_{\eta,\rho} \leq \tilde{c}_1\epsilon + \tilde{c}_2\sqrt{\epsilon},$$

with $\tilde{c}_1 = \theta/2$ and $$\tilde{c}_2 = \left[\sqrt{d_2}\,\vartheta_1 + \sqrt{2\vartheta/\log B} + 2m^*\sqrt{\frac{v}{\log B}}\right].$$

Notice that since $m^*=2+vc(x^*)\log B$, one has that $$\tilde{c}_2 = \left[\sqrt{d_2}\,\vartheta_1 + \sqrt{2\vartheta/\log B} + 4\sqrt{\frac{v}{\log B}} + 2c(x^*)v^{3/2}\sqrt{\log B}\right].$$

As before the error exponent is like $$\exp\{-L\Delta_{\eta,\rho}^2/\tilde{\xi}_0\},$$

for $\Delta_{\eta,\rho}$ near 0, where $\tilde{\xi} = (2\mathcal{C}/v)\tilde{c}_2^2$.

Comparison of Envelope and Exponent for the Two Methods with and without Factoring 1−xv Term:

First concentrate attention on the envelope, which is given by $$\frac{1}{\log B} + \frac{m^*}{\log B} + \frac{1}{\log B} + \frac{\log(\vartheta\sqrt{\log B}/\sqrt{4\pi})}{\log B}.$$

For the first method, without factoring out the 1−xv term, $\theta=\text{snr}(3+1/2\mathcal{C})$ whereas for the second method (Case 2) it is $\text{snr}/2\mathcal{C}$. The optimum number of steps m* is $2+\text{snr}\log B$ for the first method and is $2+vc(x^*)\log B$. Here $c(x^*)$ is $\log(\text{snr})$ plus a term of order log log B. Correspondingly, the envelope is smaller for the second method.

Next, observe that the quantity $c_2$ determines the error exponent. The smaller the $c_2$, the better the exponent. For the first method it is $$\left[\frac{\vartheta}{\sqrt{2}} + \sqrt{2\vartheta/\log B} + \sqrt{\frac{v}{\log B}}\right].$$

where $\theta_1=\text{snr}(1+1/2\mathcal{C})$. Further $\theta$ is as given in the previous paragraph. For the second method it is given by $$\left[\frac{\vartheta_1}{\sqrt{2}} + \sqrt{2\vartheta/\log B} + 2m^* \sqrt{\frac{v}{\log B}}\right],$$

where $\theta_1 = v + \text{snr}/2\mathcal{C}$. It is seen that for larger snr the latter is less producing a better exponent. To see this, notice that as a function of snr, the first term in $c_2$, i.e. $\theta_1/\sqrt{2}$, behaves like snr for the first case (without factorization of $1-xv$) and is like $\text{snr}/2\mathcal{C}$ for the second case. The second term in $c_2$ is like $\sqrt{\text{snr}}$ for the first case and like $\sqrt{\text{snr}/2\mathcal{C}}$ for the second. The third is near $\sqrt{1/\log B}$ for the former case and behaves like $\log(\text{snr})$ in the latter case. Consequently, it is the first term in $c_2$ which determines it behavior for larger snr for both cases. Since $\theta_1$ is smaller in the second case, it is inferred that the second method is better for larger snr.

13 Composition with an Outer Code

Use Reed-Solomon (RS) codes (Reed and Solomon, SIAM 1960), as described for instance the book of Lin and Costello (2004), to correct any remaining mistakes from the adaptive successive decoder. The symbols for the RS code can be associated with that of a Galois field, say consisting of q elements and denoted by GF(q). Here q is typically taken to be of the form of a power of two, say $2^m$. Let $K_{out}$, $n_{out}$ be the message and blocklength respectively for the RS code. Further, if $d_{RS}$ be the minimum distance between the codewords, then an RS code with symbols in GF($2^m$) can have the following parameters:

$$n_{out} = 2^m$$

$$n_{out} - K_{out} = d_{RS} - 1$$

Here $n_{out} - K_{out}$ gives the number of parity check symbols added to the message to form the codeword. In what follows it is convenient to take B to be equal to $2^m$ so that one can view each symbol in GF($2^m$) as giving a number between 1 and B.

Now it is demonstrated how the RS code can be used as an outer code in conjunction with the inner superposition code, to achieve low block error probability. For simplicity assume that B is a power of 2. First consider the case when L equals B. Taking $m = \log_2 B$, one sees that since L is equal to B, the RS codelength becomes L. Thus, one can view each symbol as representing an index specifying the selected term in each of the L sections. The number of input symbols is then $K_{out} = L - d_{RS} + 1$, so setting $\delta = d_{RS}/L$ one sees that the outer rate $R_{out} = K_{out}/n_{out}$ equals $1 - \delta + 1/L$ which is at least $1 - \delta$.

For code composition $K_{out} \log_2 B$ message bits become the $K_{out}$ input symbols to the outer code. The symbols of the outer codeword, having length L, gives the labels of terms sent from each section using the inner superposition with codelength $n = L \log_2 B/R_{inner}$. From the received Y the estimated labels $\hat{j}_1, \hat{j}_2, \ldots \hat{j}_L$ using the adaptive successive decoder can be again thought of as output symbols for the RS codes. If $\hat{\delta}_e$ denotes the section mistake rate, it follows from the distance property of the outer code that if $2\hat{\delta}_e \leq \delta$ then these errors can be corrected. The overall rate $R_{comp}$ is seen to be equal to the product of rates $R_{out}R_{inner}$ which is at least $(1-\delta)R_{inner}$. Since it is arranged for $\delta_e$ to be smaller than some $\delta_{mis}$ with exponentially small probability, it follows from the above that composition with an outer code allows is to communicate with the same reliability, albeit with a slightly smaller rate given by $(1 - 2\delta_{mis})R_{inner}$.

The case when L<B can be dealt with by observing (as in Lin and Costello, page 240) that an ($n_{out}$, $K_{out}$) RS code as above, can be shortened by length w, where $0 \leq w < K_{out}$, to form an ($n_{out} - w$, $K_{out} - w$) code with the same minimum distance $d_{RS}$ as before. This is seen by viewing each codeword as being created by appending $n_{out} - K_{out}$ parity check symbols to the end of the corresponding message string. Then the code formed by considering the set of codewords with the w leading symbols identical to zero has precisely the properties stated above.

With B equal to $2^m$ as before, the $n_{out}$ is set to equal B, so taking w to be B$-$L we get an ($n_{out}'$, $K_{out}'$) code, with $n_{out}' = L$, $K_{out}' = L - d_{RS} + 1$ and minimum distance $d_{RS}$. Now since the codelength is L and the symbols of this code are in GF(B) the code composition can be carried out as before.

14 Appendix

14.1 Distribution of $\mathcal{Z}_{k,j}$

Consider the general $k > 2$ case. Focus on the sequence of coefficients $$\mathcal{Z}_{1,j}, \mathcal{Z}_{2,j}, \ldots, \mathcal{Z}_{k-1,j}, V_{k,k,j}, V_{k+1,k,j}, \ldots, V_{n,k,j}$$

used to represent $X_j$ for j in $J_{k-1}$ in the basis $$\frac{G_1}{\|G_1\|}, \frac{G_2}{\|G_2\|}, \ldots, \frac{G_{k-1}}{\|G_{k-1}\|}, \xi_{k,k}, \xi_{k+1,k}, \ldots \xi_{n,k},$$

where the $\xi_{i,k}$ for i from k to n are orthonormal vectors in $\mathbb{R}^n$, orthogonal to the $G_1, G_2, \ldots, G_{k-1}$. These are associated with the previously described representation $X_j = \Sigma_{k'=1}^{k-1} \mathcal{Z}_{k',j} G_{k'}/\|G_{k'}\| + V_{k,j}$, except that here $V_{k,j}$ is represented as $\Sigma_{i=k}^n V_{i,k,j} \xi_{i,k}$.

Let's prove that conditional on $\mathcal{F}$, the distribution of the $V_{i,k,j}$ is independent across i from k to n, and for each such i the joint distribution of ($V_{i,k,j}$: j∈$J_{k-1}$) is Normal $N_{J_{k-1}}(0, \Sigma_{k-1})$. The proof is by induction in k. Along the way the conditional distribution properties of $G_k$, $Z_{k,j}$, and $\mathcal{Z}_{k,j}$ are obtained as consequences. As for $\hat{w}_k$ and $\delta_k$ the induction steps provide recursions which permit verification of the stated forms.

The $V_{i,1,j} = X_{i,j}$ are independent standard normals.

To analyze the k=2 case, use the vectors $U_{1,j} = U_j$ that arise in the first step properties in the proof of Lemma 1. There it is seen for unit vectors α, that the $U_{jhu\ T}\alpha$ for j∈$J_1$ have a joint $N_{J_1}(0, \Sigma_1)$ distribution, independent of Y. When represented using the orthonormal basis $Y/\|Y\|, \xi_{2,2}, \ldots, \xi_{n,2}$, the vector $U_j$ has coefficients $Z_j = U_j^T Y/\|Y\|$, and $U_j^T \xi_{2,2}$ through $U_j^T \xi_{n,2}$. Accordingly $N_j = b_{1,j} Y/\sigma + U_j$ has representation in this basis with the same coefficients, except in the direction $Y/\|Y\|$ where $Z_j$ is replaced by $\mathcal{Z}_j = b_{1,j}\|Y\|/\sigma + Z_j$. The joint distribution of ($V_{i,2,j} = U_j^T \xi_{i,2}$: j∈$J_1$) is Normal $N_{J_1}(0, \Sigma_1)$, independently for i=2 to n, and independent of $\|Y\|$ and $\mathcal{Z}_j$: j∈$J_1$).

Proceed inductively for k≥2, presuming the stated conditional distribution property of the $V_{i,k,j}$ to be true at k, conduct analysis to demonstrate its validity at k+1.

From the representation of $V_{k,j}$ in the basis given above, the $G_k$ has representation in the same basis as $G_{i,k} = \Sigma_{j \in dec_{k-1}} \sqrt{p_j} V_{i,k,j}$ for i from k to n. The coordinates less than k are 0, since the $V_{k,j}$ and $G_k$ are orthogonal to $G_1, \ldots, G_{k-1}$. The value of $\mathcal{Z}_{k,j}$ is $V_{k,j}^T G_k/\|G_k\|$, where the inner product (and norm) may be computed in the above basis from sums of products of coefficients for i from k to n.

For the conditional distribution of $G_{i,k}$ given $\mathcal{F}_{k-1}$, independence across i, conditional normality and conditional mean 0 are properties inherited from the corresponding properties of the $V_{i,k,j}$. To obtain the conditional variance of $G_{i,k} = \Sigma_{j \in dec_{k-1}} \sqrt{P_j} V_{i,k,j}$, use the conditional covariance $\Sigma_{k-1} = I - \delta_{k-1} \delta_{k-1}^T$ of $V_{i,j,k}$ for j in $J_{k-1}$. The identity part contributes $\Sigma_{j\in dec_{k-1}} P_j$ which is $(\hat{q}_{k-1}+\hat{f}_{k-1})P$; whereas, the $\delta_{k-1}\delta_{k-1}{}^T$ part, using the presumed form of $\delta_{k-1}$, contributes an amount seen to equal $v_{k-1}[\Sigma_{j\in sent \cup dec_{k-1}} P_j/P]^2 P$ which is $v_{k-1}\hat{q}_{k-1}{}^2 P$. It follows that the conditional expected square for the coefficients of $G_k$ is $$\sigma_k^2 = [\hat{q}_{k-1}+\hat{f}_{k-1}-\hat{q}_{k-1}{}^2 v_{k-1}]P.$$

Moreover, conditional on $\mathcal{F}_{k-1}$, the distribution of $\|G_k\|^2 = \Sigma_{i=k}^n G_{i,k}{}^2$ is that of $\sigma_k^2 \chi_{n-k+1}{}^2$, a multiple of a Chi-square with $n-k+1$ degrees of freedom.

Next represent $V_{k,j} b_{k,j} G_k/\sigma_k + U_{k,j}$ using a value of $b_{k,j}$ that follows an update rule (depending on $\mathcal{F}_{k-1}$). It is represented using $V_{i,k,j} = b_{k,j} G_{i,k}/\sigma_k + U_{i,k,j}$ for $i$ from $k$ to $n$, using the basis built from the $\xi_{j,k}$.

The coefficient $b_{k,j}$ is the value $\mathbb{E}[V_{i,k,j} G_{i,k} \mathcal{F}_{k-1}]/\sigma_k$. Consider the product $V_{i,k,j} G_{i,k}$ in the numerator. Use the representation of $G_{i,k}$ as a sum of the $\sqrt{P_{j'}} V_{i,k,j'}$ for $j'\in dec_{k-1}$. Accordingly, the numerator is $\Sigma_{j'\in dec_{k-1}} \sqrt{P_{j'}}[1_{j'=j}-\delta_{k-1,j}\delta_{k-1,j'}]$, which simplifies to $\sqrt{P_j}[1_{j\in dec_{k-1}}-v_{k-1}\hat{q}_{k-1}1_{j\,sent}]$. So for $j$ in $J_k=J_{k-1}-dec_{k-1}$, there is the simplification $$b_{k,j} = -\frac{\hat{q}_{k-1} v_{k-1} \beta_j}{\sigma_k},$$

for which the product for $j, j'$ in $J_k$ takes the form $$b_{k,j} b_{k,j'} = \delta_{k-1,j}\delta_{k-1,j'}\frac{\hat{q}_{k-1}v_{k-1}}{1+\hat{f}_{k-1}/\hat{q}_{k-1}-\hat{q}_{k-1}v_{k-1}}.$$

Here the ratio simplifies to $\hat{q}_{k-1}^{adj}v_{k-1}/(1-\hat{q}_{k-1}^{adj}v_{k-1})$.

Now determine the features of the joint normal distribution of the $U_{i,k,j} = V_{i,k,j} - b_{k,j} G_{i,k}/\sigma_k$ for $j\in J_k$, given $\mathcal{F}_{k-1}$. These random variables are conditionally uncorrelated and hence conditionally independent given $\mathcal{F}_{k-1}$ across choices of $i$, but there is covariance across choices of $j$ for fixed $i$. This conditional covariance $\mathbb{E}[U_{i,k,j}U_{i,k,j'}\mathcal{F}_{k-1}]$ by the choice of $b_{k,j}$ reduces to $\mathbb{E}[V_{i,j,k}V_{i,k,j'}\mathcal{Z}]-b_{k,j}b_{k,j'}$, which, for $j\in J_k$, is $1_{j=j'}-\delta_{k-1,j}\delta_{k-1,j'}-b_{k,j}b_{k,j'}$. That is, for each $i$, the $(U_{i,k,j}: j\in J_k)$ have the joint $N_{J_k}(0,\Sigma_k)$ distribution, conditional on $\mathcal{F}_{k-1}$, where $\Sigma_k$ again takes the form $1_{j,j'}-\delta_{k,j}\delta_{k,j'}$, where $$\delta_{k,j}\delta_{k,j'} = \delta_{k-1,j}\delta_{k-1,j'}\left\{1+\frac{\hat{q}_{k-1}^{adj}v_{k-1}}{1-\hat{q}_{k-1}^{adj}v_{k-1}}\right\},$$

for $j,j'$ now restricted to $J_k$. The quantity in braces simplifies to $1/(1-\hat{q}_{k-1}^{adj}v_{k-1})$. Correspondingly, the recursive update rule for $v_k$ is $$v_k = \frac{v_{k-1}}{1-\hat{q}_{k-1}^{adj}v_{k-1}}.$$

Consequently, the joint distribution for $(Z_{k,j}: j\in J_k)$ is determined, conditional on $\mathcal{F}_{k-1}$. It is also the normal $N(0,\Sigma_k)$ distribution and $(Z_{k,j}: j\in J_k)$ is conditionally independent of the coefficients of $G_k$, given $\mathcal{F}_{k-1}$. After all, the $Z_{k,j}=U_{k,j}{}^T G_k/\|G_k\|$ have this $N_{J_k}(0,\Sigma_k)$ distribution, conditional on $G_k$ and $\mathcal{F}_{k-1}$, but since this distribution does not depend on $G_k$ it yields the stated conditional independence.

Now $\mathcal{Z}_{k,j} = X_j^T G_k/\|G_k\|$ reduces to $V_{k,j}{}^T G_k/\|G_k\|$ by the orthogonality of the $G_1$ through $G_{k-1}$ components of $N_j$ with $G_k$. So using the representation $V_{k,j} = b_{k,j} G_k/\sigma_k + U_{k,j}$ one obtains $$\mathcal{Z}_{k,j} = b_{k,j}\|G_k\|/\sigma_k + Z_{k,j}.$$

This makes the conditional distribution of the $\mathcal{Z}_{k,j}$, given $\mathcal{F}_{k-1}$, close to but not exactly normally distributed, rather it is a location mixture of normals with distribution of the shift of location determined by the Chi-square distribution of $\chi_{n-k+1}{}^2 = \|G_k\|^2/\sigma_k^2$. Using the form of $b_{k,j}$, for $j$ in $J_k$, the location shift $b_{k,j}\chi_{n-k+1}$ may be written $$-\sqrt{\hat{w}_k C_{j,R,B}}[\chi_{n-k+1}/\sqrt{n}]1_{j\,sent},$$

where $\hat{w}_k$ equals $nb_{k,j}{}^2/C_{j,R,B}$. The numerator and denominator has dependence on $j$ through $P_j$, so canceling the $P_j$ produces a value for $\hat{w}_k$. Indeed, $C_{j,R,B}=(P_j/P)\nu(L/R)\log B$ equals $n(P_j/P)\nu$ and $b_{k,j}{}^2 = P_j \hat{q}_{k-1}^{adj} v_{k-1}{}^2/[1-\hat{q}_{k-1}^{adj}v_{k-1}]$. So this $\hat{w}_k$ may be expressed as $$\hat{w}_k = \frac{v_{k-1}}{v}\frac{\hat{q}_{k-1}^{adj}v_{k-1}}{1-\hat{q}_{k-1}^{adj}v_{k-1}},$$

which, using the update rule for $v_{k-1}$, is seen to equal $$\hat{w}_k = \frac{v_{k-1}-v_k}{v}.$$

Armed with $G_k$, update the orthonormal basis of $\mathbb{R}^n$ used to represent $X_j$, $V_{k,j}$ and $U_{k,j}$. From the previous step this basis was $G_1/\|G_1\|, \ldots, G_{k-1}/\|G_{k-1}\|$ along with $\xi_{k,k}, \xi_{k+1,k}, \ldots, \xi_{n,k}$, where only the later are needed for the $V_{k,j}$ and $U_{k,j}$ as their coefficients in the directions $G_1, G_{k-1}$ are 0.

Now Gram-Schmidt makes an updated orthonormal basis of $\mathbb{R}^n$, retaining the $G_1/\|G_1\|, \ldots, G_{k-1}/$ but replacing $\xi_{k,k}, \xi_{k+1,k}, \ldots, \xi_{n,k}$ with $G_k/\|G_k\|, \xi_{k+1,k+1}, \ldots, \xi_{n,k+1}$. By the Gram-Schmidt construction process, these vectors $\xi_{i,k+1}$ for $i$ from $k+1$ to $n$ are determined from the original basis vectors (columns of the identity) along with the computed random vectors $G_1, \ldots, G_k$ and do not depend on any other random variables in this development.

The coefficients of $U_{k,j}$ in this updated basis are $U_{k,j}{}^T G_k/\|G_k\|$, $U_{k,j}{}^T\xi_{k+1,k+1}, \ldots, U_{k,j}{}^T\xi_{n,k+1}$, which are denoted $U_{k,k+1,j} = Z_{k,j}$ and $U_{k+1,k+1,j}, \ldots, U_{k+1,n,j}$, respectively. Recalling the normal conditional distribution of the $U_{k,j}$, these coefficients $(U_{i,k+1,j}: k\le i\le n, j\in J_k)$ are also normally distributed, conditional on $\mathcal{F}_{k-1}$ and $G_k$, independent across $i$ from $k$ to $n$ (this independence being a consequence of their uncorrelatedness, due to the orthogonality of the $\xi_{i,k+1}$ and the independence of the coefficients $U_{i,k,j}$ across $i$ in the original basis); moreover, as seen already for $i=k$, for each $i$ from $k$ to $n$, the $(U_{i,k+1,j}: j\in J_k)$ inherit a joint normal $N(0,\Sigma_k)$ conditional distribution from the conditional distribution that the $(U_{i,k,j}: j\in J_k)$ have. After all, these coefficients have this conditional distribution, conditioning on the basis vectors and $\mathcal{F}_{k-1}$, and this conditional distribution is the same for all such basis vectors. So, in fact, these $(U_{i,k+1,j}: k\le i\le n, j\in J_k)$ are conditionally independent of the $G_k$ given $\mathcal{F}_{k-1}$.

Specializing the conditional distribution conclusion, by separating off the $i=k$ case where the coefficients are $Z_{k,j}$, one has that the $(U_{i,k+1,j}: k+1\le i\le n, j\in J_k)$ have the specified conditional distribution and are conditionally independent of $G_k$ and $(Z_{k,j}: j\in J_k)$ given $\mathcal{F}_{k-1}$. It follows that the conditional distribution of $(U_{i,k+1,j}: k+1\le i\le n, j\in J_k)$ given $\mathcal{F}_k=(\mathcal{F}_{k-1},\|G_k\|,$ $Z_k$) is identified. It is normal $N(0, \Sigma_k)$ for each i, independently across i from k+1 to n, conditionally given $\mathcal{F}_k$.

Likewise, the vector $V_{k,j}=b_{k,j}G_k/\sigma_k+U_{k,j}$ has representation in this updated basis with coefficient $\mathcal{Z}_{k,j}$ in place of $Z_{k,j}$ and with $V_{i,k+1,j}=U_{i,k+1,j}$ for i from k+1 to n. So these coefficients ($V_{i,k+1,j}$: k+1≤i≤n, j∈$J_k$) have the normal $N(0, \Sigma_k)$ distribution for each i, independently across i from k+1 to n, conditionally given $\mathcal{F}_k$.

Thus the induction is established, verifying this conditional distribution property holds for all k=1, 2, ..., n. Consequently, the $Z_k$ and $\|G_k\|$ have the claimed conditional distributions.

Finally, repeatedly apply $v_{k'}/v_{k'-1}=1/(1-\hat{q}_{k'}^{adj}v_{k'-1})$, for k' from k to 2, each time substituting the required expression on the right and simplifying to obtain $$\frac{v_k}{v_{k-1}} = \frac{1-(\hat{q}_1^{adj}+\ldots+\hat{q}_{k-2}^{adj})v}{1-(\hat{q}_1^{adj}+\ldots+\hat{q}_{k-2}^{adj}+\hat{q}_{k-1}^{adj})v}.$$

This yields $v_k=v\hat{s}_k$, which, when plugged into the expressions for $\hat{w}_k$, establishes the claims. The proof of Lemma 2 is complete.

14.2 The Method of Nearby Measures

Recall that the Renyi relative entropy of order α>1 (also known as the α divergence) of two probability measures $\mathbb{P}$ and $\mathbb{Q}$ with density functions p(Z) and q(Z) for a random vector Z is given by $$D_\alpha(\mathbb{P}\|\mathbb{Q}) = \frac{1}{\alpha-1}\log \mathbb{E}_Q[(p(Z)/q(Z))^\alpha].$$

Its limit for large α is $D_\infty(\mathbb{P}\|\mathbb{Q})=\log\|p/q\|_\infty$.

Lemma 43.

Let $\mathbb{P}$ and $\mathbb{Q}$ be a pair of probability measures with finite $D_\alpha(\mathbb{P}\|\mathbb{Q})$. For any event A, and α>1, $$\mathbb{P}[A] \leq [\mathbb{Q}[A] e^{D_\alpha(\mathbb{P}\|\mathbb{Q})}]^{(\alpha-1)/\alpha}.$$

If $D_\alpha(\mathbb{P}\|\mathbb{Q}) \leq c_0$ for all α, then the following bound holds, taking the limit of large α, $$\mathbb{P}[A] \leq \mathbb{Q}[A]e^{c_0}.$$

In this case the density ratio p(Z)/q(Z) is uniformly bounded by $e^{c_0}$.

Demonstration of Lemma 43:

For convex f, as in Csiszar's f-divergence inequality, from Jensen's inequality applied to the decomposition of $\mathbb{E}_\mathbb{Q}[f(p(Z)/q(Z))]$ using the distributions conditional on A and its complement, $$\mathbb{Q}Af(\mathbb{P}A/\mathbb{Q}A) + \mathbb{Q}A^c f(\mathbb{P}A^c/\mathbb{Q}A^c) \leq \mathbb{E}_\mathbb{Q} f(p(Z)/q(Z)).$$

Using in particular $f(r)=r^\alpha$ and throwing out the non-negative $A^c$ part, yields $$(\mathbb{P}A)^\alpha \leq (\mathbb{Q}A)^{\alpha-1} \mathbb{E}_\mathbb{Q}[(p(Z)/q(Z))^\alpha].$$

It is also seen as Holder's inequality applied to $fq(p/q)1_A$. Taking the α root produces the stated inequality.

Lemma 44.

Let $\mathbb{P}_Z$ be the joint normal $N(0,\Sigma)$ distribution, with $\Sigma=I-bb^T$ where $\|b\|^2=v<1$. Likewise, let $\mathbb{Q}_Z$ be the distribution that makes the $Z_j$ independent standard normal. Then the Rènyi divergence is bounded. Indeed, for all 1≤α≤∞.

$$D_\alpha(\mathbb{P}_Z\|\mathbb{Q}_Z) \leq c_0.$$

where $c_0=-(½)\log[1-v]$. With $v=P(\sigma^2-P)$, this constant is $c_0=(½)\log[1-P/\sigma^2]$.

Demonstration of Lemma 44:

Direct evaluation of the α divergence between $N(0,\Sigma)$ and $N(0,I)$ reveals the value $$D_\alpha = -\frac{1}{2}\log|\Sigma| - \frac{1}{2(\alpha-1)}\log|\alpha I - (\alpha-1)\Sigma|.$$

Expressing $\Sigma=I-\Delta$, it simplifies to $$\frac{1}{2}\log|I-\Delta| - \frac{1}{2(\alpha-1)}\log|I+(\alpha-1)\Delta|.$$

The matrix $\Delta$ is equal to $bb^T$, with b as previously specified with $\|b\|^2=v$. The two matrices $I-\Delta$ and $I+(\alpha-1)\Delta$ each take the form $I+\gamma bb^T$, with γ equal to $-1$ and $(\alpha-1)$ respectively.

The form $I+\gamma bb^T$ is readily seen to have one eigenvalue of $1+\gamma v$ corresponding to an eigenvector $b/\|b\|$ and L−1 eigenvalues equal to 1 corresponding to eigenvectors orthogonal to the vector b. The log determinant is the sum of the logs of the eigenvalues, and so, in the present context, the log determinants arise exclusively from the one eigenvalue not equal to 1. This provides evaluation of $D_\alpha$ to be $$-\frac{1}{2}\log[1-v] - \frac{1}{2(\alpha-1)}\log[1+(\alpha-1)v],$$

where an upper bound is obtained by tossing the second term which is negative.

One sees that $\max_Z p(Z)/q(Z)$ is finite and equals $[1/(1-v)]^{1/2}$. Indeed, from the densities $N(0, I-bb^T)$ and $N(0, I)$ this claim can be established, noting after orthogonal transformation that these measures are only different in one variable, which is either $N(0, 1-v)$ or $N(0, 1)$, for which the maximum ratio of the densities occurs at the origin and is simply the ratio of the normalizing constants. This completes the demonstration of Lemma 44.

With $v=P/(\sigma^2+P)$ this limit $-(½)\log[1-v]$ which is denoted as $c_0$ is the same as $(½)\log[1+P/\sigma^2]$. That it is the same as the capacity $\mathcal{C}$ appears to be coincidental.

Demonstration of Lemma 3:

The task is to show that for events A determined by $\mathcal{F}_k$ the probability $\mathbb{P}[A]$ is not more than $\mathbb{Q}[A]e^{kc_0}$. Write the probability as an iterated expectation conditioning on $\mathcal{F}_{k-1}$. That is, $\mathbb{P}[A]=\mathbb{E}[\mathbb{P}A|\mathcal{F}_{k-1}]]$. To determine membership in A, conditional on $\mathcal{F}_{k-1}$, one only needs $Z_{k,J_k}=(Z_{k,j}: j\in J_k)$ where $J_k$ is determined $\mathcal{F}$. Thus $$\mathbb{P}[A]=\mathbb{E}_\mathbb{P}[\mathbb{P}_{\chi^2_{n-k+1}, Z_{k,J_k}|\mathcal{F}_{k-1}}[A]],$$

where the subscript on the outer expectation is used to denote that it is with respect to $\mathbb{P}$ and the subscripts on the inner conditional probability to indicate the relevant variables. For this inner probability switch to the nearby measure $$\mathbb{Q}_{\chi_{n-k+1}, Z_{k,J_k}|\mathcal{F}_{k-1}}.$$

These conditional measures agree concerning the distribution of the independent $\chi^2_{n-k+1}$, so the a relative entropy between them arises only from the normal distributions of the $Z_{k,j_k}$ given $\mathcal{F}_{k-1}$. This α relative entropy is bounded by $c_0$.

To see this, recall that from Lemma 2 that $\mathbb{P}_{Z_{k,J_k} | \mathcal{F}_{k-1}}$ is $N_{J_k}(0,\Sigma_k)$ with $\Sigma_k = I - \delta_k \delta_k^T$. Now $$\|\delta_k\|^2 = v_k \sum_{j \in sent \cap J_k} P_j / P$$

which is $(1(\hat{q}_1 + \ldots + \hat{q}_{k-1}))v_k$. Noting that $v_k = \tilde{s}_k v$ and $\hat{s}_k(1-(\hat{q}_1 + \ldots + \hat{q}_{k-1}))$ is at most 1, get that $\|\delta_k\|^2 \le v$. Thus from Lemma 44, for all $\alpha \ge 1$, the $\alpha$ relative entropy between $\mathbb{P}_{Z_{k,J_k}|\mathcal{F}_{k-1}}$ and the corresponding $\mathbb{Q}$ conditional distribution is at most $c_0$.

So with the switch of conditional distribution, a bound is determined with a multiplicative factor of $e^{c_0}$. The bound on the inner expectation is then a function of $\mathcal{F}_{k-1}$, so the conclusion follows by induction. This completes the demonstration of Lemma 3.

14.3 Demonstration of Lemmas on the Progress of $q_{1,k}$

Demonstration of Lemma 6:

Consider any step k with $q_{1,k-1} - f_{1,k-1} \le x^*$. Now $x = q_{1,k-1}^{adj}$ is at least $\tilde{x} = q_{1,k-1} - f_{1,k-1}$, where these are initialized to be 0 when $k=1$. Consider $q_{1,k} = g_L(x) - \eta_k$ which is at least $g_L(\tilde{x}) - \eta_k$, since the function $g_L$ is increasing. By the gap property, it is at least $\tilde{x} + gap(\tilde{x}) - \eta_k$, which in turn is at least $q_{1,k-1} - \tilde{f}(x) + gap(x) - \eta(x)$, which is at least $q_{1,k-1} + gap'$.

The increase $q_{1,k} - q_{1,k-1}$ is at least gap' each such step, so the number of such steps $m-1$ is not more than 1/gap'. At the final step $\tilde{x} = q_{1,m-1} - f_{1,m-1}$ exceeds $x^*$ so $q_{1,m}$ is at least $g_L(x^*) - \eta_m$ which is $1 - \delta^* - \eta_m$. This completes the demonstration of Lemma 6.

Demonstration of Lemma 5:

With a constant gap bound, the claim when $f_{1,k} \le \bar{f}$ follows from the above, specializing $\bar{f}$ and $\eta$ to be constant. As for the claim when $f_{1,k} = kf$, it is actually covered by the case that $f_{1,k} \le \bar{f}$, in view of the choice that $f \le \bar{f}/m^*$. This completes the demonstration of Lemma 5.

14.4 The Gap has not More than One Oscillation

Demonstration of Lemma 21:

In the same manner as the derivative result for $g_{num}(x)$, the $g_{low}(x)$ has derivative with respect to x given by the following function, evaluated at $z = z_x$, $$\left\{ \frac{\tau \Delta_c}{2} \left(1 + \frac{z}{\tau}\right)^3 \phi(z) + \int_z^\infty (1 + t/\tau)^2 \phi(t) dt \right\} \frac{R}{C'}.$$

Subtracting $1 + D(\delta_c)/snr$ from it gives the function der(z), which at $z = z_x$ is the derivative with respect to x of $G(z_x) = g_{low}(x) - x - xD(\delta_c)/snr$. The mapping from x to $z_x$ is strictly increasing, so the sign of der(z) provides the direction of movement of either G(z) or of $G(z_x)$.

Consider the behavior of der(z) for $z \ge -\tau$ which includes $[z_0, z_1]$. At $z = -\tau$ the first term vanishes and the integral is not more than $1 + 1/\tau^2$, so under the stated condition on R, the der(z) starts out negative at $z = -\tau$. Likewise note that der(z) is ultimately negative for large z since it approaches $-(1 + D(\delta_c)/snr)$. Let's see whether der(z) goes up anywhere to the right of $-\tau$. Taking its derivative with respect to z, one obtains $$der'(z) =$$
$$\left\{ -\frac{\tau \Delta_c}{2}(1 + z/\tau)^3 z \phi(z) + \frac{3\Delta_c}{2}(1 + z/\tau)^2 \phi(z) - (1 + z/\tau)^2 \phi(z) \right\} \frac{R}{C'}.$$

The interpretation of der'(z) is that since der($z_x$) is the first derivative of $G(z_x)$, it follows that $z_x'$der'($z_x$) is the second derivative, where $z_x'$ as determined in the proof of Corollary 13 is strictly positive for $z > -\tau$. Thus the sign of the second derivative of the lower bound on the gap is determined by the sign of der'(z).

Factoring out the positive $(1+z/\tau)^2 \phi(z) R / C'$ for $z > -\tau$, the sign of der'(z) is determined by the quadratic expression $$-(\tau \Delta_c / 2)(1 - z/\tau)z + 3\Delta_c/2 - 1,$$

which has value $3\Delta_c/2 - 1$ at $z = -\tau$ and at $z = 0$. The discriminant of whether there are any roots to this quadratic yielding der'(z)=0 is given by $(\tau \Delta_c)^2/4 - 2\Delta_c(1 - 3\Delta_c/2)$. Its positivity is determined by whether $\tau^2 \Delta_c/4 > 2 - 3\Delta_c$, that is, whether $\Delta_c > 2/(\tau^2/4 + 3)$. If $\Delta_c \le 2/(\tau^2/4 + 3)$ which is less than 2/3, then der'(z), which in that case starts out negative at $z = -\tau$, never hits 0, so it stays negative for $z \ge -\tau$, so der(z) never goes up to the right of $-\tau$ and G(z) remains a decreasing function. In that decreasing case one may take $z_G = z_{max} = -\tau$.

If $\Delta_c > 2/(\tau^2/4 + 3)$, then by the quadratic formula there is an interval of values of z between the pair of points $-\tau/2 \pm \sqrt{\tau^2/4 - (2/\Delta_c)(1 - 3\Delta/2)}$ within which der'(z) is positive, and within the associated interval of values of x the $G(z_x)$ is convex in x. Outside of that interval there is concavity of $G(z_x)$. So then either der(z) remains negative, so that G(z) is decreasing for $z \ge -\tau$, or there is a root $z_{crit} > -\tau$ where der(z) first hits 0 and der'(z)>0, i.e. that root, if there is one, is in this interval. Suppose there is such a root. Then from the behavior of der'(z) as a positive multiple of a quadratic with two zero crossings, the function G(z) experiences an oscillation.

Indeed, until that point $z_{crit}$, the der(z) is negative so G(z) is decreasing. After that root, the der(z) is increasing between $z_{crit}$ and $z_{right}$, the right end of the above interval, so der(z) is positive and $z_{right}$, the G(z) is increasing between those points as well. Now consider $z \ge z_{right}$, where der'(z)$\le$0, strictly so for $z > z_{right}$. At $z_{right}$ the der(z) is strictly positive (in fact maximal) and ultimately for large z the der(z) is negative, so for $z > z_{right}$ the G(z) rises further until a point $z = z_{max}$ where der(z)=0. To the right of that point since der'(z)<0, the der(z) stays negative and G(z) is decreasing. Thus der(z) is identified as having two roots $z_{crit}$ and $z_{max}$, and G(z) is unimodal to the right of $z_{crit}$.

To determine the value of der(z) at $z=0$, evaluate the integral $\int_z^\infty (1 - t/v)^2 \pi(t) dt$. In the same manner as in the preceding subsection, it is $(1 + 1/\tau^2) \bar{\Phi}(z) + (2\tau + z) \phi(z)/\tau^2$.

Thus der(z) is $$\frac{R}{C'} \left\{ \frac{\tau \Delta_c}{2} \left(1 + \frac{z}{\tau}\right)^3 \phi(z) + \frac{2\tau + z}{\tau^2} \phi(z) + \left(1 + \frac{1}{\tau^2}\right) \bar{\Phi}(z) \right\} - \left(1 + \frac{D(\delta_c)}{snr}\right).$$

At $z=0$ it is $$\frac{R}{C'} \left\{ \left(\frac{\tau \Delta_c}{2} + \frac{2}{\tau}\right) \frac{1}{\sqrt{2\pi}} + \left(1 + \frac{1}{\tau^2}\right) / 2 \right\} - [1 + D(\delta_c)/snr].$$

It is non-negative if $\tau \Delta_c/(2\sqrt{2\pi})$ exceeds $$[1 + D(\delta_c)/snr] C'/R - (1 + 1/\tau^2)/2 - 2/(\tau \sqrt{2\pi})$$

which using $C'/R=1+r/\tau^2$ is $$\frac{1}{2} + \frac{(r-1/2)}{\tau^2} + \frac{D(\delta_c)}{snr}(1+r/\tau^2) - 2/(\tau\sqrt{2\pi}).$$

It is this expression which is called half for it tends to be not much more than ½. For instance, if $D(\delta_c)/snr \leq 1/2$ and $(3/2)r \leq (2/\sqrt{2\pi})\tau$, then this expression is not more than $1-1/(2\tau^2)$ which is less than 1.

So then der(z) is non-negative at z=0 if $$\Delta_c \geq \frac{2\sqrt{2\pi}\,\text{half}}{\tau}.$$

Non-negativity of der(0) implies that the critical value of the function G satisfies $z_G \leq 0$.

Suppose on the other hand that der(0)<0. Then $\Delta_c < 2\sqrt{2\pi}\text{half}/\tau$, which is less than 2/3 when $\tau$ is at least $3\sqrt{2\pi}\text{half}$. Using the condition $\Delta_c \leq 2/3$, the der'(z)<0 for z>0. It follows that G(z) is decreasing for z>0, and both $z_G$ and $z_{max}$ are non-positive.

Next consider the behavior of the function A(z), for which it is here shown that it too has at most one oscillation. Differentiating and collecting terms obtain that A'(z) is $$A'(z)=2(1-\Delta_c)(z+\tau)\Phi(z)+\Delta_c(z+\tau)^2\phi(z).$$

Consider values of z in $I_\tau = (-\tau, \infty)$ to the right of $-\tau$. Factoring out $2(z+\tau)$, the sign behavior of A'(z) is determined by the function $$M(z)=-(1-\Delta_c)\Phi(z)+(\Delta_c/2)(z+\tau)\phi(z).$$

This function M(z) is negative for large z as it converges to $-2(1-\Delta_c)$. Thus A(z) is decreasing for large z. At $z=-\tau$ the sign of M(z) is determined by whether $\Delta_c < 1$, if so then M(z) starts out negative, so then A(z) is initially decreasing, whereas in the unusual case of $\Delta_c \geq 1$, the A(z) is initially increasing and so set $z_A = -\tau$. Consider the derivative of M(z) given by $$M'(z)=-[1-3\Delta_c/2+(\Delta_c/2)z(z+\tau)]\phi(z).$$

The expression in brackets is the same quadratic function of z considered above. It is centered and extremal at $z_{cent} = -\tau/2$. This quadratic attains the value 0 only if $\Delta_c$ is at least $\Delta_c^* = 2/(\tau^2/4+3)$.

For $\Delta_c < \Delta_c^*$, which is less than 1, the M'(z) stays negative and consequently M(z) is decreasing, so M(z) and A'(z) remains negative for $z > -\tau$. Then A(z) is decreasing in $I_\tau$ (which actually implies the monotonicity of G(z) under the same condition on $\Delta_c$).

For $\Delta_c \geq \Delta_c^*$, for which the function M'(z) does cross 0, this M'(z) is positive in the interval of values of z centered at $z_{cent} = -\tau/2$ and heading up to the point $z_{right}$ previously discussed. In this interval including $[-\tau/2, z_{right}]$ the function M(z) is increasing.

Let's see whether M(z) is positive, at or to the left of $z_{cent}$. For $\Delta_c > 1$ that positivity already occurred at and just to the right of $-\tau$. For $\Delta_c \leq 1$, use the inequality $\Phi(z) \leq \phi(z)/(-z)$ for z<0. This lower bound is sufficient to demonstrate positivity in an interval of values of z centered at the same point $z_{cent} = -\tau/2$, provided $\Delta_c \tau^2/4$ is at least $2(1-\Delta_c)$, that is, $\Delta_c$ at least $\Delta_c^{} = 2/(\tau^2/4+2)$. Then $z_A$ is not more than the left end of this interval, which is less than $-\tau/2$. For $\Delta_c \geq \Delta_c^{}$, this interval is where the same quadratic $z(z+\tau)$ is less than $-2(1-\Delta_c)/\Delta_c$. Then the M(z) is positive at $-\tau/2$ and furthermore increasing from there up to $z_{right}$, while, further to the right it is decreasing and ultimately negative. It follows that such M(z) has only one root to the right of $-\tau/2$. The A'(z) inherits the same sign and root characteristics as M(z), so A(z) is unimodal to the right of $-\tau/2$.

If $\Delta_c$ is between $\Delta_c^*$ and $\Delta_c^{}$, the lower bound invoked is insufficient to determine the precise conditions of positivity of M(z) at $z_{cent}$, so resort in this case to the milder conclusion, from the negativity of M'(z) to the right of $z_{right}$, that M(z) is decreasing there and hence it and A'(z) has at most one root to the right of that point, so A(z) is unimodal there. Being less than $\Delta_c^{}$, the value of $\Delta_c$ is small enough that $2/\Delta_c > \tau^2/4+2$, and hence $z_{right}$ is not more than $[-\tau+\sqrt{4}]/2$ which is $-\tau/2+1$.

This completes the demonstration of Lemma 21.

It is remarked concerning G(z) that one can pin down the location of $z_G$ further. Under conditions on $\Delta_c$, it is near to and not more that a value near $$-\sqrt{2\log\left(\frac{1}{2\pi} \frac{\tau\Delta_c/2}{D(\delta_c)/snr + (r-1)/\tau^2}\right)},$$

provided the argument of the logarithm is of a sufficient size. As said, precise knowledge of the value of $z_G$ is not essential because the shape properties allow one to take advantage of the tight lower bounds on A(z) for negative z.

14.5 The Gap in the Constant Power Case

Demonstration of Corollary 19.

We are to show under the stated conditions that g(x)−x is smallest in [0,x*] at x=x*, when the power allocation is constant. For x in [0,1] the function $z_x$ is one to one. In this $u_{cut}=1$ case, it is equal to $z_x=[\sqrt{(1+r/\tau^2)/(1-xv)}-1]\tau$. It starts at x=0 with $z_0$ and at x=x* it is $\zeta$. Note that $(1+z_o/\tau)^2=1+r/\tau^2$. If $r \geq 0$ the $z_0 \geq 0$, while, in any case, for $r > -\tau^2$ the $z_0$ at least exceeds $-\tau$. Invert the formula for $z=z_x$ to express x in terms of z. Using $g(x)=\Phi(z)$ and subtracting the expression for x, we want the minimum of the function $$G(z) = \Phi(z) - \frac{1}{v}\left(1 - \frac{(1+r/\tau^2)}{(1+z/\tau)^2}\right).$$

Its value at $z_0$ is $G(z_0)=\Phi(z_0)$. Consider the minimization of G(z) for $z_0 \leq z \leq \zeta$, but take advantage, when it is helpful, of properties for all $z > -\tau$. The first derivative is $$\phi(z) - \frac{2}{v\tau}\frac{(1+r/\tau^2)}{(1+z/\tau)^3},$$

ultimately negative for very large z. This function has 0, 1, or 2 roots to the right of $-\tau$. Indeed, to be zero it means that z solves $$z^2 - 6\log(1+z/\tau) = 2\log(v\tau/c)$$

where $c=2(1+r/\tau^2)\sqrt{2\pi}$. The function on the left side $v(z) = z^2 - 6\log(1+z/\tau)$ is convex, with a value of 0 and a negative slope at z=0 and it grows without bound for large z. This function reaches its minimum value (lets call it val<0) at a point $z = z_{crit} > 0$, which solves $2z - 6/(\tau+z) = 0$, given by $z_{crit} = (\tau/2)[\sqrt{1+12/\tau^2}-1]$ not more than $3/\tau$.

When val>2 log(vτ/c) there are no roots, so G(z) is decreasing for $z > -\tau$ and has its minimum on [0, ζ] at z=ζ.

When 2 log(vτ/c) is positive (that is, when vτ>c, which is the condition stated in the corollary), it exceeds the value of the expression on the left at $z=0$, and G is increasing there. So from the indicated shape of the function $\upsilon(z)$, there is one root to the right of 0, which must be a maximizer of G(z), since G(z) is eventually decreasing. So then G(z) is unimodal for positive z and so if $z_0 \geq 0$ its minimum in $[z_0, \zeta]$ is at either $z=z_0$ or $z=\zeta$ and this minimum is at least $\min\{G(0), G(\zeta)\}$. The value at $z=0$ is $G(0)=\frac{1}{2}$. So, with $(r-r_{up})/[\text{snr}\tau^2+r_1)]$ less than $\frac{1}{2}$, the minimum for $z \geq 0$ occurs at $z=\zeta$, which demonstrates the first conclusion of Corollary 19.

If r is negative then $z_0 < 0$, and consider the shape of G(z) for negative z. Again with the assumption that $2 \log(\nu\tau/c)$ is positive, the function G(z) for $z \geq -\tau$ is seen to have a minimizer at a negative $z=z_{min}$ solving $z^2 = 2\log(\nu\tau/c) - 6\log(1+z/\tau)$, where $G'(z)=0$, and G(z) is increasing between $z_{min}$ and 0. It is inquired as to whether G(z) is increasing at $z_0$. If it is, then $z_0 \geq z_{min}$ and G(z) is unimodal to the right of $z_0$. The value of the derivative there is $$\phi(z_0) - \frac{2}{\nu(\tau+z_0)},$$

which is positive if $$|z_0| \leq \sqrt{2\log(\nu(\tau+z_0)/2\sqrt{2\pi})}.$$

As shall be seen momentarily, $z_0$ is between $r/\tau$ and $r/2\tau$, so this positive derivative condition is implied by $$r/\tau \geq -\sqrt{2\log(\nu(\tau+r/\tau)/2\sqrt{2\pi})}.$$

Then G(z) is unimodal to the right of $z_0$ and has minimum equal to $\min\{G(z_0), G(\zeta)\}$.

From the relationship $(1+z_0/\tau)^2 = 1+r/\tau^2$, with $-\tau < z_0 \leq 0$, one finds that $r=z_0(2\tau+z_0)$, so it follows that $z_0 = r/(2\tau+z_0)$ is between $r/\tau$ and $r/2\tau$.

Lower bound $G(z_0) = \Phi(z_0)$ for $z_0 \leq 0$ by the tangent line $(\frac{1}{2}) + z_0\phi(0)$, which is at least $(\frac{1}{2}) + r/(\tau\sqrt{2\pi})$. Thus when r is such that the positive derivative condition holds, there is the gap lower bound allowing $r_{up} < r \leq 0$ which is $$\min\{\frac{1}{2}+r/(\tau\sqrt{2\pi}), (r-r_{up})/[\text{snr}(\tau^2+r_1)]\}.$$

This completes the demonstration of Corollary 19.

Next it is asked whether a useful bound might be available if G(z) is not increasing at this $z_0 \leq 0$. Then $z_0 \leq z_{min}$, and the minimum of G(z) in $[z_0, \zeta]$ is either at $z_{min}$ or at $\zeta$. The G(z) is $$\Phi(z) + \frac{(1+z_0/\tau)^2 - (1+z/\tau)^2}{(1+z/\tau)^2}.$$

Now since $z_{min}$ is the negative solution to $z^2 = 2\log(\nu\tau/c) - 6\log(1+z/\tau)$, it follows that $z_{min}$ is near $-\sqrt{2\log(\nu\tau/c)}$. From the difference of squares, the second part of $G(z_{min})$ is near $2(z_0-z_{min})/\tau$ which is negative. So for $G(z_{min})$ to be positive the $\Phi(z_{min})$ would need to overcome that term. Now $\Phi(z_{min})$ is near $\phi(z_{min})/|z_{min}|$, and $G'(z)=0$ at $z_{min}$ means that $\phi(z_{min})$ equals the value $(2/\nu\tau)(1+z_0/\tau)^2/(1+z_{min}/\tau)^3$. Accordingly, $G(z_{min})$ is near $$\frac{2(1+z_0/\tau)^2}{\nu\tau\sqrt{2\log(\nu\tau/c)}} + \frac{2(z_0+\sqrt{2\log(\nu\tau/c)})}{\tau}.$$

The implication is that by choice of r one can not push $z_0$ much to the left of $-\sqrt{2\log(\nu\tau/c)}$ without losing positivity of G(z).

Next examine when $r_{up}$ is negative, whether r arbitrarily close to $r_{up}$ can satisfy the conditions. That would require the $r_p/\tau$ to be greater than $-\sqrt{2\pi}/2$ and greater than $$-\sqrt{2\log(\nu\tau(1+r_{up}/\tau^2)/2\sqrt{2\pi})}.$$

However, in view of the formula for $r_{up}$, it is near $[1/(1+\text{snr})-1]\tau^2 = -\nu\tau^2$ when $\text{snr}\overline{\Phi}(\zeta)$ and $\zeta/\tau$ are small. Consequently, $r_{up}/\tau$ is near $-\nu\tau$. So if $\nu\tau$ is greater than a constant near $\sqrt{2\pi}/2$ then the first of these conditions on $r_{up}/\tau$ is not satisfied. Also with this $r_{up}/\tau$ near $-\nu\tau$ the argument of the logarithm becomes $\nu(1-\nu)\tau/2\sqrt{2\pi}$, needed to be greater than 1. So if $\nu\tau$ is less than a constant near $\sqrt{2\pi}/2$ then this argument of the logarithm is strictly less than 1. Thus the conditions for allowance of such negative r so close to $r_{up}$ are vacuous. It is not possible to use an r so close to $r_{up}$ when it is negative.

If when $r_{up}/T$ is negative, near $-\nu\tau$, try instead to have $r/\tau = -\alpha\sqrt{2\pi}/2$ with $0 \leq \alpha < 1$, then the first expression in the minimum becomes $(1-\alpha)/2$, the second expression becomes $r - r_{up}/[\nu(\tau+\zeta)^2]$ near $1+r/[\nu\tau^2]$ equal to $1-\alpha\sqrt{2\pi}/(2\nu\tau)$, and the additional condition becomes $$\alpha\sqrt{2\pi}/2 \leq \sqrt{2\log\left(\nu\left(\frac{\tau}{2\sqrt{2\pi}} - \alpha/4\right)\right)}.$$

Which is acceptable with $\nu\tau$ at least a little more than $2\sqrt{2\pi}e^{\pi/4}$. So in this way the $1+r/\tau^2$ factor becomes at best near $1\sqrt{2\pi}/2\tau$. That is indeed a nice improvement factor in the rate, though not as ambitious as the unobtainable $1+r_{up}/\tau^2$ near $1-\nu$.

A particular negative r of interest would be one that makes $(1+D(\text{snr})/\text{snr})(1+r/\tau^2)=1$, for then even with constant power it would provide no rate drop from capacity. With this choice $1+r/\tau^2 = 1/(1+D(\text{snr})/\text{snr})$, the $$r/\tau = \frac{-\tau D(\text{snr})/\text{snr}}{1 + D(\text{snr})/\text{snr}}.$$

That a multiple of $-\tau$, where the multiple is near $\text{snr}/2$ when snr is small. For G(z) to be increasing at the corresponding $z_0$, it is desired that the magnitude $-r/\tau$ be less than $$\sqrt{2\log(\nu, \tau(1+r/\tau^2)/2\sqrt{2\pi})},$$

where the $\nu(1+r/\text{tau}^2)/2$ may be expressed as a function of snr, and is also near snr/2 when snr is small. But that would mean that $b = \tau\text{snr}/2$ is a value where $b^2 \leq 2\log(b/\sqrt{2\pi})$, which a little calculus shows is not possible. Likewise, the above development of the case that $z_0$ is to the left, of $z_{min}$, shows that one can not allow $-r/\tau$ to be much greater than the same value.

14.6 The Variance of $\Sigma_{j\ \text{sen}} \tau_j 1_{H_{\lambda,k,j}}$

The variance of this weighted sum of Bernoulli that is to be to controlled is $V/L = \sum_{j\,sent} \pi_j^2 \Phi(\mu_{k,j})\overline{\Phi}(\mu_{k,j})$ with $\mu_{k,j} = \text{shift}_{k,j} - \tau$. The $\text{shift}_{k,j}$ may be written as $\sqrt{c_k \pi_j} \tau$, where $c_k = vL(1-h')/(2R(1-xv)(1+\delta_a)^2)$ evaluated at $x = q_{1,k-1}^{adj}$. Thus $$V/L = \sum_{ell} \pi_{(l)}^2 \Phi\overline{\Phi}\left(\left(\sqrt{c_k \pi_{(l)}} - 1\right)\tau\right)$$

where $\Phi\overline{\Phi}(z)$ is the function formed by the product $\Phi(z)\overline{\Phi}(z)$.

In the no-leveling (c=0) case $\pi_{(l)} = e^{-2C(l-1)/L} 2\tilde{\mathcal{C}}/(vL)$ and $c_k \pi_{(l)} = u_l R'/(R(1-xv))$ with $R' = \tilde{\mathcal{C}}(1-h')/(1+\delta_a)^2$, where $u_l = e^{-2C(l-1)/L}$.

With a quantifiably small error as here before, now replace the sum over the grid of values of $t = l/L$ in $[0,1]$ with the integral over this interval, yielding the value $$V = (2\tilde{C}/v)^2 \int_0^1 e^{-4Ct} \Phi\overline{\Phi}\left(\left(\sqrt{\frac{e^{-2Ct}C'/R}{1-xv}} - 1\right)\tau\right) dt.$$

Change variables to $\tilde{u} = e^{-Ct}$ it is expressed as $$V = \frac{(2\tilde{C}/v)^2}{C} \int_{e^{-C}}^1 \tilde{u}^3 \Phi\overline{\Phi}\left(\left(\tilde{u}\sqrt{\frac{R'/R}{1-xv}} - 1\right)\tau\right) d\tilde{u}.$$

To upper bound it replace the $\tilde{u}^3$ factor with 1 and change variables further to $$z = \left(\tilde{u}\sqrt{\frac{R'/R}{1-xv}} - 1\right)\tau.$$

Thereby obtain an upper bound and V of $$\frac{\sqrt{1-xv}}{\tau\sqrt{R'/R}} \frac{(2\tilde{C}/v)^2}{C} \int \Phi\overline{\Phi}(z) dz.$$

Now $\Phi\overline{\Phi}(z)$ has the upper bound $(\frac{1}{4})e^{-z^2/2}$, which is $\sqrt{2\pi}\phi(z)/4$, which when integrated on the line yields $$V \leq \frac{\sqrt{1-xv}}{\tau\sqrt{C'/R}} \frac{(\tilde{C}/v)^2}{C} \sqrt{2\pi}.$$

When $R \leq R'$, then using $\tilde{\mathcal{C}} \leq C$ and $x \leq 1$, it yields $$V \leq \frac{\sqrt{2\pi}\,C}{v^2 \tau}.$$

This provides the desired upper bound on the variance.

14.7 Slight Improvement to the Variance of $\Sigma_{j\,sent} \pi_j 1_{H_{l,k,j}}$ The variance of this weighted sum of Bernoulli that is desired to be controlled is $V/L = \sum_{j\,sent} \pi_j^2 \Phi(\mu_{k,j})\overline{\Phi}(\mu_{k,j})$ with $\mu_{k,j} = \text{shift}_{k,j} - \tau$. The $\text{shift}_{k,j}$ may be written as $\sqrt{c_k \pi_j} \tau$, where $c_k = vL(1-h')/(2R(1-xv)(1+\delta_a)^2)$ evaluated at $x = q_{1,k-1}^{adj}$. Thus $$V/L = \sum_{ell} \pi_{(l)}^2 \Phi\overline{\Phi}\left(\left(\sqrt{c_k \pi_{(l)}} - 1\right)\tau\right)$$

where $\Phi\overline{\Phi}(z)$ is the function formed by the product $\Phi(z)\overline{\Phi}(z)$.

In the no-leveling (c=0) case $\pi_{(l)} = e^{-2C(l-1)/L} 2\tilde{\mathcal{C}}/(vL)$ and $c_k \pi_{(l)} = u_l R'/(R(1-xv))$ with $R' = \tilde{\mathcal{C}}(1-h')/(1+\delta_a)^2$, where $u_l = e^{-2C(l-1)/L}$.

With a quantifiable small error as before, replace the sum over the grid of values of $t = l/L$ in $[0,1]$ with the integral over this interval, yielding the value $$V = (2\tilde{C}/v)^2 \int_0^1 e^{-4Ct} \Phi\overline{\Phi}\left(\left(\sqrt{\frac{e^{-2Ct}C'/R}{1-xv}} - 1\right)\tau\right) dt.$$

Changing variables to $\tilde{u} = e^{-Ct}$ it is expressed as $$V = \frac{(2\tilde{C}/v)^2}{C} \int_{e^{-C}}^1 \tilde{u}^3 \Phi\overline{\Phi}\left(\left(\tilde{u}\sqrt{\frac{R'/R}{1-xv}} - 1\right)\tau\right) d\tilde{u}.$$

To upper bound the above expression, change variables further to $$z = \left(\tilde{u}\sqrt{\frac{R'/R}{1-xv}} - 1\right)\tau.$$

Thereby obtain an upper bound and V of $$\frac{(1-xv)^2}{\tau(R'/R)^2} \frac{(2\tilde{C}/v)^2}{C} \int_{(e^{-C}c_0 - 1)\tau}^{(c_0-1)\tau} (1+z/\tau)^3 \Phi\overline{\Phi}(z) dz,$$

where $c_0 = \sqrt{R'/R(1-xv)}$. Now notice that $(e^{-C}c_0 - 1)\tau$ is at least $-\tau$, making $1 + z/\tau \geq 0$ on the interval of integration. Accordingly, the above integral is can be bounded from above by, $$\int_{z \geq -\tau} (1+z/\tau)^3 \Phi\overline{\Phi}(z) dz.$$

Further, the integral of $(1+z/\tau)^3 \Phi\overline{\Phi}(z)$ for $z \leq -\tau$ is a negligible term that is polynomially small in $1/B$. Ignore that term in the rest of the analysis. Correspondingly, it is desired to bound the integral, $$\frac{(1-xv)^2}{\tau(R'/R)^2} \frac{(2\tilde{C}/v)^2}{C} \int (1+z/\tau)^3 \Phi\overline{\Phi}(z) dz.$$

Noticing that $\Phi\overline{\Phi}(z)$ is a symmetric function, the terms that are involve $z$ and $z^3$ after the expansion of $(1+z/\tau)^3$ above vanish upon integrating. Consequently, one only needs to bound the integral of $\Phi\overline{\Phi}(z)$ and $z^2 \Phi\overline{\Phi}(z)$. Doing this numerically the integral of the former is bounded by $a_1 = 0.57$ and that of the latter is bounded by $a_2 = 0.48$.

So ignoring the polynomially small term, the variance can be bounded by $$V \leq \frac{(1-xv)^2}{(R'/R)^2} \frac{(2\tilde{C}/v)^2}{C\tau}(a_1 + a_2/\tau^2).$$

which is less than, $$(1-xv)^2 \frac{(4C/v^2)}{\tau}(a_1 + a_2/\tau^2).$$

Bound the above quantity by $(4\tilde{C}/v^2)(a_1+a_2/\tau^2)/\tau$. Let's ignore the $a_2/\tau^2$ term since this of smaller order. Then the variance can be bounded by $1.62/\sqrt{\log B}$, where it is used that $\tau \geq \sqrt{2\log B}$ and that $4a_1/\sqrt{2}$ is less than 1.62.

14.8 Normal Tails

Let Z be a standard normal random variable and let $\phi(z)$ be its probability density function, $\Phi(z)$ be its cumulative distribution and $\overline{\Phi}(z)=1-\Phi(z)$ be its upper tail probability for $z>0$. Here collect some properties of this probability, beginning with a conclusion from Feller. Most familiar is his bound $\overline{\Phi}(z) \leq (1/z)\phi(z)$ which may be stated as $\phi(z)/\overline{\Phi}(z)$ being at least z. His lower bound $\overline{\Phi}(z) \geq (1/z-1/z^3)\phi(z)$ has certain natural improvements, which are expressed through upper bounds on $\phi(z)/\overline{\Phi}(z)$ showing how close it is to z.

Lemma 45.

For positive z the upper tail probability $\mathbb{P}\{Z>z\}=\overline{\Phi}(z)$ satisfies $\overline{\Phi}(z) \leq (\sqrt{2\pi}/2)\phi(z)$ and satisfies the Feller expansion $$\overline{\Phi}(z) \sim \phi(z)\left(\frac{1}{z} - \frac{1}{z^3} + \frac{3}{z^5} - \frac{3.5}{z^7} + \ldots\right),$$

with terms of alternating sign, where terminating with any term of positive sign produces an upper bound and terminating with any term of negative sign produces a lower bound. Furthermore, for $z>0$ the ratio $\phi(z)/\overline{\Phi}(z)$ is increasing and is less than $z+1/z$. Further improved bounds are that it is less than $\xi(z)$ equal to 2 for $0 \leq z \leq 1$ and equal to $z+1/z$ for $z \geq 1$, and, slightly better, $\phi(z)/\overline{\Phi}(z)$ is less than $[z+\sqrt{z^2+4}]/2$. Moreover, the positive $\phi(z)/\overline{\Phi}(z)-z$ is a decreasing function of z.

Demonstration of Lemma 45:

The expansion is from the book by Feller (1968, Vol. 1, Chap. VII), where it is noted in particular that the first order upper bound $\overline{\Phi}(z) < (1/z)\phi(z)$ is obtained from $\phi'(t) = -t\phi(t)$ by noting that $z\overline{\Phi}(z) = z\int_z^\infty \phi(t)dt$ is less than $\int_z^\infty t\phi(t)dt = \phi(z)$. Thus the ratio $\phi(z)/\overline{\Phi}(z)$ exceeds z. It follows that the derivative of the ratio $\phi(z)/\overline{\Phi}(z)$ which is $[\phi(z)/\overline{\Phi}(z)-z]\phi(z)/\overline{\Phi}(z)$ is positive, so this ratio is increasing and at least its value at $z=0$, which is $2/\sqrt{2\pi}$.

Now for any positive c consider the positive integral $\int_z^\infty (t/c-1)^2\phi(t) dt$. By expanding the square and using that $(t^2-1)\phi(t)$ is the derivative of $-t\phi(t)$ on sees that this integral is $(1+1/c^2)\overline{\Phi}(z)-(2/c-z/c^2)\phi(z)$. Multiplying through by $c^2$, and assuming $2c>z$, its positivity gives the family of bounds $$\phi(z)/\overline{\Phi}(z) \leq \frac{c^2+1}{2c-z}.$$

Evaluating it at $c=z$ gives the upper bound on the ratio of $(z^2+1)/z=z+1/z$. Note that since $z/(z^2+1)$ equals $1/z-1/[z(z^2+1)]$ it improves on $1/z-1/z^3$ for all $z\geq 0$, Since $\phi(z)/\overline{\Phi}(z)$ is increasing one can replace the upper bound $z+1/z$ with its lower increasing envelope, which is the claimed bound $\xi(z)$, noting that $z+1/z$ takes its minimum value of 2 at $z=1$ and is increasing thereafter. For further improvement note that $\phi(z)/\overline{\Phi}(z)$ equals a value not more than 1.53 at $z=1$, so the bound 2 for $0 \leq z \leq 1$ may be replaced by 1.53.

Next let's determine the best bound of the above form by optimizing the choice of c. The derivative of the bound is the ratio of $2c(2c-z)-2(c^2+1)$ and $(2c-z)^2$ and the c that sets it to 0 solves $c^2-zc-1=0$ for which $c=[z+\sqrt{z^2+4}]/2$, and the above bound is then equal to this c.

As for the monotonicity of $\phi(z)/\overline{\Phi}(z)-z$, its derivative is $(\phi/\overline{\Phi})^2 - z(\phi/\overline{\Phi})-1$ which is a quadratic in the positive quantity $\phi/\overline{\Phi}$, abbreviating $\phi(z)/\overline{\Phi}(z)$. Hence by inspecting the quadratic formula, this derivative is negative if $\phi/\overline{\Phi}$ is less than or equal to $[z+\sqrt{z^2+4}]/2$, which it is by the above bound. This completes the demonstration of Lemma 45.

It is remarked that $\log \phi(z)/\overline{\Phi}(z)$ has first derivative $\phi(z)/\overline{\Phi}(z)-z$ equal to the quantity studied in this lemma and second derivative found above to be negative. So the fact that $\phi(z)/\overline{\Phi}(z)-z$ is decreasing is equivalent to the normal hazard function $\phi(z)/\overline{\Phi}(z)$ being log-concave.

14.9 Tails for Weighted Bernoulli Sums

Lemma 46.

Let $W_j$, $1 \leq j \leq N$ be N independent Bernoulli$(r_j)$ random variables. Furthermore, let $\alpha_j$, $1 \leq j \leq K$ be non-negative weights that sum to 1 and let $N_\alpha = 1/\max_j \alpha_j$. Then the weighted sum $\hat{r} = \Sigma_j \alpha_j W_j$ which has mean given by $r^* = \Sigma_j \alpha_j r_j$, satisfies the following large deviation inequalities. For any r with $0 < r < r^*$, $$P(\hat{r} < r) \leq \exp\{-N_\alpha D(r\|r^*)\}$$

and for any $\tilde{r}$ with $r^* < \tilde{r} < 1$.

$$P(\hat{r} > \tilde{r}) \leq \exp\{-N_\alpha D(\tilde{r}\|r^*)\}$$

where $D(r\|r^*)$ denotes the relative entropy between Bernoulli random variables of success parameters r and $r^*$.

Demonstration of Lemma 46:

Let's prove the first part. The proof of the second part is similar.

Denote the event $$\mathcal{A} = \left\{\underline{W} : \sum_j \alpha_j W_j \leq r\right\}$$

with $\underline{W}$ denoting the N-vector of $W_j$'s. Proceeding as in Csiszar (*Ann. Probab.* 1984) it follows that $$P(\mathcal{A}) = \exp\{-D(P_{\underline{W}|\mathcal{A}}\|P_{\underline{W}})\}$$

$$\leq \exp\left\{-\sum_j D(P_{W_j|\mathcal{A}}\|P_{W_j})\right\}$$

Here $P_{\underline{W}|\mathcal{A}}$ denotes the conditional distribution of the vector $\underline{W}$ conditional on the event $P_{W_j|\mathcal{A}}$ and $\mathcal{A}$ denotes the associated marginal distribution of $W_j$ conditioned on $\mathcal{A}$. Now $$\sum_j D(P_{W_j|\mathcal{A}} \| P_{W_j}) \geq N_\alpha \sum_j \alpha_j D(P_{W_j|\mathcal{A}} \| P_{W_j}).$$

Furthermore, the convexity of the relative entropy implies that $$\sum_j \alpha_j D(P_{W_j|\mathcal{A}} \| P_{W_j}) \geq D\left(\sum_j \alpha_j P_{W_j|\mathcal{A}} \Big\| \sum_j \alpha_j P_{W_j}\right).$$

The sums on the right denote $\alpha$ mixtures of distributions $P_{W_j|\mathcal{A}}$ and $P_{W_j}$, respectively, which are distributions on $\{0, 1\}$, and hence these mixtures are also distributions on $\{0, 1\}$. In particular, $\Sigma_j \alpha_j P_{W_j}$ is the Bernoulli($r^*$) distribution and $\Sigma_j \alpha_j P_{W_j|\mathcal{A}}$ is the Bernoulli($r_e$) distribution where $$r_e = E\left[\sum_j \alpha_j W_j \Big| \mathcal{A}\right] = E[\hat{r} | \mathcal{A}].$$

But in the event $\mathcal{A}$ it holds that $\hat{r} \leq r$ so it follows that $r_e \leq r$. As $r < r^*$ this yields $D(r_e \| r^*) \geq D(r \| r^*)$. This completes the demonstration of Lemma 46.

14.10 Lower Bounds on D

Lemma 47.

For $p \geq p^*$ the relative entropy between Bernoulli($p$) and Bernoulli($p^*$) distributions has the succession of lower bounds $$D_{Ber}(p\|p^*) \geq D_{Poi}(p\|p^*) \geq 2\left(\sqrt{p} - \sqrt{p^*}\right)^2 \geq \frac{(p-p^*)^2}{2p}$$

where $D_{P_{oi}}(p\|p^*) = p \log p/p^* + p^* - p$ is also recognizable as the relative entropy between Poisson distributions of mean $p$ and $p^*$ respectively.

Remark A:

There are analogous statements for pairs of probability distributions $P$ and $P^*$ on a measurable space $\chi$ with densities $p(x)$ and $p^*(x)$ with respect to a dominating measure $\mu$. The relative entropy $D(P\|P^*)$ which is $\int p(x) \log p(x)/p^*(x) \mu(dx)$ may be written as the integral of the non-negative integrand $p(x) \log p(x)/p^*(x) + p^*(x) - p(x)$, which exceeds $(1/2)(p(x)-p^*(x))^2 / \max\{p(x), p^*(x)\}$. It is familiar that $D(P\|P^*)$ exceeds the squared Bellinger distance $H^2(P,P^*) = \int (\sqrt{p(x)} - \sqrt{p^*(x)})^2 \mu(dx)$. That fact arises for instance via Jensen's inequality, from which D exceeds $2 \log 1/(1-(1/2)H^2)$ which in turn is at least $H^2$.

Remark B:

When $\hat{p}$ is the relative frequency of occurrence in N independent Bernoulli trials it has the bound $P\{\hat{p} > p\} \leq e^{-ND_{Ber}(p\|p^*)}$ on the upper tail of the Binomial distribution of $N\hat{p}$ for $p > p^*$. In accordance with the Poisson interpretation of the lower bound on the exponent, one sees that this upper tail of the Binomial is in turn bounded by the corresponding large deviation expression that would hold if the random variables were Poisson.

Demonstration of Lemma 47:

The Bernoulli relative entropy may be expressed as the sum of two positive terms, one of which is $p \log p/p^* + p^* - p$, and the other is the corresponding term with $1-p$ and $1-p^*$ in place of $p$ and $p^*$, so this demonstrates the first inequality. Now suppose $p > p^*$. Write $p \log p/p^* + p^* - p$ as $p^* F(s)$ where $F(s) = 2s^2 \log s + 1 - s^2$ with $s^2 = p/p^*$ which is at least 1. This function F and its first derivative $F'(s) = 4s \log s$ have value equal to 0 at $s=1$, and its second derivative $F''(s) = 4+4 \log s$ is at least 4 for $s \geq 1$. So by second order Taylor expansion $F(s) \geq 2(s-1)^2$ for $s \geq 1$. Thus $p \log p/p^* + p^* - p$ is at least $2(\sqrt{p}-\sqrt{p^*})^2$. Furthermore $2(s-1)^2 \geq (s^2-1)^2/(2s^2)$ as, taking the square root of both sides, it is seen to be equivalent to $2(s-1) \geq s^2-1$, which, factoring out $s-1$ from both sides, is seen to hold for $s \geq 1$. From this the final lower bound $(p-p^*)^2/(2p)$ is obtained. This completes the demonstration of Lemma 47.

ACKNOWLEDGMENT

The inventors herein thank Creighton Hauikulani who performed simulations of the decoder and earlier incarnations of it in fall 2009 and spring 2010 while completed masters studies in the Department of Statistics at Yale.

FINAL STATEMENT

Although the invention has been described in terms of specific embodiments and applications, persons skilled in the art may, in light of this teaching, generate additional embodiments without exceeding the scope or departing from the spirit of the invention described and claimed herein. Accordingly, it is to be understood that the drawing and description in this disclosure are proffered to facilitate comprehension of the invention, and should not be construed to limit the scope thereof.

What is claimed is:

1. A sparse superposition encoder for a structured code for encoding digital information for transmission over a data channel, the encoder comprising:
   a memory for storing a design matrix formed of a plurality of column vectors $X_1, X_2, \ldots, X_N$, each such vector having n coordinates; and
   an input for entering a sequence of input bits $u_1, u_2, \ldots, U_K$ which determine a plurality of coefficients $\beta_1, \ldots, \beta_N$, each of the coefficients being associated with a respective one of the vectors of the design matrix to form codeword vectors, with real or complex-valued entries, in the form of superpositions $\beta_1 X_1 + \beta_2 X_2 + \ldots + \beta_N X_N$, the sequence of bits $u_1, u_2, \ldots, U_K$ constituting at least a portion of the digital information;
   wherein: (1) at least some of the plurality of the coefficients $\beta_j$ have a predetermined value multiplied selectably by +1, or the predetermined value multiplied by −1; (2) at least some of the plurality of the coefficients $\beta_j$ have a zero value, a number of the plurality of the coefficients $\beta_j$ having a non-zero value being denoted L and the value B=N/L controlling an extent of sparsity; (3) a dictionary is generated by independent standard normal random variables; or (4) the dictionary is generated by independent, equiprobable, +1 or −1, random variables.

2. The encoder of claim 1, wherein the plurality of the coefficients $\beta_j$ have selectably the non-zero value, or the zero value.

3. The encoder of claim 1, wherein (1) at least some of the plurality of the coefficients $\beta_j$ have the predetermined value multiplied selectably by the +1, or the predetermined value multiplied by the −1.

4. The encoder of claim 1, wherein (2) at least some of the plurality of the coefficients $\beta_j$ have the zero value, the number of the plurality of the coefficients $\beta_j$ having the non-zero value being denoted the L and the value B=N/L controlling the extent of the sparsity.

5. The encoder of claim 4, wherein there is an adder that computes each entry of the codeword vector as the superposition of corresponding dictionary elements for which the coefficients are non-zero.

6. The encoder of claim 4, wherein there are n adders computing the codeword vector entries as the superposition of selected L columns of a dictionary in parallel.

7. The encoder of claim 1, wherein the design matrix stored in the memory is partitioned into L sections, with each section having B columns, where L>1.

8. The encoder of claim 7, wherein each of the L sections of size B has B memory positions, one for each column of a dictionary, where B has a value corresponding to a power of 2, said positions addressed (selected) by binary strings of length $\log_2(B)$.

9. The encoder of claim 8, wherein the input bit string of length K=L $\log_2 B$ is split into L substrings, wherein for each section the associated substring provides the memory address of which one column is flagged to have a non-zero coefficient.

10. The encoder of claim 8, wherein an input to the code arises as an output of a Reed-Solomon outer code of alphabet size B and length L for the purpose of maintaining an optimal separation, with distance measured by a fraction of distinct selections of non-zero terms.

11. The encoder of claim 7, wherein only 1 out of B coefficients in each section is non-zero.

12. The encoder of claim 7, wherein the L sections each has allocated a respective power that determines squared magnitudes of non-zero coefficients, denoted $P_1, P_2, \ldots, P_L$, one from each section.

13. The encoder of claim 12, wherein the respectively allocated powers sum to a total P to achieve a predetermined transmission power.

14. The encoder of claim 12, wherein the allocated powers are determined in a set of variable power assignments that permit a code rate up to value $C_B$ where, with increasing sparsity B, this value approaches the capacity C=1/2 $\log_2(1+P/\sigma^2)$ for a Gaussian noise channel of noise variance $\sigma^2$.

15. The encoder of claim 14, wherein the code rate is R=K/n, for an arbitrary R where R<C, for an additive channel of capacity C, and a partitioned superposition code rate is R=(L log B)/n.

16. The encoder of claim 12, wherein before initiating communications, the allocated magnitudes are pre-multiplied to the columns of each section of the design matrix X, so that only adders are subsequently required of an encoder processor to form the code words codeword vectors.

17. The encoder of claim 16, wherein R/log(B) is arranged to be bounded so that encoder computation time to form the superposition of L columns is not larger than order n, yielding constant computation time per symbol sent.

18. The encoder of claim 17, wherein R/log(B) is chosen to be small.

19. The encoder of claim 7, wherein encoder size complexity is not more than nBL memory positions to hold the design matrix and n adders.

20. The encoder of claim 7, wherein the value of B is chosen to be not more than a constant times n, whereupon also L is not more than n divided by a log, so that encoder size complexity nBL is not more than $n^3$.

21. The encoder of claim 1, wherein (3) the dictionary is generated by the independent standard normal random variables.

22. The encoder of claim 21, wherein the random variables are provided to specified predetermined precision.

23. The encoder of claim 1, wherein (4) the dictionary is generated by the independent, equiprobable, +1 or −1, random variables.

24. A sparse superposition encoder for a structured code for encoding digital information for transmission over a data channel, the encoder comprising:
a memory for storing a design matrix formed of a plurality of column vectors $X_1, X_2, \ldots, X_N$, each such vector having n coordinates; and
an input for entering a sequence of input bits $u_1, u_2, \ldots, U_K$ which determine a plurality of coefficients $\beta_1, \ldots, \beta_N$, each of the coefficients being associated with a respective one of the vectors of the design matrix to form codeword vectors, with real or complex-valued entries, in the form of superpositions $\beta_1 X_1 + \beta_2 X_2 + \ldots + \beta_N X_N$, the sequence of bits $u_1, u_2, \ldots, U_K$ constituting at least a portion of the digital information;
wherein the design matrix stored in the memory is partitioned into L sections, with each section having B columns, where L>1;
wherein: (1) each of the L sections of size B has B memory positions, one for each column of a dictionary, where B has a value corresponding to a power of 2, said positions addressed (selected) by binary strings of length $\log_2(B)$; (2) only 1 out of B coefficients in each section is non-zero; (3) the L sections each has allocated a respective power that determines squared magnitudes of non-zero coefficients, denoted $P_1, P_2, \ldots, P_L$, one from each section; (4) encoder size complexity is not more than nBL memory positions to hold the design matrix and n adders; or (5) the value of B is chosen to be not more than a constant times n, whereupon also L is not more than n divided by a log, so that encoder size complexity nBL is not more than $n^3$.

25. The encoder of claim 24, wherein the plurality of the coefficients $\beta_j$ have selectably a determined non-zero value, or a zero value.

26. The encoder of claim 24, wherein at least some of the plurality of the coefficients $\beta_j$ have a predetermined value multiplied selectably by +1, or the predetermined value multiplied by −1.

27. The encoder of claim 24, wherein at least some of the plurality of the coefficients $\beta_j$ have a zero value, the number of the plurality of the coefficients $\beta_j$ having a non-zero value being denoted L and the value B=N/L controlling an extent of sparsity.

28. The encoder of claim 27, wherein there is an adder that computes each entry of the codeword vector as the superposition of corresponding dictionary elements for which the coefficients are non-zero.

29. The encoder of claim 27, wherein there are n adders computing the codeword vector entries as the superposition of selected L columns of a dictionary in parallel.

30. The encoder of claim 24, wherein (1) each of the L sections of the size B has the B memory positions, one for each of the column of the dictionary, where the B has the value corresponding to the power of 2, said positions addressed (selected) by the binary strings of the length $\log_2(B)$.

31. The encoder of claim 30, wherein the input bit string of length K=L $\log_2 B$ is split into L substrings, wherein for each section the associated substring provides the memory address of which one column is flagged to have a non-zero coefficient.

32. The encoder of claim 30, wherein an input to the code arises as an output of a Reed-Solomon outer code of alphabet size B and length L for the purpose of maintaining an optimal separation, with distance measured by a fraction of distinct selections of non-zero terms.

33. The encoder of claim 24, wherein (2) only the 1 out of the B coefficients in said each section is the non-zero.

34. The encoder of claim 24, wherein (3) the L sections each has allocated the respective power that determines the squared magnitudes of the non-zero coefficients, denoted the $P_1, P_2, \ldots, P_L$, the one from each section.

35. The encoder of claim 34, wherein the respectively allocated powers sum to a total P to achieve a predetermined transmission power.

36. The encoder of claim 34, wherein the allocated powers are determined in a set of variable power assignments that permit a code rate up to value $C_B$ where, with increasing sparsity B, this value approaches the capacity $C=1/2 \log_2(1+P/\sigma^2)$ for a Gaussian noise channel of noise variance $\sigma^2$.

37. The encoder of claim 36, wherein the code rate is R=K/n, for an arbitrary R where R<C, for an additive channel of capacity C, and a partitioned superposition code rate is R=(L log B)/n.

38. The encoder of claim 34, wherein before initiating communications, the allocated magnitudes are pre-multiplied to the columns of each section of the design matrix X, so that only adders are subsequently required of an encoder processor to form the codeword vectors.

39. The encoder of claim 38, wherein R/log(B) is arranged to be bounded so that encoder computation time to form the superposition of L columns is not larger than order n, yielding constant computation time per symbol sent.

40. The encoder of claim 39, wherein R/log(B) is chosen to be small.

41. The encoder of claim 24, wherein (4) the encoder size complexity is not more than the nBL memory positions to hold the design matrix and the n adders.

42. The encoder of claim 24, wherein (5) the value of B is chosen to be not more than the constant times the n, whereupon also the L is not more than the n divided by the log, so that the encoder size complexity nBL is not more than the $n^3$.

43. The encoder of claim 24, wherein a dictionary is generated by independent standard normal random variables.

44. The encoder of claim 43, wherein the random variables are provided to specified predetermined precision.

45. The encoder of claim 24, wherein a dictionary is generated by independent, equiprobable, +1 or −1, random variables.

* * * * *